(12) United States Patent
Bokma et al.

(10) Patent No.: US 11,036,318 B2
(45) Date of Patent: Jun. 15, 2021

(54) CAPACITIVE TOUCH OR PROXIMITY DETECTION FOR CROWN

(71) Applicant: Apple Inc., Cupertino, CA (US)

(72) Inventors: Louis W. Bokma, San Jose, CA (US); Prashanth Holenarsipur, Fremont, CA (US); Yuta Kuboyama, San Jose, CA (US); Mengshu Huang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 210 days.

(21) Appl. No.: 15/275,323

(22) Filed: Sep. 23, 2016

(65) Prior Publication Data
US 2017/0090599 A1 Mar. 30, 2017

Related U.S. Application Data

(60) Provisional application No. 62/235,465, filed on Sep. 30, 2015, provisional application No. 62/235,254,
(Continued)

(51) Int. Cl.
*G06F 3/038* (2013.01)
*G06F 3/0354* (2013.01)
(Continued)

(52) U.S. Cl.
CPC ............. *G06F 3/038* (2013.01); *G04C 3/001* (2013.01); *G04C 3/005* (2013.01); *G04C 3/007* (2013.01);
(Continued)

(58) Field of Classification Search
CPC ...... G06F 1/1607; G06F 1/1613; G06F 1/163; G06F 1/1637; G06F 3/02; G06F 3/0202;
(Continued)

(56) References Cited

U.S. PATENT DOCUMENTS

| 3,673,327 A | 6/1972 | Johnson |
| 4,203,280 A * | 5/1980 | Ziegler ................ G04G 21/08 |
| | | 200/600 |

(Continued)

FOREIGN PATENT DOCUMENTS

| JP | 2000-163031 A | 6/2000 |
| JP | 2001-202178 A | 7/2001 |

(Continued)

OTHER PUBLICATIONS

Final Office Action dated Feb. 20, 2013, for U.S. Appl. No. 12/184,232, filed Jul. 31, 2008, 24 pages.
(Continued)

*Primary Examiner* — Keith L Crawley
(74) *Attorney, Agent, or Firm* — Kubota & Basol LLP

(57) ABSTRACT

An electronic device is disclosed. In some examples, the electronic device comprises a rotatable mechanical input mechanism. In some examples, the electronic device comprises sense electrode positioned proximate to the mechanical input mechanism. In some examples, the electronic device comprises a capacitive sense circuit comprising drive circuity operatively coupled to the mechanical input mechanism and configured for driving a drive signal onto the mechanical input mechanism. In some examples, the electronic device comprises a capacitive sense circuit comprising sense circuitry operatively coupled to the sense electrode and configured to measure an amount of coupling between the rotatable mechanical input mechanism and the sense electrode. In some examples, the electronic device comprises a housing, wherein the sense electrode is included in a gasket for connecting a display to the housing.

17 Claims, 64 Drawing Sheets

Related U.S. Application Data filed on Sep. 30, 2015, provisional application No. 62/235,473, filed on Sep. 30, 2015, provisional application No. 62/235,426, filed on Sep. 30, 2015, provisional application No. 62/297,780, filed on Feb. 19, 2016, provisional application No. 62/304,129, filed on Mar. 4, 2016, provisional application No. 62/304,135, filed on Mar. 4, 2016.

(51) Int. Cl.

| | | |
|---|---|---|
| *G06F 3/0362* | (2013.01) | |
| *G06F 1/16* | (2006.01) | |
| *G06F 3/044* | (2006.01) | |
| *G06F 3/043* | (2006.01) | |
| *H03K 17/96* | (2006.01) | |
| *G06F 3/03* | (2006.01) | |
| *G04C 3/00* | (2006.01) | |
| *G04G 21/08* | (2010.01) | |

(52) U.S. Cl.
CPC ............ *G04G 21/08* (2013.01); *G06F 1/163* (2013.01); *G06F 3/0304* (2013.01); *G06F 3/0362* (2013.01); *G06F 3/03547* (2013.01); *G06F 3/044* (2013.01); *G06F 3/0433* (2013.01); *H03K 17/962* (2013.01); *G06F 2203/04105* (2013.01); *G06F 2203/04108* (2013.01); *H03K 2217/96003* (2013.01)

(58) Field of Classification Search
CPC ...... G06F 3/0227; G06F 3/0362; G06F 3/038; G06F 3/0304; G06F 3/03547; G06F 3/0433; G06F 3/044; G06F 2203/04105; G06F 2203/04108; G04C 3/001; G04C 3/005; G04C 3/007; G04G 17/04; G04G 17/045; G04G 21/08; H03K 17/955; H03K 17/96; H03K 17/962; H03K 17/9625; H03K 17/975; H03K 2217/96003; H03K 2217/96031; H03K 2217/96054; H03K 2217/9607; H03K 2217/96071; H03K 2217/960745; H03K 2217/960755; H03K 2217/960775

See application file for complete search history.

(56) References Cited

U.S. PATENT DOCUMENTS

| | | |
|---|---|---|
| 4,506,354 A | 3/1985 | Hansen |
| 4,746,914 A | 5/1988 | Adler |
| 4,825,212 A | 4/1989 | Adler |
| 5,483,261 A | 1/1996 | Yasutake |
| 5,488,204 A | 1/1996 | Mead et al. |
| 5,591,945 A | 1/1997 | Kent |
| 5,766,493 A | 6/1998 | Shin |
| 5,816,225 A | 10/1998 | Koch et al. |
| 5,825,352 A | 10/1998 | Bisset et al. |
| 5,835,079 A | 11/1998 | Shieh |
| 5,854,450 A | 12/1998 | Kent |
| 5,880,411 A | 3/1999 | Gillespie et al. |
| 6,061,050 A | 5/2000 | Allport et al. |
| 6,078,315 A | 6/2000 | Huang |
| 6,091,406 A | 7/2000 | Kambara |
| 6,188,391 B1 | 2/2001 | Seely et al. |
| 6,225,985 B1 | 5/2001 | Armstrong |
| 6,229,529 B1 | 5/2001 | Yano |
| 6,252,825 B1 * | 6/2001 | Perotto .................. G04C 3/007 368/185 |
| 6,310,610 B1 | 10/2001 | Beaton et al. |
| 6,323,846 B1 | 11/2001 | Westerman et al. |
| 6,327,011 B2 | 12/2001 | Kim |
| 6,636,197 B1 | 10/2003 | Goldenberg et al. |
| 6,661,438 B1 | 12/2003 | Shiraishi et al. |
| 6,690,387 B2 | 2/2004 | Zimmerman et al. |
| 6,856,259 B1 | 2/2005 | Sharp |
| 7,015,894 B2 | 3/2006 | Morohoshi |
| 7,079,118 B2 | 7/2006 | Benard |
| 7,098,891 B1 | 8/2006 | Pryor |
| 7,184,064 B2 | 2/2007 | Zimmerman et al. |
| 7,489,308 B2 | 2/2009 | Blake |
| 7,499,039 B2 | 3/2009 | Roberts |
| 7,573,466 B1 | 8/2009 | Marzen |
| 7,663,607 B2 | 2/2010 | Hotelling et al. |
| 7,800,592 B2 | 9/2010 | Kerr et al. |
| 7,822,469 B2 | 10/2010 | Lo |
| 7,907,129 B2 | 3/2011 | Idzik |
| 8,169,404 B1 | 5/2012 | Boillot |
| 8,294,670 B2 | 10/2012 | Griffin |
| 8,479,122 B2 | 7/2013 | Hotelling et al. |
| 8,624,836 B1 | 1/2014 | Miller et al. |
| 8,736,162 B2 | 5/2014 | Jin et al. |
| 8,743,091 B2 | 6/2014 | Bernstein |
| 8,976,141 B2 | 3/2015 | Myers et al. |
| 9,047,009 B2 | 6/2015 | King et al. |
| 9,070,648 B2 | 6/2015 | De Jong et al. |
| 9,753,436 B2 | 9/2017 | Ely et al. |
| 10,503,271 B2 | 12/2019 | Ely et al. |
| 2004/0164970 A1 | 8/2004 | Benard |
| 2005/0017959 A1 | 1/2005 | Kraus |
| 2005/0052432 A1 | 3/2005 | Kraus |
| 2005/0083313 A1 | 4/2005 | Hardie-bick |
| 2005/0248548 A1 | 11/2005 | Tsumura |
| 2006/0026521 A1 | 2/2006 | Hotelling et al. |
| 2006/0097991 A1 | 5/2006 | Hotelling et al. |
| 2006/0197750 A1 | 9/2006 | Kerr et al. |
| 2006/0197753 A1 | 9/2006 | Hotelling |
| 2007/0181410 A1 * | 8/2007 | Baier .................. F24C 7/082 200/17 R |
| 2007/0211031 A1 | 9/2007 | Marc |
| 2007/0240913 A1 | 10/2007 | Schermerhorn |
| 2008/0059761 A1 | 3/2008 | Norman |
| 2008/0114251 A1 | 5/2008 | Weymer |
| 2008/0207281 A1 | 8/2008 | Tsuchiya et al. |
| 2008/0266266 A1 | 10/2008 | Kent |
| 2008/0297638 A1 | 12/2008 | Hiratsuka |
| 2009/0273570 A1 | 11/2009 | Degner et al. |
| 2010/0026667 A1 | 2/2010 | Bernstein |
| 2010/0231238 A1 * | 9/2010 | Toyota ................. G01D 5/2405 324/662 |
| 2011/0298699 A1 * | 12/2011 | Goto .................... G06F 3/0202 345/156 |
| 2012/0139852 A1 | 6/2012 | Huang et al. |
| 2012/0139880 A1 * | 6/2012 | Shirakawa .......... G06F 3/03547 345/184 |
| 2012/0212445 A1 | 8/2012 | Heikkinen et al. |
| 2013/0154955 A1 | 6/2013 | Guard |
| 2014/0009441 A1 | 1/2014 | Bernstein et al. |
| 2014/0016048 A1 | 1/2014 | Omote et al. |
| 2014/0045547 A1 | 2/2014 | Singamsetty et al. |
| 2014/0087658 A1 | 3/2014 | Hou et al. |
| 2014/0106814 A1 | 4/2014 | Schmidt |
| 2014/0299884 A1 | 10/2014 | Park et al. |
| 2014/0328147 A1 | 11/2014 | Yang et al. |
| 2015/0015512 A1 | 1/2015 | Kwak et al. |
| 2015/0070309 A1 | 3/2015 | Kang |
| 2015/0070312 A1 | 3/2015 | Her et al. |
| 2015/0109744 A1 * | 4/2015 | Jufer .................... G04G 17/06 361/752 |
| 2015/0227227 A1 | 8/2015 | Myers et al. |
| 2015/0334211 A1 | 11/2015 | Shin et al. |
| 2015/0370376 A1 * | 12/2015 | Harley ................. G06F 3/0414 345/174 |
| 2016/0004367 A1 * | 1/2016 | Shimada ............... G09G 5/003 345/174 |
| 2016/0033342 A1 * | 2/2016 | Lyon ..................... G01L 1/142 73/862.626 |
| 2016/0058375 A1 | 3/2016 | Rothkopf |
| 2016/0098016 A1 * | 4/2016 | Ely ...................... G04G 21/00 368/308 |
| 2016/0170624 A1 * | 6/2016 | Zambetti ............. G06F 3/04842 715/771 |

(56) References Cited

U.S. PATENT DOCUMENTS

| | | | | |
|---|---|---|---|---|
| 2016/0209939 A1* | 7/2016 | Zambetti | ............... | G06F 3/0362 |
| 2016/0327911 A1* | 11/2016 | Eim | ...................... | G04B 27/002 |
| 2017/0090592 A1* | 3/2017 | Ely | ........................ | G06F 1/3231 |
| 2017/0090614 A1 | 3/2017 | Kuboyama et al. | | |
| 2017/0308200 A1 | 10/2017 | Mugiraneza et al. | | |
| 2018/0181733 A1* | 6/2018 | Shim | ...................... | G04G 21/08 |

FOREIGN PATENT DOCUMENTS

| | | | | | |
|---|---|---|---|---|---|
| JP | 2002-342033 A | | 11/2002 | | |
| JP | 2004-184396 A | | 7/2004 | | |
| WO | 2005103872 A2 | | 11/2005 | | |
| WO | WO 2014/124173 | * | 8/2014 | ............. | G06F 3/041 |
| WO | WO2014/200766 | * | 12/2014 | ............... | G06F 3/02 |
| WO | WO 2015/034969 | * | 3/2015 | ........... | G06F 3/0362 |
| WO | WO-2015/034969 A2 | | 3/2015 | | |

OTHER PUBLICATIONS

Final Office Action dated Aug. 27, 2013, for U.S. Appl. No. 12/184,232, filed Jul. 31, 2008, 25 pages.

Non-Final Office Action dated Nov. 18, 2011, for U.S. Appl. No. 12/184,232, filed Jul. 31, 2008, 21 pages.

Non-Final Office Action dated Jul. 25, 2012, for U.S. Appl. No. 12/184,232, filed Jul. 31, 2008, 18 pages.

Notice of Allowance dated Mar. 14, 2014, for U.S. Appl. No. 12/184,232, filed Jul. 31, 2008, eight pages.

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI ' 92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

Final Office Action for U.S. Appl. No. 14/870,905, dated Dec. 14, 2018, 24 pages.

Non-Final Office Action for U.S. Appl. No. 14/870,905, dated Feb. 23, 2018, 21 pages.

Non-Final Office Action for U.S. Appl. No. 14/870,905, dated Jul. 19, 2019, 25 pages.

Notice of Allowance for U.S. Appl. No. 14/870,905, dated Dec. 2, 2019, 10 pages.

Restriction Requirement for U.S. Appl. No. 14/870,905, dated Sep. 8, 2017, 6 pages.

Notice of Allowance for U.S. Appl. No. 14/870,905, dated Mar. 16, 2020, 10 pages.

\* cited by examiner

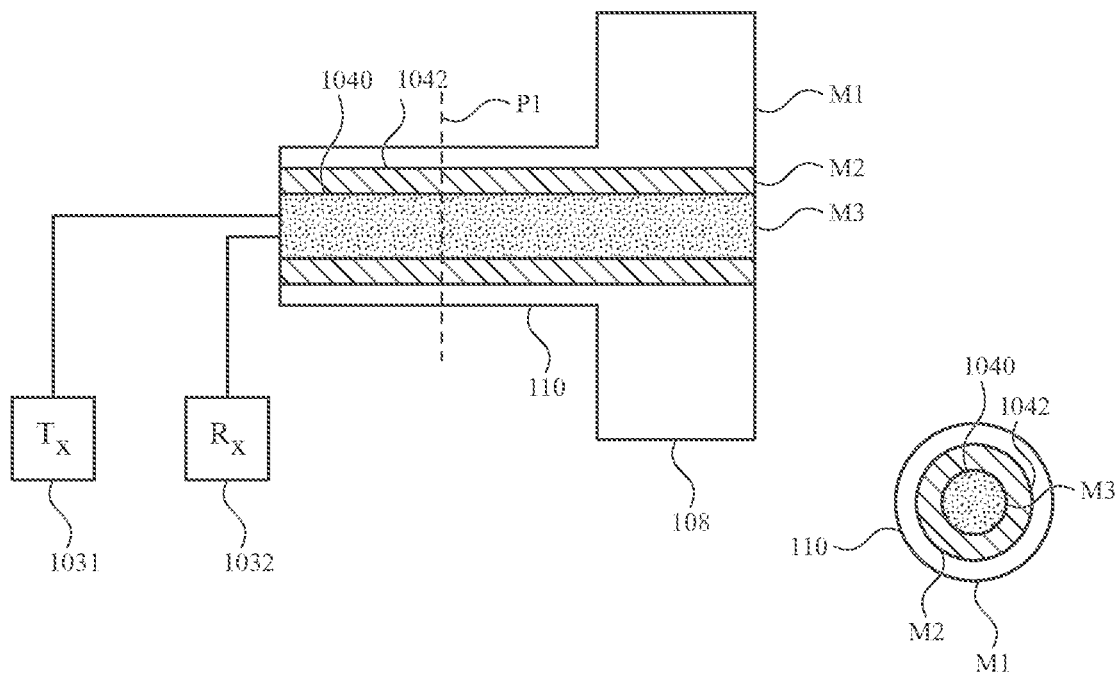
FIG. 10A
FIG. 10B
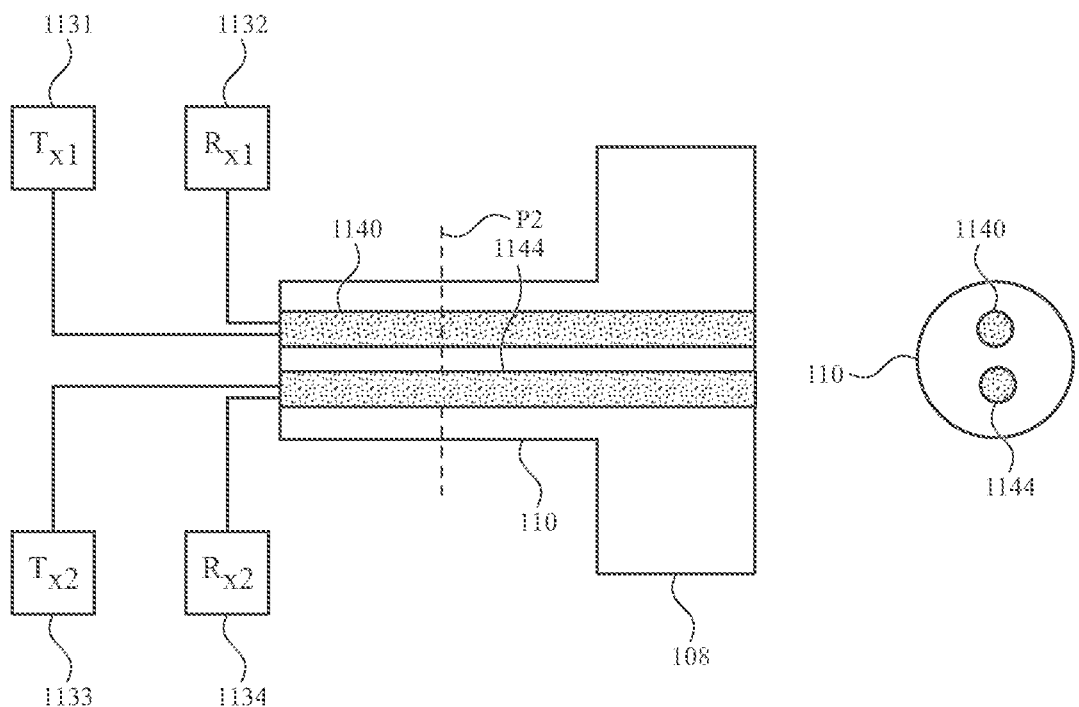
FIG. 11A
FIG. 11B

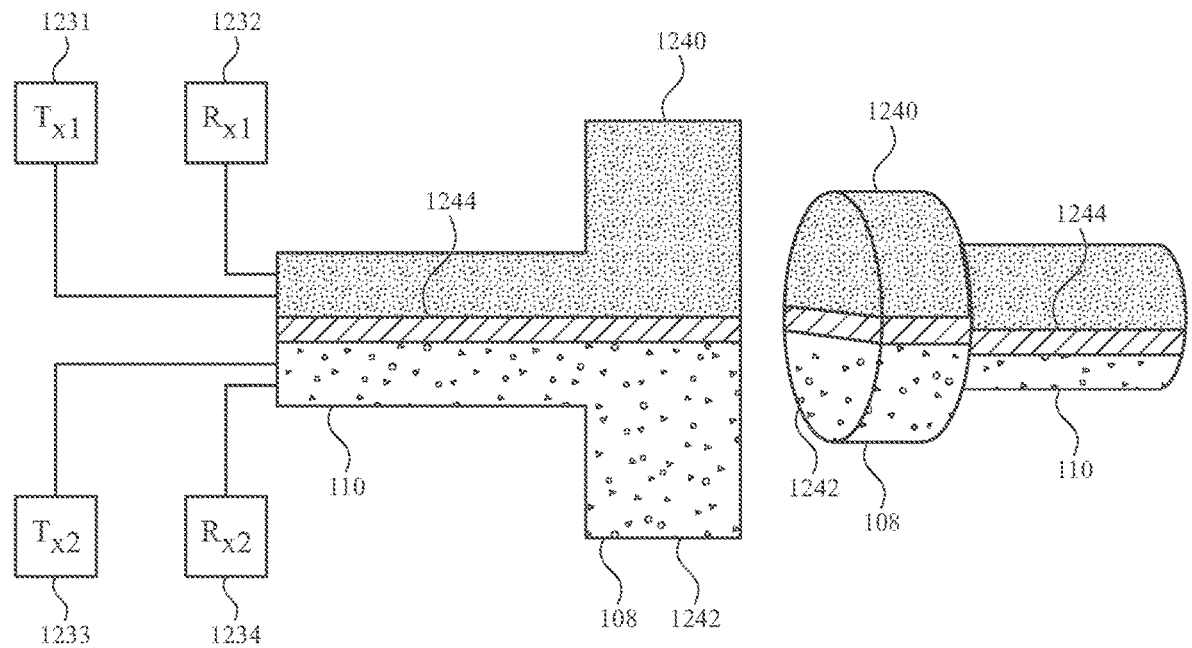
*FIG. 12A*  *FIG. 12B*
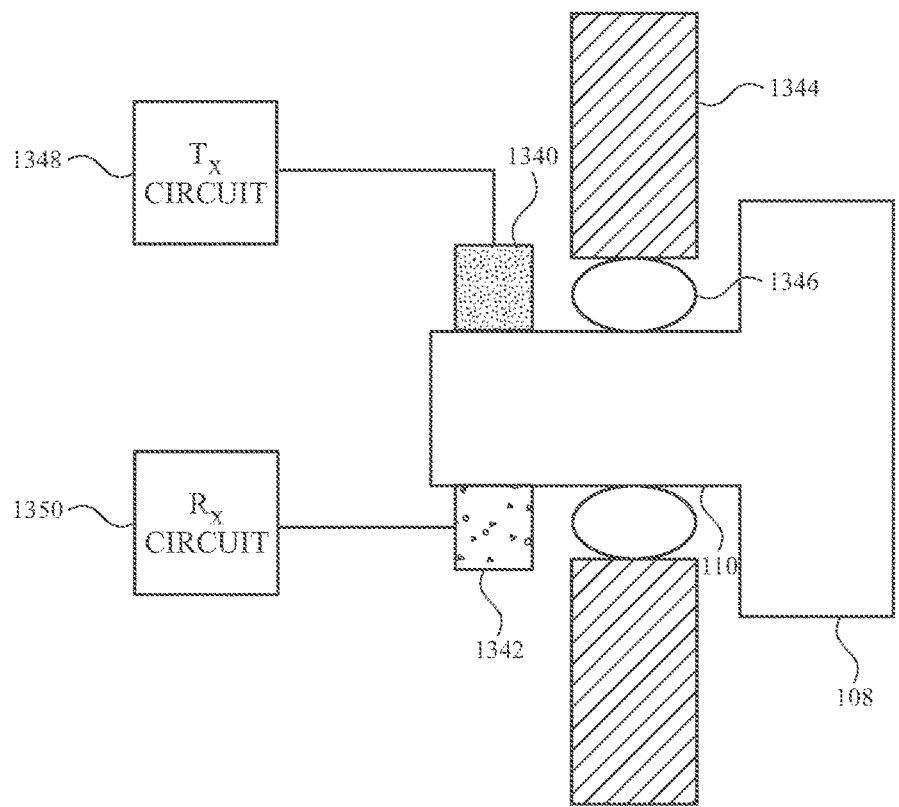
*FIG. 13*

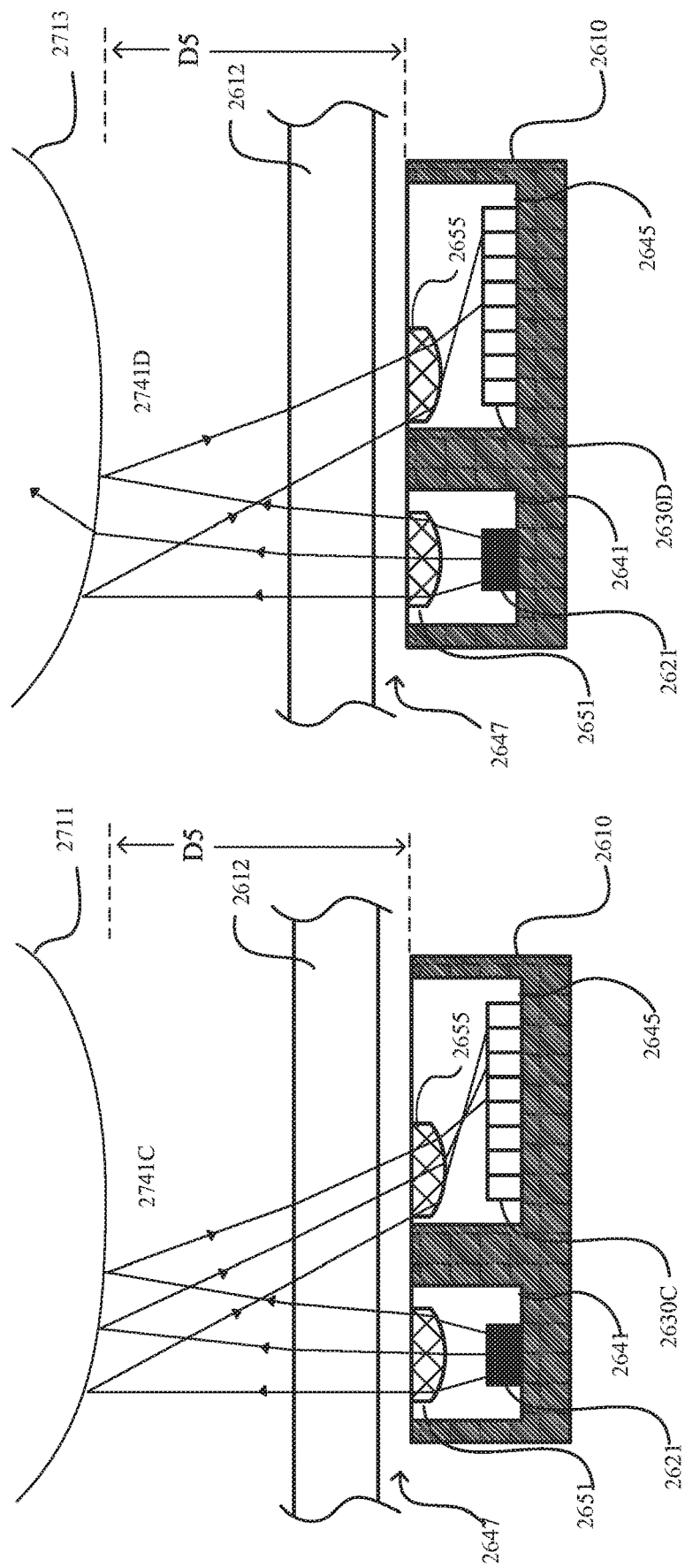

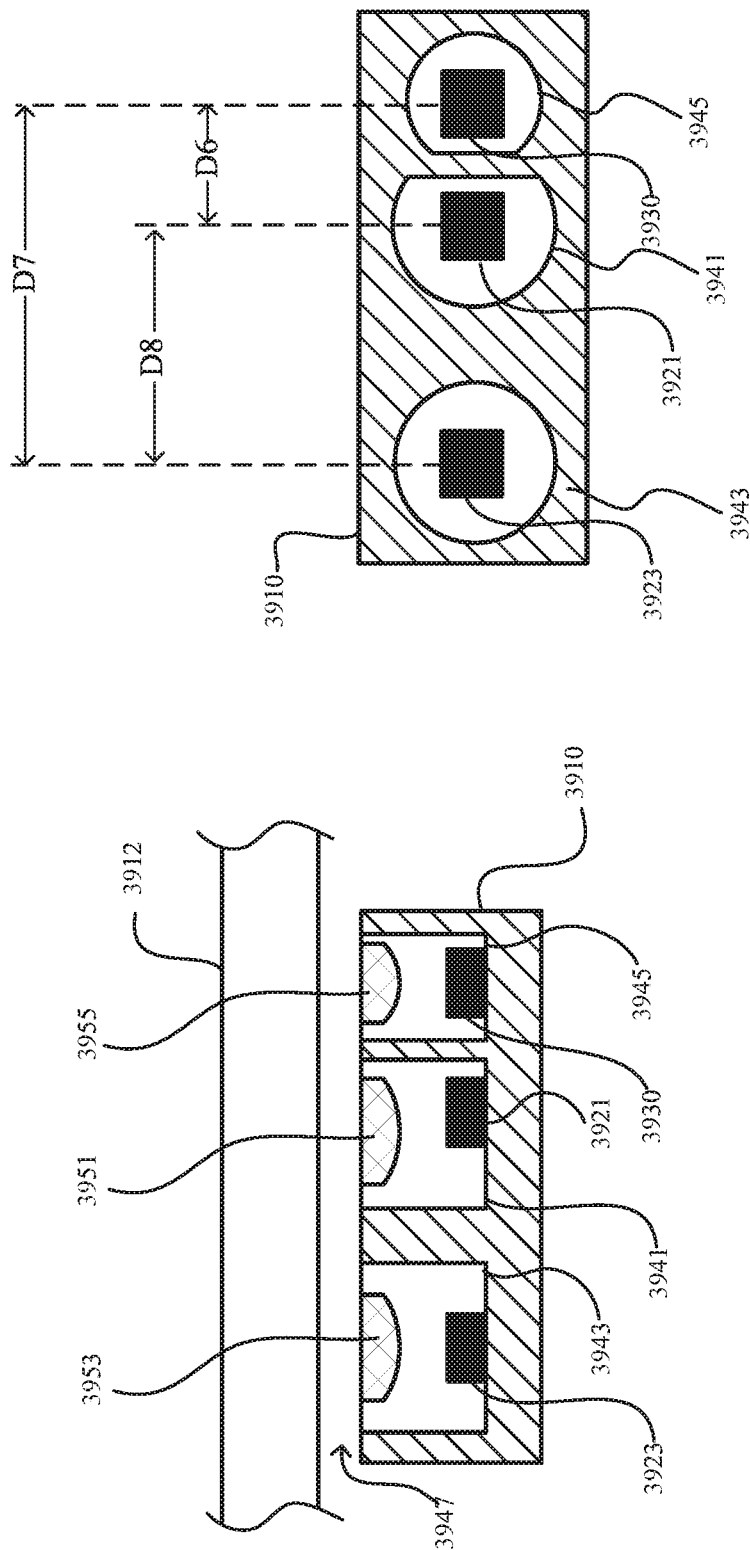

CAPACITIVE TOUCH OR PROXIMITY DETECTION FOR CROWN

CROSS-REFERENCES TO RELATED APPLICATIONS

This application claims the benefit under 35 U.S.C. § 119(e) of U.S. Provisional Patent Application No. 62/235,465, filed Sep. 30, 2015, of U.S. Provisional Patent Application No. 62/235,254, filed Sep. 30, 2015, of U.S. Provisional Patent Application No. 62/235,473, filed Sep. 30, 2015, of U.S. Provisional Patent Application No. 62/235,426, filed Sep. 30, 2015, of U.S. Provisional Patent Application No. 62/297,780, filed Feb. 19, 2016, of U.S. Provisional Patent Application No. 62/304,129, filed Mar. 4, 2016, and of U.S. Provisional Patent Application No. 62/304,135, filed Mar. 4, 2016, the contents of which are incorporated by reference herein in their entirety for all purposes.

FIELD OF THE DISCLOSURE

This relates generally to user inputs, such as mechanical inputs, and more particularly, to providing touch and proximity sensing for such inputs.

BACKGROUND OF THE DISCLOSURE

Many types of input devices are presently available for performing operations in a computing system, such as buttons or keys, mice, trackballs, joysticks, touch sensor panels, touch screens and the like. Touch screens, in particular, are becoming increasingly popular because of their ease and versatility of operation as well as their declining price. Touch screens can include a touch sensor panel, which can be a clear panel with a touch-sensitive surface, and a display device such as a liquid crystal display (LCD) that can be positioned partially or fully behind the panel so that the touch-sensitive surface can cover at least a portion of the viewable area of the display device. Touch screens can allow a user to perform various functions by touching the touch sensor panel using a finger, stylus or other object at a location often dictated by a user interface (UI) being displayed by the display device. In general, touch screens can recognize a touch and the position of the touch on the touch sensor panel, and the computing system can then interpret the touch in accordance with the display appearing at the time of the touch, and thereafter can perform one or more actions based on the touch. In the case of some touch sensing systems, a physical touch on the display is not needed to detect a touch. For example, in some capacitive-type touch sensing systems, fringing electrical fields used to detect touch can extend beyond the surface of the display, and objects approaching near the surface may be detected near the surface without actually touching the surface. However, devices that accept non-mechanical inputs, such as capacitive touch input, often do not provide tactile feedback to a user. Therefore, in addition to touch panels/touch screens, many electronic devices may also have mechanical inputs, such as buttons, switches, and/or knobs. These mechanical inputs can control power (i.e., on/off) and volume for the electronic devices, among other functions.

The examples described herein refer to detection of an object (e.g., a finger of a user) touching a mechanical input (e.g., a crown) of a device (e.g., a wearable device such as a watch) having a touch screen. In some examples, the detection of an object touching (but not pressing or rotating) the crown can be useful to alert the device that the user is interacting (or is about to interact) with the crown or display. In some configurations, the crown can be touch-sensitive, for example, using capacitive touch technologies that can detect contact with the crown. In some cases, devices in these configurations can only detect objects that can modulate capacitance. It can be beneficial to detect the presence (and in some cases, characteristics of) objects touching the crown on a device.

SUMMARY OF THE DISCLOSURE

In addition to touch panels/touch screens, many electronic devices may also have mechanical inputs, such as buttons, switches, and/or knobs. These mechanical inputs can control power (i.e., on/off) and volume for the electronic devices, among other functions. The examples described herein refer to detection of an object (e.g., a finger of a user) touching a mechanical input (e.g., a crown) of a device (e.g., a wearable device such as a watch) having a touch screen. In some examples, the detection of an object touching (but not pressing or rotating) the crown can be useful to alert the device that the user is interacting (or is about to interact) with the crown or display. In some configurations, the crown can be touch-sensitive, for example, using capacitive touch technologies that can detect contact with the crown. However, in some cases, devices in these configurations can only detect objects that can modulate capacitance. Therefore, it can be beneficial to detect the presence (and in some cases, characteristics) of objects touching the crown on a device.

In some examples, a device can use acoustic touch sensors to determine the presence (and in some examples, characteristics of) objects touching the crown on a device. In some configurations, an acoustic touch sensor can use one or more acoustic waves emitted from an emitter (e.g., a transducer) into the crown or crown shaft. In these examples, the emitted acoustic wave can travel from an acoustic emitter at the near end of a crown shaft (i.e., the end distal to the crown), through the crown shaft, reflect off the far end (i.e., the end proximate to the crown) and return back to the near end, where it is received by an acoustic receiver. The received wave's strength and characteristics will depend on the material properties of the material (e.g., air, skin, fabric) at the crown. Thus, the received wave can be analyzed in order to determine the presence and, in some cases, the characteristics of any objects in contact with the crown. In addition, in some examples, the acoustic waves can be channeled through one or more acoustic channels in the crown shaft and/or crown. In some examples, the crown itself can be divided into acoustically isolated segments, each forming a portion of a touch sensor. Acoustic waves can be sent on each segment and analyzed to determine the presence and/or characteristics of an object touching a respective segment. In some examples, an acoustic touch sensor can use acoustic resonance to determine the presence and/or characteristics of an object touching the crown. In these configurations, a resonator can be operatively coupled to the crown or crown shaft, and the resonator can be configured to vibrate the crown or crown shaft. A sensor can detect the parameters of the vibration and detect the presence and/or characteristics of an object based on the parameters of the vibration (e.g., based on the amount of damping caused by the touching object.) In some configurations, the sensor can be coupled to the crown shaft or crown (e.g., when an accelerometer operates as a sensor) or not coupled to the crown shaft or crown (e.g., when a proximity sensor operates as a sensor). The acoustic touch sensors described herein can be useful to alert the device that the user is interacting (or is about to interact) with the crown or display, and in some cases, can cause the device to exit a rest state.

In some cases, the proximity sensor can be mounted such that the cover substrate (e.g., glass) refracts a field of view of the proximity detector. As a result, the proximity detector can detect the presence of an object to the side of the wearable device (i.e., adjacent to the device in a direction parallel to the plane of the display), even if the proximity sensor is not mounted normal to the side of the wearable device. For example, the proximity sensor can be mounted to an inner surface of the cover substrate, normal to a first angle with respect to the plane of the display. The field of view can refract through the cover substrate such that the field of view extending beyond the cover substrate is centered about a second angle, different than the first, with respect to the plane of the display. Consequently, the field of view of proximity sensor can include areas adjacent to the wearable device in a direction parallel to the plane of the display. This can be beneficial, for example, in detecting the presence of an object near a crown of the wearable device. In some examples, methods for detecting the presence of an object are described, including examples where the proximity sensor in the wearable device utilizes one or more light-pulsing schemes, including schemes where the light-pulse frequency can change during the operation of the proximity sensor. In some examples, the wearable device can perform one or more operations if the wearable device detects the presence of an object. In some examples, the wearable device can distinguish between the presence of an object which is touching the wearable device (e.g., touching the crown of the wearable device), and the presence of an object that is not touching the wearable device. In some configurations, the wearable device can wake from a power saving mode when a non-touching object is detected, and can perform a touch operation when a touching object is detected.

In some examples discussed herein, a proximity sensor can use an array of light detectors to detect the presence of objects. In some examples, the proximity sensor can determine the location of a centroid of light detected by the array of light detectors. Due to parallax in the imaging path of the array of light detectors, the position of the centroid detected by the array of light detectors can change as a function of the distance of the object to the proximity sensor. In some examples, the array of light detectors can be one or two-dimensional. In addition, in some examples, the size and/or shape of the light detected by the array of light detectors can be used to determine the distance and/or characteristics of an object. In some examples, the wearable device can perform one or more operations if the wearable device detects the presence of an object.

In some examples discussed herein, a proximity sensor can use multiple channels to detect the presence of objects. In some examples, the proximity sensor can have two or more light emitters located at different distances from a light detector. In this configuration, the proximity sensor can use a ratio of light received from the first emitter to light received from a second emitter to determine whether an object is proximate to the proximity sensor. In other examples, a proximity sensor can have two or more light detectors located at different distances from a light emitter. In these configurations, the proximity sensor can use a ratio of light detected by the first detector and light detected by the second detector to determine whether an object is proximate to the proximity sensor. In some examples, the wearable device can perform one or more operations if the wearable device detects the presence of an object.

A device can inject electromagnetic energy into the crown to detect objects touching or proximate to the crown of a device. In some examples, a touch and/or proximity sensor can include a transmit circuit operatively coupled to a rotational input element (e.g., crown) and configured to inject electromagnetic energy via inductive coupling into the rotational input element, and a monitoring circuit operatively coupled to the rotational input element and configured to measure one or more parameters (e.g., resonant frequency). The one or more parameters can be indicative of an object touching or in proximity to the rotational input element. One or more touch or hover events can be detected based on the one or more parameters measured by the monitoring circuit. In some examples, the proximity sensor can include a transmit circuit and a receive circuit. The transmit circuit can include a first inductive element and one or more first capacitive elements and can oscillate at a first resonant frequency. The receive circuit can be operatively coupled to or formed as part of the rotational input element. The receive circuit can include a second inductive element and one or more second capacitive elements, and can oscillate at a second resonant frequency. The inductive elements of the transmit circuit and the receive circuit can be coupled transmit energy therebetween. In some examples, the resonant frequencies of the transmit circuit and receive circuit can be designed or turned to be the same frequency. In some examples, the touch and/or proximity sensor can measure changes in resonant frequency of the transmit circuit to detect touch and/or hover events. n some examples, a touch and/or proximity sensor can include a transmit circuit operatively coupled to a rotational input element (e.g., crown) and configured to inject electromagnetic energy into the rotational input element, and a monitoring circuit operatively coupled to the rotational input element and configured to measure one or more parameters (e.g., resonant frequency). The one or more parameters can be indicative of an object touching or in proximity to the rotational input element. One or more touch or hover events can be detected based on the one or more parameters measured by the monitoring circuit. In some examples, the touch and/or proximity sensor can measure changes in resonant frequency of an oscillating circuit (e.g., an LC tank circuit). In some examples, the touch and/or proximity sensor can measure detuning of an antenna (e.g., the crown acting as an antenna).

In some examples, a device can drive the crown with a drive signal to detect objects in contact or in proximity of the crown of the device. In some examples, a contact and/or proximity sensor can include a drive circuit operatively coupled to a rotational input element (e.g., crown) and configured to drive the drive signal onto the rotational input element, and a sense circuit for sensing capacitive coupling to an object (e.g., a finger) based on capacitive coupling between the finger and the contact and/or proximity sensor. The capacitive coupling can be indicative of an object contacting or in proximity to the rotational input element. One or more touch or hover events can be detected based on the signals measured by the sense circuit. In some examples, the contact and/or proximity sensor can detect an object by performing a self-capacitance measurement. In some examples, the contact and/or proximity sensor can detect an object by performing a mutual capacitance measurement. In some examples, the contact and/or proximity sensor can switch between performing self-capacitance measurements and performing mutual capacitance measurements. In some examples, to assist in the detection of objects in contact or in proximity of the crown of the device, one or more gasket sensor electrodes can be added proximate to the crown. In some examples, the gasket sensor electrodes can form a mutual capacitance with the rotational input element for performing a mutual capacitance measurement. In some examples, the gasket sensor electrode can be used for performing a self-capacitance measurement. Due to the proximity of the gasket sensor electrode to the crown, measurements indicative of contact or proximity of the object and the gasket sensor electrode can also indicate that the object is in contact or proximity of the crown. The additional touch detection capabilities provided by the driven crown and/or gasket sensor electrodes of the disclosure can be used to provide new interactions with user interface elements displayed on the electronic device.

BRIEF DESCRIPTION OF THE DRAWINGS

FIGS. 10A-10B illustrate an example configuration in which crown shaft and crown can include an acoustic channel according to examples of the disclosure.

FIGS. 11A-11B illustrate an example configuration in which the crown includes two or more touch sensors according to examples of the disclosure.

FIGS. 12A-12B illustrate another example configuration in which the crown includes two or more touch sensors according to examples of the disclosure.

FIG. 13 illustrates a magnified cross-sectional view of an exemplary acoustic touch detector which uses acoustic resonance according to examples of the disclosure.

FIGS. 27A-27H illustrate an example operation of a parallax-based proximity sensor including an array of light detectors according to examples of this disclosure.

FIGS. 39A-39B illustrate an example configuration of a multiple-channel proximity sensor including multiple light detectors according to examples of this disclosure.

DETAILED DESCRIPTION

In the following description of the disclosure and examples, reference is made to the accompanying drawings in which it is shown by way of illustration specific examples that can be practiced. It is to be understood that other examples can be practiced and structural changes can be made without departing from the scope of the disclosure.

Figure 1:
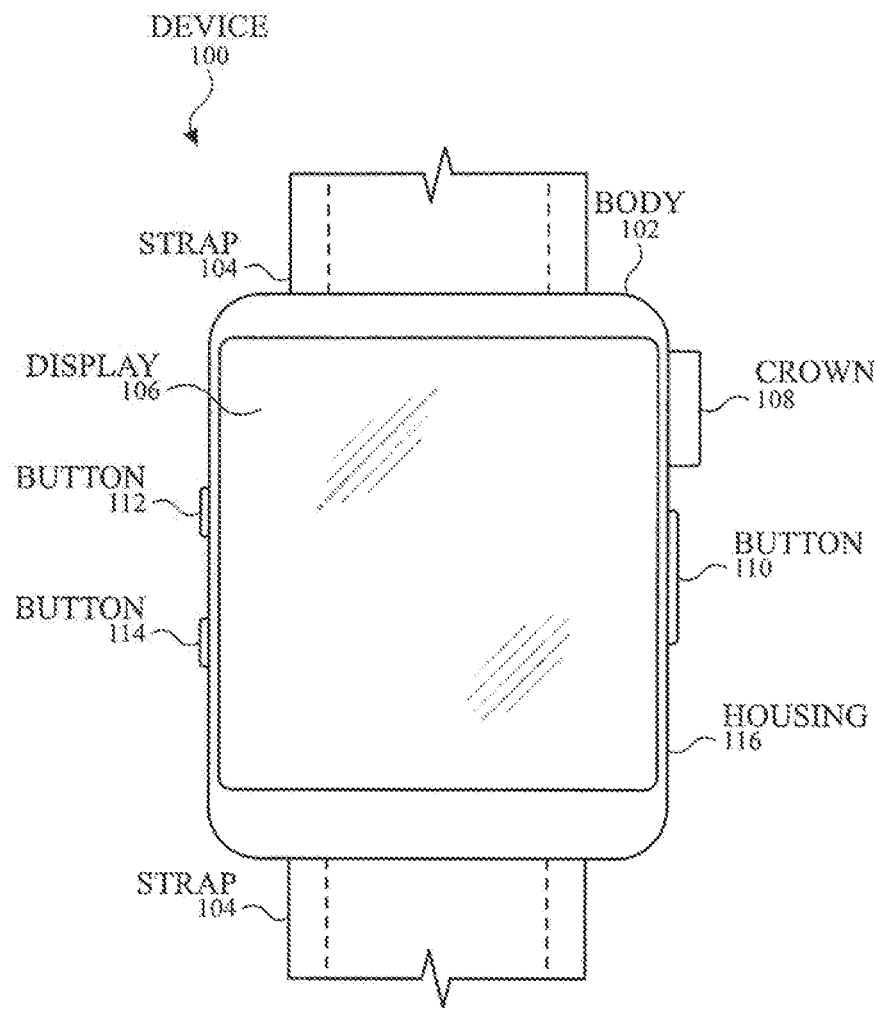
FIG. 1 illustrates an exemplary personal electronic device including a crown according to examples of the disclosure.

FIG. 1 illustrates exemplary personal electronic device 100 including a crown according to examples of the disclosure. In the illustrated example, device 100 is a watch that generally includes housing 102 and strap 104 for affixing device 100 to the housing of a user. That is, device 100 is a wearable device. Housing 102 can be designed to couple to straps 104. Device 100 can have touch-sensitive display screen 106 (hereafter display) and crown 108. Device 100 can also have buttons 112 and 114. Though device 100 is illustrated as a watch, it is understood that the examples of the disclosure can be implemented in devices other than watches, such as tablet computers, mobile phones, or any other wearable or non-wearable electronic device that can include a rotary input such as a crown.

Conventionally, the term 'crown,' in the context of a watch, can refer to the cap atop a stem or shaft for winding the watch. In the context of a personal electronic device 100, the crown can be a physical component of the electronic device, rather than a virtual crown on a touch-sensitive display. Crown 108 can be mechanical, meaning that it can be connected to a sensor for converting physical movement of the crown into electrical signals. Crown 108 can rotate in two directions of rotation (e.g., forward and backward, or clockwise and counter-clockwise). Crown 108 can also be pushed in towards the housing 102 of device 100 (i.e., like a button) and/or be pulled away from the device. Inputs that require physical movement of crown 108 (e.g., crown rotation or crown press) can be referred to as "mechanical inputs," and the events associated with these inputs can be referred to as "mechanical events." Crown 108 can be touch-sensitive, for example, using capacitive touch technologies (e.g., self-capacitance, mutual capacitance) or other suitable technologies as described herein that can detect whether a user is touching the crown. In some examples, crown 108 can also be used as part of a sensor to detect touch and/or proximity of an object (e.g., a finger) to the crown. Crown 108 can further be configured, in some examples, to tilt in one or more directions or slide along a track at least partially around a perimeter of housing 102. In some examples, more than one crown 108 can be included in device 100. The visual appearance of crown 108 can, but need not, resemble crowns of conventional watches. Buttons 112 and 114, if included, can each be a physical or a touch-sensitive button. The buttons may be, for example, physical buttons actuated by physical movement or capacitive buttons actuated by sensing a change in capacitance due to an object (e.g., a finger) touching a touch-sensitive surface corresponding to the capacitive buttons. Further, housing 102, which can include a bezel, may have predetermined regions on the bezel that can act as buttons.

Display 106 can include a display device, such as a liquid crystal display (LCD), light-emitting diode (LED) display, organic light-emitting diode (OLED) display, or the like, positioned partially or fully behind or in front of a touch sensor panel implemented using any desired touch sensing technology, such as mutual-capacitance touch sensing, self-capacitance touch sensing, resistive touch sensing, projection scan touch sensing, or the like. Display 106 can allow a user to perform various functions by touching or hovering near the touch sensor panel using one or more fingers or other objects. The electrodes can be coupled to conductive traces, where one set of conductive traces can form drive lines to drive the electrodes with drive signals from drive circuitry and another set of conductive traces can form sense lines to transmit touch or sense signals, indicative of a touch proximate to the display 106, from the electrodes to sense circuitry. In some examples, additional electrodes can be added near an edge of housing 116 proximate to crown 108, and can be used to indicate the touch or proximity of an object at the edge of the housing. One type of touch panel for display 106 can have a row-column electrode pattern. Another type of touch panel for display 106 can have a pixelated electrode pattern. Display 106 can allow a user to perform various functions by touching or hovering near the touch sensor panel using one or more fingers or other objects.

In some examples, device 100 can further include one or more force or pressure sensors (not shown) for detecting an amount of force or pressure applied to the display 106. The amount of force or pressure applied to display 106 can be used as an input to device 100 to perform any desired operation, such as making a selection, entering or exiting a menu, causing the display of additional options/actions, or the like. In some examples, different operations can be performed based on the amount of force or pressure being applied to display 106. The one or more pressure sensors can further be used to determine a position of the force that is being applied to display 106.

The examples described herein refer to detection of an object (e.g., a finger) proximate to or touching crown 108. In some examples, the detection of an object proximate to crown 108 or touching crown 108 can alert device 100 that a user is about to interact with crown 108 or display 106 (e.g., wake the device from a power-saving mode). In some examples, crown 108 can be touch-sensitive, for example, using capacitive touch technologies that can detect contact with the crown.

Although examples described herein primarily involve touch sensors used to detect objects touching or near the crown of a watch, it should be understood that the touch sensors described herein can be implemented for any rotary input or button input for wearable devices and portable or non-portable electronic devices.

In addition to touch panels/touch screens, many electronic devices may also have mechanical inputs, such as buttons, switches, and/or knobs. These mechanical inputs can control power (i.e., on/off) and volume for the electronic devices, among other functions. The examples described herein refer to detection of an object (e.g., a finger of a user) touching a mechanical input (e.g., a crown) of a device (e.g., a wearable device such as a watch) having a touch screen. In some examples, the detection of an object touching (but not pressing or rotating) the crown can be useful to alert the device that the user is interacting (or is about to interact) with the crown or display. In some configurations, the crown can be touch-sensitive, for example, using capacitive touch technologies that can detect contact with the crown. However, in some cases, devices in these configurations can only detect objects that can modulate capacitance. Therefore, it can be beneficial to detect the presence (and in some cases, characteristics of) objects touching the crown on a device.

In some examples, a device can use acoustic touch sensors to determine the presence (and in some examples, characteristics of) objects touching the crown on a device. In some configurations, an acoustic touch sensor can use one or more acoustic waves emitted from an emitter (e.g., a transducer) into the crown or crown shaft. In these examples, the emitted acoustic wave can travel from an acoustic emitter at the near end of a crown shaft (i.e., the end distal to the crown), through the crown shaft, reflect off the far end (i.e., the end proximate to the crown) and return back to the near end, where it is received by an acoustic receiver. The received wave's strength and characteristics will depend on the material properties of the material (e.g., air, skin, fabric) at the crown. Thus, the received wave can be analyzed in order to determine the presence and, in some cases, the characteristics of any objects in contact with the crown. In addition, in some examples, the acoustic waves can be channeled through one or more acoustic channels in the crown shaft and/or crown. In some examples, the crown itself can be divided into acoustically isolated segments, each forming a portion of a touch sensor. Acoustic waves can be sent on each segment and analyzed to determine the presence and/or characteristics of an object touching a respective segment. In some examples, an acoustic touch sensor can use acoustic resonance to determine the presence and/or characteristics of an object touching the crown. In these configurations, a resonator can be operatively coupled to the crown or crown shaft, and the resonator can be configured to vibrate the crown or crown shaft. A sensor can detect the parameters of the vibration and detect the presence and/or characteristics of an object based on the parameters of the vibration (e.g., based on the amount of damping caused by the touching object.) In some configurations, the sensor can be coupled to the crown shaft or crown (e.g., when an accelerometer operates as a sensor) or not coupled to the crown shaft or crown (e.g., when a proximity sensor operates as a sensor). The acoustic touch sensors described herein can be useful to alert the device that the user is interacting (or is about to interact) with the crown or display, and in some cases, can cause the device to exit a rest state.

In some cases, the proximity sensor can be mounted such that the cover substrate (e.g., glass) refracts a field of view of the proximity detector. As a result, the proximity detector can detect the presence of an object to the side of the wearable device (i.e., adjacent to the device in a direction parallel to the plane of the display), even if the proximity sensor is not mounted normal to the side of the wearable device. For example, the proximity sensor can be mounted to an inner surface of the cover substrate, normal to a first angle with respect to the plane of the display. The field of view can refract through the cover substrate such that the field of view extending beyond the cover substrate is centered about a second angle, different than the first, with respect to the plane of the display. Consequently, the field of view of proximity sensor can include areas adjacent to the wearable device in a direction parallel to the plane of the display. This can be beneficial, for example, in detecting the presence of an object near a crown of the wearable device. In some examples, methods for detecting the presence of an object are described, including examples where the proximity sensor in the wearable device utilizes one or more light-pulsing schemes, including schemes where the light-pulse frequency can change during the operation of the proximity sensor. In some examples, the wearable device can perform one or more operations if the wearable device detects the presence of an object. In some examples, the wearable device can distinguish between the presence of an object which is touching the wearable device (e.g., touching the crown of the wearable device), and the presence of an object that is not touching the wearable device. In some configurations, the wearable device can wake from a power saving mode when a non-touching object is detected, and can perform a touch operation when a touching object is detected.

In some examples discussed herein, a proximity sensor can use an array of light detectors to detect the presence of objects. In some examples, the proximity sensor can determine the location of a centroid of light detected by the array of light detectors. Due to parallax in the imaging path of the array of light detectors, the position of the centroid detected by the array of light detectors can change as a function of the distance of the object to the proximity sensor. In some examples, the array of light detectors can be one or two-dimensional. In addition, in some examples, the size and/or shape of the light detected by the array of light detectors can be used to determine the distance and/or characteristics of an object. In some examples, the wearable device can perform one or more operations if the wearable device detects the presence of an object.

In some examples discussed herein, a proximity sensor can use multiple channels to detect the presence of objects. In some examples, the proximity sensor can have two or more light emitters located at different distances from a light detector. In this configuration, the proximity sensor can use a ratio of light received from the first emitter to light received from a second emitter to determine whether an object is proximate to the proximity sensor. In other examples, a proximity sensor can have two or more light detectors located at different distances from a light emitter. In these configurations, the proximity sensor can use a ratio of light detected by the first detector and light detected by the second detector to determine whether an object is proximate to the proximity sensor. In some examples, the wearable device can perform one or more operations if the wearable device detects the presence of an object.

A device can inject electromagnetic energy into the crown to detect objects touching or proximate to the crown of a device. In some examples, a touch and/or proximity sensor can include a transmit circuit operatively coupled to a rotational input element (e.g., crown) and configured to inject electromagnetic energy via inductive coupling into the rotational input element, and a monitoring circuit operatively coupled to the rotational input element and configured to measure one or more parameters (e.g., resonant frequency). The one or more parameters can be indicative of an object touching or in proximity to the rotational input element. One or more touch or hover events can be detected based on the one or more parameters measured by the monitoring circuit. In some examples, the proximity sensor can include a transmit circuit and a receive circuit. The transmit circuit can include a first inductive element and one or more first capacitive elements and can oscillate at a first resonant frequency. The receive circuit can be operatively coupled to or formed as part of the rotational input element. The receive circuit can include a second inductive element and one or more second capacitive elements, and can oscillate at a second resonant frequency. The inductive elements of the transmit circuit and the receive circuit can be coupled transmit energy therebetween. In some examples, the resonant frequencies of the transmit circuit and receive circuit can be designed or turned to be the same frequency. In some examples, the touch and/or proximity sensor can measure changes in resonant frequency of the transmit circuit to detect touch and/or hover events. n some examples, a touch and/or proximity sensor can include a transmit circuit operatively coupled to a rotational input element (e.g., crown) and configured to inject electromagnetic energy into the rotational input element, and a monitoring circuit operatively coupled to the rotational input element and configured to measure one or more parameters (e.g., resonant frequency). The one or more parameters can be indicative of an object touching or in proximity to the rotational input element. One or more touch or hover events can be detected based on the one or more parameters measured by the monitoring circuit. In some examples, the touch and/or proximity sensor can measure changes in resonant frequency of an oscillating circuit (e.g., an LC tank circuit). In some examples, the touch and/or proximity sensor can measure detuning of an antenna (e.g., the crown acting as an antenna).

In some examples, a device can drive the crown with a drive signal to detect objects in contact or in proximity of the crown of the device. In some examples, a contact and/or proximity sensor can include a drive circuit operatively coupled to a rotational input element (e.g., crown) and configured to drive the drive signal onto the rotational input element, and a sense circuit for sensing capacitive coupling to an object (e.g., a finger) based on capacitive coupling between the finger and the contact and/or proximity sensor. The capacitive coupling can be indicative of an object contacting or in proximity to the rotational input element. One or more touch or hover events can be detected based on the signals measured by the sense circuit. In some examples, the contact and/or proximity sensor can detect an object by performing a self-capacitance measurement. In some examples, the contact and/or proximity sensor can detect an object by performing a mutual capacitance measurement. In some examples, the contact and/or proximity sensor can switch between performing self-capacitance measurements and performing mutual capacitance measurements. In some examples, to assist in the detection of objects in contact or in proximity of the crown of the device, one or more gasket sensor electrodes can be added proximate to the crown. In some examples, the gasket sensor electrodes can form a mutual capacitance with the rotational input element for performing a mutual capacitance measurement. In some examples, the gasket sensor electrode can be used for performing a self-capacitance measurement. Due to the proximity of the gasket sensor electrode to the crown, measurements indicative of contact or proximity of the object and the gasket sensor electrode can also indicate that the object is in contact or proximity of the crown. The additional touch detection capabilities provided by the driven crown and/or gasket sensor electrodes of the disclosure can be used to provide new interactions with user interface elements displayed on the electronic device.

Figure 2:
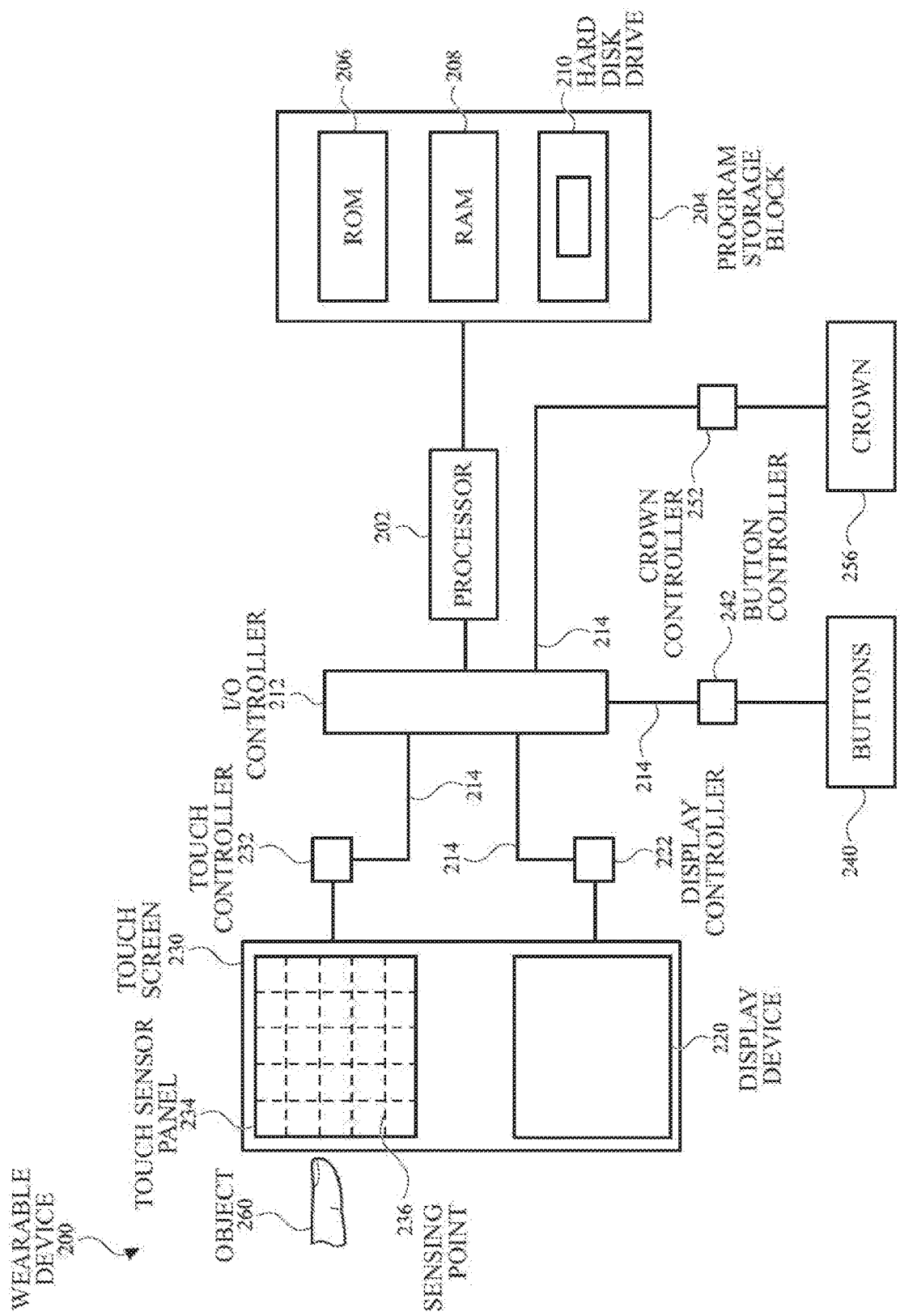
FIG. 2 illustrates an exemplary block diagram of components within an exemplary device according to examples of the disclosure.

FIG. 2 illustrates an exemplary block diagram of components within an exemplary device (e.g., wearable device 200) according to examples of the disclosure. As illustrated, the wearable device 200 can include a processor 202 configured to execute instructions and to carry out operations associated with the wearable device 200. For example, using instructions retrieved from, for example, memory, the processor 202 may control the reception and manipulation of input and output data between components of the wearable device 200. The processor 202 can be a single-chip processor or can be implemented with multiple components.

In some examples, the processor 202 together with an operating system can operate to execute computer code and produce and use data. The computer code and data may reside within a program storage block 204 that can be operatively coupled to the processor 202. Program storage block 204 can generally provide a place to store data used by the wearable device 200. By way of example, the program storage block may include Read-Only Memory (ROM) 206, Random-Access Memory (RAM) 208, hard disk drive 210 and/or the like. The computer code and data can also reside on a removable storage medium that can be loaded or installed onto the computer system when needed. Removable storage mediums can include, for example, CD-ROM, PC-CARD, floppy disk, magnetic tape, a network component, and the like.

The wearable device 200 can also include an input/output (I/O) controller 212 that can be operatively coupled to the processor 202. The I/O controller 212 may be integrated with the processor 202 or it may be one or more separate components. The I/O controller 212 can be configured to control interactions with one or more I/O devices. The I/O controller 212 can operate by exchanging data between the processor 202 and the I/O devices that desire to communicate with the processor. The I/O devices and the I/O controller can communicate through one or more data links 214. The one or more data links 214 may include data links that have a one way link or two way (bidirectional) link. In some examples, the I/O devices may be coupled to I/O controller 212 through wired connections. In other examples, the I/O devices may be wirelessly coupled to I/O controller 212. By way of example, the one or more data links 214 can correspond to one or more of PS/2, USB, Firewire, IR, RF, BLUETOOTH™ or the like.

Wearable device 200 can also include a display device 220 that can be operatively coupled to the processor 202. For example, as illustrated in FIG. 2, display device 220 can be coupled to a display controller 222, and display controller 222 can be coupled to I/O controller 212. In other examples, the functionality of display controller 222 can be implemented in I/O controller 212 or processor 202, and display device 220 can be coupled to I/O controller 212 or directly to processor 202. Display device 220 can be a separate component (peripheral device) or it can be integrated with the processor and/or program storage in a single device. Display device 220 can be configured to display a graphical user interface (GUI) including, for example, a pointer or cursor or other information to the user.

Wearable device 200 can also include a touch screen 230 that can be operatively coupled to processor 202. Touch screen 230 can include a transparent or semi-transparent touch sensor panel 234 that can be positioned, for example, in front of the display device 220. Touch sensor panel 234 may be integrated with the display device 220 (e.g., touch sensing circuit elements of the touch sensing system can be integrated into the display pixel stack-ups of the display) or it may be a separate component. Touch screen 230/touch sensor panel 234 can be configured to receive input from an object 260 (e.g., a finger) touching or proximate to touch screen 230/touch sensor panel 234 and to send this information (e.g., presence of touch and/or magnitude of touch signals) to processor 202. Touch screen 230 can report the touch information to processor 202, and processor 202 can process the touch information in accordance with its programming. For example, processor 202 may initiate a task in accordance with a particular touch event.

In some examples, touch screen 230 can track one or more objects (e.g., object 260), which hover over, rest on, tap on, or move across the touch-sensitive surface of touch screen 230. The objects can be conductive objects including, but not limited to, fingers, palms, and styli. Touch screen 230 can include a sensing device, such as touch sensor panel 234, configured to detect an object touching or in close proximity thereto and/or the force or pressure exerted thereon.

Touch sensor panel 234 can be based on a wide variety of technologies including self-capacitance, mutual capacitance, resistive and/or other touch sensing technologies. In some examples, touch sensor panel 234 can include a matrix of small plates of conductive material (e.g., ITO) that can be referred to as sensing points, nodes or regions 236. For example, a touch sensor panel 234 can include a plurality of individual sensing nodes, each sensing node identifying or representing a unique location on the touch screen at which touch or proximity (hovering) (i.e., a touch or proximity event) is to be sensed, and each sensing node being electrically isolated from the other sensing nodes in the touch screen/sensor panel. Such a touch sensor panel/screen can be referred to as a pixelated touch sensor panel/screen. During self-capacitance operation of the pixelated touch screen, for example, a sensing node can be stimulated with an AC waveform, and the self-capacitance of the sensing node can be measured. As an object approaches the sensing node, the self-capacitance to ground of the sensing node can change. This change in the self-capacitance of the touch node can be detected and measured by the touch sensing system to determine the positions of one or more objects when they touch, or come in proximity to, the pixelated touch screen.

The number and configuration of the sensing points 236 may be widely varied. The number of sensing points 236 can, for example, be a tradeoff between the desired sensitivity (resolution) and the desired transparency of the touch screen. More nodes or sensing points can generally increase sensitivity, but can also, in some examples, reduce transparency (and vice versa). With regards to the configuration, the sensing points 236 can map the touch screen plane into a coordinate system such as a Cartesian coordinate system, a Polar coordinate system, or some other coordinate system. When a Cartesian coordinate system is used (as shown), the sensing points 236 can correspond to x and y coordinates. When a Polar coordinate system is used, the sensing points 236 can correspond to radial (r) and angular coordinates (φ).

Although touch sensor panel 234 is illustrated and described with reference to FIG. 2 as a pixelated touch sensor panel, in other examples, the touch sensor panel can be formed from rows and columns of conductive material (row-column touch sensor panel), and changes in the self-capacitance to ground of the rows and columns can be detected. Additionally or alternatively, in some examples, the pixelated touch sensor panel or row-column touch sensor panel can be configured to sense changes in mutual capacitance at sensing nodes measuring capacitive coupling between two electrodes (e.g., at the intersection of a drive and a sense electrode). In some examples, a touch screen can be multi-touch, single touch, projection scan, full-imaging multi-touch, capacitive touch, etc.

Touch screen 230 can include and/or be operatively coupled to a touch controller 232 that can perform touch sensing scans and acquire the touch data from touch sensor panel 234 and that can supply the acquired data to processor 202. For example, as illustrated in FIG. 2, touch screen 230 can be coupled to touch controller 232, and touch controller 232 can be coupled to I/O controller 212. In other examples, the functionality of touch controller 232 can be implemented in I/O controller 212 or processor 202, and touch screen 230 can be coupled to I/O controller 212 or directly to processor 202. The touch screen 230 can be a separate component (peripheral device) or it can be integrated with the processor and/or program storage in a single device.

In some examples, touch controller 232 can be configured to send raw touch data to processor 202, and processor 202 can process the raw touch data. For example, processor 202 can receive data representative at touch measured at sensing points 234, process the data to identify touch events, and then take actions based on the identified touch events. The touch data may include the coordinates of each sensing point 234 and/or the force measured at each sensing point 234. In some examples, touch controller 232 can be configured to process the raw data and then transmit identified touch events and location information to processor 202. Touch controller 232 can include a plurality of sense channels, logic and/or other processing circuitry (not shown) that may perform optimization and/or touch detection operations. Optimization operations can be implemented to reduce a busy data stream and reduce the load on processor 202. In some examples, processor 202 can perform at least some of the optimization operations. The touch detection operations can include, acquiring raw data (e.g., scanning the touch sensor panel), adjust the raw data (e.g., compensating the touch image), performing centroid calculations, identifying touch events, etc. before sending or reporting information to processor 202.

Touch screen 230 and touch controller 232 can be referred to as the touch sensing system. Touch controller 232 can include or be coupled to one or more touch processors (not shown) to perform some of the processing functions described herein. Touch controller 232 can include circuitry and/or logic configured to sense touch inputs on touch screen 230 as described herein. In some examples, touch controller 232 and the one or more touch processors can be integrated into a single application specific integrated circuit (ASIC).

The wearable device 200 can also include one or more buttons 240 (e.g., corresponding to buttons 110, 112 and 114) that can be operatively coupled to processor 202. For example, as illustrated in FIG. 2, buttons 240 can be coupled to a button controller 242, and button controller 242 can be coupled to I/O controller 212. In other examples, the functionality of button controller 242 can be implemented in I/O controller 212 or processor 202, and buttons 240 can be coupled to I/O controller 212 or directly to processor 202.

The wearable device 200 can also include crown 250 (e.g., corresponding to crown 108) or other rotary input that can be operatively coupled to processor 202. For example, as illustrated in FIG. 2, crown 250 can be coupled to a crown controller 252, and crown controller 252 can be coupled to I/O controller 212. In other examples, the functionality of crown controller 252 can be implemented in I/O controller 212 or processor 202, and crown 250 can be coupled to I/O controller 212 or directly to processor 202.

Crown controller 252 can include an encoder (not shown), which can be configured to monitor a physical state or change of physical state of crown 250 (e.g., the position of the crown), convert it to an electrical signal (e.g., convert it to an analog or digital signal representation of the position or change in position of crown 250), and provide the signal to processor 202. In some examples, the encoder can be configured to sense the absolute rotational position (e.g., an angle between 0-360°) of crown 250 and output an analog or digital representation of this position to processor 202. Alternatively, in other examples, the encoder can be configured to sense a change in rotational position (e.g., a change in rotational angle) of crown 250 over some sampling period and to output an analog or digital representation of the sensed change to processor 202. In these examples, the crown position information can further indicate a direction of rotation of the crown (e.g., a positive value can correspond to one direction and a negative value can correspond to the other). In yet other examples, the encoder can be configured to detect a rotation of crown 250 in any desired manner (e.g., velocity, acceleration, or the like) and can provide the crown rotational information to processor 202. The rotational velocity can be expressed in numerous ways. For example, the rotational velocity can be expressed in a direction and a speed of rotation, such as hertz, as rotations per unit of time, as rotations per frame, as revolutions per unit of time, as revolutions per frame, as a change in angle per unit of time, and the like. In some examples, instead of providing information to processor 202, this information can be provided to other components of device. The rotational position of crown 250 can be used, for example, to control scrolling or scaling of a view in the GUI displayed on display device 220, though the rotational input of the crown can be used for other purposes.

Additionally, it should be appreciated that any other physical state of crown 250 can be used as an input (e.g., pressing the crown when the crown includes a button). In some examples, the physical state of the crown 250 can control physical attributes of display device 220. For example, if crown 250 is in a particular position (e.g., rotated forward), display device 220 can have limited z-axis traversal ability. In other words, the physical state of the crown can represent physical modal functionality of display device 220. In some examples, a temporal attribute of the physical state of crown 250 can be used as an input to wearable device 200. For example, a fast change in physical state can be interpreted differently than a slow change in physical state. Additionally or alternatively, crown controller 252 can include circuitry configured to transfer energy to the crown to enable detection of touch events at the surface of the crown and/or proximity events of an object proximate to the crown.

In some examples, processor 202 can be a host processor for receiving outputs from various I/O devices and performing actions based on the outputs. Processor 202 can be connected to program storage block 204. For example, processor 202 can be operably coupled to receive signals from touch sensor panel 234, buttons 240 and crown 250. Processor 202 can be configured to interpret these input signals and output appropriate display signals to cause an image to be produced by touch-sensitive display 220. The inputs, individually or in combination, can also be used to perform other functions for wearable device 200. For example, processor 202 can contribute to generating an image on touch screen 230 (e.g., by controlling a display controller to display an image of a user interface (UI) on the touch screen), and can use touch controller 232 to detect one or more touches on or near touch screen 230. Processor 202 can also contribute to sensing and/or processing mechanical inputs from buttons 240 and crown 250. The inputs from touch screen 230 and/or mechanical inputs can be used by computer programs stored in program storage block 204 to perform actions in response to the touch and/or mechanical inputs. For example, touch inputs can be used by computer programs stored in program storage block 204 to perform actions that can include moving an object such as a cursor or pointer, scrolling or panning, adjusting control settings, opening a file or document, viewing a menu, making a selection, executing instructions, operating a peripheral device connected to the host device, answering a telephone call, placing a telephone call, and other actions that can be performed in response to touch inputs. Mechanical inputs can be used by computer programs stored in program storage block 204 to perform actions that can include changing a volume level, locking the touch screen, turning on the touch screen, taking a picture, and other actions that can be performed in response to mechanical inputs. Processor 202 can also perform additional functions that may not be related to touch and/or mechanical input processing.

Note that one or more of the functions described above can be performed by firmware stored in memory in wearable device 200 and executed by touch processor in touch controller 232, or stored in program storage block 204 and executed by processor 202. The firmware can also be stored and/or transported within any non-transitory computer-readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "non-transitory computer-readable storage medium" can be any medium (excluding signals) that can contain or store the program for use by or in connection with the instruction execution system, apparatus, or device. The computer-readable storage medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport medium can include, but is not limited to, an electronic, magnetic, optical, electromagnetic or infrared wired or wireless propagation medium.

Acoustic Detection Apparatus and Methods

Figure 3A:
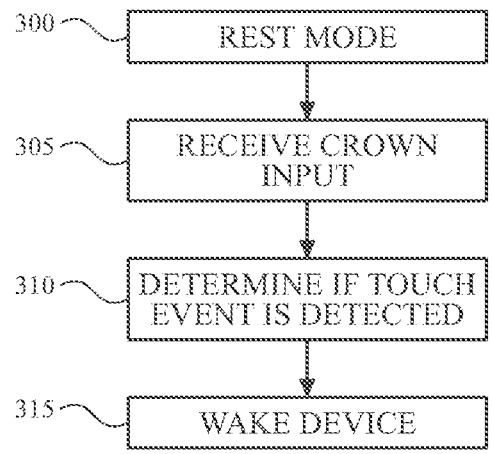
FIGS. 3A-3B illustrate exemplary processes for processing mechanical events and touch events detected at the crown according to examples of the disclosure.
Figure 3B:
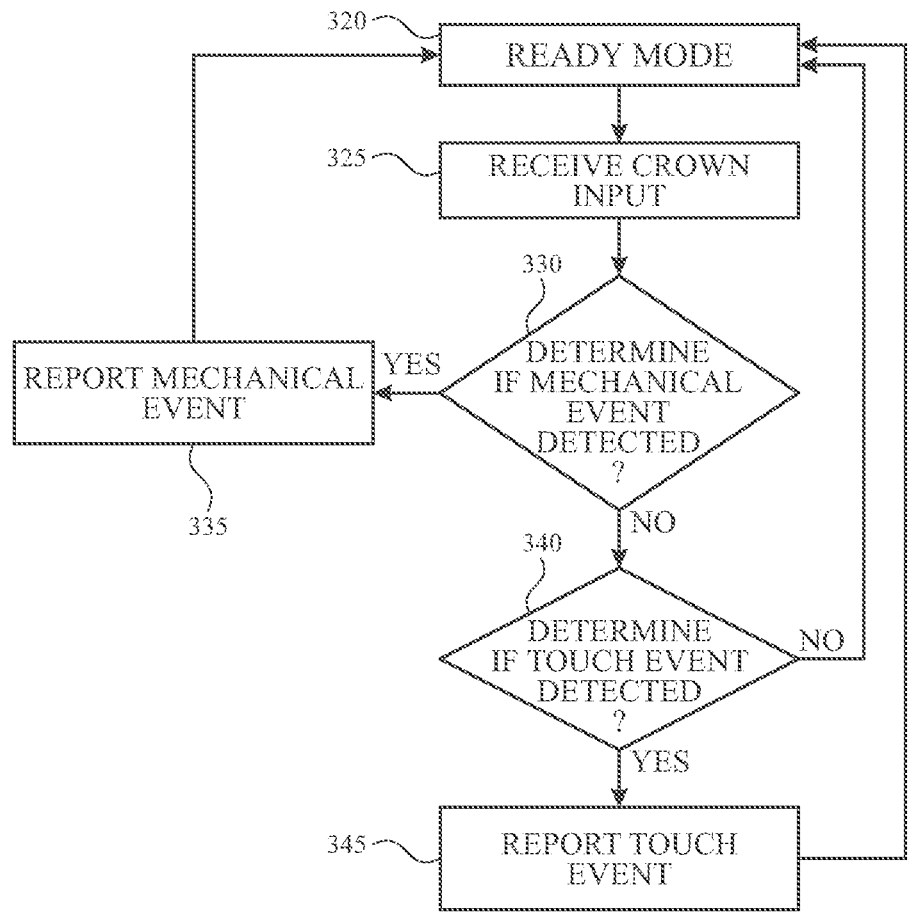

FIGS. 3A and 3B illustrate exemplary processes for processing mechanical and touch inputs detected at the crown according to examples of the disclosure. FIG. 3A illustrates an example process using touch events at the crown to transition between two modes of operation. At block 300, the device can be in a rest mode. The rest mode may correspond, for example, to a low-power mode. In some examples, the display device (e.g., display device 220) can be powered down or enter a low-power state in the rest mode. Additionally or alternatively, in some examples, the touch sensing system (e.g., touch sensor panel 234 and touch controller 232) can be powered down or enter a low-power state in the rest mode. Additionally or alternatively, in some examples, one or more processors, I/O devices and/or other circuitry can be powered down or enter a low-power state in the rest mode.

At block 305, the device (e.g., a processor or state machine) can receive input from a touch sensor of the crown. In some examples, the touch sensor can be implemented using the crown and/or the crown shaft as part of the sensor. At block 310, the device (e.g., the processor or state machine) can determine from the received input whether a touch event is detected. If a touch event is detected, processing can proceed to block 315, where processing can wake up the device, and the device can enter a ready mode. Waking up the device can including powering up one or more processors, I/O devices and/or other circuitry that were powered down or placed in a low-power state during rest mode, resuming touch sensing operations, and/or resuming display operations.

In some examples, the device can exit the rest mode and enter the ready mode in response to detecting a mechanical event (e.g., a rotation or press of the crown), rather than a touch event. In some examples, the device can wake up and enter the ready mode in response to detecting either of a touch or mechanical event.

Although not illustrated, the device can return to the rest mode under various conditions. For example, the device can return to rest mode manually when user input is detected causing the device to enter a rest mode (e.g., covering the touch screen, rotating the touch screen away from the user, or in response to selection of UI element by touch, button, or crown input) or automatically in response to detecting no inputs for a threshold period of time (e.g., no touch, button or crown inputs). In some examples, as long as a touch event is detected at the crown, the device cannot return to the rest mode.

In some examples, mechanical events and/or touch events at the crown can be used as additional inputs to the device. FIG. 3B illustrates an example process using touch (touch) events and/or mechanical events as additional inputs. At block 320, the device can be in a ready mode. At block 325, the device can receive input from a mechanical input and/or touch sensor at the crown. In some examples, the touch sensor can be implemented using the crown and/or the crown shaft as part of the sensor. At block 330, the device (e.g., the processor or state machine) can determine from the received input whether a mechanical event is detected. If a mechanical event is detected, processing can proceed to block 335, where a mechanical event can be reported. The reported mechanical event can be used by the device to perform one or more functions (e.g., changing the UI or selecting a UI element) corresponding to a mechanical event at the crown, and processing can return to block 320 (i.e., the device can remain in ready mode). If no mechanical event is detected at block 330, processing can proceed to block 340, and the device (e.g., the processor or state machine) can determine from the received input whether a touch event is detected. If a touch event is detected, processing can proceed to block 345, where a touch event can be reported. The reported touch event can be used by device to perform one or more functions (e.g., changing the UI or selecting a UI element) corresponding to a touch event at the crown, and processing can return to block 320 (i.e., the device can remain in ready mode). If no touch event is detected at block 340, processing can proceed to block 320 (i.e., the device can remain in ready mode). In some examples, if no mechanical event or touch event is detected, the device can exit ready mode and return to rest mode (e.g., for example if no other inputs are detected in addition to detecting no mechanical event or touch event at the crown).

Although discussed in the context of a crown for a wearable device, the exemplary processes of FIGS. 3A and 3B can be applied to a mechanical event and/or touch sensor implemented to detect mechanical events or touch events for other rotary input devices, button inputs, or other inputs.

Although the touch event is described above as a binary event (i.e., touch event or no touch event), in some examples, different types of touch events can be reported. For example, as will be described in more detail with reference to FIGS. 6A-6F below, in some examples of "acoustic wave touch detection," the touch sensor can estimate characteristics of a touch object based on the loss of amplitude of an acoustic wave as it travels through the crown shaft and crown and reflects off a boundary between the crown and touch object. Thus, in these examples, a touch event threshold may correspond to a difference in amplitude between two or more waveforms. Other acoustic touch sensors may operate using acoustic resonance touch detection, as will be described in more detail with reference to FIGS. 13-14 below. In acoustic resonance touch detection, the touch sensor can estimate characteristics of a touch object based on the amount of damping a touch object applies to the crown shaft and crown when vibrating. Thus, in these examples, a touch event threshold may correspond, for example, to a difference in vibration amplitude when an object is applied to the crown. It should be noted, however, that in both acoustic wave touch detection and acoustic resonance touch detection, other parameters may correspond to touch event thresholds.

As described herein, in some examples, the touch sensor can be implemented using the crown and/or crown shaft as part of the sensor. For example, as will be described in more detail with reference to FIGS. 5-9 below, in some examples, the touch sensor can detect the presence of (and in some cases, estimate characteristics of) a touch object based on the loss of amplitude of an acoustic wave as it travels through the crown shaft and crown and reflects off a boundary between the crown and touch object. In other examples, as will be described in more detail with reference to FIGS. 13-15 below, the touch sensor can detect the presence of (and in some cases, estimate characteristics of) a touch object based on the amount of damping a touch object applies to the crown shaft and crown when vibrating.

Figure 4:
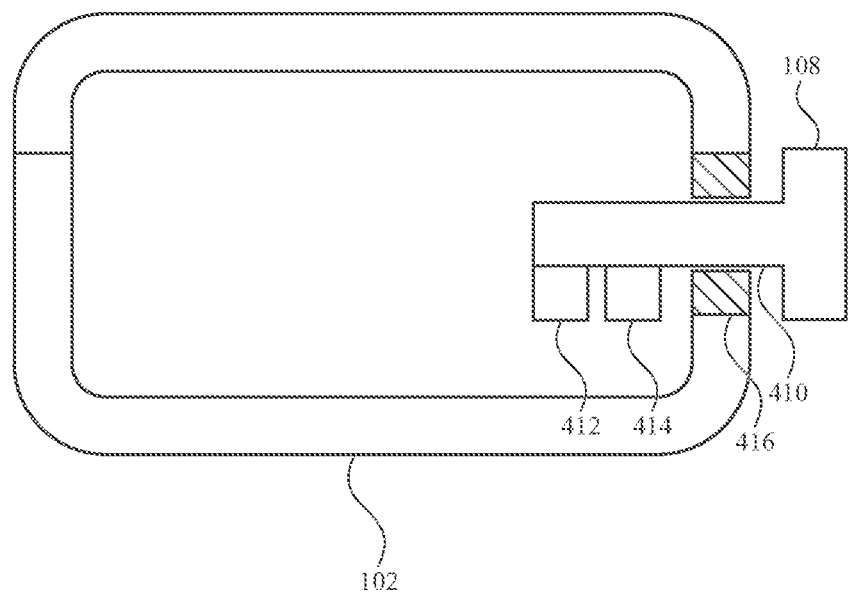
FIG. 4 illustrates a simplified cross-sectional view of wearable device according to examples of the disclosure.

FIG. 4 illustrates a simplified cross-sectional view of wearable device 100 including a housing 102, a crown shaft 410, and a crown 108 mounted on the crown shaft according to examples of the disclosure. In some configurations, wearable device 100 can include at least one acoustic transmitter 412 and at least one acoustic receiver 414, illustrated in FIG. 4 as boxes for simplicity. Also for simplicity, other elements of device 100, including transmitter and receiver circuitry, are omitted. Example configurations of the acoustic transmitter and acoustic receiver will be discussed in more detail with reference to FIGS. 5A-5B below, however, it should be noted here that the configuration of these components can differ from the simplified examples shown in FIG. 4.

Figure 5A:
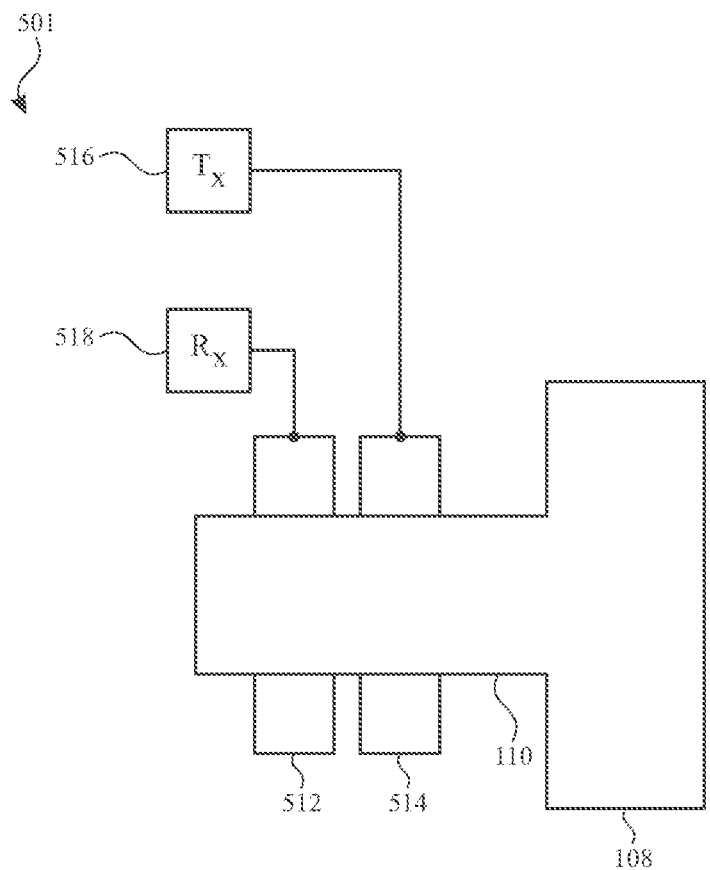
FIG. 5A illustrates a magnified cross-sectional view of an exemplary acoustic touch detector according to examples of the disclosure.

FIG. 5A illustrates a magnified cross-sectional view of an exemplary acoustic touch detector 501 according to examples of the disclosure. Some configurations can include a crown 108, crown shaft 410, an transmit transducer 514 operating as an acoustic emitter, an acoustic transmit circuit 516 coupled to the acoustic emitter, a receiver transducer 512 operating as an acoustic receiver, and an acoustic receiver circuitry 518 coupled to the receiver transducer. Both the transmit transducer 514 and the receiver transducer 512 can encircle crown shaft 410. In some configurations, the emitter or receiver transducer can be contact coupled to crown shaft 410, and can thus emit and receive acoustic signals via contact coupling. For example, in configurations where transducers 512, 514 are contact coupled to crown shaft 410, the emitter or receiver transducer can be a piezoelectric transducer. In other configurations, the emitter transducer can be non-contact coupled to crown shaft 410. In these configurations, acoustic signals can be emitted without physical contact between the transducer and crown shaft, for example, using electromagnetic waves to vibrate the area of crown shaft encircled by transmit transducer 514. The operation of the acoustic touch detector according to some configurations will now be discussed.

Figure 5B:
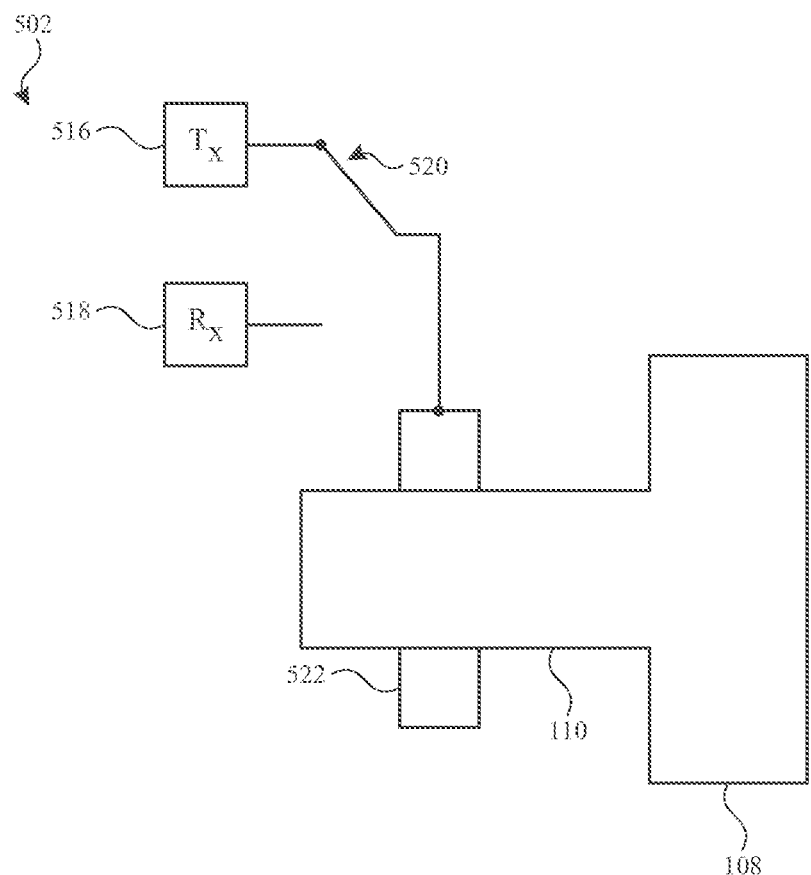
FIG. 5B illustrates a magnified cross-sectional view of another exemplary acoustic touch detector according to examples of the disclosure.

FIG. 5B illustrates a magnified cross-sectional view of another exemplary acoustic touch detector 502 according to examples of the disclosure. In the configuration shown in FIG. 5B, a single transducer 522 can encircle the crown shaft 110. In some configurations, a switching circuitry 520 can be included to selectively couple transducer 516 to transmit circuit 516 and receiver circuit 518. Thus, in some examples, single transducer 522 can operate both as the acoustic emitter and acoustic receiver. The operation of the example configuration shown in FIG. 5B are discussed in more detail below.

In some configurations, an acoustic touch detector can utilize time-domain reflectometry (TDR), specifically acoustic TDR, in order to detect one or more objects (e.g., one or more fingers) touching the crown. In short, an acoustic wave can travel from an acoustic emitter at the near end of a crown shaft (i.e., the end distal to the crown), through the crown shaft, reflect off the far end (i.e., the end proximate to the crown) and return back to the near end, where it is received by an acoustic receiver. The received wave's strength and characteristics will depend on the material properties of the material (e.g., air, skin, fabric) at the crown. Thus, the received wave can be analyzed in order to determine the presence and, in some cases, the characteristics of any objects in contact with the crown. In some examples, acoustic wave is an ultrasonic pulse.

FIGS. 6A-6F illustrate a simplified example of an acoustic wave touch detection process according to examples of the disclosure. For simplicity, other elements, including wiring and mounting elements are omitted. A transmitter 633 (shown as box "TX") can represent, for example, a transmit transducer and transmit circuit. A receiver 631 (shown as box "RX") can represent, for example, a receiver transducer and receiver circuit. An acoustic wave is shown in FIGS. 6A-6F symbolically (641, 643, 645, 647, 649), though it should be understood that the waveforms are merely an example provided for ease of explanation, and may not represent the actual waveform of an acoustic wave.

Figure 6A:
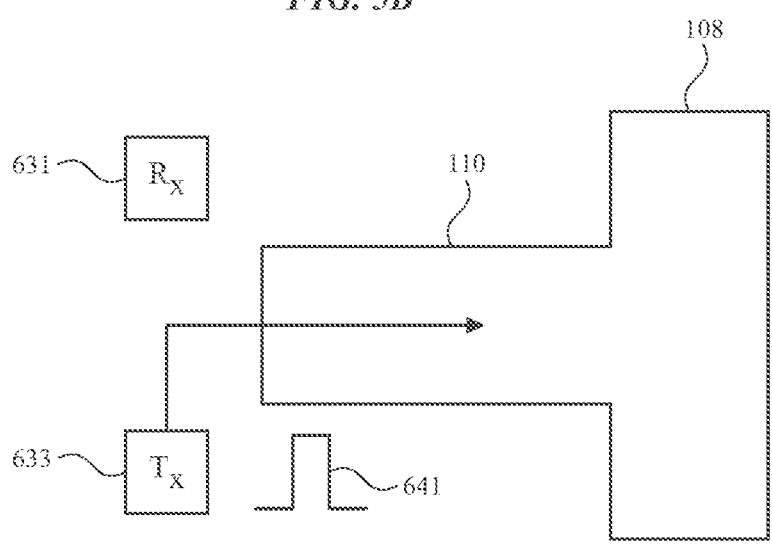
FIGS. 6A-6F illustrate a simplified example of an acoustic wave touch detection process according to examples of the disclosure.
Figure 6B:
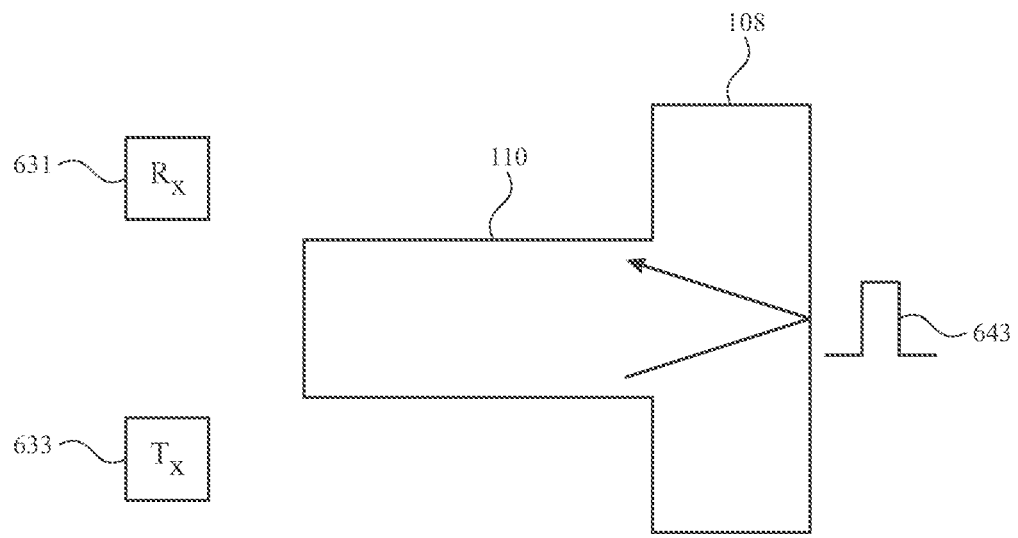
Figure 6C:
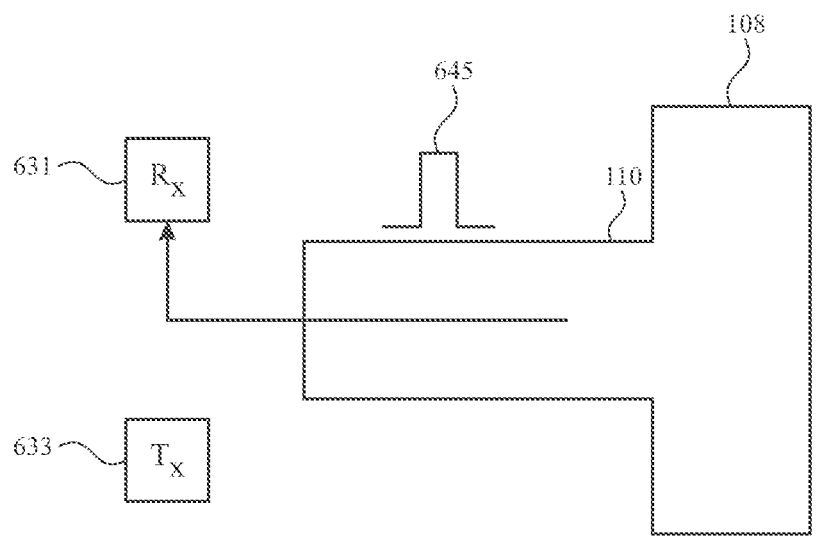

FIGS. 6A-6C illustrate the operation of an acoustic touch detector when no object is touching crown 108. As shown in FIG. 6A, transmitter 633 can couple emitted acoustic wave having a waveform 641 to the near end of the shaft. Next, as shown in FIG. 6B, acoustic wave 643 can reflect off the crown 108 at the border between crown 108 and air. As shown, the amplitude and phase of corresponding waveform 643 of acoustic wave is largely retained after the reflection off the crown boundary. Next, as shown in FIG. 6C, reflected acoustic wave can travel back toward the near end of crown shaft 110 where it is detected by receiver 631. As shown, the amplitude and phase of corresponding waveform 645 of received acoustic wave can be similar to that of waveform 641 corresponding to emitted acoustic wave.

Figure 6D:
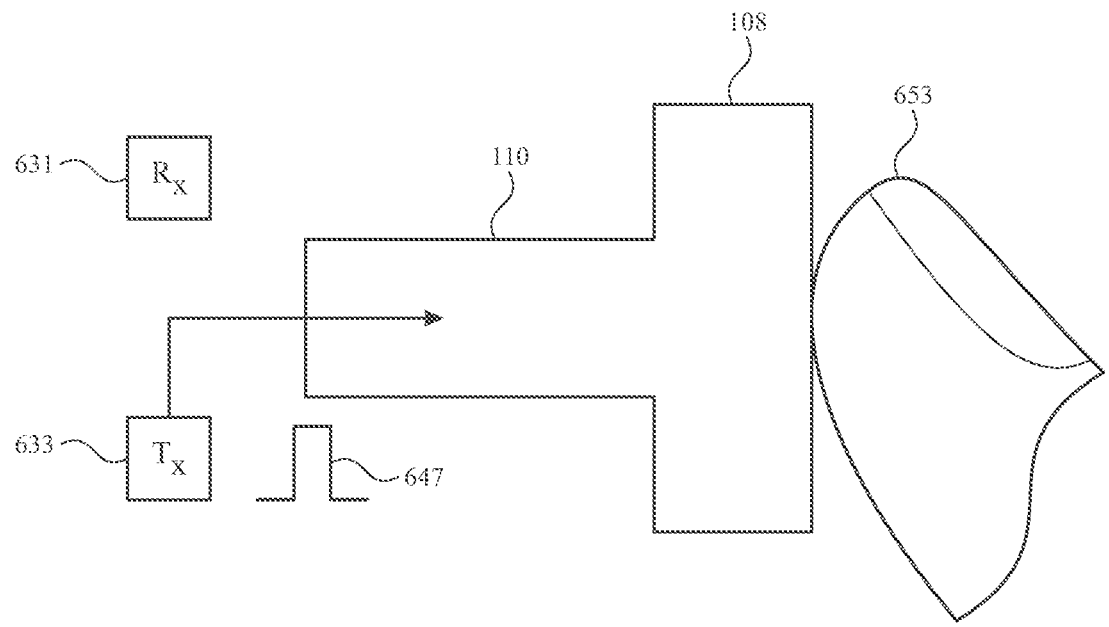
Figure 6E:
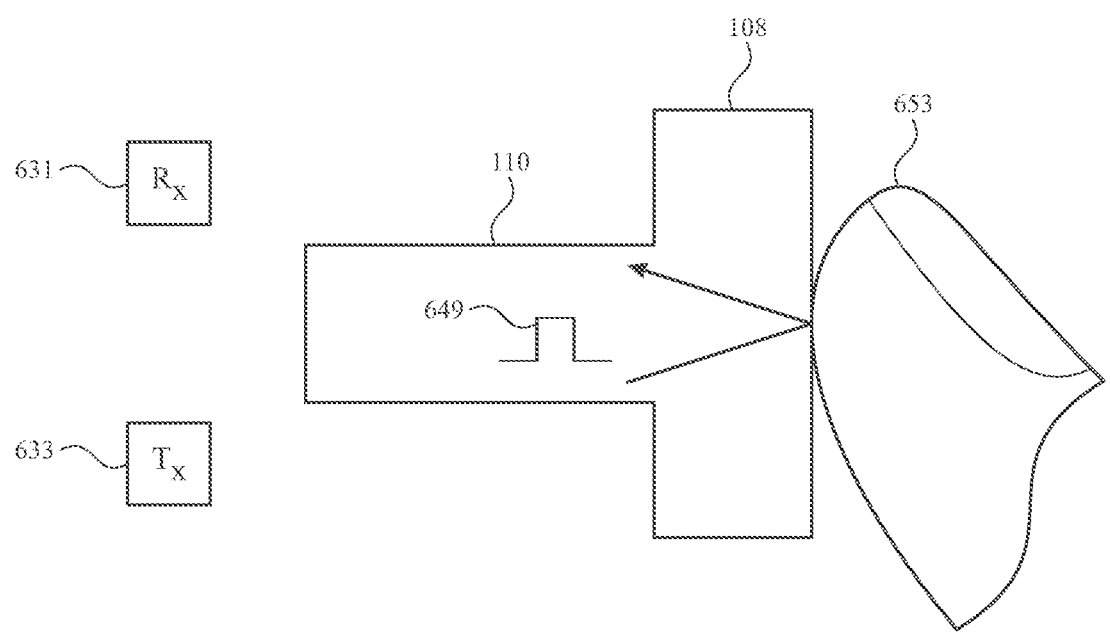
Figure 6F:
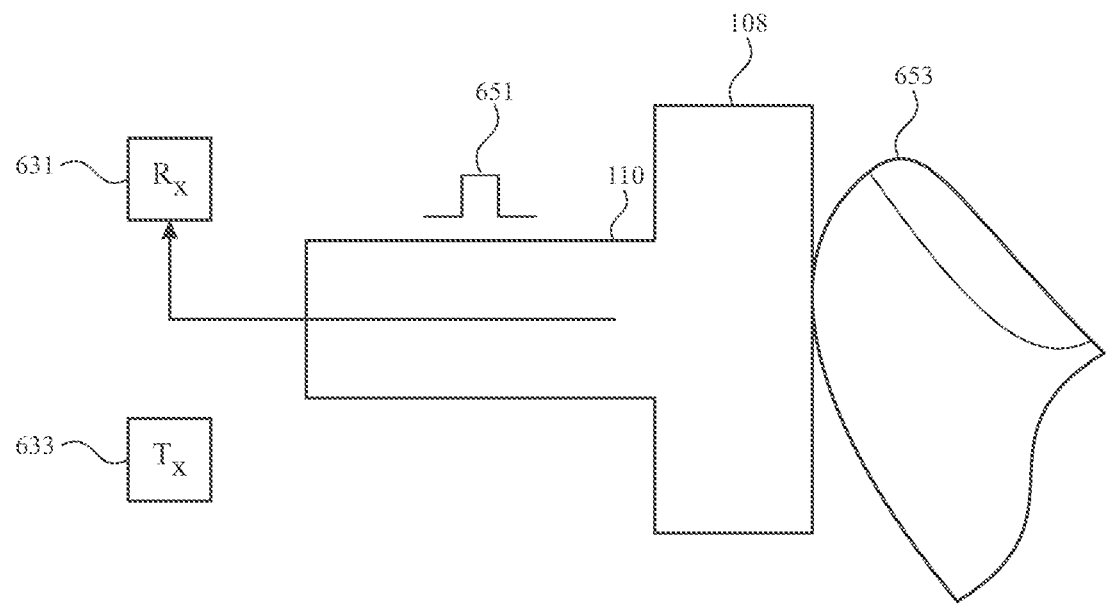

In contrast, FIGS. 6D-6F illustrate the operation of an acoustic touch detector when an object (e.g., a finger 653) is touching crown 108. As similarly shown in FIG. 6A, transmitter 633 can couple emitted acoustic wave having a waveform 647 to the near end of crown shaft 110. However, in this example, acoustic wave reflects off the crown 108 at a border between crown 108 and finger 653. Because finger 653 absorbs more of the acoustic wave at the boundary than air, waveform 649 of reflected acoustic wave is slightly decreased in amplitude. That is, less of the acoustic wave is reflected back to the near end of crown shaft 110. The reflected acoustic wave is received at the receiver 631 where the waveform 651 and its parameters can be analyzed to determine that finger 653 is touching crown 108. Specific examples of waveforms and waveform characteristics will be discussed in more detail with reference to FIGS. 8A-8H below.

In configurations such as the configuration shown in FIG. 5B, acoustic touch detection with acoustic waves can be performed using a process as similarly described with respect to FIGS. 6A-6F, but between the time that acoustic wave is emitted (e.g., as in FIG. 6A) and the time that reflected acoustic wave 645 is received (e.g., as in FIG. 6C), switching circuitry can change the transducer coupling from the transmitter 633 to the receiver 631.

As discussed above, acoustic touch detection with acoustic waves can be used to detect the presence of objects at the crown of a wearable device. In some configurations, the characteristics of reflected acoustic waveforms can indicate that an object is touching the crown. In some examples, the characteristics of the touching object or objects (e.g., location of touch, number of objects touching, density of object) can be determined or estimated based on the characteristics of the reflected acoustic waveforms. In analyzing reflected acoustic waveforms, it can be helpful to conceptualize the process of acoustic touch detection with acoustic waves in terms of a conceptual circuit as shown in FIG. 7.

Figure 7:
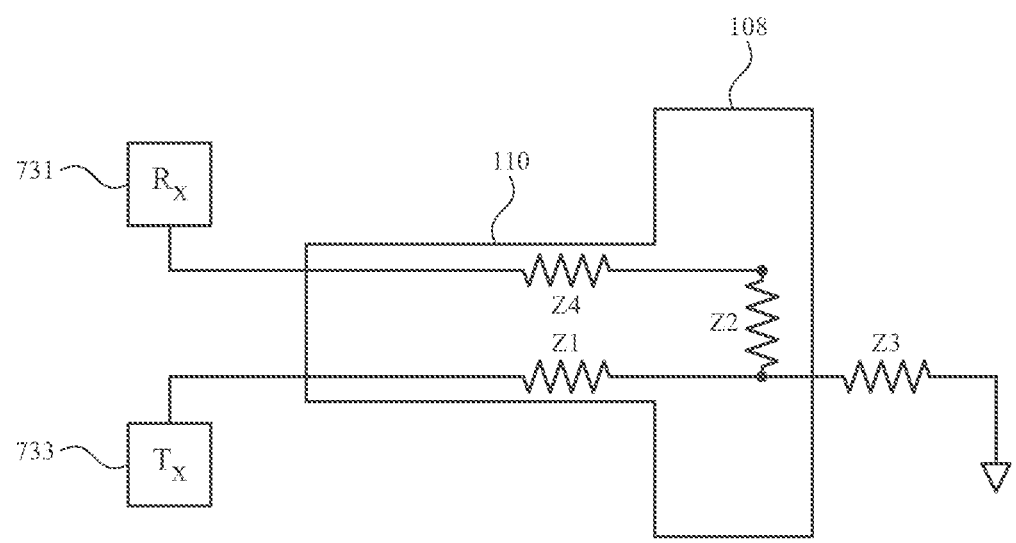
FIG. 7 illustrates a conceptual circuit of an acoustic wave touch detector according to examples of the disclosure.

FIG. 7 illustrates a conceptual circuit of an acoustic wave touch detector according to examples of the disclosure. For simplicity, other elements, including wiring and mounting elements are omitted. A transmitter 733 (shown as box "TX") can represent, for example, an emitter transducer and transmitter circuit. A receiver 731 (shown as box "RX") can represent, for example, a receiver transducer and receiver circuit. As similarly discussed with reference to FIGS. 6A-6F, transmitter 733 can couple an acoustic wave (such as an ultrasonic pulse) onto the near end of crown shaft 110 which travels down the length of the crown shaft, reflects off crown 108, travels back down the length of the crown shaft toward the near end, and be received by receiver 731. As the acoustic wave travels down the length of the crown shaft, the acoustic wave will experience some loss in amplitude, depending on the characteristics of the crown shaft and crown material or materials. As indicated in FIG. 7, this path of the acoustic wave from the emitter to the crown can be conceptually represented as a first impedance Z1. When the acoustic wave is reflected at the boundary of the crown, the amplitude of the acoustic wave can decrease as only some of the wave is reflected back toward the near end of crown shaft 110, while another portion of the acoustic wave is absorbed by the material (e.g., air or an object) at the end of crown shaft 110. As indicated in FIG. 7, this reflection of the acoustic wave off of the boundary between crown and material in contact with the crown (e.g., skin, air, etc.) can be conceptually represented as a resistance divider including a second impedance Z2 and a third impedance Z3. Conceptually speaking, the higher that impedance Z3 is in comparison to impedance Z2, the less the amplitude will decrease after the acoustic wave is reflected off of the boundary. As the acoustic wave travels back from the reflection toward receiver 731, the wave can experience more loss depending on the properties of the crown material. This loss can be conceptually represented as a fourth impedance Z4, as indicated in FIG. 7. It should be noted that the path of an acoustic wave illustrated in FIG. 7 has been simplified for ease of explanation. In reality, acoustic waves traveling through crown shaft 110 and crown 108 can take a variety of paths and encounter a variety of losses.

FIGS. 8A-8D illustrate different scenarios of the touch detector (e.g., whether an object or objects are touching crown 108), while FIGS. 8E-8H illustrate waveforms corresponding to the scenarios shown in FIGS. 8A-8D, respectively according to examples of the disclosure. FIGS. 8E-8H show examples of emitted and received acoustic waveforms in an acoustic touch detector according to examples of the disclosure. For ease of comparison and illustration, each of the waveforms shown in FIGS. 8E-8H is assumed to be a pulse waveform of the same duration and amplitude, though it should be understood that these waveforms are exemplary only, and the actual acoustic pulse waveforms may differ from those shown here. In each of FIGS. 8E-8H, the emitted pulse is represented in solid line, while the reflected pulse detected at the receiver is shown in dashed line. In each of FIGS. 8E-8H, the y axis represents the amplitude of the waveforms, while the x axis represents time.

Figure 8A:
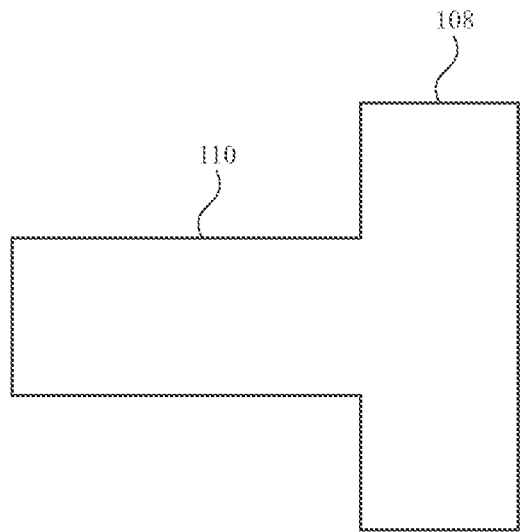
FIGS. 8A-8D illustrate different scenarios of the touch detector according to examples of the disclosure.

FIG. 8A illustrates a scenario in which no objects are touching crown 108 such that the material at the boundary at the far end of crown 108 is air. FIG. 8E illustrates a corresponding example pulse waveforms 841, 851 for the scenario shown in FIG. 8E. In all FIGS. 8E-8H, the difference between the time t1 of the rising edge of the emitted waveform 841 and the time t2 of the rising edge of received waveform 851 is represented as Δ1. Because Δ1 corresponds to the time it takes the acoustic wave to travel down the length of the crown shaft and back to the receiver, the distance from the receiver to the reflective boundary (in this case, the boundary between crown 108 and the air) can be calculated. Moreover, although only one received waveform 851 is illustrated in each of FIGS. 8E-8H, it should be understood that multiple reflected waveforms can be detected at the receiver if the acoustic wave reflects off of more than one boundary. For example, if crown 108 was formed of a second material different from a first material of the crown shaft 110, two acoustic waveforms may be received at the receiver, including a first waveform representing the wave reflection at the boundary between the first material and second material, and a second waveform representing the wave reflection at the boundary between the second material and the air. However, in the example shown in FIG. 8E, only one received waveform 851 is present, representing the reflection of the acoustic wave at the boundary between the crown and air. Referring back to FIG. 7, air can be conceptually thought of as representing a high impedance Z3 in comparison to the impedance Z2 of crown 108 at the boundary, such that most of the acoustic waveform is reflected back down crown shaft 110 to receiver (not shown). As a result, the difference Δ1 between the amplitude A1 of the emitted wave (represented as waveform 841) and the amplitude A2 of the received wave (represented as waveform 851) is relatively small. In some examples, device 100 (e.g., processor 202 or crown controller 252) can analyze the received waveform to determine that no object is touching crown 108.

Figure 8B:
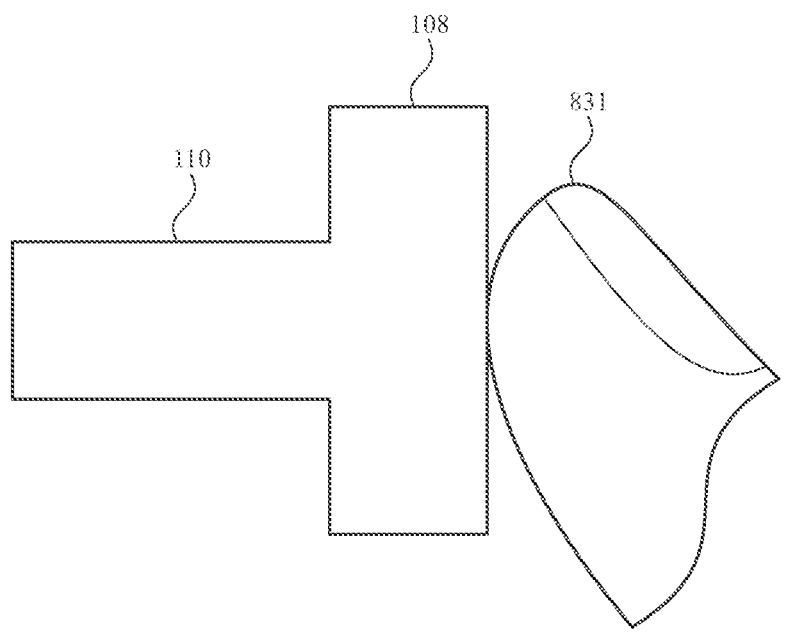

FIG. 8B illustrates a scenario in which a single bare finger 831 is touching crown 108 such that the material at the boundary of crown 108 is skin. FIG. 8F illustrates a corresponding example emitted waveform 842 and received waveform 852 for the scenario shown in FIG. 8B. Here, some of the emitted acoustic wave is absorbed by finger 831, with the remainder reflecting back down crown shaft 110 to receiver (not shown). As a result, the amplitude A2 of the received wave 852 is considerably smaller than the amplitude A1 of the emitted wave 842, resulting in a large difference Δ1. In some examples, device 100 (e.g., processor 202 or crown controller 252) can analyze the received waveform to determine that an object is touching the crown, and in some examples, determine that finger 831 is touching crown 108.

Figure 8C:
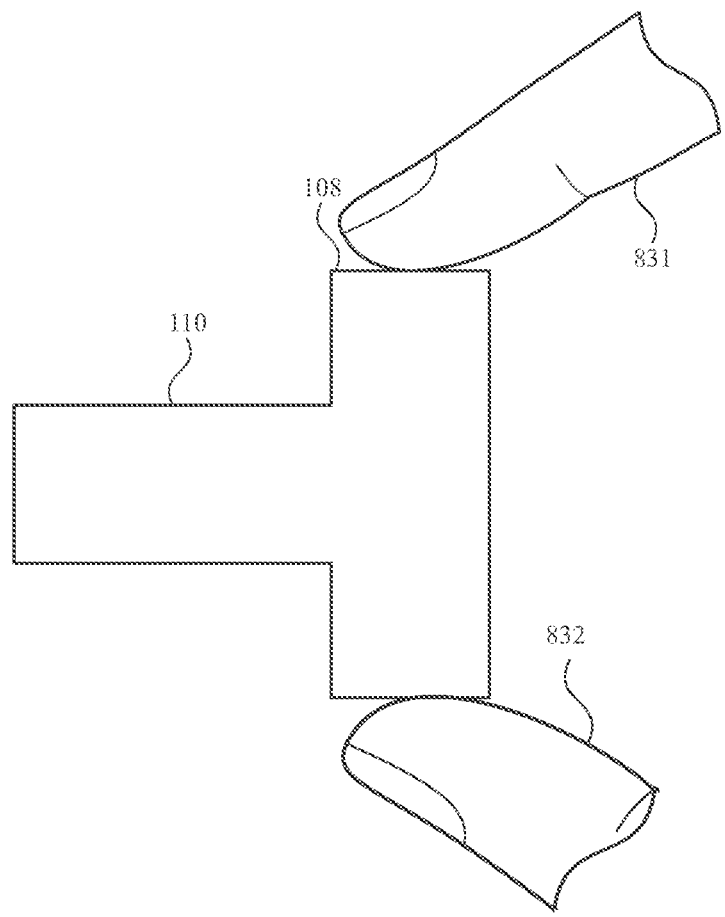

FIG. 8C illustrates a scenario in which two bare fingers 831 and 832 are touching crown 108 such that the material at the boundary of crown 108 is skin, but with a larger area of contact than the scenario illustrated in FIG. 8B. FIG. 8G illustrates a corresponding example emitted waveform 843 and received waveform 853 for the scenario shown in FIG. 8C. Here, some of the emitted acoustic wave is absorbed by finger 831, with the remainder reflecting back down crown shaft 110 to receiver (not shown). Here, unlike in the scenario described with reference to FIGS. 8B and 8F, the additional finger 831 provides an additional path for the acoustic wave to be absorbed by. Consequently, the difference in amplitude Δ1 is even larger than in the examples shown in FIGS. 8E and 8F. In some examples, device 100 (e.g., processor 202 or crown controller 252) can analyze the characteristics of the received waveform to determine that an object is touching the crown, and in some examples, determine that two fingers are touching crown 108.

Figure 8D:
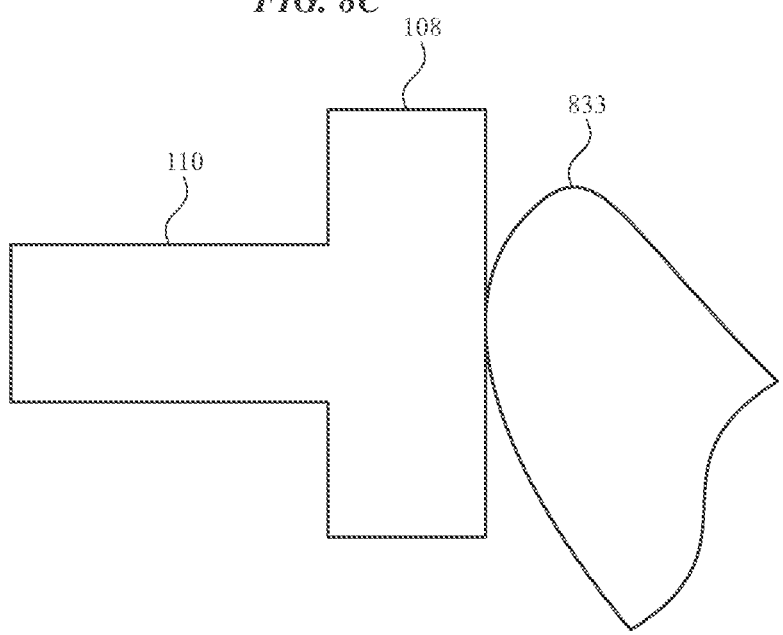
Figure 8E:
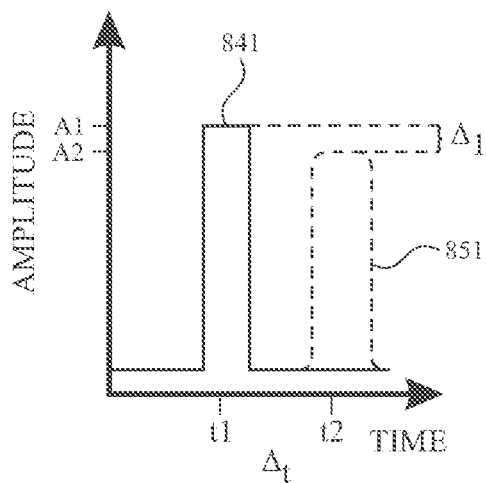
FIGS. 8E-8H illustrate waveforms corresponding to the scenarios shown in FIGS. 8A-8D, respectively according to examples of the disclosure.
Figure 8F:
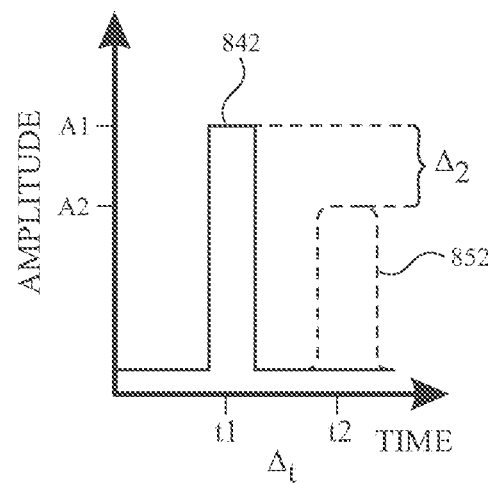
Figure 8G:
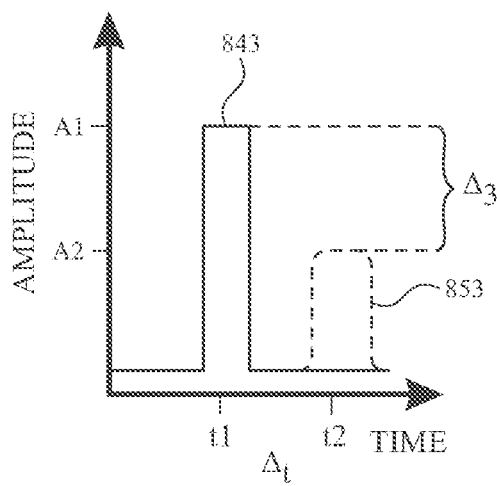
Figure 8H:
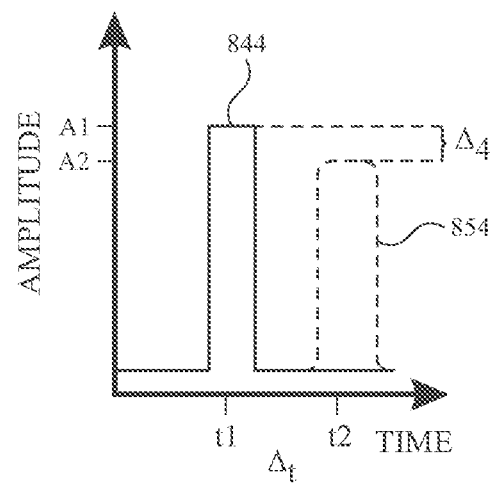

FIG. 8D illustrates a scenario in which a gloved finger 833 is touching crown 108 such that the material at the boundary of crown 108 is fabric. FIG. 8H illustrates a corresponding example waveform for the scenario shown in FIG. 8D. Here, a small amount of the emitted acoustic wave is absorbed by gloved finger 833, with the remainder reflecting back down crown shaft 110 to receiver (not shown). Here, unlike in the scenario described with reference to FIGS. 8B and 8F, the gloved finger 833 does not absorb as much of the acoustic wave. Consequently, the difference in amplitude Δ1 is larger than in the example shown in FIG. 8E (i.e., where no object is touching crown), but is less than the examples shown in FIGS. 8B-8C (i.e., where one or more bare fingers are touching the crown). In some examples, device 100 (e.g., processor 202 or crown controller 252) can analyze the characteristics of the received waveform to determine that an object is touching the crown, and in some examples, more specifically determine that a gloved finger is touching crown 108.

Although example scenarios are discussed with reference to FIGS. 8A-8D above, the scope of the disclosure includes other scenarios in which wearable device 100 can analyze the characteristics of a waveform to determine the presence (and in some configurations, the characteristics) of an object touching crown 108. For example, in some configurations, wearable device 100 can determine that a user's wrist is touching the crown (e.g., an unintentional touch). In other examples, wearable device 100 can use the techniques described herein to determine the amount of force applied to the crown by an object (e.g., how hard a finger is pressed against crown 108).

Figure 9:
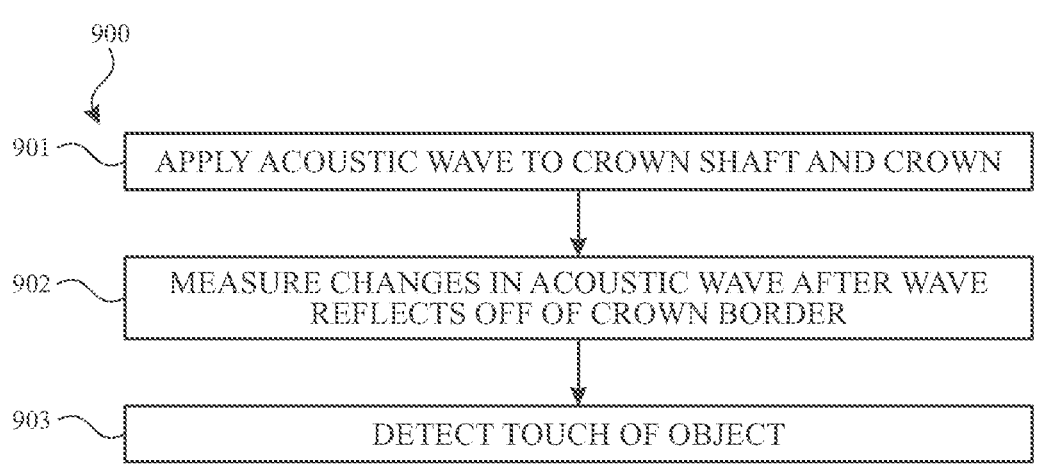
FIG. 9 illustrates an exemplary process for detecting the presence of a capacitive or non-capacitive object touching crown according to examples of the disclosure.

FIG. 9 illustrates an exemplary process 900 for detecting the presence of a capacitive or non-capacitive object touching the crown according to examples of the disclosure. The device can apply an acoustic wave to at least the crown shaft and crown of the device (901). For example, as discussed above with regard to FIGS. 5A-5B for example, a transmit circuit can include a transducer operatively coupled to the crown shaft or crown. The device can measure changes in one or more parameters (e.g., characteristics of the waveform) of the acoustic wave after it travels through the crown shaft and crown and reflects off of the crown (902). For example, a receiver circuit or element can detect changes in amplitude, frequency, phase, and/or slew rate of the reflected acoustic wave. The device can detect touch and/or characteristics of an object at the crown (903). For example, based on the measured one or more parameters, the device (e.g., processor 202 or crown controller 252) can detect that an object is touching the crown (e.g., based on comparing the one or more parameters in the reflected wave to known parameters or parameters in the emitted wave). In some examples, the characteristics of a touching object can be estimated by comparing the one or more parameters to values in a look-up table (LUT). In some examples, the system can exit a rest state (as described, for example, with respect to FIG. 3A) in response to detecting a threshold level of contact between the object and the crown.

In some examples, wearable device 100 can perform acoustic wave touch detection using a range of emitted acoustic pulses, including pulses of varying duration, amplitude, and waveform shape. In some examples, acoustic wave touch detection can be performed using varying emitted acoustic pulses having different characteristics, and the characteristics of each waveform corresponding to a respective emitted acoustic pulse can be analyzed. Certain materials (e.g., fabric, skin, etc.) can have a "signature" reflected acoustic wave, which, in some examples, can be stored by device 100 (e.g., stored by processor 202 or crown controller 252 in a LUT) and used to determine that the specific material is touching the crown. It should be noted that the waveform shape of the emitted acoustic wave need not be a pulse shape, but can include any waveform shape beneficial to performing acoustic wave touch detection, including, but not limited to, sinusoidal waveforms. It should also be noted that the characteristics of reflected waveforms analyzed by device (e.g., by processor 202 or crown controller 252) are not limited to those discussed here. It should further be understood that, in these configurations, the processor may utilize multiple thresholds, and that the thresholds may vary dynamically.

In some examples, the characteristics (e.g., acoustic conductivity) of crown 108 and crown shaft 110 can be selected to facilitate object detection using acoustic property changes. For example, the one or more materials forming crown 108 and crown shaft 110 can be selected such that an acoustic wave can effectively travel longitudinally along the length of the crown shaft and crown. In some examples, portions of the crown or crown shaft can be formed of a metal material. FIGS. 10A-10B illustrate an example configuration in which crown shaft 110 and crown 108 can include an acoustic channel 1040 according to examples of the disclosure. In some examples, an acoustic channel can guide the emitted and reflected acoustic waves from transmitter 1031, down the crown shaft 110 to the boundary at the far end of crown 108, and back to receiver 1032. As shown in the configuration illustrated in FIG. 10A-10B, in some examples, a single acoustic channel can operate as an acoustic channel for both emitted and reflected acoustic waves. In other configurations not shown, crown 108 and crown shaft 110 can include separate channels for emitted acoustic waves and reflected acoustic waves. In some examples, acoustic channels can be formed using a step gradient density, wherein the material with the highest density forms the channel, while one or more materials having a lower density form the boundaries of the channel. For example, FIG. 10B illustrates a cross sectional view of crown shaft 110 including acoustic channel 1040 at a reference plane P1 as indicated in FIG. 10A. As shown, the innermost (e.g., center) portion of crown shaft 110 can be formed of a first material M1 having a first acoustic conductivity. In some examples, the first material M1 can form an acoustic channel. The next portion of crown shaft 110 extending outwardly from the center can be formed of a second material M2 having a second acoustic conductivity. The second material M2 can form the boundary 1042 of the acoustic channel. The outermost portion of crown shaft 110 can be formed of a third material. In some examples, the difference in characteristics (e.g., acoustic conductivity) between the acoustic channel 1040 and acoustic channel boundary 1042 can confine the emitted acoustic wave such that more energy moves longitudinally along the length of the crown and is reflected back to the receiver.

In some examples, wearable device 100 can use acoustic waves to detect touching objects in specific areas of crown 108. This can be beneficial, for example, to distinguish objects touching the top of crown 108 (e.g., intentional touches from a user's finger) from objects touching the bottom of crown 108 (e.g., unintentional touches from a user's wrist). In some configurations, crown shaft 110 and crown 108 can include a plurality of acoustic channels, like those discussed with reference to FIGS. 9A-9B above FIGS. 11A-11B illustrate a side cross sectional view and front cross-sectional view, respectively, of a crown shaft 110 and crown 108 including two acoustic channels 1140 and 1144 according to examples of the disclosure. The cross-sectional view of FIG. 11B is at a cross-sectional plane P2, as shown in FIG. 11A. Each of the plurality of acoustic channels can terminate at a particular area of crown 108 (e.g., one acoustic channel terminates to an area on a first half of crown 108, while another acoustic channel terminates to an area on a second half of crown 108). In these configurations, each acoustic channel can have a dedicated emitter and receiver (e.g., 1131-1132 and 1133-1134), though in other configurations, the plurality of acoustic channels can share the same emitter and receiver through time multiplexing and switching networks.

FIGS. 12A-12B illustrates a side cross-sectional view and perspective view, respectively, of another example configuration in which crown 108 includes two or more touch sensors according to examples of the disclosure. In the example shown, crown shaft 110 and crown 108 can be collectively divided lengthwise, forming a first half 1240 and second half 1242. In some configurations, first half 1240 and second half 1242 can be separated by an acoustically isolating material 1244. In some configurations, as shown in FIGS. 12A-12B, first half 1240 and second half 1242 can each be coupled to a respective emitter and receiver (e.g., 1231-1232 and 1233-1234), though in other examples, each half may share an emitter and receiver using, for example, switching networks and time multiplexing.

FIG. 13 illustrates a magnified cross-sectional view of another exemplary acoustic touch detector according to examples of the disclosure. The configuration shown in FIG. 13 uses acoustic resonance according to examples of the disclosure. As in the configuration described with reference to FIGS. 5A-5B above, in some configurations, wearable device 100 can include a crown shaft 110, and a crown 108 supported by the crown shaft. In some examples, wearable device 100 can also include a resonator 1340 coupled to a transmit circuit 1348 and a sensor 1342 coupled to a receiver circuit 1350. In some configurations, crown shaft 110 can be supported by mounts 1344 which can be integrated with (or coupled to) housing 102 of the wearable device (not shown). In some examples, one or more flexible supports 1346 (for example, rubber bushings) can be positioned between mounts 1344 and crown shaft 110. In some examples resonator 1340 can be configured to resonate the crown shaft 110 and crown 108. Sensor 1342 can be configured to sense any damping of the resonation, thereby detecting when an object is touching crown 108.

Figure 14:
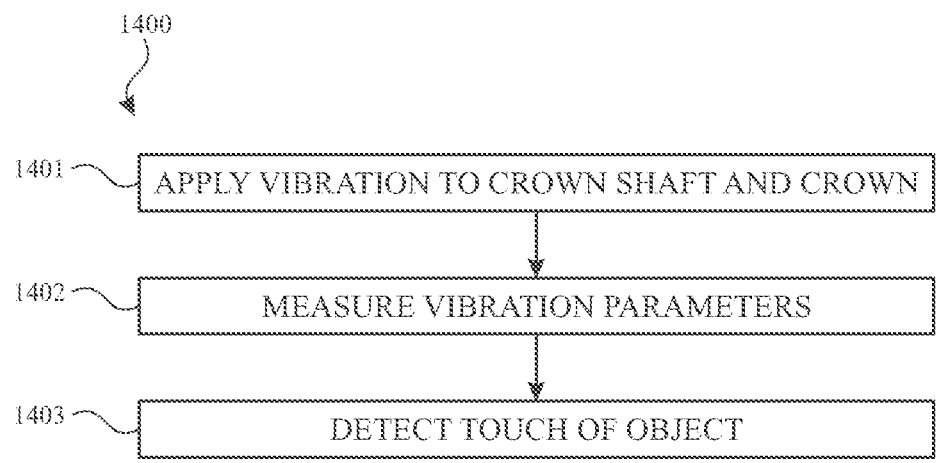
FIG. 14 illustrates an exemplary process for detecting the presence of a capacitive or non-capacitive object touching the crown according to examples of the disclosure.

FIG. 14 illustrates an exemplary process 1400 for detecting the presence of a capacitive or non-capacitive object touching the crown according to examples of the disclosure.

The device can apply a vibration to at least the crown shaft and crown of the device (1401). As will be discussed in more detail below, a resonator can include, for examples, a transducer, a vibrating mass, an electromagnet or a mechanical hammer operatively coupled to the crown shaft or crown. The resonator can be configured such that, if no object is touching crown, the crown shaft and crown will vibrate at the set frequency (e.g., the resonant frequency of the crown shaft and crown) with a set of known parameters. As an object comes in contact with the crown, the actual vibration will be dampened, resulting in a change in vibration characteristics (e.g., vibration amplitude or frequency). Therefore, while the resonator vibrates the crown shaft and crown, the device can measure one or more parameters of the actual vibration on the crown shaft and crown (1402). For example, a receiver circuit coupled to a sensor can detect amplitude, frequency, phase, of the vibration. As will be discussed in more detail below, the sensor can include, for example, and accelerometer, or an optical proximity sensor. The device can detect touch and/or characteristics of an object at the crown (1403). For example, based on the measured one or more parameters, the device (e.g., processor 202 or crown controller 252) can detect that an object is touching the crown (e.g., based on determining the amount of damping by comparing the one or more parameters in the vibration to known parameters). In some examples, the characteristics of an object touching the crown can be determined by comparing the one or more parameters to values in a look-up table (LUT). In some examples, the system can exit a rest state (as described, for example, with respect to FIG. 3A) in response to detecting a threshold level of proximity between the object and the crown.

As discussed, in some examples, wearable device 100 can determine whether an object is touching the crown based on whether a change in vibration parameters exceeds one or more preselected thresholds. Similar to the examples discussed above with reference to FIGS. 8A-8D, in some examples, the change in vibration characteristics (e.g., frequency and amplitude) can be unique for different scenarios of object interaction with the crown. For example, a single bare finger in contact with the crown can change the vibration characteristics differently than when two fingers, a gloved finger, or a wrist are in contact with the crown. In other words, each of these scenarios can have a unique vibration characteristic "signature" (though it should be noted that possible scenarios and signatures are not limited to these examples only). In some examples, detected vibration characteristics can be compared against stored vibration characteristic signatures (e.g., vibration characteristic signatures stored in an LUT) and determine that a corresponding scenario (e.g., a finger touching crown) is occurring when the vibration character signature is detected. In some examples, vibration characteristic signatures can be learned during operation (e.g., learning that a signature represents a finger touch if crown is mechanically pressed thereafter), or predetermined. In some examples, the resonator can operate in a plurality of frequencies. For example, the resonator can perform a frequency sweep wherein crown shaft and crown are vibrated at a range of frequencies, and sensor can detect changes in the vibration characteristics at each of these frequencies. In these configurations, a single scenario (e.g., a finger touching crown) can have multiple vibration characteristic signatures corresponding to multiple vibration frequencies, which can be beneficial in distinguishing scenarios one from another.

Examples of resonators in an acoustic resonance touch detection configuration will now be discussed. Returning to FIG. 13, in some examples, resonator 1340 can be contact coupled to crown shaft 110 in order to vibrate the crown shaft 110 and crown 108 at a frequency (e.g., a resonant frequency). In some configurations, resonator 1340 can comprise a spinning mass (e.g., an off-balance mass on a motor) configured to vibrate crown shaft 110 and crown 108. In these configurations, the revolution speed of the spinning mass can be tuned in order to optimize the resonance of the crown shaft 110 and crown 108. In some examples, a haptic feedback device of wearable device 100 can be coupled to crown shaft 110 and crown 108 and can be configured to operate as a resonator 1340 for the crown shaft and crown (e.g., by being configured to run at a different frequency when operating as a resonator). In other examples, crown shaft 110 and crown 108 can vibrate and resonate as a result of being struck by a mechanical hammer (e.g., a solenoid) within the housing of wearable device 100, that is, the mechanical hammer can operate as resonator 1340. In still other examples, the crown shaft 110 and crown 108 can be vibrated by magnetomechanical effects. For example, in some configurations, resonator 1340 can comprise an electromagnet configured to provide electromagnetic pulses which can vibrate crown shaft 110 and crown 108. In these configurations, resonator 1340 need not be contact coupled to crown shaft 110 or crown 108 in order to vibrate and resonate these elements. It should be noted that, although the resonator illustrated in FIG. 13 is mounted at a base of crown shaft 110, resonator can be mounted anywhere on the crown shaft 110 or crown 108 (or, in the case of electromagnetic coupling, mounted in proximity to the crown shaft or crown). In still other examples, the resonator may not be directly coupled to the crown shaft or crown, but can be indirectly coupled to the crown shaft or crown (e.g., coupled to a mount which is, in turn, coupled to the crown shaft). It should also be understood that some configurations may include multiple resonators and/or multiple sensors.

Figure 15:
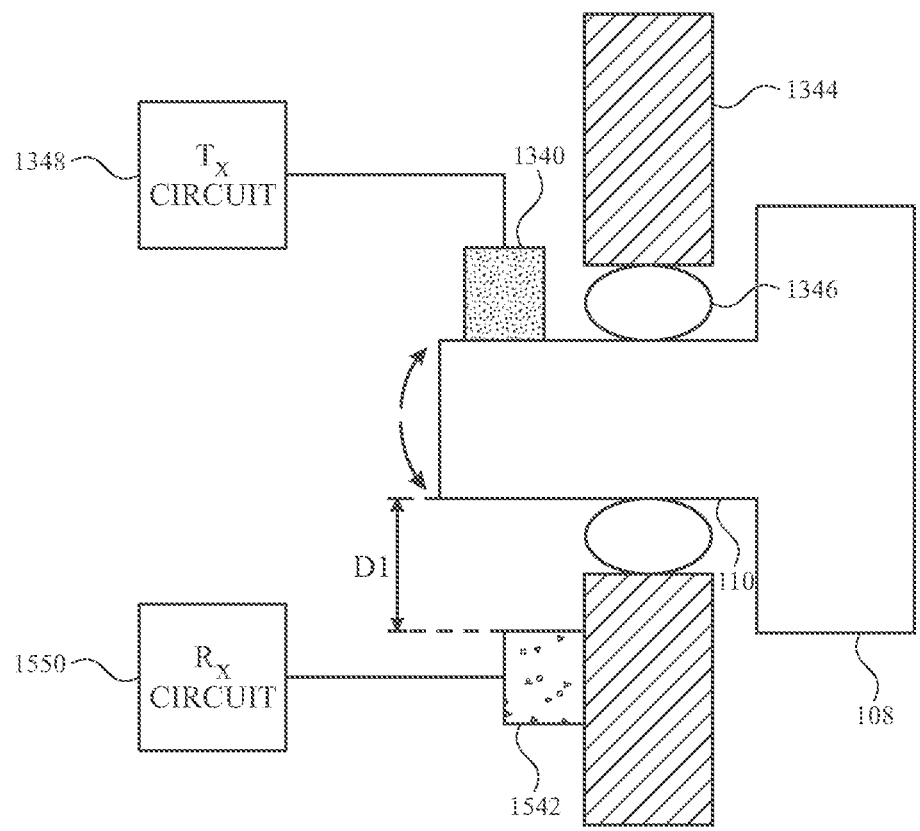
FIG. 15 illustrates a magnified cross-sectional view of an exemplary acoustic touch detector which uses acoustic resonance and a proximity sensor according to examples of the disclosure.

Examples of sensors in an acoustic resonance touch detection configuration will now be discussed. In some examples, the sensor can comprise an accelerometer coupled to the crown shaft or crown. For example, referring again to FIG. 13, sensor 1342 can comprise an accelerometer coupled to the crown shaft 110 or crown 108, which can detect the movement (i.e., vibration characteristics) of the crown shaft 110 or crown 108. Additionally or alternatively, in some configurations, the sensor can include a proximity detector. For example, FIG. 15 illustrates a magnified cross-sectional view of an exemplary acoustic touch detector which uses acoustic resonance and a proximity sensor according to examples of the disclosure. In the example illustrated in FIG. 15, sensor 1542 can comprise a proximity detector, which is not coupled to the crown shaft or crown, but is configured to detect a distance D1 between sensor 1542 and crown shaft 110 or crown 108. As shown in FIG. 15, in some configurations, crown shaft 110 can be supported by one or more mounts 1344. In some examples, one or more flexible supports 1346 (for example, rubber bushings) can be positioned between mounts 1344 and crown shaft 110. The flexibility of flexible supports 1346 can allow crown shaft 110 to move and rotate about the fulcrum of mounts 1344. Thus, in some examples, resonator 1340 can be configured to vibrate crown shaft 110 and crown 108 such that crown shaft 110 moves about the fulcrum of mounts 1344 as indicated by the directional arrows in FIG. 15. As sensor 1542 can be configured to measure a distance D1 between the optical sensor and crown shaft 110 over time, the frequency with which crown shaft 110 returns to a position (i.e., the frequency of the vibration) and the range in detected distance D1 (i.e., the amplitude of the vibration) can be determined. In some configuration, sensor 1542 can be an optical sensor configured to operate using any appropriate optical distance-detection techniques including, but not limited to, time of flight, coincidence, or stereoscopic distance calculation). In some examples, sensor 1542 can also operate as an optical encoder to register mechanical rotation of crown 108, as discussed with reference to FIG. 2 above.

Figure 16A:
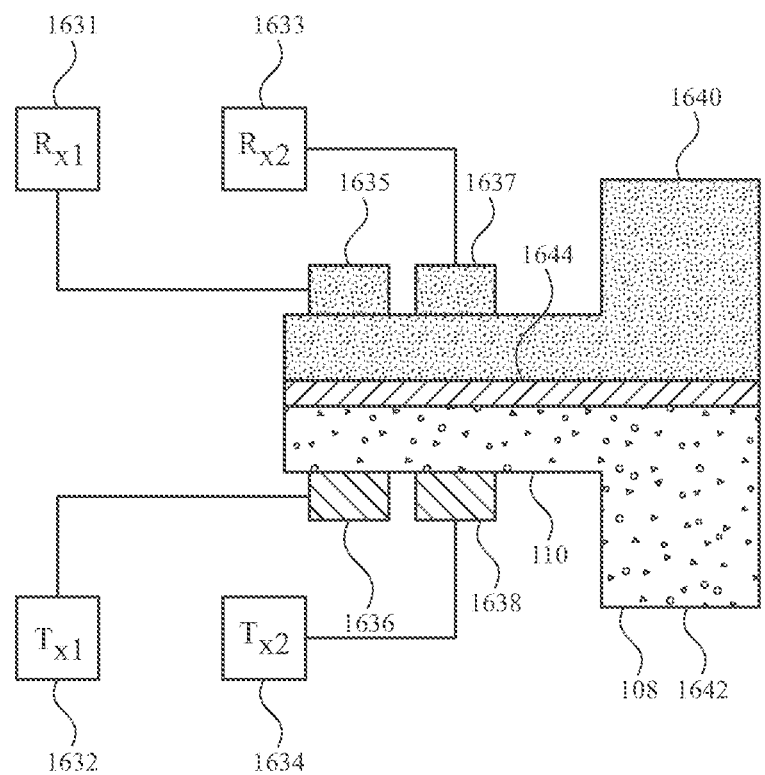
FIGS. 16A-16B illustrate an exemplary acoustic touch detector which includes two or more touch sensors according to examples of the disclosure.
Figure 16B:
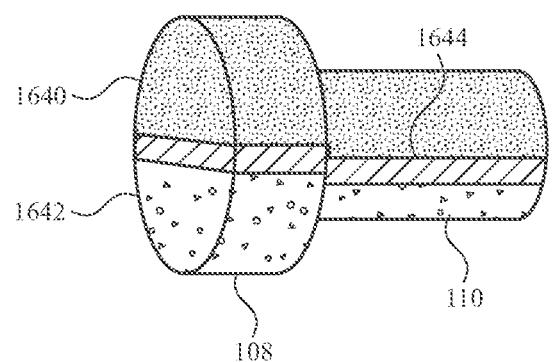

As similarly discussed with reference to the examples shown in FIGS. 12A-12B above, crown shaft 110 and crown 108 can be configured to detect touching objects in specific areas of crown 108. This can be beneficial, for example, to distinguish objects touching the top of crown 108 (e.g., intentional touches from a user's finger) from objects touching the bottom of crown 108 (e.g., unintentional touches from a user's wrist). FIGS. 16A-16B illustrate an example configuration in which crown 108 includes two or more touch sensors according to examples of the disclosure. In the example shown, crown shaft 110 and crown 108 can be collectively divided lengthwise, forming a first half 1640 and second half 1642. In some configurations, first half 1640 and second half 1642 can be separated by an acoustically isolating material 1644. In some configurations, as shown in FIG. 16, first half 1640 and second half 1642 can each be coupled to a respective resonator and sensors (e.g., 1635-1636 and 1637-1638) and respective transmit circuits and receiver circuits (e.g., 1631-1632 and 1633-1634) (though in other examples not shown, each half may share a resonator and sensor and circuitry via time multiplexing).

Although examples described herein primarily involve acoustic touch sensors used to detect objects touching the crown of a watch, it should be understood that the sensors described herein can be used to detect the presence of objects on any component of a device that can be resonated. For example, referring back to FIG. 1, buttons 112 and 114 can be configured as described in this disclosure in order to detect objects that are touching (but not necessarily pressing) a button. In some of these configurations, touch sensors can be used in conjunction with a display of a device to ready the device (e.g., touchscreen) for a button-press operation based on a detected touch on the button, as similarly described with reference to the process illustrated in 3A-3B above. Similarly, although the examples discussed herein focus primarily on wearable devices, it should be noted that the examples discussed herein can be used in other electronic devices including, but not limited to, cellular phones, laptops, or tablet devices.

Optical Detection Apparatus and Methods

In some examples, it can be beneficial to detect the presence of both conductive and non-conductive objects (e.g., an ungloved or gloved finger) at specific areas proximate to a crown (e.g., 108 in FIG. 1 above) with improved accuracy. In addition, it can be beneficial to detect objects at a greater range than possible with capacitive touch technologies. Moreover, when a device is a watch, it can be beneficial to have proximity sensors be unobtrusive, and in some examples, positioned within the housing of the watch beneath the cover substrate of the watch.

Some examples described herein refer to an optical proximity sensor. The configurations described herein can be used to detect the presence and/or distance of an object. For example, proximity sensors can be used to detect user interaction with an electronic device by sensing the presence and/or distance of an object such as a stylus or a user's finger. In these configurations, near-field proximity sensing can be used to detect when an object is touching or approaching the electronic device. In some cases, different objects interacting with an electronic device can have different levels of optical reflectivity (e.g., a gloved finger, a non-gloved finger, or a finger with lotion), and some conventional amplitude-based optical proximity sensors can have difficulty reliably detecting the proximity of objects having different levels of optical reflectivity. Moreover, while some time-of-flight (i.e., not amplitude-based) optical sensors can more reliably detect objects of varying levels of reflectivity, these sensors can be less suited for near-field proximity sensing. Therefore, it can be beneficial to detect the presence and/or distance of objects near an electronic device with improved accuracy, better range, and with more consistency between objects having different reflective characteristics. The examples herein discuss proximity sensors in the context of a wearable device; however, it should be understood that the examples herein can be used in any appropriate application which requires proximity or contact sensing.

Figure 17A:
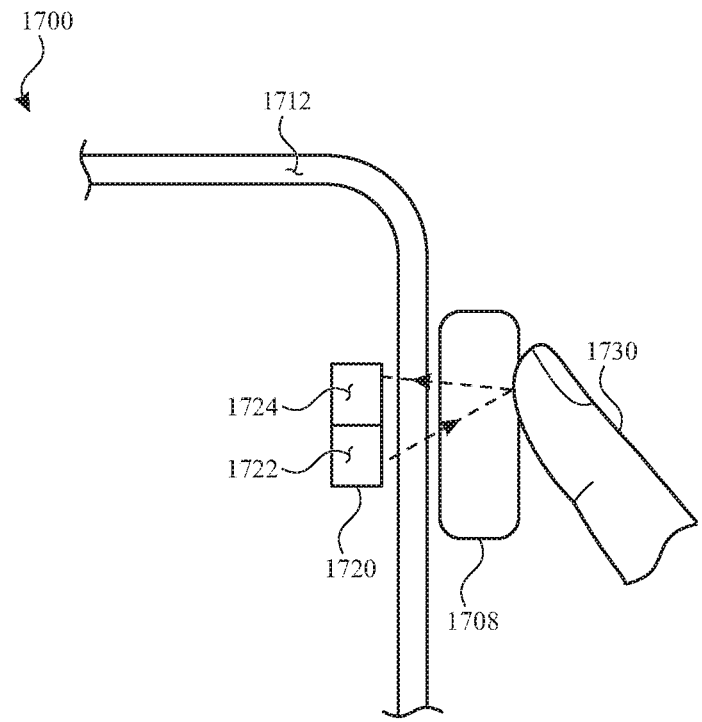
FIGS. 17A and 17B illustrate an exemplary optical proximity sensor according to examples of this disclosure
Figure 17B:
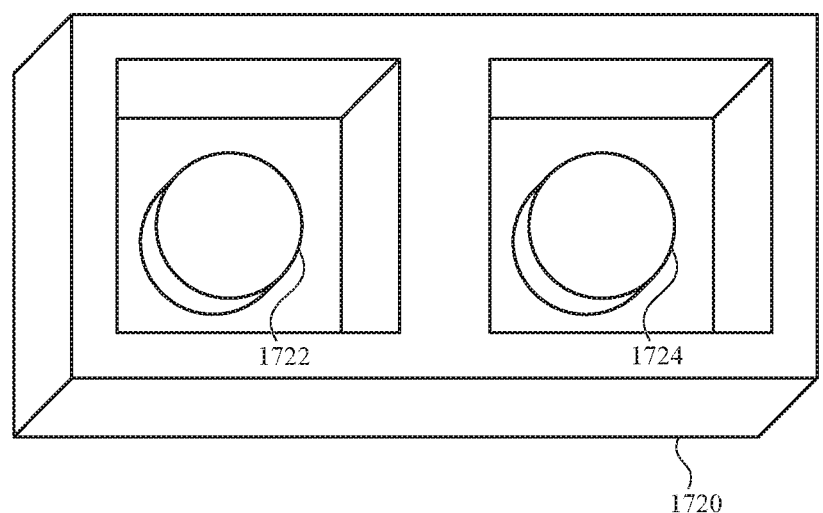

FIG. 17A shows an exemplary optical proximity sensor 1720 integrated in a wearable device 1700 (which can correspond to device 100 above) according to examples of the disclosure. FIG. 17B shows a magnified simplified drawing of the optical proximity sensor according to examples of the disclosure. As shown, proximity sensor 1720 can comprise a photo emitter 1722 and photodetector 1724, though in some cases, proximity sensor can include multiple emitters and/or detectors. Proximity sensor 1720 can determine the presence and/or range of object 1730 (e.g., a user finger) using any appropriate method. For example, emitter 1722 can emit a beam of electromagnetic radiation (e.g., Infra-Red (IR) light), and the presence and/or range of object 1730 can be detected based on the amount of radiation received back at detector 1724. In some examples, the beam of electromagnetic radiation emitted from emitter 1722 can be emitted through a cover substrate 1712 of the device (e.g., a cover glass). In some examples, a higher amount of radiation (e.g., light) received back at the detector can correspond to an object at a closer distance, while a lower amount of radiation received back at the detector can correspond to an object at a further distance. In some examples, proximity sensor 1720 can detect objects at a distance from the wearable device 1700 ranging from 0 mm (i.e., when an object is touching the wearable device) to 100 mm.

In other examples, other methods can be used to detect the presence and/or range of the object such as, for example, time of flight calculations. It should be noted that the scope of the disclosure is not limited to the proximity sensors described herein, but can include any optical proximity sensor capable of detecting the presence and/or range of an object according to examples of the disclosure. For example, emitter 1722 can, in some examples, emit light of other wavelengths including visible light and ultraviolet light, or can selectively emit light from other wavelengths according to environmental conditions (e.g., characteristics of approaching object, ambient light level, etc.).

Figure 18:
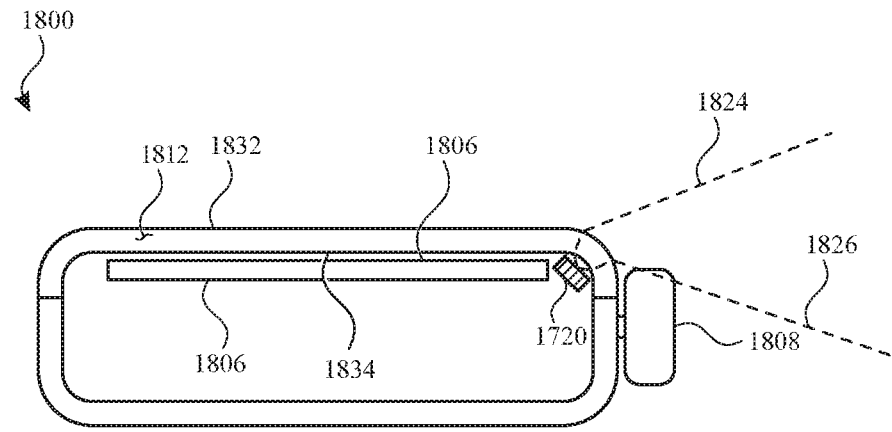
FIG. 18 illustrates a simplified cross-sectional diagram of an exemplary wearable device having an integrated optical proximity sensor according to examples of this disclosure.

In some examples, the proximity sensor can be positioned beneath the cover substrate of the wearable device 1800 (which can correspond to device 100 above). FIG. 18 illustrates a simplified cross-sectional diagram of wearable device 1800 having a crown 1808 (which can correspond to crown 108 above) and integrated optical proximity sensor according to examples of the disclosure. Cover substrate 1812 (which can correspond to cover substrate 1712 above)

can have an outer surface 1832 and an inner surface 1834. In some examples, display 1806 (which can correspond to display 106 above) can be positioned behind the cover substrate 1812. In some examples, the field of view of proximity sensor 1720 (that is, the path of light emitted and received by the proximity sensor) can be refracted using cover substrate 1812 and the cover substrate can provide a protective barrier for the display 1806. In some examples, the characteristics of proximity sensor 1720 and cover substrate 1812 can be selected such that the field of view is focused to a particular region about the wearable device 1800 such as the area above crown 1808.

In general, the path of a light wave passing across a boundary between two media (e.g., through air and cover substrate 1812) can be determined using Snell's law of refraction, shown in Equation (1) below:

$$n1 \sin(\alpha) = n2 \sin(\beta) \quad (1)$$

where n1 is the refractive index of the first medium, n2 is the refractive index of the second medium, a is the angle of incidence (i.e., the entrance angle) of the light, and β is the angle of refraction (i.e., the exit angle) of the light. Although the examples herein describe a path of light being emitted from the proximity sensor 1720 through the cover substrate 1812 and toward an object (e.g., finger 1730 above), it should be understood that light received at the proximity sensor can follow a similar path. Both the light path of the light emitted by the proximity sensor and light received by the proximity sensor can be described generally as the field of view of the proximity sensor. As shown in FIG. 18, the field of view can be represented as having an upper bound 1824 and lower bound 1826 (both shown in dashed line). In some examples, the field of view can be centered about a center line, where the center line is refracted through the cover substrate at an angle in the range of 10 and 60 degrees.

Figure 19:
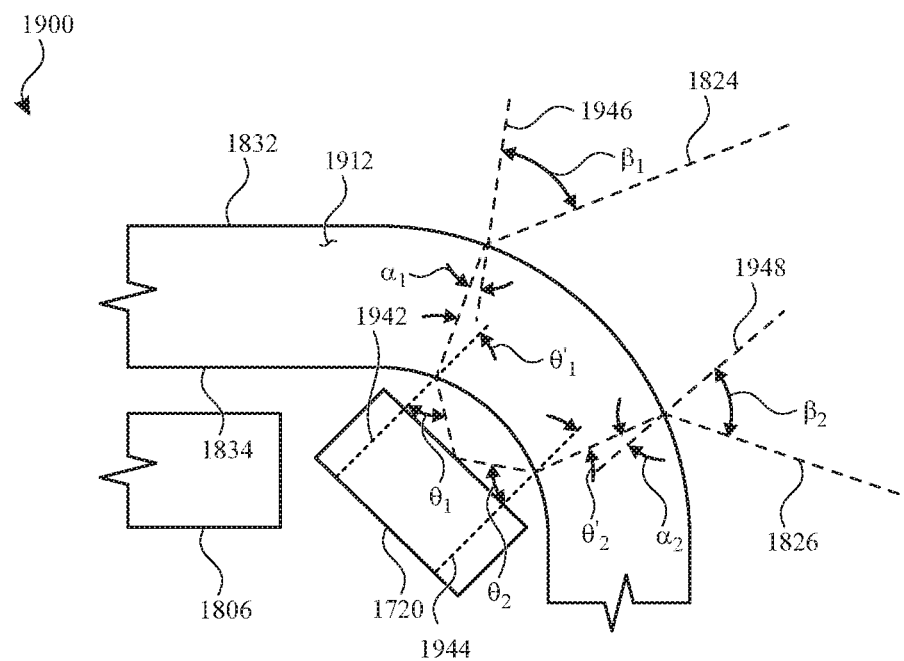
FIG. 19 illustrates a magnified view of the curved portion of a cover substrate of an exemplary wearable device according to examples of this disclosure.

FIG. 19 illustrates a magnified view of the curved portion of cover substrate 1912 (which can correspond to cover substrate 1812 above) including an inner surface 1834, outer surface 1832, and proximity sensor 1720 (which can correspond to proximity sensor 1720 above) mounted to the inner surface of the cover substrate 1912 (e.g., glass) according to examples of the disclosure. In other examples, proximity sensor 1720 need not be mounted to cover substrate 1912, but can be mounted to some other component within the housing and cover substrate 1912 of the device. The initial field of view of proximity sensor 1720 (e.g., the field of view beneath the inner surface of cover substrate 1912) shown in FIG. 19 is defined by an upper bound beneath the cover substrate having an angle $\theta_1$ and a lower bound beneath the cover substrate having an angle $\theta_2$. As shown in FIG. 19, angles $\theta_1$ and $\theta_2$ are expressed with respect to normal lines 1942 and 1944 (shown in dotted line) perpendicular to the boundary at the inner surface. The characteristics of proximity sensor 1720 (such as focal length and lens shape), can be selected to produce desired angles $\theta_1$ and $\theta_2$. As shown, the light path of the upper bound beneath the cover substrate and lower bound beneath the cover substrate can change as the light path enters the cover substrate 1912 at the boundary of the inner surface 1834. In FIG. 19 the angles of the light path as it enters the cover substrate are represented for the upper and lower bounds as $\theta_1'$ and $\theta_2'$ respectively. As indicated in Equation (1), the refractive index n of cover substrate 1912 can define, at least in part, angles $\theta_1'$ and $\theta_2'$. Using Equation (1) to solve for β and substituting variables for those at hand, θ' (e.g., $\theta_1'$ or $\theta_2'$ as illustrated in FIG. 4 can be represented as shown in Equation (2) below:

$$\theta' = \sin^{-1}\left(\frac{n\text{AIR}}{n\text{GLASS}} \times \sin(\theta)\right) \quad (2)$$

One skilled in the art would understand that the refractive index $n_{GLASS}$ of the cover substrate (which could also be made of other transparent materials such as plastic) and the distance and angle at which proximity sensor 1720 is positioned with respect to the inner surface of cover substrate 1912 can be selected to achieve a desired light path within cover substrate 1912. In some examples, angles θ and 0' can be the same, that is, the upper and lower bounds can be symmetric within the cover substrate. For example, the upper and lower bounds may be symmetric when the proximity sensor 1720 is mounted parallel to the inner surface 1834.

The light path of the upper bound 1824 and lower bound 1826 within cover substrate 1912 can be refracted at the boundary between the outer surface of the cover substrate 1912 and air. As shown in FIG. 19, angles $\beta_1$ and $\beta_2$ can represent the exit angles where the upper and lower bounds of the light path (1824 and 1826) exit cover substrate 1912. As shown, angles $\beta_1$ and $\beta_2$ are expressed with respect to the normal lines 1946 and 1948 perpendicular to the boundary at the upper and lower bounds 1824 and 1826, respectively. As indicated in Equation (1), the refractive index $n_{GLASS}$ of cover substrate 1912 can define, at least in part, angles $\beta_1$ and $\beta_2$. Using Equation (1) to solve for β and substituting variables for those at hand, $\beta_1$ or $\beta_2$ as illustrated in FIG. 19 can be represented as shown in Equation (3) below:

$$\beta = \sin^{-1}\left(\frac{n\text{GLASS}}{n\text{AIR}} \times \sin(\alpha)\right) \quad (3)$$

Returning again to FIG. 18, the characteristics of proximity sensor 1720 and cover substrate 1812 can be selected such that the field of view is focused to a particular region about the wearable device 1800 such as the area above crown 1808. As discussed above, the refractivity of the cover substrate material can be selected in order to achieve desired angles $\theta_1'$, $\theta_2'$, $\beta_1$ and $\beta_2$ as shown in FIG. 19. In addition, the curvature of the inner surface 1834 of cover substrate 1812 can be selected to achieve desired angles $\theta_1'$ and $\theta_2'$ Likewise, the curvature of the outer surface 1832 of cover substrate 1812 can be also selected to achieve desired angles $\beta_1$ and $\beta_2$. In addition, the thickness of cover substrate 1812 can be selected to produce desired results. Although the cover substrate has been described herein as comprising a single material for convenience, it should be understood that cover substrate 1812 can comprise multiple materials, including configurations wherein cover substrate comprises layers of materials. In such configurations, the light path of proximity sensor 1720 can undergo multiple refractions at the boundaries between each material. Accordingly, in configurations where cover substrate 1812 comprises multiple layers of materials, the refraction index of one or more of the materials can be selected to achieve a desired field of view for the proximity sensor. It should be noted that, in addition to the above-mentioned approaches, the field of view of proximity sensor 1820 can be further defined using other well-known techniques including, but not limited to, utilizing additional lenses, prisms, or mirrors.

As illustrated in FIG. 18, in some examples, the field of view defined by bounds 1824-1826 of proximity sensor 1720 can extend to an area not normal to the proximity sensor. In some cases, the field of view of proximity sensor 1720 can extend to next to the device 1800. That is, the field of view can include an area adjacent to the device in a direction parallel to the plane of the display 1806 (which can correspond to display 106 above). In some examples, the field of view can extend to an area next to crown 1808 (which can correspond to crown 108 above) in a direction parallel to the plane of touch sensor panel 1836. In some examples, the field of view can include an area proximate to device 1800 at an angle with respect to the plane of touch sensor pane 1836, wherein the angle can be in a range of 10 to 80 degrees.

Figure 20A:
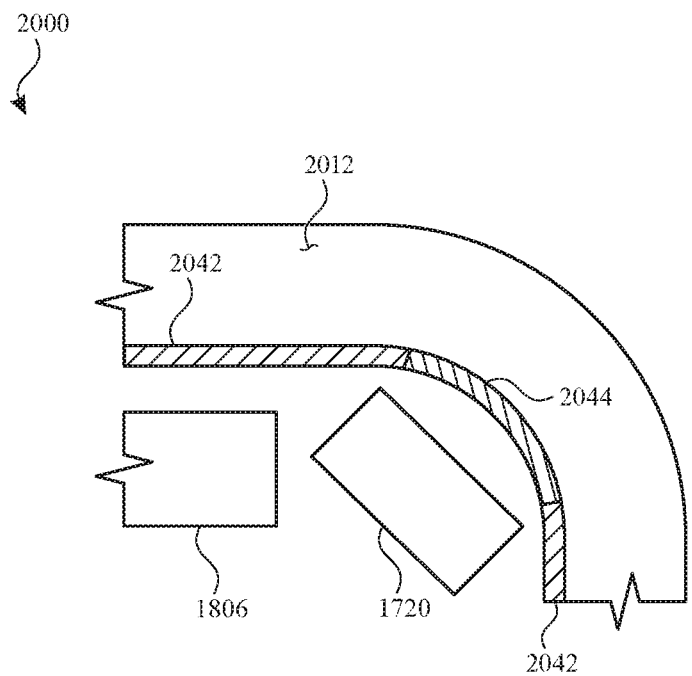
FIGS. 20A and 20B illustrate an optical filtering structure including an optical mask and optical filter according to examples of this disclosure.
Figure 20B:
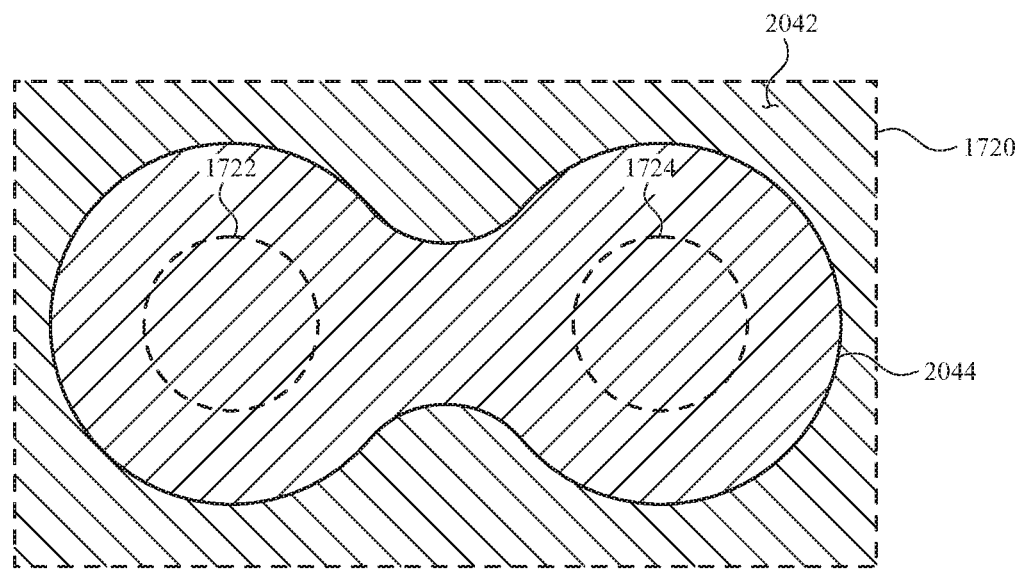

In some examples, a wearable device according to examples of the disclosure can include optical filtering structures. FIGS. 20A and 20B illustrate an optical filtering structure in a device 2000 (which can correspond to device 100 above) including an optical opaque mask 2042 configured to preferentially pass light to and from proximity sensor 1720 and optical filter 2044 according to examples of the disclosure. As shown in FIG. 20A, proximity sensor 1720 can include an opaque mask 2042 (shown in double cross-hatching) which blocks light from entering the proximity sensor at respective areas surrounding the light emitter 1722 and photodetector 1724 of proximity sensor. As shown in FIG. 20B, in some examples, opaque mask 2042 can include respective apertures (e.g., circular openings) in front of light emitter 1722 and photodetector 1724 to allow light to pass through this portion. In some examples, the apertures in front of light emitter 1722 and photodetector 1724 can include an optical filter 2044 formed of a material which is permeable to light of specific wavelengths (e.g., IR wavelengths) and blocks other light (e.g., visible light). In these examples, one or both of the opaque mask 2042 and optical filter 2044 can be formed by depositing opaque or filtering material on the inner surface of cover substrate 2012 (which can correspond to cover substrate 1812 above). FIG. 20B illustrates a top view of the proximity sensor configuration of FIG. 20A in which the area surrounding proximity sensor 1720 includes opaque mask 2042 which can be deposited, for example, on the inner surface of cover substrate 2012. As shown, optical filter 2044 can also be deposited on the inner surface of cover substrate 2012 at locations where light is emitted and received by proximity sensor 1720. In addition, other optical filtering structures not described here are contemplated within the scope of the disclosure including, for example, optical coatings configured to alter the reflection or transmission of light within device 2000.

Figure 21:
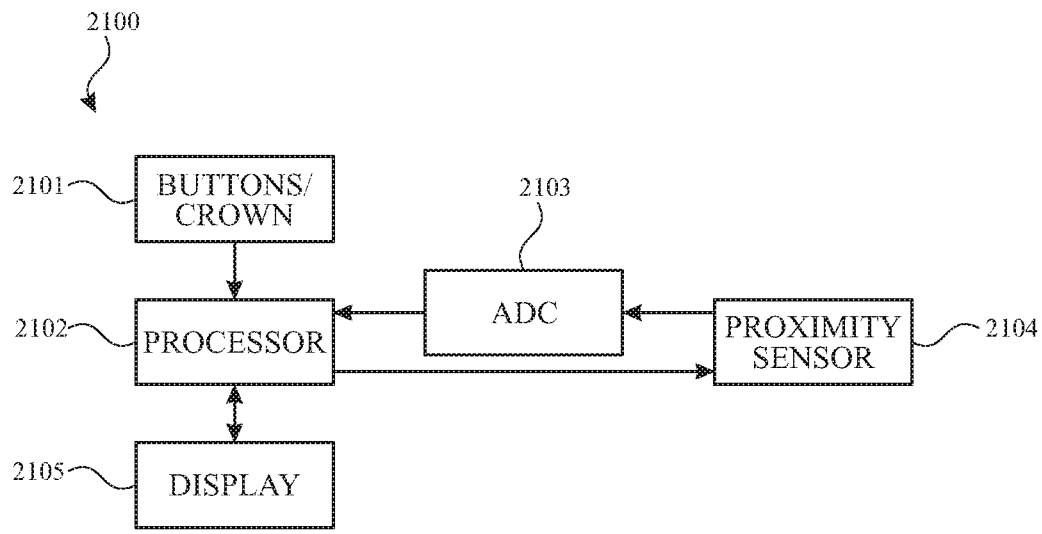
FIG. 21 illustrates a simplified block diagram of an exemplary wearable device according to examples of this disclosure.

FIG. 21 illustrates a simplified block diagram 2100 of wearable device 2100 (which can correspond to device 100 above) according to examples of the disclosure. As shown, device 2100 can include input mechanisms 2101, which can include one or more buttons and crown (e.g., buttons 110, 112, 114, and crown 108 above). Device 2100 may also include a touchscreen 2105, a proximity sensor 2104, and an analog-to-digital converter (ADC) 2103. A processor 2102 may also be included in the wearable device 2100 and be configured to execute algorithms for carrying out the various methods described herein and control the reception and manipulation of input and output data between components of wearable device, e.g., the buttons, crown, display, and emitters and receivers of proximity sensor 2104. The processor can be a single-chip processor or can be implemented with multiple components. It should be understood that the scope of the disclosure is not limited to the components and configuration of FIG. 21, but can include other or additional components in multiple configurations.

Methods for detecting the presence of an object proximate to the crown of a watch are further disclosed herein. In some variations, the methods generally include detecting the presence of a conductive or non-conductive object proximate to the device. In some configurations, the device can detect objects as far as 100 mm from the wearable device. In some configurations, the device can execute one or more operations based on the detection of the presence of an object.

Figure 22:
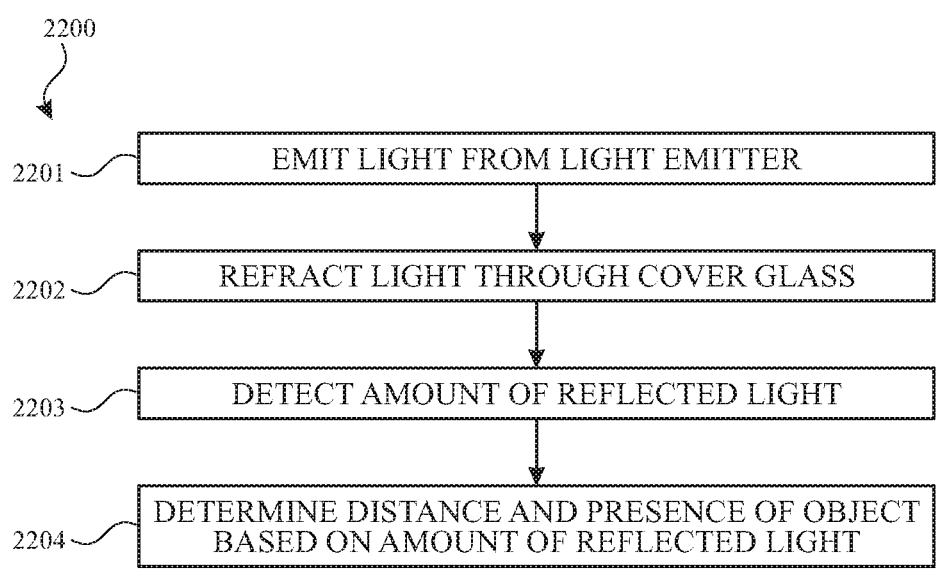
FIG. 22 illustrates an exemplary process for detecting the presence of an object proximate to the device according to examples of this disclosure.

FIG. 22 illustrates an exemplary process 2200 for detecting the presence of a capacitive or non-capacitive object proximate to the device according to examples of the disclosure. At block 2201, the device can emit light from a light emitter. At block 2202, the light can be refracted through a cover substrate as described above with reference to FIGS. 18-19. At block 2203 a photodetector can detect the amount of the emitted light which is reflected back from the emitted light. This amount can be represented as a value. At block 2204, the presence (and in some examples, the distance) of an object can be detected based on the value representing the amount of emitted light which is reflected back. In some examples, a processor can be configured to operate the proximity sensor according to various light-pulsing (i.e., luminous modulation) schemes. For example, referring back to FIG. 21, in some configurations, the processor 2102 can be configured in conjunction with proximity sensor 2104 to pulse and detect light at a frequency less likely to match to the pulse frequency of ambient light (e.g., 120 Hz, which matches the flicker of conventional fluorescent lamps). In some configurations, processor 2102 can be configured in conjunction with proximity sensor 2104 to emit and detect light at changing pulse frequencies, i.e., according to a pulse-frequency hopping scheme.

In some configurations, the device can execute one or more operations based on the detection of the presence of an object. Referring back to FIG. 17, in some examples, device 1700 can determine the distance between object 1730 and crown 1708, including determining when the object is touching the crown (i.e., when the distance between the object and device is zero). Moreover, in some configurations, device 1700 can determine when object 1730 is approaching crown 1708 (i.e., when the distance between object and crown decreases during two successive times) and when object 1730 is traveling away from crown 1708 (i.e., when the distance between object and crown decreases during two successive times). In some examples, different operations can be performed based on whether the object is not touching the crown (e.g., approaching the crown or distancing itself from the crown) or touching the crown. In some configurations, the determination can be performed in conjunction with a touch-sensor on crown 1708 itself (e.g., a capacitive touch sensor).

Figure 23:
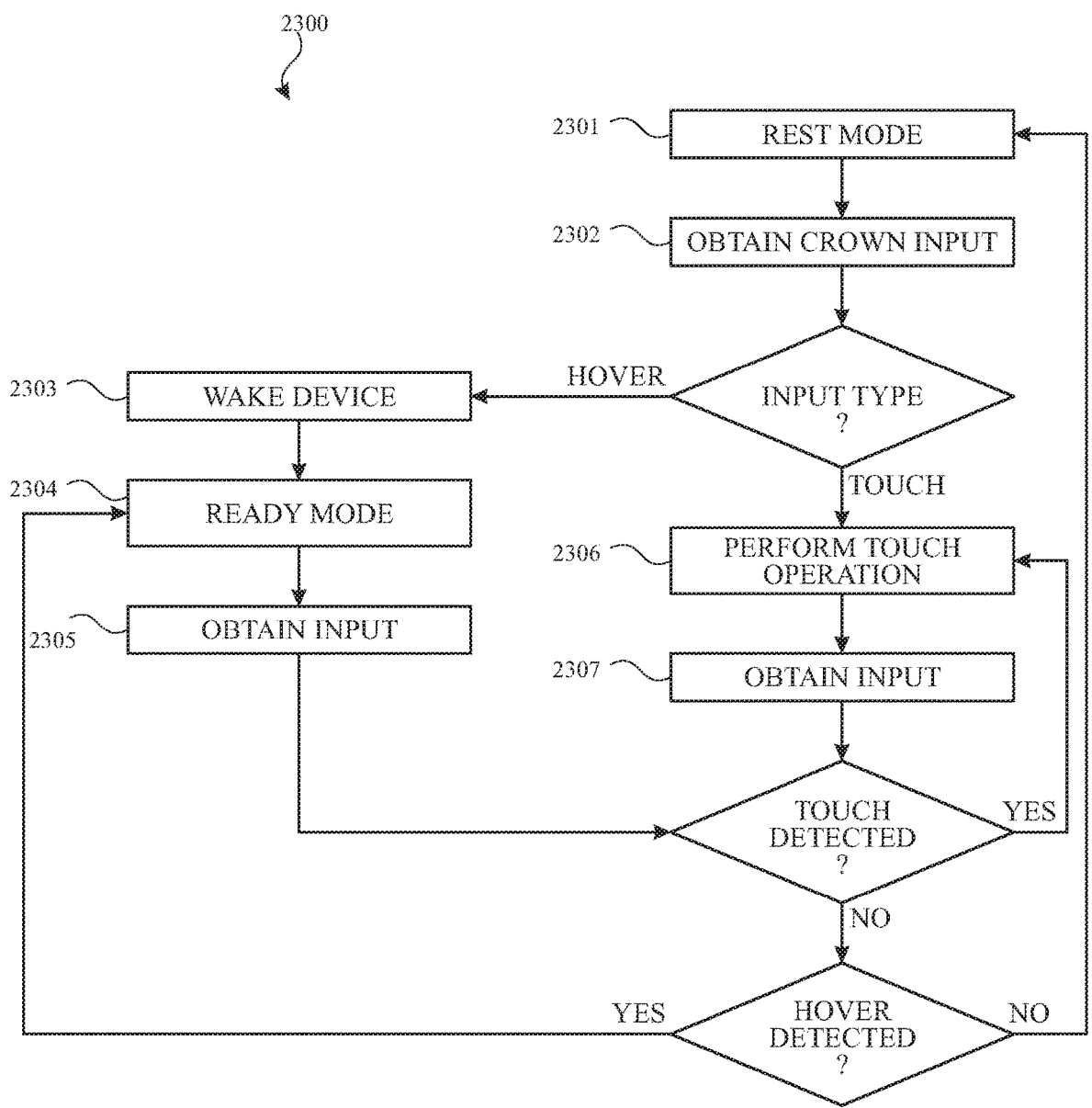
FIG. 23 illustrates an exemplary process for performing operations according to examples of this disclosure.

FIG. 23 illustrates an exemplary process 2300 for performing the operations described above according to examples of the disclosure. At block 2301, the device can be in a rest mode. This may correspond, for example, to a power-saving mode in which the device display is powered down. In other examples, the rest mode can correspond to a device mode where the display is operative, but the device is not performing an operation (e.g., a touch or hover operation). At block 2302, device can obtain crown input from, for example, the proximity sensor. If the input represents a crown touch, processing proceeds to block 2306. At block 2306, a touch operation can be performed. The touch operation can correspond, for example, to a display of a contextual message on the device display, the selection of an icon on a screen, etc. During the performance of the touch operation at block 2306, the device can again obtain crown input, as shown in block 2307. If a touch is still detected, then the touch operation can continue to be performed in block 2306. If a touch is no longer detected, processing can determine whether a hover input (i.e., an object proximate to, but not touching, the crown) is detected. If, however, a hover is not detected, processing can return the device to rest mode shown in block 2301. If a hover input is detected, processing can set the device to ready mode as shown in block 2304. Ready mode will be described in more detail shortly. Returning again to block 2302, if the crown input obtained is a hover input, processing can proceed to block 2303, where processing can wake the device, and next configure the device to be in ready mode as indicated in block 2304. Ready mode can correspond, for example, to a mode where the device is preparing to receive a touch input. During the ready mode at block 2304, the device can again obtain crown input, as shown in block 2305. If a touch is detected, then processing can proceed to block 2306 to perform a touch operation. After performing a touch operation at block 2306, process 2300 can obtain an input at block 2307. If a touch is not detected at block 2304 or block 2307, processing can determine whether a hover input is still detected. If a hover is still detected, processing can return to block 2304 where the device continues to operate in ready mode. If, however, hover is no longer detected, then processing can return to rest mode in block 2301.

Figure 24:
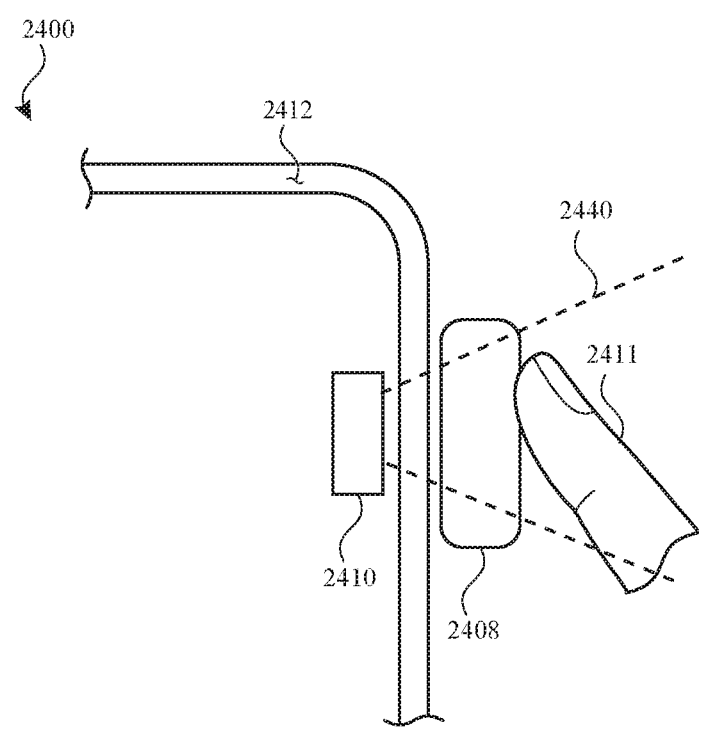
FIG. 24 shows an exemplary optical proximity sensor integrated in a wearable device according to examples of this disclosure.

FIG. 24 shows an alternative exemplary optical proximity sensor 2410 integrated in a wearable device 2400 (which can correspond to device 100 above) according to examples of the disclosure. As shown, proximity sensor 2410 can determine the presence and/or range of object 2411 (e.g., a user finger) using any appropriate method. In some configurations, proximity sensors can operate by emitting light and detecting light reflected off of an object. In some examples, the light can be emitted through a cover substrate 2412 (which can correspond to cover substrate 1812 above). In some examples, proximity sensor can have a field of view 2440, which can include an area above crown 2408 (which can correspond to crown 108 above). In some examples, proximity sensor 2410 can detect objects at a distance ranging from 0 mm (i.e., when an object is touching the device) to 100 mm. In some examples, device 2400 can have a corresponding block diagram as illustrated in FIG. 21.

As described above, in some cases, it can be beneficial to detect the proximity of objects having different levels of optical reflectivity, where each object may interact with a device. For example, a gloved finger, a bare finger, a dry finger, or a finger has lotion on the skin may all have different levels of optical reflectivity. It can be beneficial for a device to determine the presence of objects such as these at a range of distances from the device. For instance, it can be beneficial to detect whether an object is present at a "trigger distance," at which the proximity sensor determines that an object is proximate to the proximity sensor (e.g., a finger is proximate to a crown of a wearable device). Similarly, it can be beneficial to detect whether an object is present at a "release distance," at which, if the object is not detected, the proximity sensor determines than an object is not proximate to the proximity sensor (e.g., a finger is not proximate to the crown of the wearable device).

Figure 25:
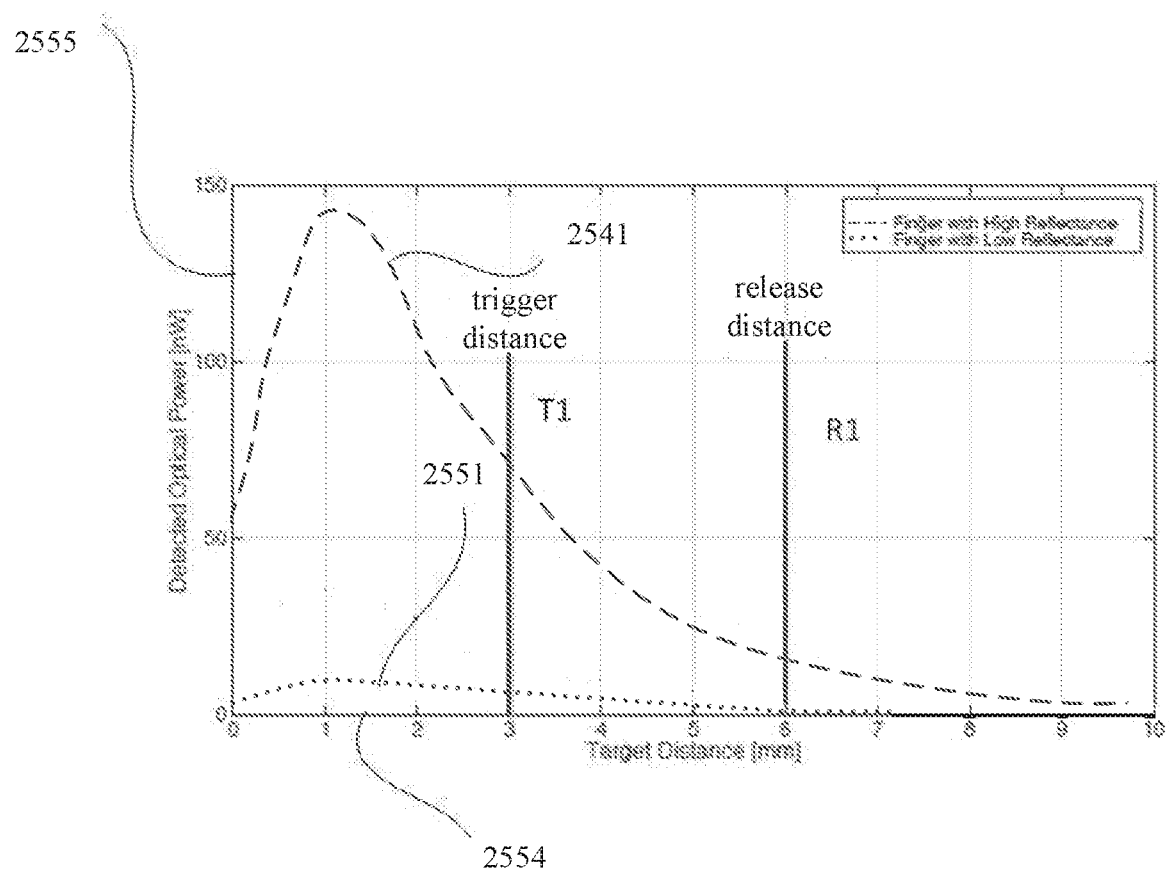
FIG. 25 illustrates a graph relating to proximity detection using a single-channel amplitude-based optical proximity sensor according to examples of this disclosure.

FIG. 25 illustrates a graph relating to proximity detection using a single-channel amplitude-based optical proximity sensor according to examples of the disclosure. The x-axis 2554 can represent the distance of an object (e.g., object 2411 in FIG. 24) from the single-channel proximity sensor in units of millimeters. The y-axis 2555 can represent the detected amplitude of light received by a single light detector originating from a single emitter in units of nanowatts (nW). Also shown is a trigger distance, T1, and release distance, R1. As discussed above, trigger distance T1 can represent a point at which the proximity sensor determines that an object is proximate to the proximity sensor. Likewise, release distance R1 can represent a point at which the proximity sensor determines than an object is not proximate to the proximity sensor. In some examples, trigger distance T1 can be 3 mm from the proximity sensor, and release distance R1 can be 6 mm from the proximity sensor. FIG. 25 illustrates two curves 2541 and 2551. First curve 2541 can represent light detected by the single light detector which is emitted by a single light emitter and reflected off of an object having a Lambertian (matte or diffusely reflecting) surface. This may correlate, for example, to a scenario in which light is reflected from the emitter off of a dry finger. Second curve 2551 represents light received by the single detector which is emitted by the single light emitter and reflected off of an object having a more specular (more reflective) surface. This may correlate, for example, to a scenario in which light is reflected from the emitter off of an oily surface of a finger (e.g., a finger having a coating of hand lotion). As shown, at trigger distance T1, curve 2541 (corresponding to an object having a Lambertian surface) can have a first value (in this example about 70 nW of optical power). In contrast, at trigger distance T1, curve 2551 (corresponding to an object having a more specular surface) can have a second value significantly lower than the value of curve 2541 (in this example, about 3 nW of optical power). Likewise, as shown, curve 2551 can have a value significantly lower than that of curve 341 at release distance R1. Accordingly, in some examples, a single-channel proximity sensor cannot unambiguously detect the presence of an object at trigger distance T1, or at release distance R1.

Figure 26B:
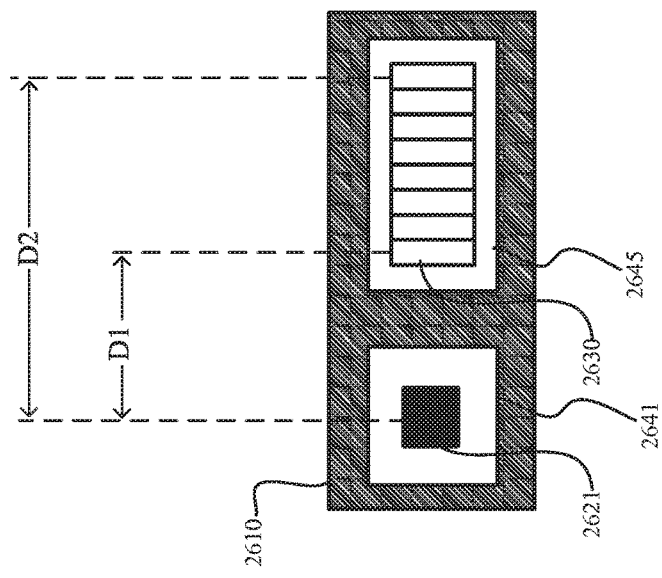
FIGS. 26A-26C illustrate an example configuration of a parallax-based proximity sensor including an array of light detectors according to examples of this disclosure.
Figure 26A:
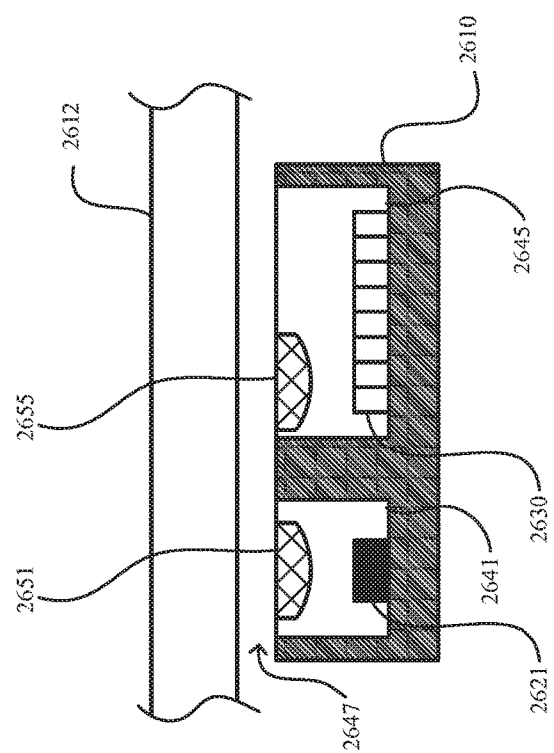
Figure 26C:
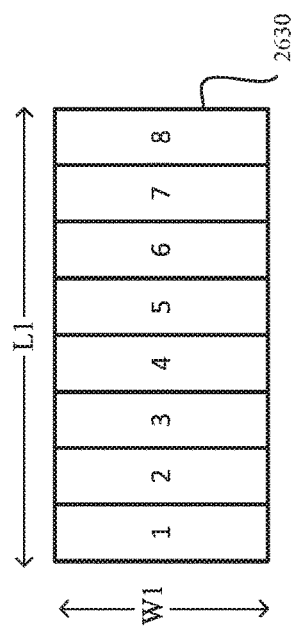

In some examples, a proximity sensor (e.g., proximity sensor 2410 shown in FIG. 24) can utilize an array of light detectors to perform parallax-based proximity sensing. FIGS. 26A-26C illustrate an example configuration of a parallax-based proximity sensor including an array of light detectors according to examples of the disclosure. In the example configuration shown here, proximity sensor 2610 uses a light emitter 2621 (e.g., a light-emitting diode (LED)) and an array of light detectors 2630 (e.g., an array of photodetectors). FIG. 26A illustrates a cross-sectional side view of proximity sensor 2610, while FIG. 26B illustrates a top view. FIG. 26C illustrates a detailed view of detector array 2630, which includes detectors 1-8 labeled accordingly, though it should be understood that detector array 2630 can include any number of detectors according to examples of the disclosure.

As shown, in some examples, emitter 2621 and detector array 2630 can be aligned in a direction parallel to the cover substrate 2612 (which can correspond to cover substrate 1812 above). Detector array 2630 can have a length L1 from end-to-end which can be, for example, in the range of 1 mm to 1.8 mm. Detector array 2630 can also have a width W1, which can be, for example, in the range of 0.3 mm to 1 mm. As shown, light emitter 2621 and detector array 2630 can each be positioned within respective cavities 2641 and 2645. As shown in FIG. 26A, in some examples, each of light emitter 2621 and detector array 2630 can correspond to respective imaging lenses 2651 and 2655, which can direct emitted light or (in the case of detector array 2630) received light so as to form a desired field of view, which can correspond, for example, to the field of view 2440 shown in FIG. 24. In some examples, imaging lens 2655 corresponding to detector array 2630 can be positioned off-center with respect to the length of detector array 2630. For example, as shown in FIGS. 26A and 26C, imaging lens 2655 can be positioned above the detectors 2 and 3 of array 2630 which is nearer to emitter 2621 than the center point along the length of detector array 2630 between detectors 4 and 5. In some configurations, the individual field of view of each of the detectors in detector array can overlap such that, for example, light seen by one detector can also be seen by an adjacent detector.

In some examples, proximity sensor 2610 can be positioned such that emitted and reflected light passes through a cover substrate 2612 of a device (which can correspond to cover substrate 1812 above). In some examples, proximity sensor 2610 can be positioned such that an air gap 2647 exists between the imaging lenses 2651, 2655 and cover substrate 2612. For ease of illustration, cover substrate 2612, air gap 2647, and imaging lenses 2651, 2655 are not shown in FIG. 26B. As shown, in some examples, light emitter 2621 can be separated from detector 1 of detector array 2630 by a first center-to-center distance D1, while detector 8 can be separated from emitter 2621 by a second center-to-center distance D2, which is greater than distance D1.

The operation of the example proximity sensor 2610 illustrated in FIGS. 26A-26C will now be discussed with reference to the examples shown in FIGS. 27A-27H below. FIGS. 27A-27H illustrate an example operation of a parallax-based proximity sensor 2610 described with reference to FIGS. 26A-26C, according to examples of the disclosure. FIGS. 27A-27C and 27E-27G relate to a scenario in which an object 2711 has a first optical reflectivity level, and FIGS. 27D and 27H relate to a scenario in which a different object 2713 has a second reflectivity level lower than that of object 2711.

In these examples, proximity sensor 2610 can operate by detecting the centroid (and in some examples the size and shape) of the light received by detector array 2630 (labeled here as 2630A, 2630B, 2630C, and 2630D for ease of reference). As shown, light can be emitted by emitter 2621, pass through lens 2651 (e.g., a collimating lens), reflect off of an object (object 2711 in FIGS. 27A-27C, object 2713 in FIG. 27D), pass through lens 2655 (e.g., a converging lens), and be received by one or more of detectors 1-8 of detector array 2630. As shown, emitter 2621 and detector array 2630 can be aligned in a first direction, which can be parallel to cover substrate 2612. Detectors 1-8 of detector array 2630 can also be aligned in the first direction as to have a collective length L1 from one end to the other as shown in FIGS. 27E-27H. As will be explained, due to parallax in the imaging path, the detected light received by detector array 2630 can move across the detector array in the first direction as a function of the distance of the object to proximity sensor 2610, the distance measured in a direction orthogonal to the first direction. It should be understood that, while 8 detectors are shown here, detector arrays can include any number of detectors. Moreover, as will be explained further with reference to FIGS. 30A-30B below, in some configurations, detector arrays may be two-dimensional.

Figure 27B:
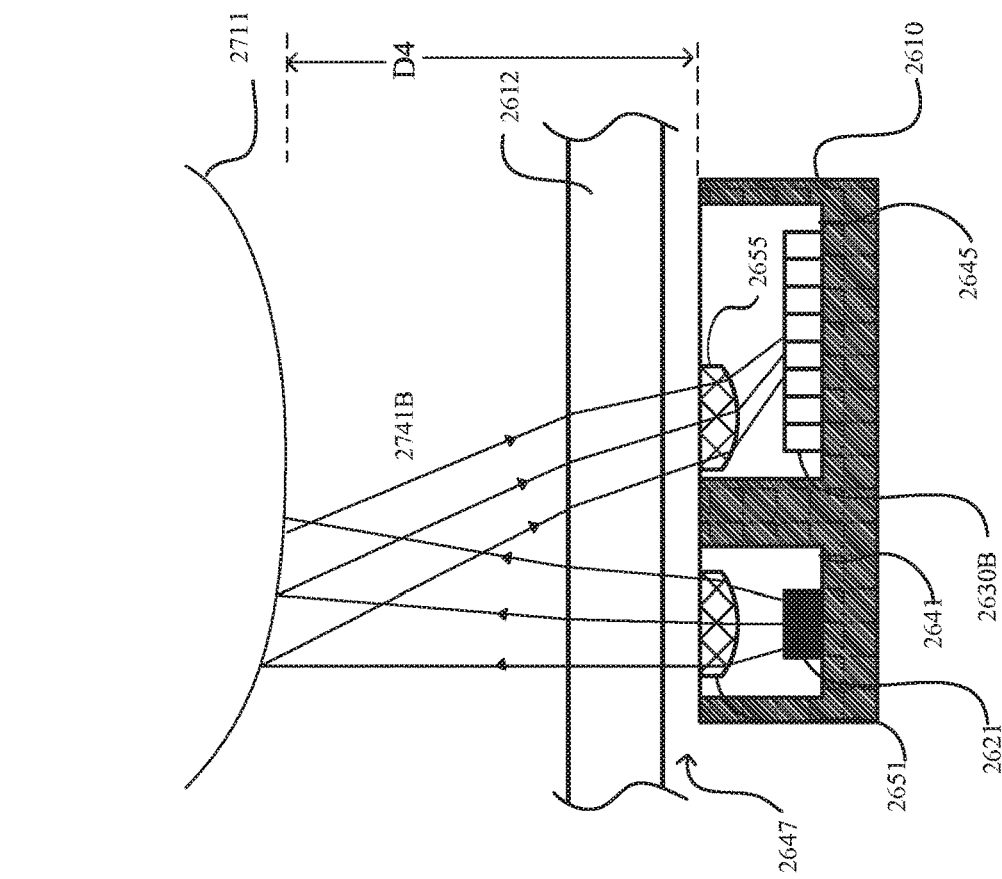
Figure 27A:
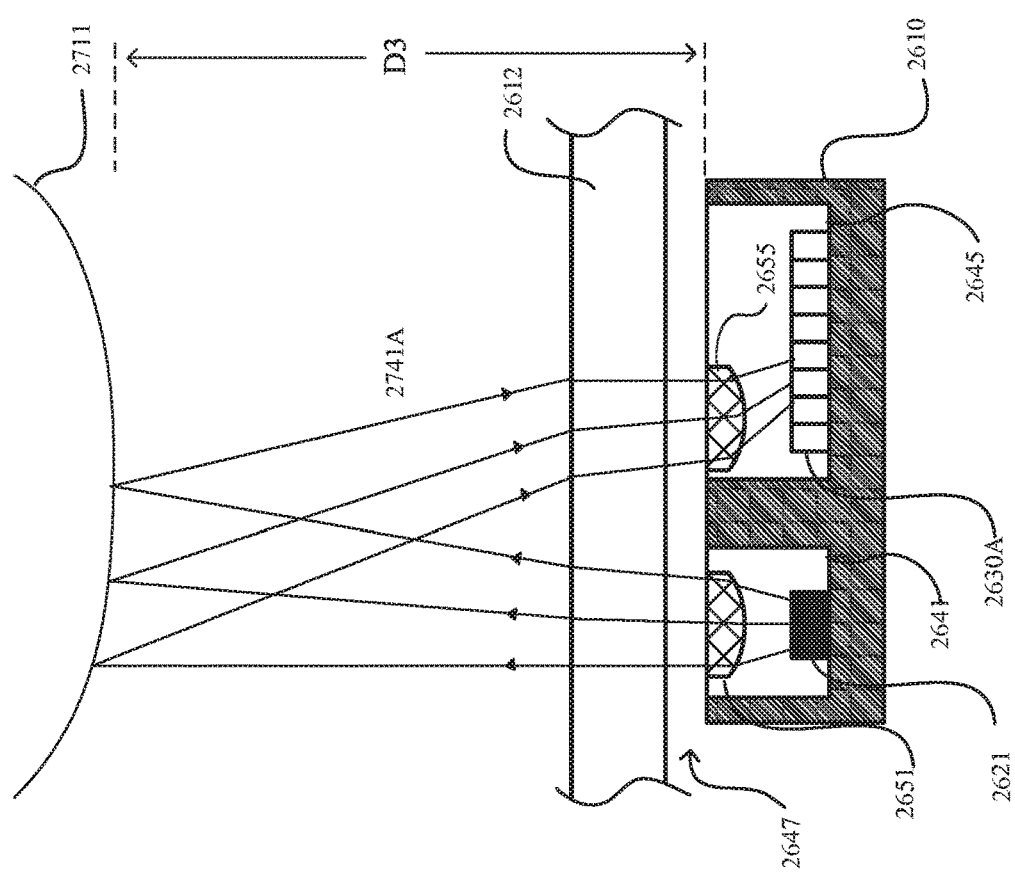
Figure 27E:
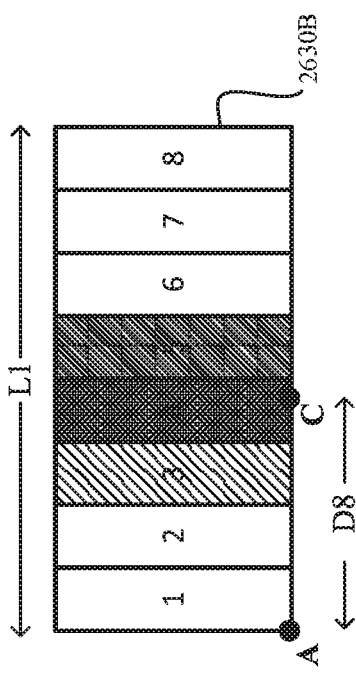

FIG. 27A illustrates a first scenario where an object 2711 (corresponding, for example, to finger 2411 shown in FIG. 24) is positioned at a distance D3 from proximity sensor 2610. FIG. 27E illustrates a representation of the amplitude of light received at each of detectors 1-8 in detector array 2630A (so labeled for ease of reference) shown in FIG. 27A, with darker areas indicating a higher amplitude of light. In FIG. 27A, the light path 2741A is represented symbolically as lines with arrows indicating direction. As shown in FIGS. 27A and 27E, when object 2711 is positioned at relatively far distance D3, light passing through lens 2655 can be directed primarily to detector 3 of detector array 2630A, with lesser parts of the light directed equally to adjacent detectors 2 and 4. In some examples, the one-dimensional centroid of the received light from light path 2651A can be calculated using the respective amplitudes detected by detectors 1-8 of detector array 2630. In some examples, the determined centroid can be determined only in terms of which detector the centroid is located. For example, in the scenario shown in FIG. 27E, the centroid can be calculated merely to be in the area of detector 3. In these examples, the centroid can be estimated to be in the center of the detector (i.e., in the center of detector 3 in this example). In other configurations, interpolation can be used to more precisely determine the centroid. For example, in this scenario, the amplitude detected by detector 3 and the equal amplitude detected by detectors 2 and 4 can be used to determine that the centroid is located at a distance D7, measured from a point A to point B, where point A is located at the end of detector array nearest to emitter 2621 and point B can be located midway between the border of detectors 2 and 3 and the border of detectors 2 and 4. In some examples, the centroid of the light received by detector array 2630 can be used to determine that object 2711 is at a distance D3 from the proximity sensor.

Figure 27F:
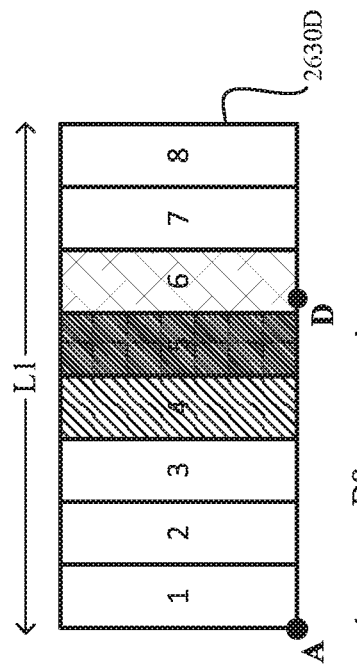

FIG. 27B illustrates a second scenario where object 2711 is at a distance D4 from proximity sensor 2610, where distance D4 is less than distance D3. FIG. 27F illustrates a representation of the amplitude of light received at each of detectors 1-8 in detector array 2630B (so labeled for ease of reference), with darker areas indicating a higher amplitude of light. The light path 2741B is represented symbolically as lines with arrows indicating direction. As shown, due to parallax in the imaging path, the light path can be directed to a different position on the detector array 2630 than in the scenario described with reference to FIGS. 27A and 27E. Here, when object 2711 is positioned at a distance D4, smaller than D3, light passing through lens 2655 can be directed primarily to detector 4 of detector array 2630B, with a lesser part directed to adjacent detector 5 and an even lesser part directed to adjacent detector 3. Therefore, in the scenario shown in FIG. 27F, the centroid can be calculated to be in the area of detector 4, or if interpolation is used, the centroid can be calculated to be a distance D8, greater than D7, where D8 is measured from point A to a point C in the area of detector 4, but nearer to detector 5 than detector 3. The centroid of the light received by detector array 2630 can be used to determine that object 2711 is at a distance D4 from the proximity sensor.

FIG. 27C illustrates a third scenario where object 2711 is at a distance D5 from proximity sensor 2610, where distance D5 is less than distance D4. FIG. 27F illustrates a representation of the amplitude of light received at each of detectors 1-8 in detector array 2630C with darker areas indicating a higher amplitude of light. In FIG. 27C, the light path 2741C is represented symbolically as lines with arrows indicating direction. As shown, the light path can be directed to a different position on the detector array 2630 than in the scenarios described above with reference to FIGS. 27A and 27B. Here, when object 2711 is positioned at a distance D5, smaller than D4, light passing through lens 2655 can be directed primarily to detector 6 of detector array 2630C, with a lesser part light directed to adjacent detector 5 and an even lesser part directed to adjacent detector 7. Therefore, in the scenario shown in FIG. 27G, the centroid can be calculated to be in the area of detector 6, or if interpolation is used, the centroid can be more specifically calculated to be at a distance D9, greater than D8, where D9 is measured from point A to a point D located in the area of detector 6 and nearer to detector 5 than detector 7. The centroid of the light received by detector array 2630C can be used to determine that object 2711 is at a distance D4 from the proximity sensor.

Figure 27G:
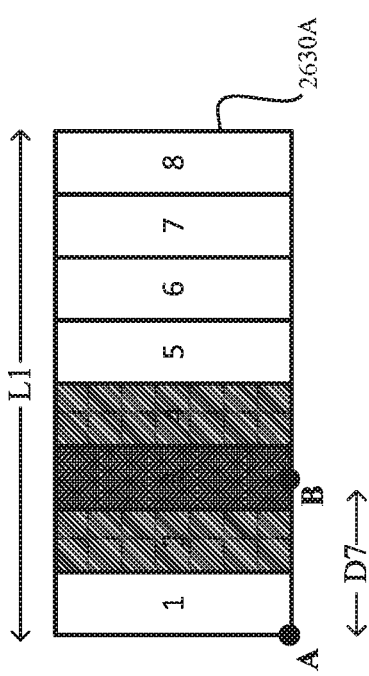
Figure 27H:
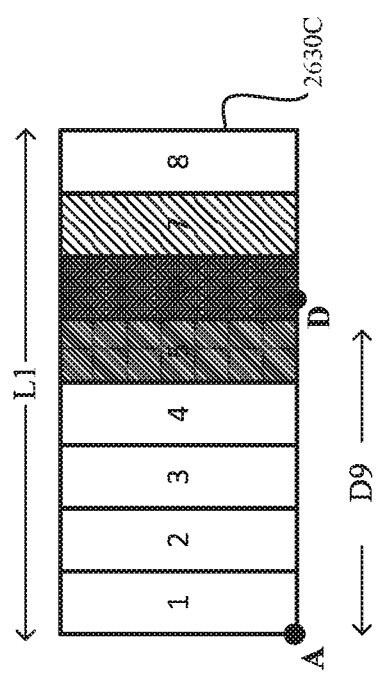

FIG. 27D illustrates a fourth scenario where a different object 2713 is at the distance D5 from proximity sensor 2610, as similarly shown with reference to object 2711 in FIG. 27C. As similarly shown in FIG. 27C, FIG. 27D illustrates that light can be emitted and reflected off of object 2713 and follow a light path 2741D. However, unlike FIG. 27C, in FIG. 27D, object 2713 can be less optically reflective than object 2711. Therefore, though the same amount of light can be emitted from emitter 2621, less light is reflected back to detector array 2630D (so labeled for ease of reference). Despite this, light path 2741D follows substantially the same path as 2741C shown in FIG. 27C. Thus, as in FIG. 27G, FIG. 27H illustrates that when object 2711 is positioned at a distance D5, light passing through lens 2655 can be directed primarily to detector 6 of detector array 2630D, with a lesser part directed to adjacent detector 5 and an even lesser part directed to adjacent detector 7. Although the magnitude of light to each of detectors 1-8 in detector array 2630D is less than those shown in detectors 1-8, respectively, of detector 2630C, the location of the centroid will still be in the area of detector 6, and more specifically at distance D9 if interpolation is utilized. Consequently, the centroid of the light received by detector array 2630D can be used to determine that object 2713 (having a second level of reflectivity) is at a distance D4 from the proximity sensor, just as object 2711 (having a first level of reflectivity) was at the distance D4 in the scenario of FIG. 27C.

In addition to detecting the centroid of light detected at detector array 2630, in some examples, detector array 2630 can also detect the one-dimensional shape and/or size of the detected light, which can also change as a function of the distance of the object to the proximity sensor. For example, in some configurations, as a distance between an object and proximity sensor decreases, a detected size of a spot created by the detected light may increase. Moreover, in some examples the detected shape and/or size of the detected light can be used in conjunction with the detected centroid to determine optical reflectance characteristics of an object.

As discussed above with reference to FIG. 25, the detected optical power at a detector can vary greatly depending on the reflectance of an object. Therefore, it can be difficult to unambiguously detect the presence of an object at both the trigger distance T1 and release distance R1 using a single-channel amplitude-based proximity sensor. More generally, it can be beneficial to unambiguously detect the presence of objects having different reflective characteristics at a range of distances from the proximity sensor. Therefore, based on the above, it can be beneficial to unambiguously detect the presence of objects having different reflective characteristics at both the trigger distance T1 and release distance R2 using a parallax-based proximity sensor, such as the sensor 2610 discussed above with reference to FIGS. 26A-26B. This is illustrated and explained below with reference to the graph shown in FIG. 28.

Figure 28:
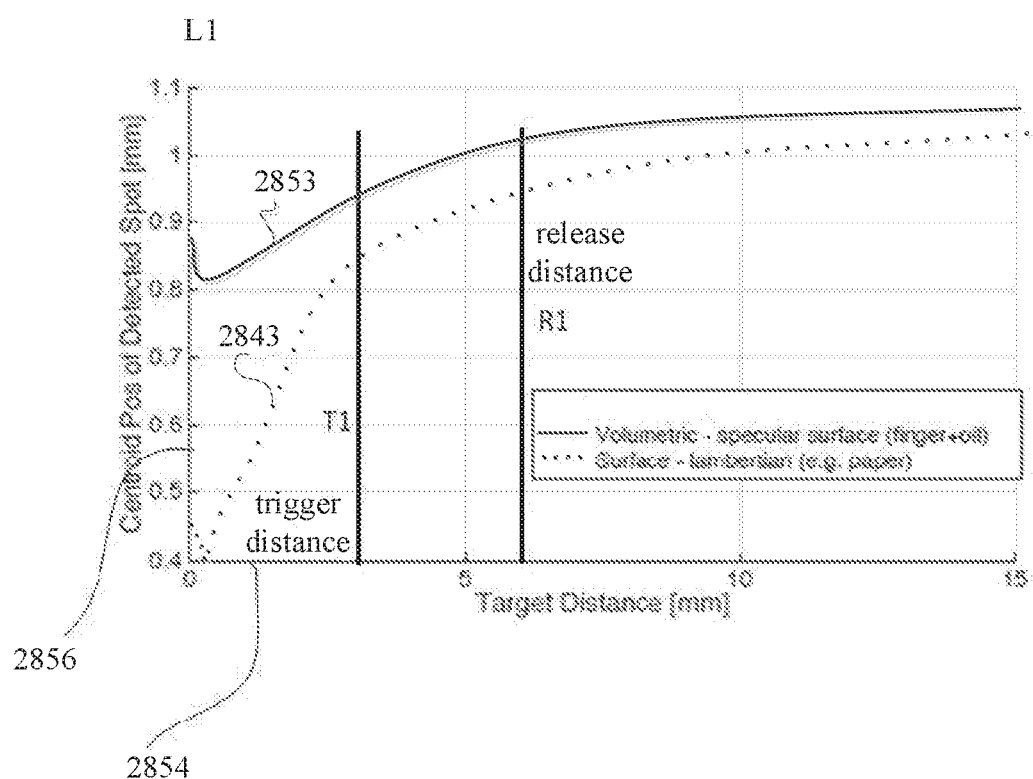
FIG. 28 illustrates a graph relating to proximity detection of a parallax-based proximity sensor including an array of light detectors according to examples of this disclosure.

FIG. 28 illustrates a graph relating to proximity detection of the proximity sensor 410 described above with reference to FIGS. 26A-26B and 27A-27H according to examples of the disclosure. FIG. 28 relates to proximity detection using the position of a centroid of light detected by an array of light detectors (e.g., detector array 2630). The x-axis 2854 in FIG. 28 can represent the distance of an object to a proximity sensor in units of millimeters. This distance can correspond, for example, to distances D3, D4, or D5 from proximity sensor 2610 to object 2711 or 2713 as shown in FIGS. 27A-2D. The y-axis 656 represents the centroid position of light detected by the array of light detectors with respect to the length of the array of light detectors, L1. L1 can correspond, for example, to the length L1 shown in FIGS. 5E-5H above. Also shown is a trigger distance, T1, and release distance, R1, which can be similar to the trigger distance T1 and R1 explained above with reference to FIG. 3. In some examples, trigger distance T1 can be 3 mm from the proximity sensor, and release distance R1 can be 6 mm from the proximity sensor.

FIG. 28 illustrates two curves 2843 and 2853. First curve 2843 can represent a scenario in which respective light is received by a detector array (e.g., detector array 430) which is emitted by the light emitter (e.g., light emitter 2621 above) and reflected off of an object having a Lambertian (matte or diffusely reflecting) surface. This can correspond, for example, to the scenario set forth above with reference to curve 2541 of FIG. 25. Second curve 2853 can represent a scenario in which light is received by a detector array which is emitted by the light emitter and reflected off of an object having a more specular (more reflective) surface. This can correspond, for example, to the scenario set forth above with reference to curve 2551 of FIG. 25. However, unlike the graph shown in FIG. 25, in which curves 2541 and 2551 represent the amount of detected optical power by a single emitter and detector, here, curves 2843 and 2853 represent the position of the centroid of the received light with respect to the length (L1) of the detector array as a function of the distance of an object from the proximity sensor. As shown, unlike the curves in FIG. 25, here, at both trigger distance T1 and release distance R1, curves 2843 and 2853 are sufficiently close to one another (i.e., the centroid positions are sufficiently close to one another) such that the presence of objects having both Lambertian and specular surfaces can be reliably detected at distances T1 and R1.

Figure 29:
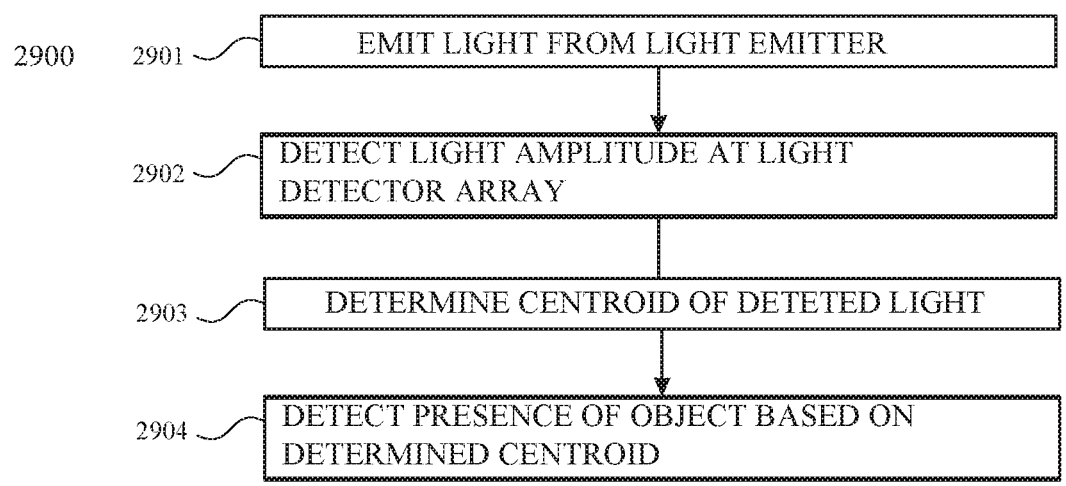
FIG. 29 illustrates an exemplary process for proximity detection using a parallax-based proximity sensor including an array of light detectors according to examples of this disclosure.

FIG. 29 illustrates an exemplary process 2900 for proximity detection using a parallax-based proximity sensor including an array of light detectors, such as detector array 2630 described with reference to FIGS. 26A-26C and 27A-27H above, according to examples of the disclosure. At block 2901, the device can emit light from a light emitter. At block 2902 a plurality of light detectors, such as a detector array, can detect respective amplitudes of light received at each detector originating from the light emitter. At block 2903, a centroid of the light received at the detector array is determined. In some configurations, the centroid can be determined only to be within the area of a detector. In some configurations, interpolation can be used to more precisely determine a location of the centroid within a detector based, at least in part, on the amplitudes of adjacent cells. In still other examples, the position of a light path (e.g., the position of the centroid) can be estimated based on which of the detectors in the detector array receive a maximum amplitude of light. At block 2904, the presence (and in some examples, the distance) of an object can be detected based on the determined position of the centroid. In some examples, the proximity sensor can be configured to determine a continuous range of distances of an object. In other examples, the proximity sensor can be configured to detect the presence of an object at only one or more discrete distances (e.g., the threshold and release distances T1 and R1 discussed above with reference to FIG. 28).

In some examples, a processor can be configured to operate the proximity sensor according to various light-pulsing (i.e., luminous modulation) schemes. For example, referring back to FIG. 24, in some configurations, a processor (e.g., processor 2102 above) can be configured in conjunction with proximity sensor 2410 to pulse and detect light at a frequency less likely to match to the pulse frequency of ambient light (e.g., 120 Hz, which matches the flicker of conventional fluorescent lamps). In some configurations, processor 2102 shown in FIG. 21 can be configured in conjunction with proximity sensor 2410 to emit and detect light at changing pulse frequencies, i.e., according to a pulse-frequency hopping scheme.

As shown in the examples explained above with reference to FIGS. 26-28, a proximity sensor can utilize a one-dimensional detector array to determine the distance of an object using the one-dimensional centroid of the light detected by the detector array. In addition or alternatively to the above-discussed examples, in some configurations, a proximity sensor (e.g., the proximity sensor 2410 shown in FIG. 24) can include a two-dimensional detector array. In these configurations, the characteristics of light detected by the two-dimensional detector array can be used to detect the presence of objects having different reflective characteristics at a range of distances from the proximity sensor.

Figure 30B:
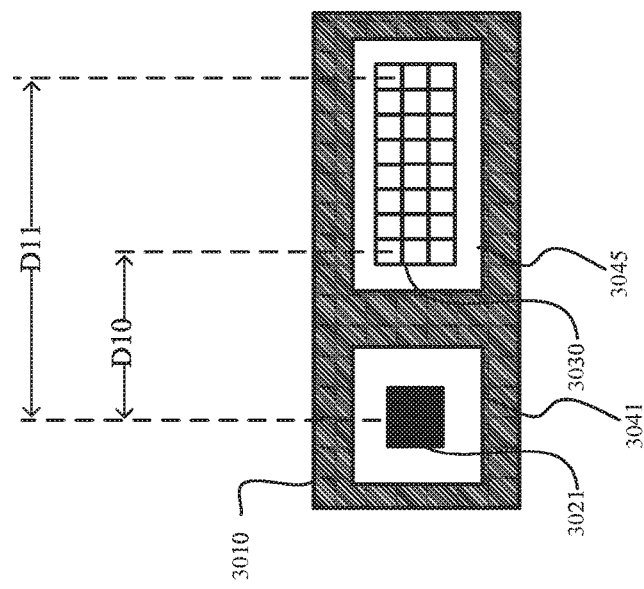
FIGS. 30A-30C illustrate an example configuration of a parallax-based proximity sensor including a two-dimensional array of light detectors according to examples of this disclosure.
Figure 30A:
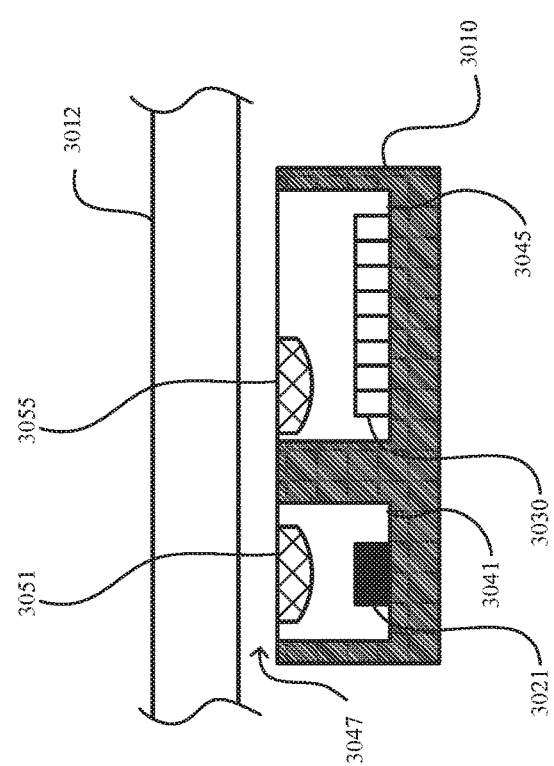
Figure 30C:
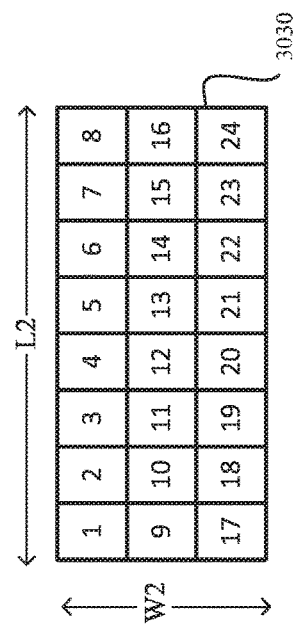

FIGS. 30A-30C illustrate an example configuration of a parallax-based proximity sensor which uses a two-dimensional detector array according to examples of the disclosure. In the example configuration shown here, proximity sensor 3010 uses a two-dimensional detector array 3030 and a single light emitter 3021 (e.g., an LED). FIG. 30A illustrates a cross-sectional side view of proximity sensor 3010, while FIG. 30B illustrates a top view. FIG. 30C illustrates a detailed view of detector array 3030, which includes detectors 1-24 labeled accordingly, though it should be understood that detector array 3030 can include any number of detectors according to examples of the disclosure. Detector array 3030 can have a length L2 from end-to-end which can be, for example, in the range of 1 mm to 1.8 mm. Detector array 3030 can also have a width W2, which can be, for example, in the range of 0.3 mm to 1 mm. In some configurations, W2 and L2 can correspond, for example, to the width and length W1 and L1 described above with reference to FIG. 26C above. As shown, in some examples, emitter 3021 and detector array 3030 can be aligned in a direction parallel to the cover substrate 3012 (which can correspond to cover substrate 1812 above).

As in the examples described above with reference to FIGS. 26A-26B, light emitter 3021 and detector array 3030 can each be positioned within respective cavities 3041 and 3045, and proximity sensor 3030 can include lenses 3051 (e.g., a collimating lens) and 3055 (e.g., a converging lens), where imaging lens 3055 corresponding to detector array 3030 can be positioned off-center with respect to the length of detector array 3030. Moreover, as in FIGS. 26A-26B, emitted and reflected light can pass through a cover substrate 3012 of a device, and proximity sensor 3010 can be positioned such that an air gap 3047 exists between the imaging lenses 3051, 3055 and cover substrate 3012. For ease of illustration, cover substrate 3012, air gap 3047, and imaging lenses 3051, 3055 are not shown in FIG. 30B. As shown, in some examples, light emitter 3021 can be separated from a first column of detectors (i.e., detectors 1, 9, 17) of detector array 3030 by a first center-to-center distance D10, while the light emitter can be separated from an eighth column of detectors (i.e., detectors 8, 16, 24) by a second center-to-center distance D11, which can be greater than distance D10.

Figure 31A:
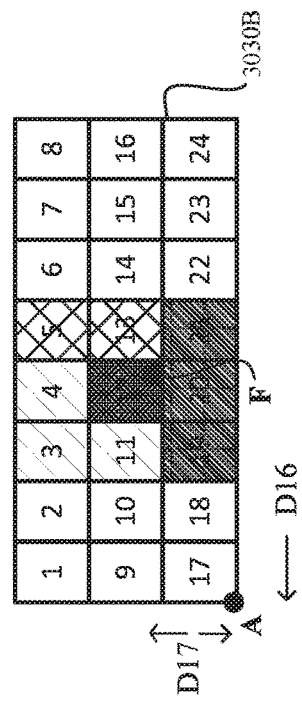
FIGS. 31A-31D illustrate an example operation of a parallax-based proximity sensor including a two-dimensional array of light detectors according to examples of this disclosure.
Figure 31B:
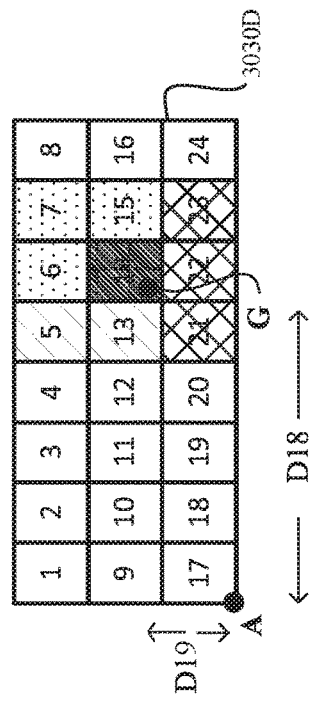
Figure 31C:
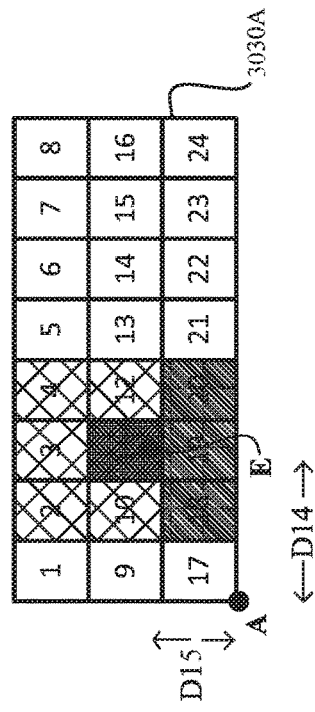

The operation of the example proximity sensor 3010 illustrated in FIGS. 30A-30C will now be discussed with reference to the examples shown in FIGS. 31A-31D below. FIGS. 31A-31D illustrate an example operation of a proximity sensor including a two-dimensional detector array 3030 described with reference to FIGS. 30A-30C, according to examples of the disclosure. FIGS. 31A-31C relate to a scenario in which an object has a first optical reflectivity level, and FIG. 31D relates to a scenario in which an object has a second reflectivity level lower than the first reflectivity level. In each of the detector arrays depicted in FIGS. 30A-30D, the amplitude of light received by each of detectors 1-24 is represented symbolically by shading within respective detectors, a darker shade indicating a higher amplitude of light received.

Figure 31D:
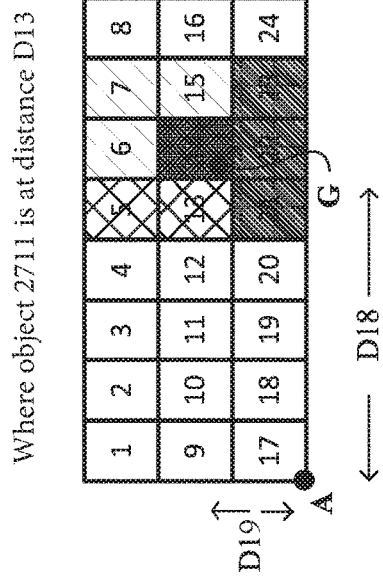

The scenarios reflected in FIGS. 31A-31D can correspond to scenarios similar to those depicted in FIGS. 27A-27D, respectively. FIG. 31A illustrates detector array 3030A when an object 2711 is at a distance, D11 from proximity sensor 3010. FIG. 31B illustrates detector array 3030B when object 2711 is a distance D12 from proximity sensor 3010 (D12 being less than D13). FIG. 31C illustrates detector array 3030C when object 2711 is a distance D13 from the proximity sensor 3010 (D13 being less than D12). FIG. 31D illustrates detector array 3030 when a different object 2713, having a lower optical reflectivity than object 2711, is the distance D13 from the proximity sensor 3010.

In these examples, proximity sensor 3010 can operate by detecting the centroid (and in some examples the size and shape) of the light received by detector array 3030 (labeled here as 3030A, 3030B, 3030C and 3030D for ease of reference). As in the examples explained with reference to FIGS. 27A-27H above, due to parallax in the imaging path, the detected light received by detector array 3030 moves along the length of the detector array as a function of the distance of the object to proximity sensor 3030. In addition, in some examples, the two-dimensional detector array 3030 can also detect the shape and size of the detected light, which can also change as a function of the distance of the object to proximity sensor. X and Y coordinates 3170 are shown only for ease of explanation, and should not be understood to imply any specific orientation of the detector arrays shown.

FIG. 31A illustrates a representation of the amplitude of light received at each of detectors 1-24 in detector array 3030A (so labeled for ease of reference) in a scenario where an object 2711 is at a distance D11 from the proximity sensor 3010 (which can correspond to proximity sensor 2610 above). As shown in FIG. 31A, when object 3111 is positioned at relatively far distance D11, light can be directed primarily to detector 11 of detector array 3030A, with a lesser part of the light directed to adjacent detectors 18-20, and an even lesser part directed to detectors 2-4, 10, 12. In some examples, the two-dimensional centroid of the received light can be calculated using the respective amplitudes detected by detectors 1-24 of detector array 3030A. In some configurations, the centroid can be calculated only to be in the area of detector 11. In other configurations, interpolation can be used to more precisely determine the centroid in both X and Y coordinates. For example, in this scenario, the amplitude detected by detector 11, the lesser amplitudes detected by detectors 18-20, and the even lesser amplitudes detected by detectors 2-4, 10, 12 can be used to determine that the centroid is located at a point E as shown. Point E can be a distance D14 in an X-direction from point A, where point A is at the end of the detector array nearest to emitter 3021, and point E is midway between the borders of detectors 10 and 11 and detectors 11 and 12 in the X-direction. In the Y-direction, point E can be a distance D15 measured from point D to point E, where point E can be in the area of detector 11 nearest to detector 19 in the Y-direction. In some examples, the centroid of the light received by detector array 3030 can be used to determine that object 3111 is at a distance D11 from the proximity sensor. In addition, in some examples, the shape and size can be used to determine characteristics of the object 3111. For example, here, the comparatively high amplitude detected by detectors 18-20 and the comparatively low amplitude detected by detectors 2-4, 10, 12 can indicate that the portion of light reflecting off of object 3111 onto detectors 2-4, 10, 12 may be further from the proximity sensor than the portion of light reflecting off of the object and onto detectors 18-20. In some examples, the proximity sensor can use this information to determine the shape or other characteristics of object 3111.

FIG. 31B illustrates a representation of the amplitude of light received at each of detectors 1-24 in detector array 3030B (so labeled for ease of reference) in a second scenario where the object 3111 is at a distance D12 from the proximity sensor 3010 (not shown), where D12 is smaller than D11. As shown in FIG. 31B, when object 3111 is positioned at nearer distance D12, the light path can be directed to a different position on the detector array 3030B than in the scenarios described above with reference to FIG. 31A due to parallax in the imaging path. As shown, light can be directed primarily to detector 12 of detector array 3030B, with a lesser part of the light directed to adjacent detectors 19-21, an even lesser part directed to adjacent detectors 5, 13, and an even lesser part to detectors 3, 4, 11. As similarly described with reference to FIG. 31A, in some configurations, the centroid can be calculated only to be generally in the area of detector 12, or more precisely determined to be at a point F on detector array 3030B. Point F can be measured from point A in the X-direction to be at a distance D16 located in the area of detector 12 near detector 13 in the X-direction. In the Y-direction, point F can be measured from point A to be a distance D17, which is located in the area of detector 12 and near detector 20 in the Y-direction. In some examples, the centroid of the light received by detector array 3030 can be used to determine that object 3111 is at a distance D12 from the proximity sensor.

FIG. 31C illustrates a representation of the amplitude of light received at each of detectors 1-24 in detector array 3030C (so labeled for ease of reference) in a third scenario where the object 3111 is at a distance D13 from the proximity sensor 3010 (not shown), where D13 is smaller than D12. As shown in FIG. 31C, when object 3111 is positioned at nearer distance D13, the light path can be directed to a different position on the detector array 3030C than in the scenarios described above with reference to FIGS. 31A and 31B due to parallax in the imaging path. As shown, light can be directed primarily to detector 14 of detector array 3030C, with a lesser part of the light directed to adjacent detector 21-23, an even lesser part directed to adjacent detectors 5, 13, and an even lesser part to detectors 6, 7, 15. As similarly described with reference to FIGS. 31A and 31B, in some configurations, the centroid can be calculated only to be generally in the area of detector 14, or more precisely determined to be at a point G on detector array 3030C. Point G can be measured from point A in the X-direction to be at a distance D18 located in the area of detector 14 near detector 13 in the X-direction. In the Y-direction, point G can be measured from point A to be a distance D19, which can be located in the area of detector 14 and near detector 22 in the Y-direction. In some examples, the centroid of the light received by detector array 3030C can be used to determine that object 3111 is at a distance D13 from the proximity sensor.

FIG. 31D illustrates a representation of the amplitude of light received at each of detectors 1-24 in detector array 3030D in a fourth scenario where a different object 2713 is at the distance D13 from proximity sensor 3010 (not shown), as similarly described above with reference to object 3111 in FIG. 31C. As in the example of FIG. 31C, light can be emitted and reflected off of object 3112, however, unlike FIG. 31C, in FIG. 31D, object 3112 can be less optically reflective than object 3111. Therefore, though the same amount of light can be emitted from emitter 3021 (not shown), less light is reflected back to detector array 3030D (so labeled for ease of reference). Despite this, FIG. 31D illustrates that when object 3112 is positioned at a distance D13, light can still be directed primarily to detector 14 of detector array 3030C, with a lesser part of the light directed to adjacent detector 21-23, an even lesser part directed to adjacent detectors 5, 13, and an even lesser part to detectors 6, 7, 15. Although the amplitude of light detected by each of detectors 1-24 in detector array 3030D is less than those shown in corresponding detectors 1-24 of detector 3030C, the location of the centroid can still be in the area of detector 14, and more specifically at the point G if interpolation is used. Therefore, as in the scenario of FIG. 31C, the centroid of the light received by detector array 3030D can be used to determine that object 2713 (having a second level of reflectivity) is at the distance D13 from the proximity sensor, just as object 3111 (having a first level of reflectivity) was determined to be at distance D13 in the scenario of FIG. 31C. In some configurations, the size and/or shape of the detected light can be used in conjunction with the centroid information to determine characteristics of the object. For example, object 2713 in the scenario of FIG. 31D could be determined to be of a lower reflectivity than objection 3111 due to the difference in amplitude detected by the detector array 3030.

In some configurations, the device can execute one or more operations based on the detection of the presence (and in some examples, the distance) of an object. Referring back to FIG. 24, in some examples, device 2400 can determine the distance between object 2411 and crown 2408, including determining when the object is touching the crown (i.e., when the distance between the object and crown is zero). Moreover, in some configurations, device 2400 can determine when object 2411 is approaching crown 2408 (i.e., when the distance between object and crown decreases during two successive times) and when object 2411 is traveling away from crown 2408 (i.e., when the distance between object and crown decreases during two successive times). In some examples, different operations can be performed based on whether the object is not touching the crown (e.g., approaching the crown or distancing itself from the crown) or touching the crown. In some configurations, the determination can be performed in conjunction with a touch-sensor on crown 2408 itself (e.g., a capacitive touch sensor).

Figure 32A:
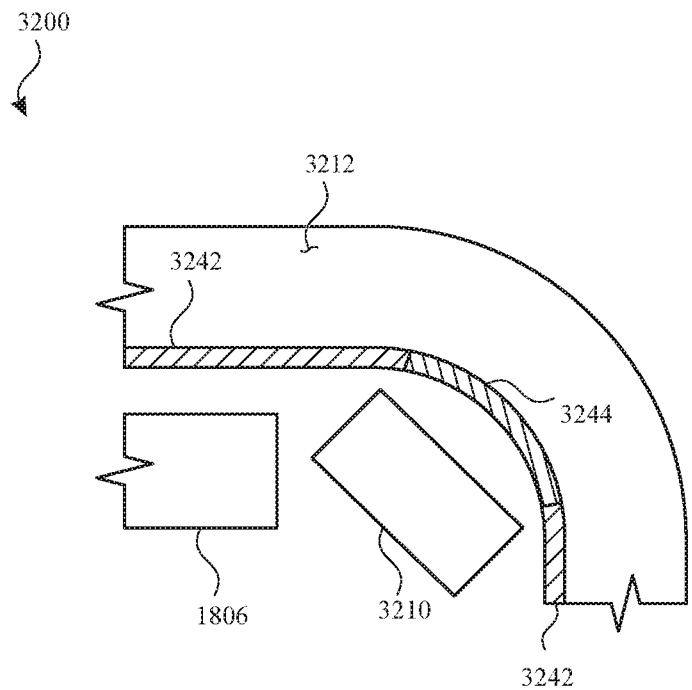
FIGS. 32A and 32B illustrate an optical filtering structure configured to preferentially pass light to and from a proximity sensor according to examples of this disclosure.
Figure 32B:
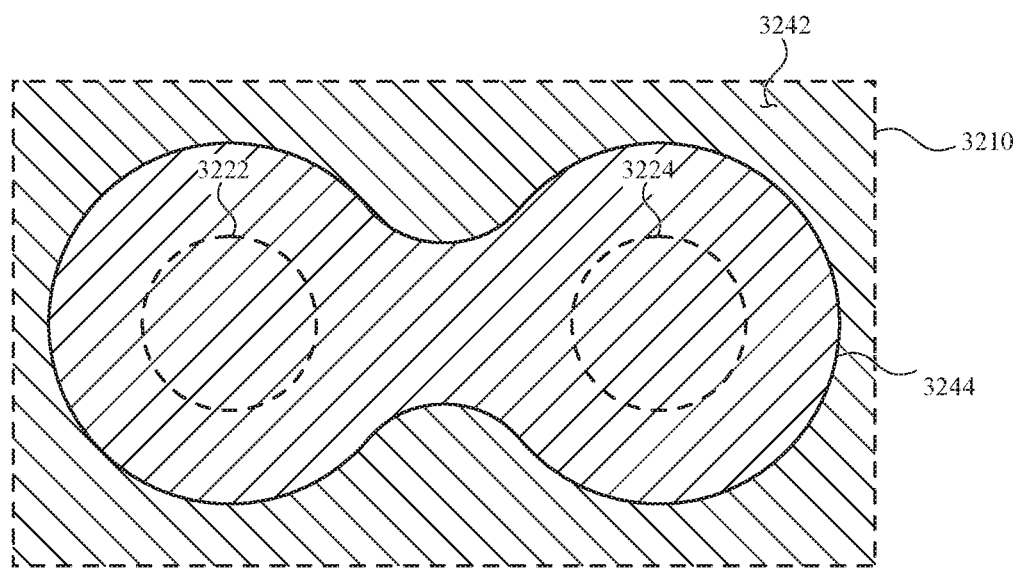

In some examples, wearable device 3200 (which can correspond to device 100 above) can include optical filtering structures. FIGS. 32A-32B illustrate an optical filtering structure configured to preferentially pass light to and from proximity sensor 3210 (which can correspond to proximity detector 2610 or 3010 above) according to examples of the disclosure. As shown in FIG. 32A, device 3200 can include an opaque mask 3242 (shown in double cross-hatching) which blocks light from entering the proximity sensor at respective areas surrounding the light emitter or emitters and light detector or light detectors of proximity sensor 3210. As shown in FIG. 32B, in some examples, opaque mask 3242 can include respective apertures (e.g., circular openings) in front of a light emitter 3222 (which can correspond, for example to emitters 2621 and 3021 in FIGS. 26A-26B and 30A-30B) and light detector 3224 (which can correspond, for example, to detector arrays 2630 and 3030 in FIGS. 26A-26B and 30A-30B) to allow light to pass through this portion. Though not shown, opaque mask 3242 can include additional apertures for additional light emitters or light detectors. In some examples, the apertures in front of light emitter 3222 and light detector 3224 can include an optical filter 3244 formed of a material which is permeable to light of specific wavelengths (e.g., IR wavelengths) and blocks other light (e.g., visible light). In these examples, one or both of the opaque mask 3242 and optical filter 3244 can be formed by depositing opaque or filtering material on the inner surface of cover substrate 112. FIG. 32B illustrates a top view of the proximity sensor configuration of FIG. 32A in which the area surrounding proximity sensor 3210 includes opaque mask 3242 which can be deposited, for example, on the inner surface of cover substrate 3212 (which can correspond to cover substrate 1812 above). As shown, optical filter 3244 can also be deposited on the inner surface of cover substrate 3212 at locations where light is emitted and received by proximity sensor 3210. In addition, other optical filtering structures not described here are contemplated within the scope of the disclosure including, for example, optical coatings configured to alter the reflection or transmission of light within device 3200.

Figure 33:
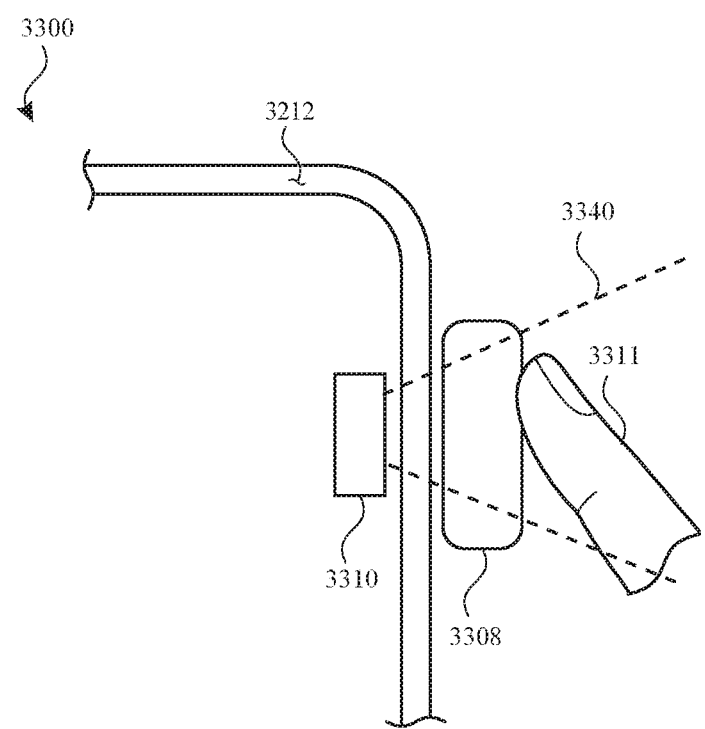
FIG. 33 shows an exemplary optical proximity sensor integrated in a wearable device according to examples of this disclosure.

FIG. 33 shows an exemplary optical proximity sensor 3310 integrated in a wearable device 3300 (which can correspond to device 100 above) according to examples of this disclosure. As shown, proximity sensor 3310 can determine the presence and/or range of object 3311 (e.g., a user's finger) using any appropriate method. In some configurations, an optical amplitude-based proximity sensor operates by emitting light and detecting the amount of emitted light reflected off of an object. In some examples, proximity sensor can have a field of view 3340, which can include an area above crown 108. In some examples, proximity sensor 3310 can detect objects at a distance ranging from 0 mm (i.e., when an object is touching the wearable device) to 100 mm.

In some cases, it can be beneficial to detect the proximity of objects having different levels of optical reflectivity, where each object may interact with a device. For example, a gloved finger, a bare finger, a dry finger, or a finger has lotion on the skin may all have different levels of optical reflectivity. It can be beneficial for a device to determine the presence of objects such as these at a range of distances from the device. For instance, it can be beneficial to detect whether an object is present at a "trigger distance," at which the proximity sensor determines that an object is proximate to the proximity sensor (e.g., a finger is proximate to a crown of a wearable device). Similarly, it can be beneficial to detect whether an object is present at a "release distance," at which, if the object is not detected, the proximity sensor determines than an object is not proximate to the proximity sensor (e.g., a finger is not proximate to the crown of the wearable device).

Figure 34:
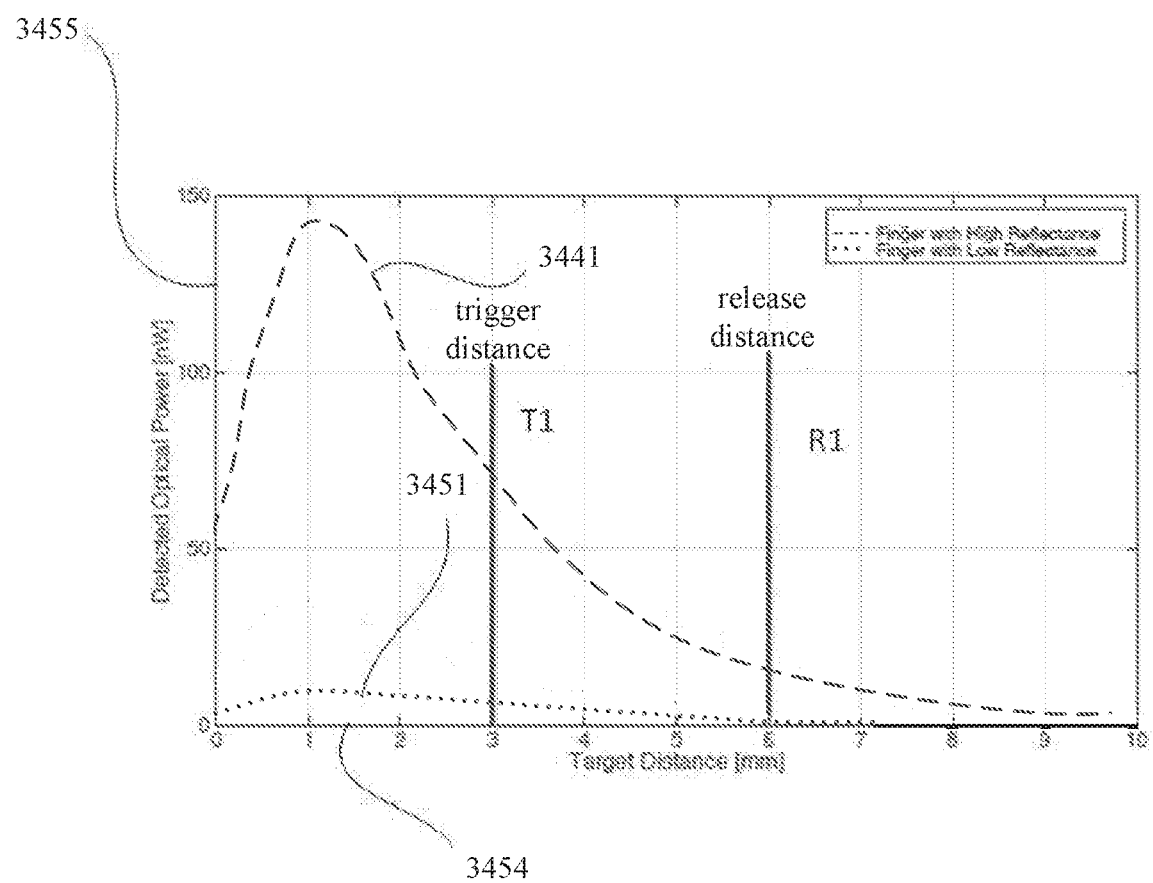
FIG. 34 illustrates a graph relating to proximity detection using a single-channel amplitude-based optical proximity sensor according to examples of this disclosure.

FIG. 34 illustrates a graph relating to proximity detection using a single-channel amplitude-based optical proximity sensor according to examples of the disclosure. The x-axis 3454 represents the distance of an object (e.g., object 211 in FIG. 2B) from the single-channel proximity sensor in units of millimeters. The y-axis 3455 represents the detected amplitude of light received by a single light detector originating from a single emitter in units of nanowatts (nW). Also shown is a trigger distance, T1, and release distance, R1. As discussed above, trigger distance T1 can represent a point at which the proximity sensor determines that an object is proximate to the proximity sensor. Likewise, release distance R1 can represent a point at which the proximity sensor determines than an object is not proximate to the proximity sensor. In some examples, trigger distance T1 can be 3 mm from the proximity sensor, and release distance R1 can be 6 mm from the proximity sensor. FIG. 34 illustrates two curves 3441 and 3451. First curve 3441 can represent light detected by the single light detector which is emitted by a single light emitter and reflected off of an object having a Lambertian (matte or diffusely reflecting) surface. This may correlate, for example, to a scenario in which light is reflected from the emitter off of a dry finger. Second curve 3451 represents light received by the single detector which is emitted by the single light emitter and reflected off of an object having a more specular (more reflective) surface. This may correlate, for example, to a scenario in which light is reflected from the emitter off of an oily surface of a finger (e.g., a finger having a coating of hand lotion). As shown, at trigger distance T1, curve 3441 (corresponding to an object having a Lambertian surface) can have a first value (in this example about 70 nW of optical power). In contrast, at trigger distance T1, curve 3451 (corresponding to an object having a more specular surface) can have a second value significantly lower than the value of curve 3441 (in this example, about 3 nW of optical power). Likewise, as shown, curve 3451 can have a value significantly lower than that of curve 3441 at release distance R1. Accordingly, in some examples, a single-channel proximity sensor cannot unambiguously detect the presence of an object at trigger distance T1, or at release distance R1.

Figure 35B:
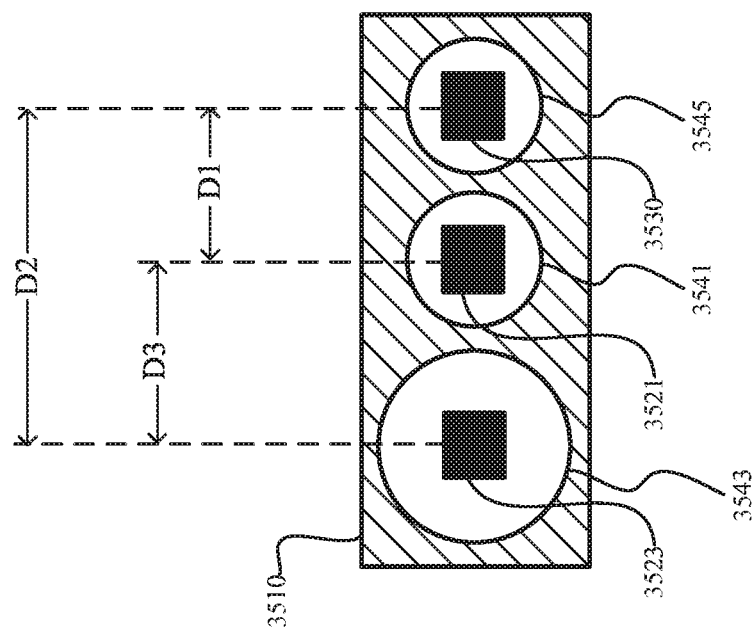
FIGS. 35A-35B illustrate an example configuration of a dual-channel proximity sensor including multiple light emitters according to examples of this disclosure.
Figure 35A:
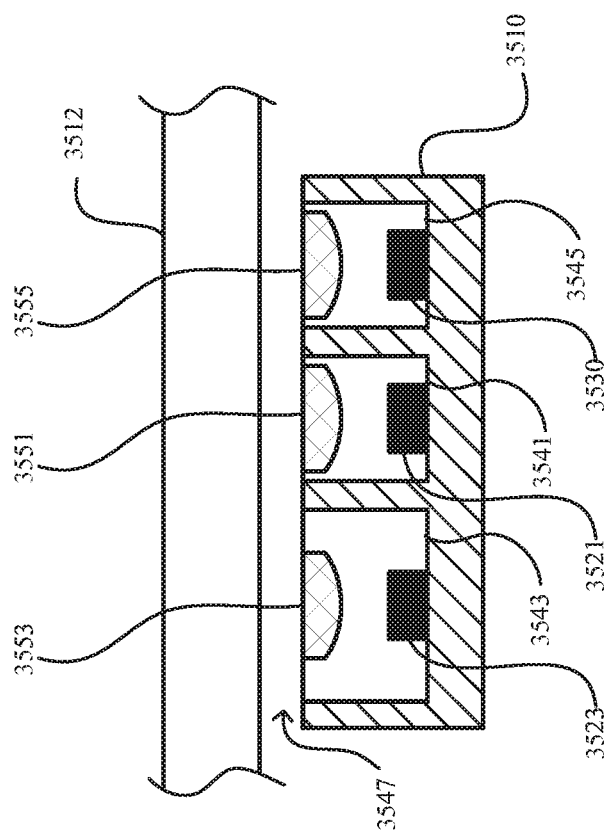

In some examples, a proximity sensor (e.g., proximity sensor 3310 shown in FIG. 33) can utilize multiple channels for proximity sensing. FIGS. 35A-35B illustrate an example configuration of a dual-channel proximity sensor including multiple light emitters according to examples of the disclosure. In the example configuration shown here, proximity sensor 3510 uses dual light emitters 3521 and 3523 (e.g., light-emitting diode (LED) emitters) and a single light detector 3530 (e.g., a photodetector). For ease of reference, first light emitter 3521 is referred to hereinafter as "LED1" and light emitter 3523 is hereinafter referred to as "LED2," though it should be understood that the scope of the disclosure can include light emitters which are not LEDs. Furthermore, the terms "LED1" and "LED2" should be not be understood to signify any difference in the characteristics of the light emitters, as LED1 and LED2 can be the same or different, as will be discussed in more detail below.

FIG. 35A illustrates a cross-sectional side view of proximity sensor 3510, while FIG. 35B illustrates a top view. As shown, LED1 3521, LED2 3523, and detector 3530 can each be positioned within respective cavities 3541, 3543, and 3545. As shown in FIG. 35A, in some examples, each of LED1 3521, LED2, and detector 3530 can correspond to respective imaging lenses 3553, 3551, and 3555, which can direct emitted light or (in the case of detector 3530) received light so as to form a desired field of view, which can correspond, for example to the field of view 3340 shown in FIG. 33. In some examples, proximity sensor 3510 can be positioned such that emitted and reflected light passes through cover substrate 3512 of a device (which can correspond to cover substrate 1812 above). In some examples, proximity sensor 3510 can be positioned such that an air gap 3547 exists between the imaging lenses 3551, 3553, 3555 and cover substrate 3512. For ease of illustration, cover substrate 3512

As shown, in some examples, LED1 3521, LED2 3523, and detector 3530 can all be aligned in a direction parallel to the cover substrate 3512. LED1 3521 can be separated from detector 3530 by a first center-to-center distance D1, while LED2 3523 can be separated from detector 3530 by a second center-to-center distance D2, which is greater than distance D1. LED1 can be separated from LED2 by a center-to-center distance D3, which can be greater than distance D2 separating LED1 from detector 3530.

Figure 36B:
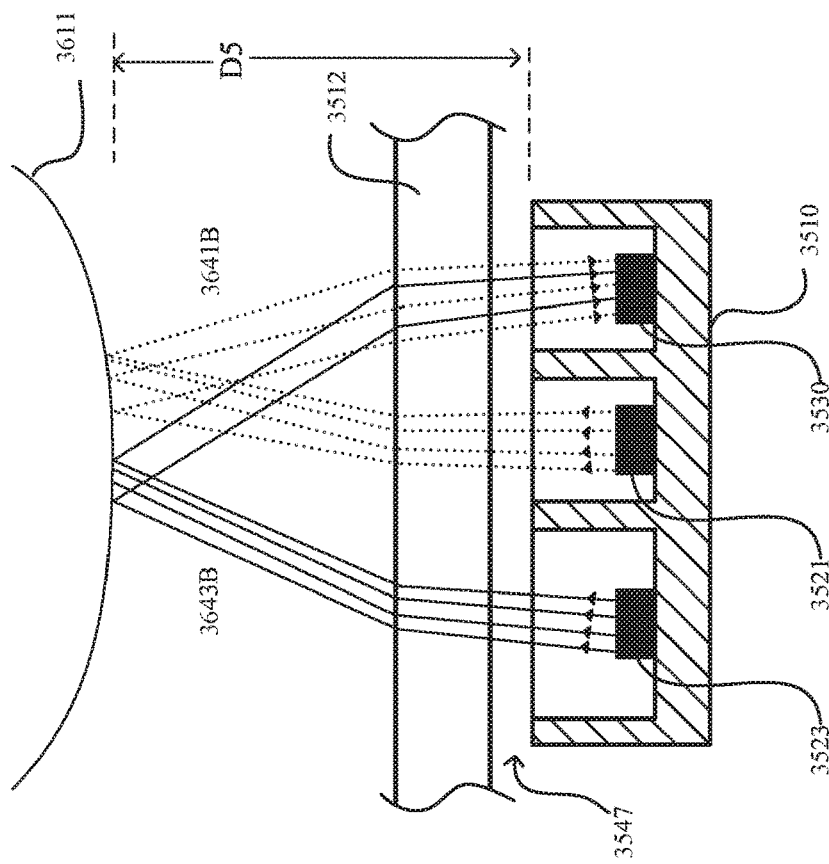
FIGS. 36A-36B illustrate an example operation of a dual channel proximity sensor including multiple light emitters according to examples of this disclosure.
Figure 36A:
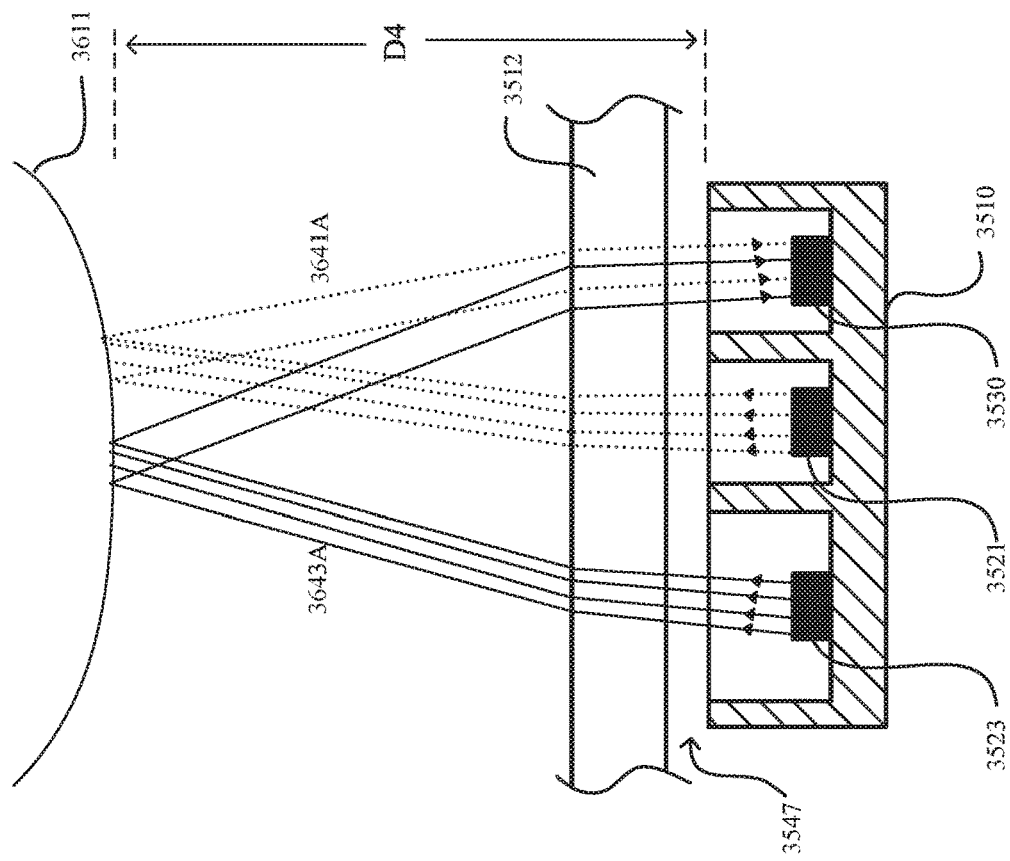

The operation of the example proximity sensor 3510 illustrated in FIGS. 35A-35B will now be discussed with reference to the examples shown in FIGS. 36A-36B below. FIGS. 36A-36B illustrate an example operation of a dual channel proximity sensor 3510 described with reference to FIGS. 35A-35B, according to examples of the disclosure. For clarity of illustration, some elements such as imaging lenses are omitted. FIG. 36A illustrates a first scenario where an object 3611 (corresponding, for example, to object 3311 shown in FIG. 33) is positioned at a distance D4 from detector 3530. FIG. 36B illustrates a second scenario where object 3611 is at a distance D5 from detector 3530, where distance D5 is less than distance D4.

In these examples, proximity sensor 3510 can operate by calculating the ratio between light received by detector 3530 from LED1 3521 and light received by LED2 3523, and determining the distance of object 3611 from proximity sensor 3510 using this ratio. As explained, LED1 3521, LED2 3523, and detector 3530 can all be aligned in a first direction parallel to the cover substrate 3512, and the distance of object 3611 to proximity sensor 3510 can be measured in a second direction orthogonal to the first direction. As shown, LED 1 can emit light having a light path 3641A or 3641B (shown symbolically as arrows having dotted lines) and LED2 can emit light having a light path 3643A or 3643B (shown symbolically as arrows having solid lines). Both light paths 3643 and 3641 can reflect off of object 3611, and some of the reflected light of both paths can be directed to detector 3530. As indicated symbolically by the number of arrows which reflect back to detector 3530, some of the light emitted by LED1 3521 and LED2 3523 is scattered in the air, reflected off of object 3611 in a different direction, or absorbed by object 3611.

FIG. 36A illustrates a scenario where object 3611 is separated from proximity sensor 3510 by a relatively far distance D4. As shown in FIG. 36A, when object 3611 is relatively far from detector 3530, the amount of reflected light received from LED1 3521 can be comparable to the amount of reflected light received from LED2 3523. In the example here, an approximate ratio of 2:2 of LED1 to LED2 light is represented symbolically by two dotted arrows of light path 3641A being received by detector 3530 and two solid arrows of light path 3643A received by the detector, though it should be understood that these values are illustrative only. The ratio 2:2 representing a comparable amount of light reflected back to detector 3530 by both emitters can be due, at least in part, to the similar distance traveled by light paths 3643A and 3641A.

In contrast, as shown in FIG. 36B, when object 3611 is separated by a relatively near distance D5 (less than distance D4), the amount of reflected light received from LED1 3521 can be significantly greater than the amount of light received from LED2 3523. In the example here, an approximate ratio of 3:2 of LED1 light to LED2 light is represented symbolically by three dotted arrows of light path 3641B received by detector 3530 and two solid arrows of light path 3643B received by the detector, though it should be understood that these numbers are illustrative only. Because object 3611 is at a distance D5 which is shorter than distance D4, the difference in respective distances of light paths 3641B and 3643B can be comparatively greater than the difference in respective distances of 3641A and 3643A. Accordingly, the ratio 3:2 representing a greater difference between the amount of light reflected back to detector 3530 by LED1 3521 and LED2 3523 can be due, at least in part, to the greater difference in distance traveled by light paths 3643B and 3641B.

As discussed, proximity sensor 3510 can operate by calculating the ratio between light received by detector 3530 from LED1 3521 and light received by LED2 3523 and determining the distance of object 3611 using the ratio. In some examples, light emitted from LED1 3521 can be distinguishable from light emitted from LED2 3523. For example, light emitted from both sources can be of different wavelength (e.g., different color) or pulsed at different frequencies. In such configurations, detector 3530 can simultaneously receive light from both LED1 3521 and LED2 3523. In other configurations, light emissions from LED1 3521 and LED2 3523 can be time-multiplexed such that detector 3530 receives light from one emitter at a time (e.g., light is emitted sequentially from the multiple emitters).

As discussed above with reference to FIG. 34, the detected optical power at a detector can vary greatly depending on the reflectance of an object. Therefore, it can be difficult to unambiguously detect the presence of an object at both the trigger distance T1 and release distance R1 using a single-channel proximity sensor. More generally, it can be beneficial to unambiguously detect the presence of objects having different reflective characteristics at a range of distances from the proximity sensor. Therefore, based on the above, it can be beneficial to unambiguously detect the presence of objects having different reflective characteristics at both the trigger distance T1 and release distance R2 using a dual-channel proximity sensor, such as the sensor 3510 discussed above with reference to FIG. 35. This is illustrated and explained below with reference to the graph shown in FIG. 37.

Figure 37:
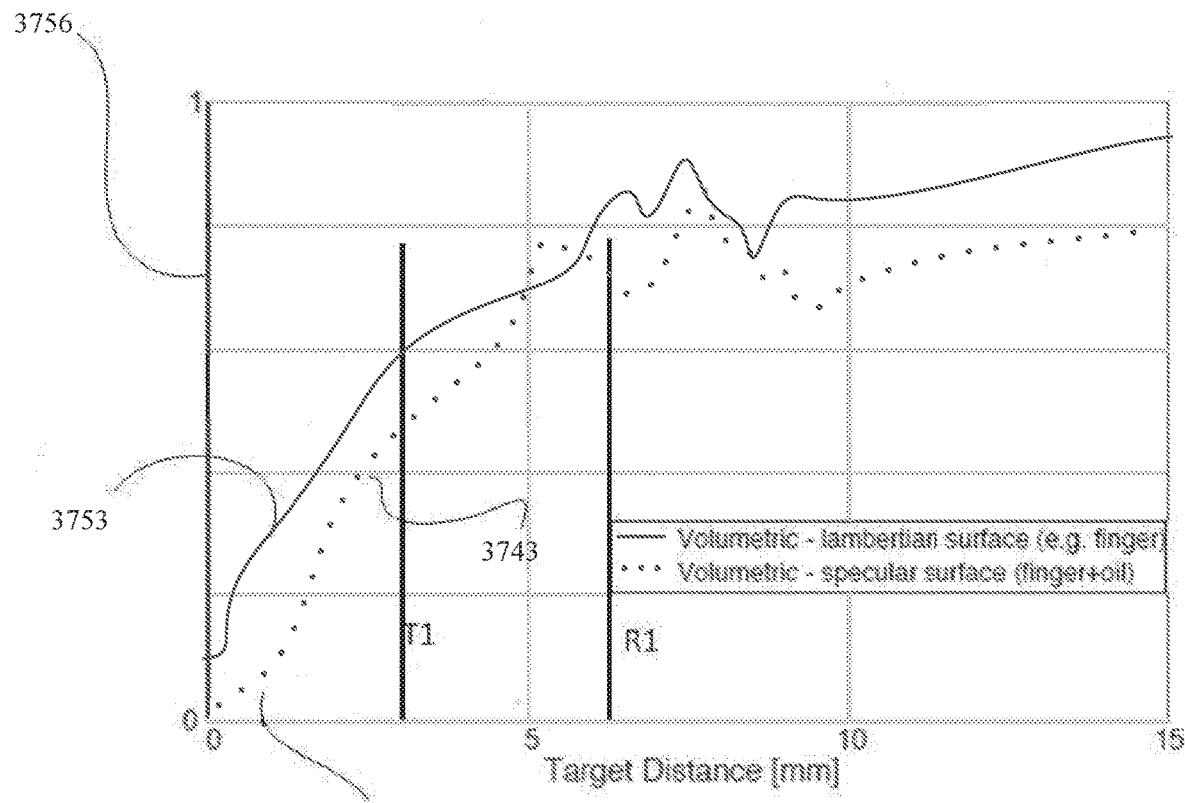
FIG. 37 illustrates a graph relating to proximity detection of a dual channel proximity sensor including multiple light emitters according to examples of this disclosure.

FIG. 37 illustrates a graph relating to proximity detection of the proximity sensor 3510 described above with reference to FIGS. 35A-35B and 36A-36B according to examples of the disclosure. FIG. 37 relates to proximity detection using a ratio of the amount of light received from a second emitter (e.g., LED2 3523) to the amount of light received from a first emitter (e.g., LED1 3521). The x-axis 3754 in FIG. 37 can represent the distance of an object to a proximity sensor in units of millimeters. This distance can correspond, for example, to distances D4 or D5 from proximity sensor 3510 to object 3611 as shown in FIGS. 36A-36B. The y-axis 3756 represents the ratio of the light received from the second emitter to the light received from the first emitter. Also shown in each of the graphs is a trigger distance, T1, and release distance, R1, which can be similar to the trigger distance T1 and R1 explained above with reference to FIG. 35. In some examples, trigger distance T1 can be 3 mm from the proximity sensor, and release distance R1 can be 6 mm from the proximity sensor.

FIG. 37 illustrates two curves 3743 and 3753. First curve 3743 can represent a scenario in which respective light is received by a detector (e.g., detector 3530) which is emitted by the first and second light emitter (e.g., LED1 3521 and LED2 3523) and reflected off of an object having a Lambertian (matte or diffusely reflecting) surface. This can correspond, for example, to the scenario set forth above with reference to curve 3741 of FIG. 37. Second curve 3753 can represent a scenario in which light is received by the detector which is emitted by the first and second light emitter and reflected off of an object having a more specular (more reflective) surface. This can correspond, for example, to the scenario set forth above with reference to curve 3751 of FIG. 37. However, unlike the graph shown in FIG. 37, in which curves 3741 and 3751 represent the amount of detected optical power by a single emitter and detector, here, curves 3743 and 3753 represent a ratio of the light detected from two emitters. Specifically, curves 3743 and 3753 represent a ratio of light detected from the second emitter by the detector to the light detected from the first emitter by the detector. As shown, unlike the curves shown in FIG. 37, here, at both trigger distance T1 and release distance R1, curves 3743 and 3753 are sufficiently close to one another (i.e., the ratios at these points are sufficiently similar) such that the presence of objects having both Lambertian and specular surfaces can be reliably detected at distances T1 and R1.

Figure 38:
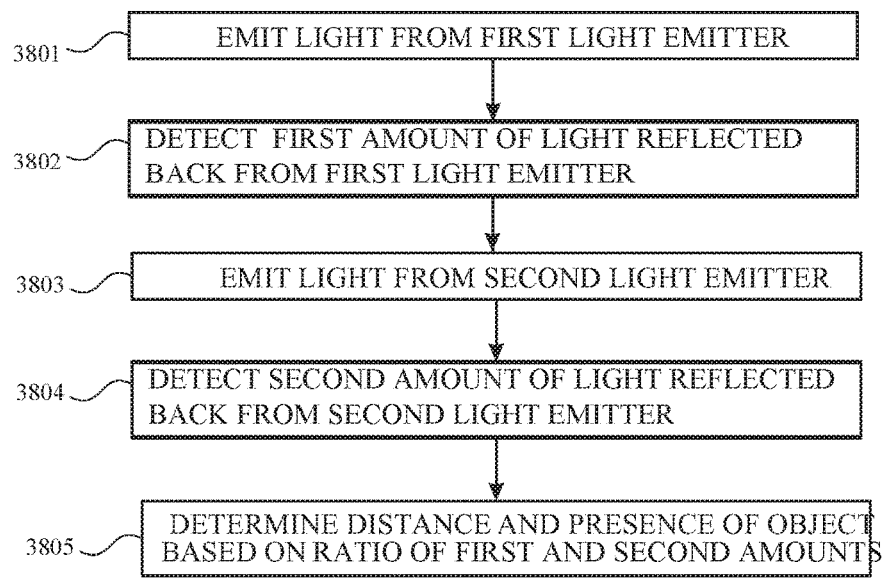
FIG. 38 illustrates an exemplary process for proximity detection using a dual channel proximity sensor including multiple light detectors according to examples of this disclosure.

FIG. 38 illustrates an exemplary process 3800 for proximity detection using a dual channel proximity sensor including multiple light emitters, such as proximity sensor 3530 described with reference to FIGS. 35A-35B and 36A-36B, according to examples of the disclosure. At block 3801, the device can emit light from a first light emitter. At block 3802 a light detector can detect a first amount of the emitted light from the first light emitter which is reflected back from the first light emitter. This amount can be represented as a first value. At block 3803, the device can emit light from a second light emitter. At block 3804 a light detector can detect a second amount of emitted light which is reflected back from the second light emitter. This amount can be represented as a second value. In some examples, the same light detector can detect both the first and second amounts of light. At block 3805, the presence (and in some examples, the distance) of an object can be detected based on a ratio of the second value to the first value. In some examples, a processor can be configured to operate the proximity sensor according to various light-pulsing (i.e., luminous modulation) schemes. For example, referring back to FIGS. 21 and 33, in some configurations, a processor (e.g., processor 2102 above) can be configured in conjunction with proximity sensor 3310 to pulse and detect light at a frequency less likely to match to the pulse frequency of ambient light (e.g., 120 Hz, which matches the flicker of conventional fluorescent lamps). In some configurations, processor 2102 can be configured in conjunction with proximity sensor 3310 to emit and detect light at changing pulse frequencies, i.e., according to a pulse-frequency hopping scheme. Similarly, in some configurations, processor 2102 can be configured in conjunction with the proximity sensor to emit and detect light at one or more pulse frequencies for the first light emitter and one or more different pulse frequencies for the second light emitter, thus allowing the proximity sensor to distinguish between emitted light received from the first emitter and emitted light received from the second emitter.

As shown in the examples explained above with reference to FIGS. 35-37, a proximity sensor can utilize multiple channels by using multiple light emitters. In addition or alternatively to the above-discussed examples, in some configurations, a proximity sensor can utilize multiple channels by using multiple light detectors.

FIGS. 39A-39B illustrate an example configuration of a multiple-channel proximity sensor which uses multiple light detectors according to examples of the disclosure. In the example configuration shown here, proximity sensor 3910 uses dual light detectors 3921 and 3923 (e.g., photodetectors) and a single light emitter 3930 (e.g., an LED). For ease of reference, first light detector 3921 is referred to hereinafter as "detector1" and light detector 3923 is hereinafter referred to as "detector2," though it should be understood that the terms "detector1" and "detector2" should be not be understood to signify any difference in the characteristics of the light detectors; detector 1 and detector2 can be the same or different, as will be discussed in more detail below. Similarly, the light emitter 3930 is hereinafter referred to as "LED," though it should be understood that the scope of the disclosure can include light emitters which are not LEDs.

FIG. 39A illustrates a cross-sectional side view of proximity sensor 3910, while FIG. 39B illustrates a top view. As shown, detector1 3921, detector2 3923, and LED 3930 can each be positioned within respective cavities 3941, 3943, and 3945. As shown in FIG. 39A, in some examples, each of detector1 3921, detector2 3923, and LED 3930 can correspond to respective imaging lenses 3951, 3953, and 3955, which can direct emitted light or (in the case of detectors 3921 and 3923) received light so as to form a desired field of view, which can correspond, for example to the field of view 3340 shown in FIG. 33. As in the example illustrated in FIGS. 35A-35B, in some examples, proximity sensor 3910 can be positioned such that emitted and reflected light passes through a cover substrate 3912 (which can correspond to cover substrate 1812 above) of a device. Likewise, in some examples, proximity sensor 3930 can be positioned such that an air gap 3947 exists between the imaging lenses 3951, 3953, 3955 and cover substrate 3912. For ease of illustration, cover substrate 3912, air gap 3947 and imaging lenses 3951, 3953, and 3955 are not shown in FIG. 39B.

As shown in FIG. 39B, in some examples, LED 3930, detector1 3921, and detector3 3923 can all be aligned in a direction parallel to the cover substrate 3912. Detector1 3921 can be separated from emitter 3930 by a first center-to-center distance D6, while detector2 3923 can be separated from emitter 3930 by a second center-to-center distance D7, which can be greater than distance D6. Detector1 can be separated from detector2 by a center-to-center distance D8, which can be greater than distance D6 separating detector1 from LED 3930.

Figure 40B:
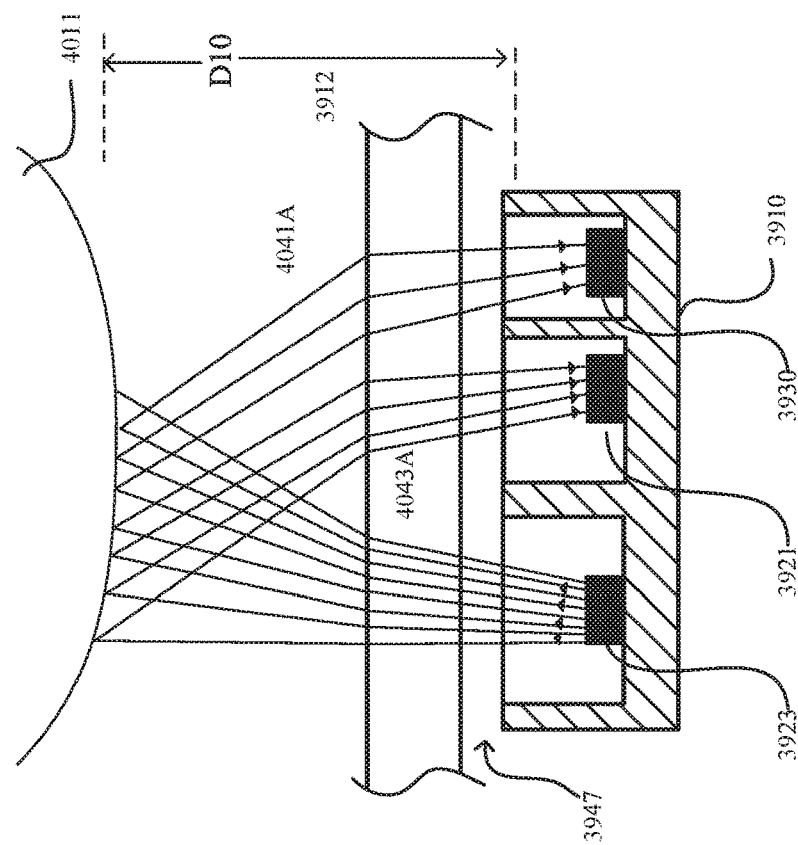
FIGS. 40A-40B illustrate an example operation of a dual channel proximity sensor including multiple light detectors according to examples of this disclosure.
Figure 40A:
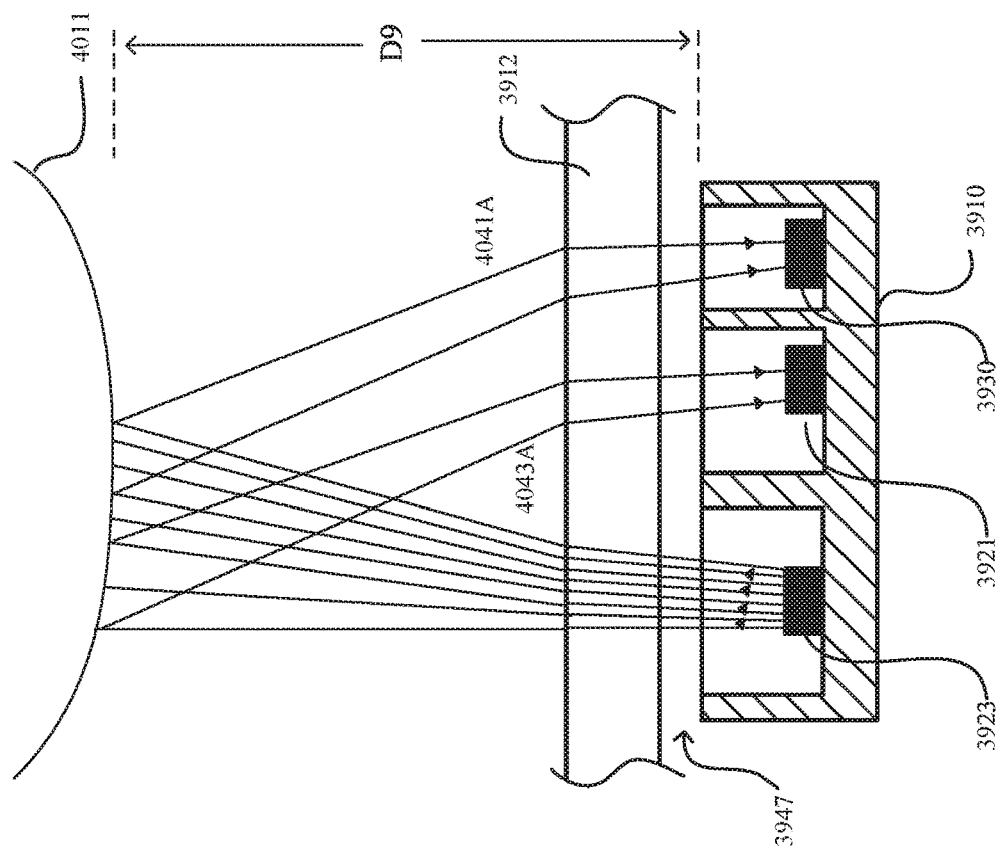

The operation of the example proximity sensor 3910 illustrated in FIGS. 39A-39B will now be discussed with reference to the examples shown in FIGS. 40A-40B below. FIGS. 40A-40B illustrate an example operation of a dual channel proximity sensor 3910 described with reference to FIGS. 39A-39B, according to examples of the disclosure. For clarity of illustration, some elements such as imaging lenses are omitted. FIG. 40A illustrates a first scenario where an object 4011 (corresponding, for example, to object 3311 shown in FIG. 33) is positioned at a distance D9 from LED 3930. FIG. 40B illustrates a second scenario where object 4011 is at a distance D10 from LED 3930, where distance D10 is less than distance D9.

Similar to the operation of the example discussed with reference to FIGS. 36A-36B, in these examples, proximity sensor 3910 can operate by calculating the ratio between light detected by detector1 3921 from LED 3930 and light detected by detector2 3923 from LED 3930 and determining the distance of object 4011 from proximity sensor 3910 using this ratio. As explained, LED 3930, detector1 3921, and detector3 3923 can all be aligned in a first direction parallel to the cover substrate 3912, and the distance of object 4011 to proximity sensor 3910 can be measured in a second direction orthogonal to the first direction. As shown, detector1 can receive a certain amount of light from LED 3930, the light having a first light path 4041 and detector2 can receive a certain amount of light from LED 3930, the light having a second light path 4043. Light paths 4041 and 4043 are represented symbolically as arrows. Light paths 4043 and 4041 can reflect off of object 4011, and some of the reflected light can be directed to detector1 3921 and detector2 3923. As indicated symbolically by the number of arrows which reflect back to detectors 3921 and 3923, some of the light emitted LED 3930 is scattered by the air, reflected off of object 4011 in a different direction than toward the detectors, or absorbed by object 4011.

FIG. 40A illustrates a scenario where object 4011 is separated from proximity sensor 3910 by a relatively far distance D9. As shown in FIG. 40A, when object 4011 is relatively far from detectors 3921 and 3923, the amount of reflected light received by detector1 3921 from the light emitter can be comparable to the amount of reflected light received by detector2 3923 from the light emitter. In the example here, an approximate ratio of 2:2 of light detected by detector1 to light detected by detector2 is represented symbolically by two arrows being received by detector1 3921 and two arrows received by the detector2 3923, though it should be understood that these values are illustrative only. The ratio 2:2 representing a comparable amount of light detected by both detectors can be due, at least in part, to the similar distance traveled by light paths 4043A and 4041A.

In contrast, as shown in FIG. 40B, when object 4011 is separated by a relatively near distance D10 (less than distance D9), the amount of reflected light detected by detector1 3921 can be significantly greater than the amount of light detected by detector2 3923. In this example, an approximate ratio of 4:3 of detector1 light to detector2 light is represented symbolically by four arrows received by detector2 3923 and three arrows received by detector1 3921, though it should be understood that these numbers are illustrative only. Because object is at a distance D10 (which is shorter than distance D9), the differences in distances of light paths 4041B and 4043B is comparatively greater than the difference in distances between 4041A and 4043A. Accordingly, the ratio 4:3 between light detected by detector2 and detector1 can be due, at least in part, to the greater difference in distance traveled by light paths 4043B and 4041B.

As discussed, proximity sensor 3910 can operate by calculating the ratio between light detected by detector1 3921 and light detected by detector2 3923 and determining the distance of object 4011 using the ratio. Because multiple detectors (rather than multiple emitters) are used in the configuration discussed above, both channels of the proximity sensor can be used at the same time. This is in contrast to some configurations discussed above with reference to FIGS. 35A-35B and 36A-36B above, wherein the detection of light in the multiple channels can be time-multiplexed so that the single detector 3530 can distinguish between light emitted from LED1 3921 and light emitted from LED2 3923. Accordingly, the examples discussed above with reference to FIGS. 39A-39B and 40A-40B can perform proximity detection faster than configurations in which a single detector is used. In addition, in some examples, detectors such as detectors 3921 and 3923 can require less power than light emitters (e.g., LEDs). Accordingly, in some cases, the configurations discussed above with reference to FIGS. 39A-39B and 40A-40B can be more power efficient than configurations which use multiple light emitters.

Figure 41:
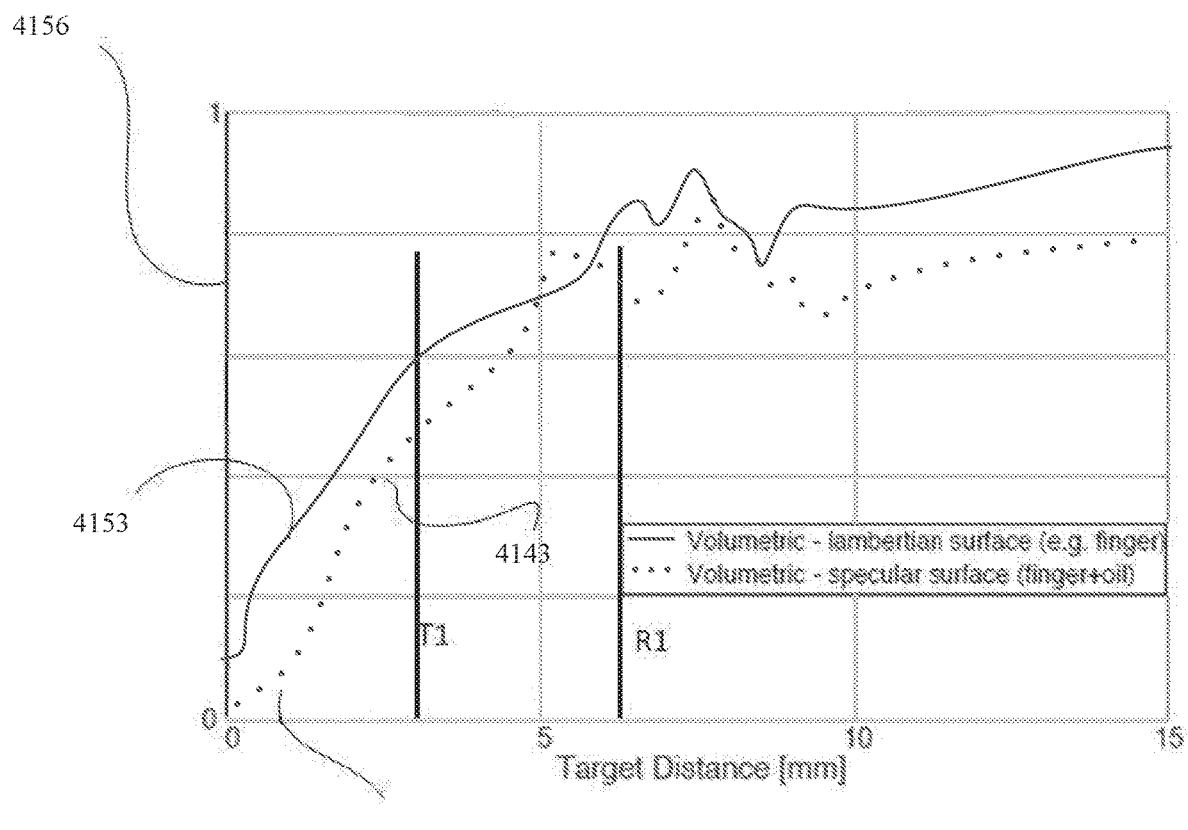
FIG. 41 illustrates a graph relating to proximity detection of a dual channel proximity sensor including multiple light detectors according to examples of this disclosure.

FIG. 41 illustrates a graph relating to proximity detection of the proximity sensor 3910 described above with reference to FIGS. 39A-39B and 40A-40B according to examples of the disclosure. FIG. 41 relates to proximity detection using a ratio of the light detected by a second detector (e.g., detector2 3923) to the light detected by the first detector (e.g., detector1 3921), both of which originate from a light emitter (e.g., LED 3930). As in FIG. 37, the x-axis 4154 in FIG. 41 can represent the distance of an object to a proximity sensor in units of millimeters. This distance can correspond, for example, to distances D9 or D10 from proximity sensor 3910 to object 4011 as shown in FIGS. 36A-36B. The y-axis 4156 can represent the ratio of the light received from the second emitter to the light received from the first emitter. Also shown in each of the graphs is a trigger distance, T1, and release distance, R1, which can be similar to the trigger distance T1 and R1 explained above with reference to FIG. 34. In some examples, trigger distance T1 can be 3 mm from the proximity sensor, and release distance R1 can be 6 mm from the proximity sensor.

FIG. 41 illustrates two curves 4143 and 4153. First curve 4143 can represent a ratio of light received by two detectors (e.g., detector1 3921 and detector2 3923) which can originate from a light emitter (e.g., LED 3930) and reflected off of an object having a Lambertian surface. This can correspond, for example, to the scenario set forth above with reference to curve 3441 of FIG. 34. Second curve 4153 can represent a ratio of light received by the two detectors which is reflected off of an object having a more specular surface. This can correspond, for example, to the scenario set forth above with reference to curve 3451 of FIG. 34. As shown, unlike the curves shown in FIG. 34, here, at both trigger distance T1 and release distance R1, curves 4143 and 4153 are sufficiently close to one another (i.e., the ratios at these points are sufficiently similar) such that the presence of objects having both Lambertian and specular surfaces can be reliably detected at distances T1 and R1.

Figure 42:
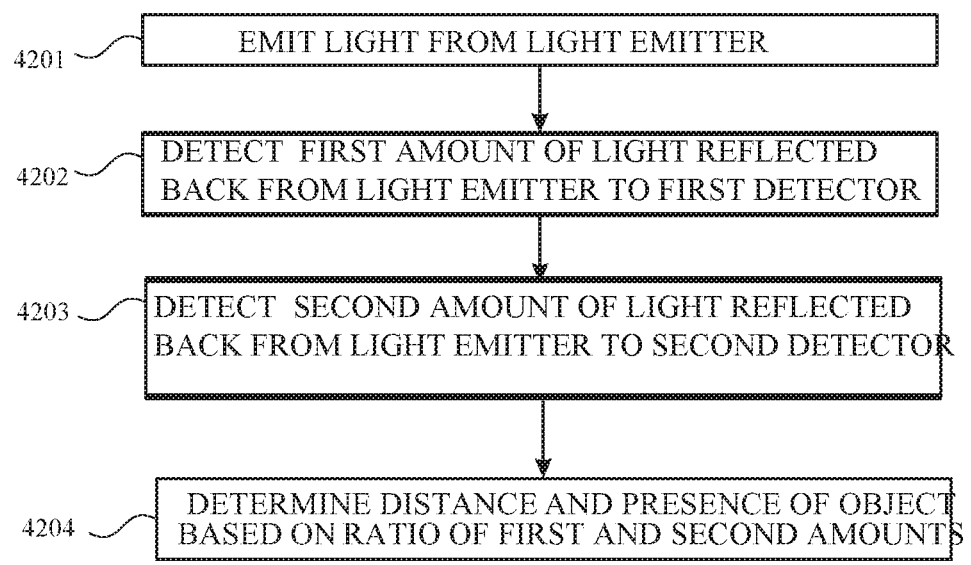
FIG. 42 illustrates an exemplary process for proximity detection using a dual channel proximity sensor including multiple light detectors according to examples of this disclosure.

FIG. 42 illustrates an exemplary process for proximity detection using a dual channel proximity sensor such as proximity sensor 3930 described with reference to FIGS. 39A-39B and 40A-40B according to examples of the disclosure. At block 4201, the device can emit light from a light emitter. At block 4202, the device can detect a first amount of light reflected back from the light emitter to a first detector and a second amount of light reflected back to a second detector. These first and second amounts can be represented as first and second values, respectively. At block 4203 a light detector can detect the amount of the emitted light which is reflected back to the second light emitter. This amount can be represented as a second value. At block 4204, the presence (and in some examples, the distance) of an object can be detected based on a ratio of the second value to the first value. In some configurations the first and second amounts of light can be detected simultaneously. As in the example operation discussed above with reference to FIG. 38, in some examples, a processor can be configured to operate the proximity sensor according to various light-pulsing (i.e., luminous modulation) schemes. For example, referring back to FIGS. 21 and 33, in some configurations, the processor 2102 can be configured in conjunction with proximity sensor 3310 to pulse and detect light at a frequency less likely to match to the pulse frequency of ambient light (e.g., 120 Hz, which matches the flicker of conventional fluorescent lamps). In some configurations, processor 2102 can be configured in conjunction with proximity sensor 3310 to emit and detect light at changing pulse frequencies, i.e., according to a pulse-frequency hopping scheme.

In some configurations, the device can execute one or more operations based on the detection of the presence (and in some examples, the distance) of an object. Referring back to FIG. 33, in some examples, device 3310 can determine the distance between object 3311 and crown 3308, including determining when the object is touching the crown (i.e., when the distance between the object and crown is zero). Moreover, in some configurations, device 3300 (which can correspond to device 100 above) can determine when object 3311 is approaching crown 3308 (i.e., when the distance between object and crown decreases during two successive times) and when object 3311 is traveling away from crown 3308 (i.e., when the distance between object and crown decreases during two successive times). In some examples, different operations can be performed based on whether the object is not touching the crown (e.g., approaching the crown or distancing itself from the crown) or touching the crown. In some configurations, the determination can be performed in conjunction with a touch-sensor on crown 3308 itself (e.g., a capacitive touch sensor).

Figure 43A:
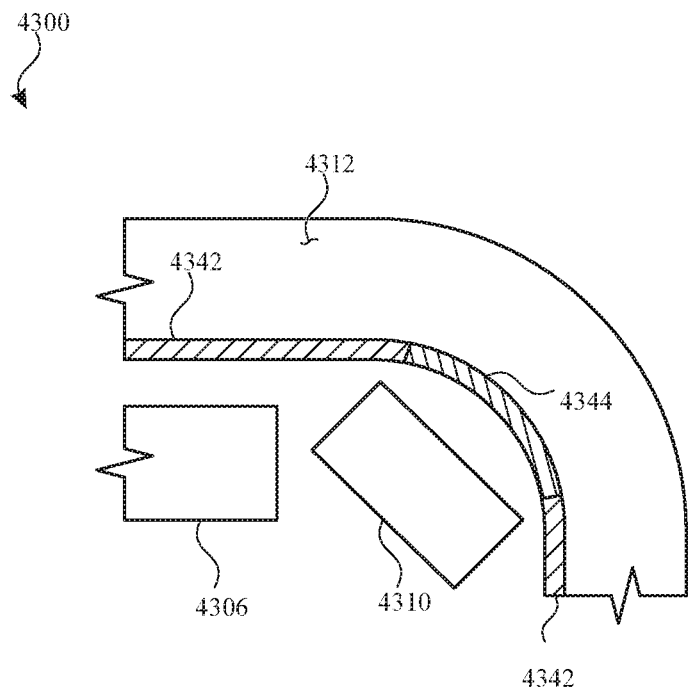
FIGS. 43A and 43B illustrate an optical filtering structure configured to preferentially pass light to and from a proximity sensor according to examples of this disclosure.
Figure 43B:
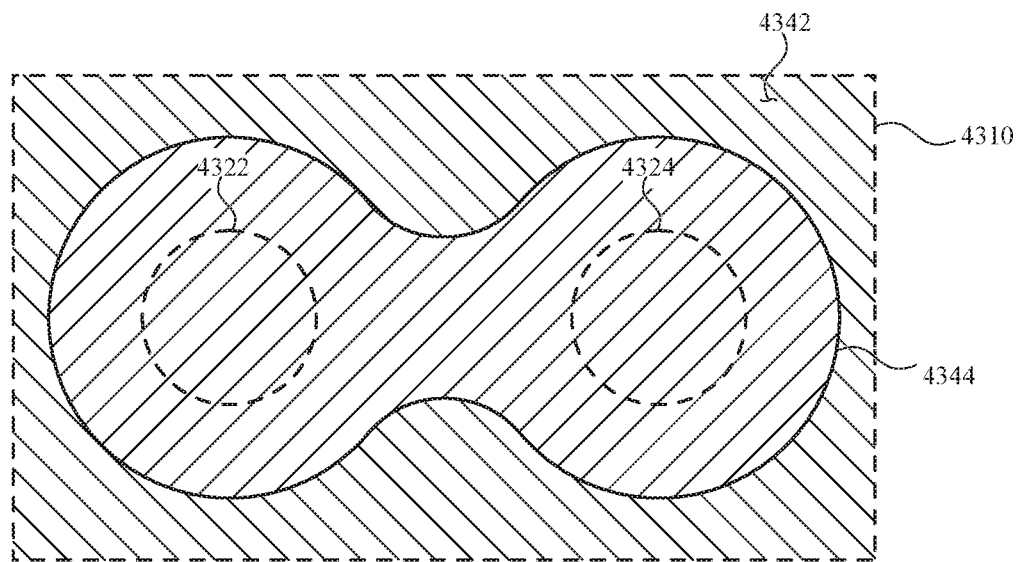

In some examples, wearable device 4300 (which can correspond to device 100 above) can include optical filtering structures. FIGS. 43A and 43B illustrate an optical filtering structure configured to preferentially pass light to and from proximity sensor 4310 according to examples of the disclosure. As shown in FIG. 43A, proximity sensor 4310 can include an opaque mask 4342 (shown in double crosshatching) which blocks light from entering the proximity sensor at respective areas surrounding the light emitter or emitters and light detector or light detectors of proximity sensor 4310. As shown in FIG. 43B, in some examples, opaque mask 4342 can include respective apertures (e.g., circular openings) in front of a light emitter 4322 (which can correspond, for example to LED1 3921 in FIGS. 39A-39B) and light detector 4324 (which can correspond, for example, to detector 3930 in FIGS. 39A-39B) to allow light to pass through this portion. Though not shown, opaque mask 4342 can include additional apertures for additional light emitters or light detectors (such as LED2 3923 in FIGS. 39A-39B). In some examples, the apertures in front of light emitter 4322 and light detector 4324 can include an optical filter 4344 formed of a material which is permeable to light of specific wavelengths (e.g., IR wavelengths) and blocks other light (e.g., visible light). In these examples, one or both of the opaque mask 4342 and optical filter 4344 can be formed by depositing opaque or filtering material on the inner surface of cover substrate 4312 (which can correspond to cover substrate 1812 above). FIG. 43B illustrates a top view of the proximity sensor configuration of FIG. 43A in which the area surrounding proximity sensor 4310 includes opaque mask 4342 which can be deposited, for example, on the inner surface of cover substrate 4312. As shown, optical filter 4344 can also be deposited on the inner surface of cover substrate 4312 at locations where light is emitted and received by proximity sensor 4310. In addition, other optical filtering structures not described here are contemplated within the scope of the disclosure including, for example, optical coatings configured to alter the reflection or transmission of light within device 4300.

Radio Frequency Detection Apparatus and Methods

Some examples of the disclosure relate to a device that can inject electromagnetic energy into the crown (e.g., crown 108 of device 100 above) to detect objects touching or proximate to the crown of a device. In some examples, a touch and/or proximity sensor can include a transmit circuit operatively coupled to a rotational input element (e.g., crown) and configured to inject electromagnetic energy via inductive coupling into the rotational input element, and a monitoring circuit operatively coupled to the rotational input element and configured to measure one or more parameters (e.g., resonant frequency). The one or more parameters can be indicative of an object touching or in proximity to the rotational input element. One or more touch or hover events can be detected based on the one or more parameters measured by the monitoring circuit. In some examples, the proximity sensor can include a transmit circuit and a receive circuit. The transmit circuit can include a first inductive element and one or more first capacitive elements and can oscillate at a first resonant frequency. The receive circuit can be operatively coupled to or formed as part of the rotational input element. The receive circuit can include a second inductive element and one or more second capacitive elements, and can oscillate at a second resonant frequency. The inductive elements of the transmit circuit and the receive circuit can be coupled transmit energy therebetween. In some examples, the resonant frequencies of the transmit circuit and receive circuit can be designed or turned to be the same frequency. In some examples, the touch and/or proximity sensor can measure changes in resonant frequency of the transmit circuit to detect touch and/or hover events.

Figure 44A:
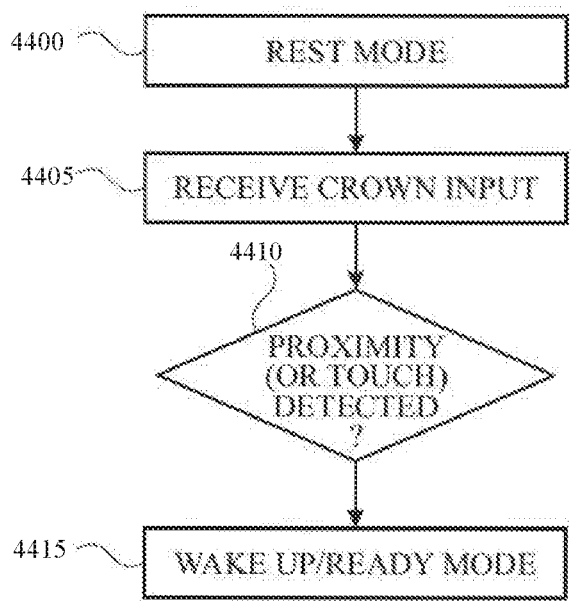
FIGS. 44A and 44B illustrate exemplary processes for processing touch and hover events detected at the crown according to examples of the disclosure.
Figure 44B:
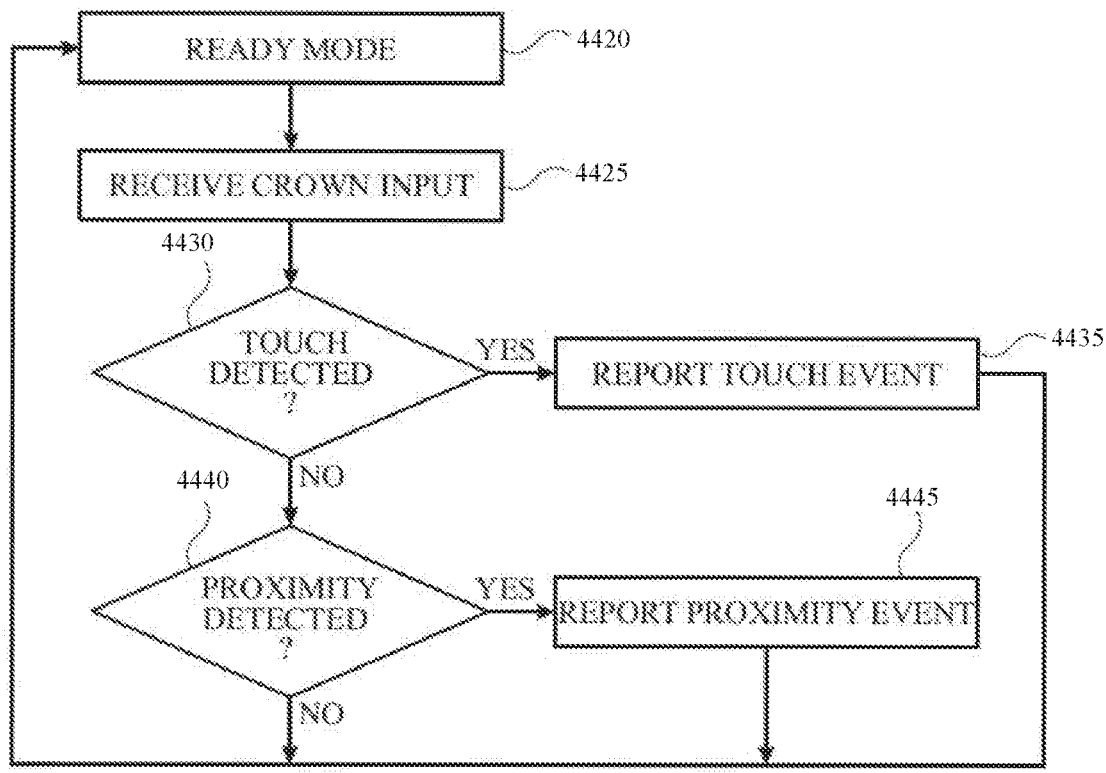

FIGS. 44A and 44B illustrate exemplary processes for processing touch and hover events detected at the crown according to examples of the disclosure. FIG. 44A illustrates an example process using proximity (hover) events and/or touch events at the crown to transition between two modes of operation. At block 4400, the device can be in a rest mode. The rest mode may correspond, for example, to a low-power mode. In some examples, referring back to FIG. 2, the display device (e.g., display device 220) can be powered down or enter a low-power state in the rest mode. Additionally or alternatively, in some examples, the touch sensing system (e.g., touch sensor panel 234 and touch controller 232) can be powered down or enter a low-power state in the rest mode. Additionally or alternative, in some examples, one or more processors, I/O devices and/or other circuitry can be powered down or enter a low-power state in the rest mode.

At block 4405, the device (e.g., a processor or state machine) can receive input from a touch and/or proximity sensor detecting touch or proximity events for the crown. In some examples, the touch and/or proximity sensor can be implemented using the crown and/or the crown shaft as part of the sensor. At block 4410, the device (e.g., the processor or state machine) can determine from the received input whether a touch event or proximity (hover) event is detected. If a proximity (hover) event is detected, processing can proceed to block 4415, where processing can wake up the device, and the device can enter a ready mode. For example, a proximity event can be reported when the touch and/or proximity sensor detects an object within a first threshold distance of the crown (e.g., within 1 cm of the crown). Waking up the device can including powering up one or more processors, I/O devices and/or other circuitry that were powered down or placed in a low-power state during rest mode, resuming touch sensing operations, and/or resuming display operations.

In some examples, the device can exit the rest mode and enter the ready mode in response to detecting a touch event, rather than a proximity event. For example, a touch event can be reported when the touch and/or proximity sensor detects an object within a second threshold distance of the crown. In some examples, the second threshold can be set such that the distance between the crown at the object is zero (direct contact). In some examples, the device can wake up and enter the ready mode in response to detecting either of a touch or hover event.

Although not illustrated, the device can return to the rest mode under various conditions. For example, the device can return to rest mode manually when user input is detected causing the device to enter a rest mode (e.g., covering the touch screen, rotating the touch screen away from the user, or in response to selection of UI element by touch, button, or crown input) or automatically in response to detecting no inputs for a threshold period of time (e.g., no touch, button or crown inputs). In some examples, as long as a touch or hover event is detected at the crown, the device cannot return to the rest mode.

In some examples, touch and/or hover events at the crown can be used as additional inputs to the device. FIG. 44B illustrates an example process using proximity (hover) events and/or touch input events as additional inputs. At block 4420, the device can be in a ready mode. At block 4425, the device can receive input from a touch and/or proximity sensor detecting touch or proximity events at the crown. In some examples, the touch and/or proximity sensor can be implemented using the crown and/or the crown shaft as part of the sensor. At block 4430, the device (e.g., the processor or state machine) can determine from the received input whether a touch event is detected (e.g., using a first threshold). If a touch event is detected, processing can proceed to block 4435, where a touch event can be reported. The reported touch event can be used by the device to perform one or more functions (e.g., changing the UI or selecting a UI element) corresponding to a touch event at the crown, and processing can return to block 4420 (i.e., the device can remain in ready mode). If no touch event is detected at block 4430, processing can proceed to block 4440, and the device (e.g., the processor or state machine) can determine from the received input whether a hover event is detected (e.g., using a second threshold). If a hover event is detected, processing can proceed to block 4445, where a hover event can be reported. The reported hover event can be used by device to perform one or more functions (e.g., changing the UI or selecting a UI element) corresponding to a hover event at the crown, and processing can return to block 4420 (i.e., the device can remain in ready mode). If no hover event is detected at block 4440, processing can proceed to block 4420 (i.e., the device can remain in ready mode). In some examples, if no touch or hover event is detected, the device can exit ready mode and return to rest mode (e.g., for example if no other inputs are detected in addition to detecting no touch or hover event at the crown).

The first thresholds used to detect touch events in the example processes of FIGS. 44A and 44B can be the same or different. The second thresholds used to detect hover events in the example processes of FIGS. 44A and 44B can be the same or different. Although discussed in the context of a crown for a wearable device, the exemplary processes of FIGS. 44A and 44B can be applied to a touch and/or proximity sensor implemented to detect touch or hover events for other rotary input devices, button inputs, or other inputs).

Figure 44C:
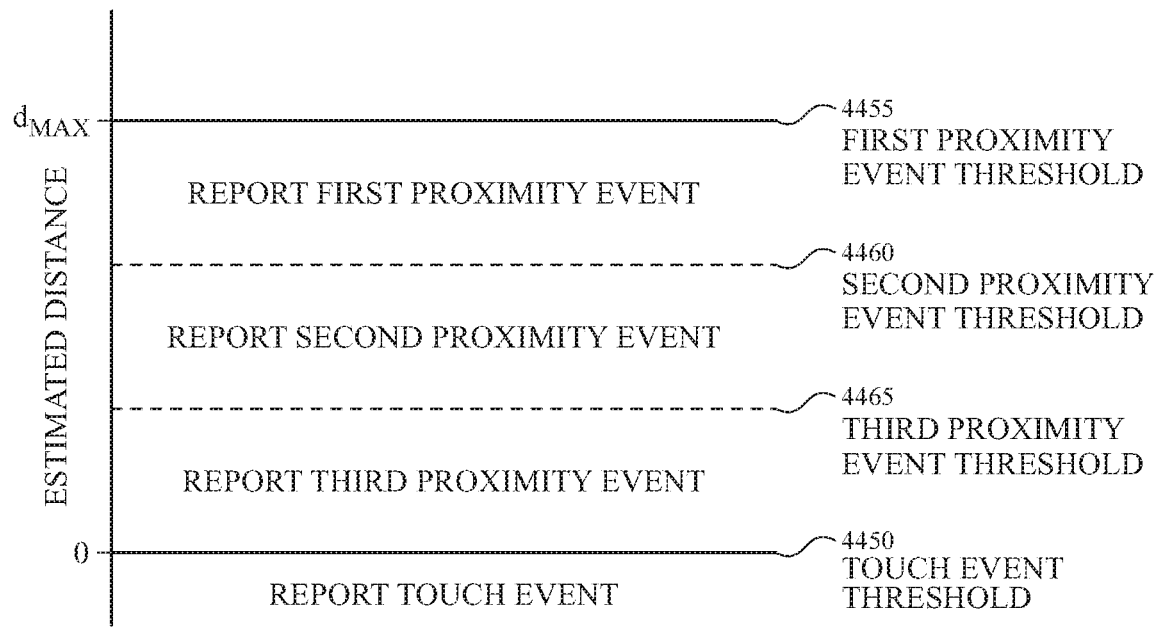
FIG. 44C illustrates examples of touch and hover events that can be reported based on the estimated distance between an object and a crown according to examples of the disclosure.

Although the hover event is described above as a binary event (i.e., hover event or no hover event), in some examples, different types of hover events can be reported. For example, the touch and/or proximity sensor can estimate a distance between the object and the crown. Depending on the distance, different types of hover events can be reported. FIG. 44C illustrates examples of touch and hover events that can be reported based on the estimated distance between an object and a crown according to examples of the disclosure. As described herein, the touch and/or proximity sensor can estimate a distance between the object and the crown. In some examples, a touch event threshold 4450 can be set at an estimated distance of zero (or within a threshold distance of zero, such as 5%, 10%, etc.). When the estimated distance is zero or less than zero (i.e., or otherwise meets touch detection threshold 4450), a touch event can be reported.

In some examples, a first proximity event threshold 4455 can be set at a maximum estimated distance ($d_{max}$) that can be detected by the sensor (or within a threshold distance of $d_{max}$, such as 5%, 10%, etc.) When the estimated distance is between the first proximity event threshold 4455 and the touch event threshold 4450, a proximity (hover) event can be reported. In some examples, one or more additional proximity event thresholds can be used to provide one or more additional proximity/hover event inputs. For example, FIG. 44C illustrates a second proximity event threshold 4460 and a third proximity event threshold 4465, which can allow reporting a first, second or third proximity/hover events. It should be understood that fewer or more proximity detection thresholds than illustrated in FIG. 44C can be used to generate a different number of proximity/hover events.

Returning to FIG. 44A, in some examples, detecting a proximity event that triggers waking up the device can be a proximity event meeting the first proximity event threshold of FIG. 44C (e.g., at least within the maximum detectable distance). In other examples, in order to wake up the device, the proximity event must meet a different proximity event threshold (i.e. the distance of the object is closer that the maximum detectable distance of the sensor).

As described herein, in some examples, the touch and/or proximity sensor can be implemented using the crown and/or crown shaft as part of the sensor. For example, a device including a crown can include a circuit to inject electromagnetic energy into the shaft and/or crown and monitor electrical effects due to an object touching or proximate to the crown. The monitored electrical effects can be used to detect a touch or hover event at the crown.

Figure 45A:
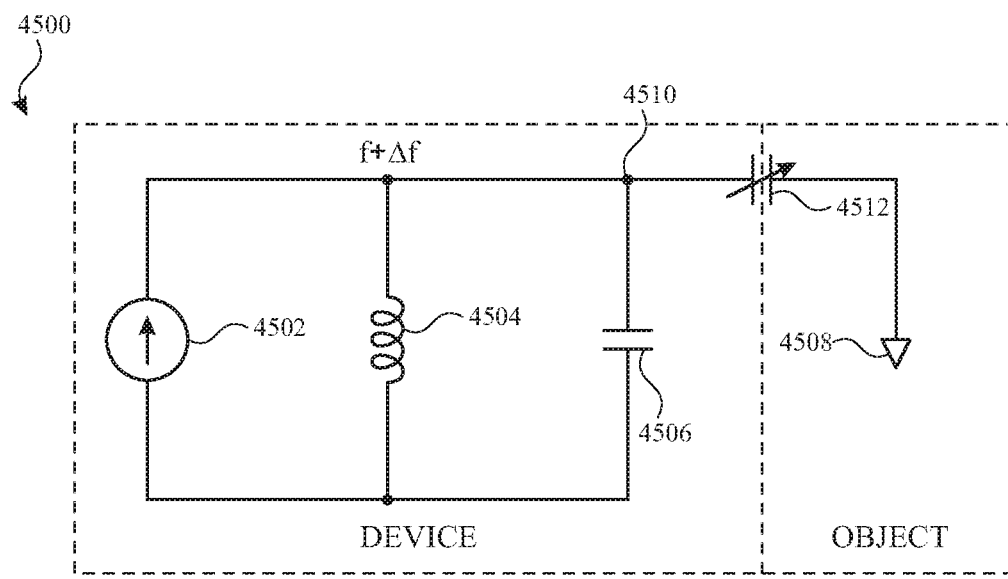
FIG. 45A illustrates a circuit diagram of an exemplary touch and/or proximity sensor according to examples of the disclosure.

FIG. 45A illustrates a circuit diagram of an exemplary touch and/or proximity sensor according to examples of the disclosure. FIG. 45A illustrates a circuit 4500 including a current source 4502, inductor 4504 and capacitance 4506. Circuit 4500 can be referred to as a resonant circuit or tank circuit that can oscillate with a resonant frequency f. Although circuit 4500 is illustrated as including a current source 4502, it is understood that current source 4502 can be replaced with any suitable driving source (e.g., a voltage source, etc.) When an object, modeled by ground 4508, is proximate to or contacting node 4510, a variable capacitance 4512 can be formed between the object and circuit 4500. The variable capacitance 4512 can cause a change in the operation of circuit 4500. For example, the resonant frequency of circuit 4500 can shift to f+Δf, where f can represent the resonant frequency without a proximate object and Δf can represent the shift in resonant frequency due to the variable capacitance introduced by a proximate object. The shift in frequency can be monitored and used to determine the presence of an object touching or proximate to circuit 4500. Additionally, the shift in frequency can be used to estimate the distance between the object and circuit 4500 based on the amount of shift in frequency, as the capacitance value associated with variable capacitance 4512 can be a function of the distance between the object and circuit 4500. It should be understood that the example circuit 4500 in FIG. 45A is exemplary only and fewer or additional components can be added in the same or a different configuration.

Although discussed above as monitoring a shift in frequency, the sensor can be configured to measure other parameters that can be used to determine touch and/or proximity events. For example, the dynamics of the circuit that can be measured can include changes in the amplitude or phase of the signals produced by the driving source (e.g., current source 4502). Depending on the signal dynamics to be measured, a suitable monitoring circuit or element (not shown) can be used to measure the parameter(s), which can be used to detect the presence of an object proximate to the crown and can be used to estimate the distance between the object and the crown from the parameter. For example, when the measured shift in frequency from the resonant frequency meets a first threshold, but not a second threshold, the object can be estimated to be proximate to the crown, but not touching the crown. The distance between the object and crown can be estimated as a function of the shift in frequency. When the object meets the second threshold, the object can be estimated to be touching the crown. In some examples, the first threshold can represent the maximum distance (e.g., $d=d_{max}$) between the object and the crown that can be detected by the sensor (e.g., above a noise threshold), and the second threshold can represent the minimum distance between the object and the crown (e.g., $d=0$). In some examples, detecting an object touching or proximate to the crown (and estimating its distance) can be based on measuring more than one of the parameters. In some examples, each of the one or more parameters can be compared to one or more thresholds to determine a touch and/or hover event.

In some examples, the touch and/or proximity sensor can include processing circuitry to process measured parameters and detect the presence of a touch or hover event and/or estimate the distance between an object and the crown. In other examples, the raw or partially processed data can be processed by other processing circuitry external to the sensor (e.g., by processor 202).

The detection range of the touch and/or proximity sensor can be a function of the sensitivity of the sensor to detect changes in capacitance between the object and the crown. As described herein, the capacitance can be a function of the surface area of the crown, the surface area of the object proximate to the crown, and the distance between the object and the crown. As a result, the maximum detectable distance of the sensor can be function of the surface area of the crown and the surface area of the finger.

Additionally or in the alternative, in some examples, rather than comparing one or more measured parameters to one or more thresholds to detect a touch and/or proximity event, a signature of an approaching object can be detected based on a multiple (e.g., a sequence) of measurements by the touch and/or proximity sensor. For example, an object approaching the crown can be sensed to have a signature of increasing shifts in resonant frequency that can be used to trigger a touch/proximity event. In some examples, the rate of change of the shifts in resonant frequency can be used to determine if the rate of change corresponds to the signature of an object approaching and/or contacting the crown.

Figure 45B:
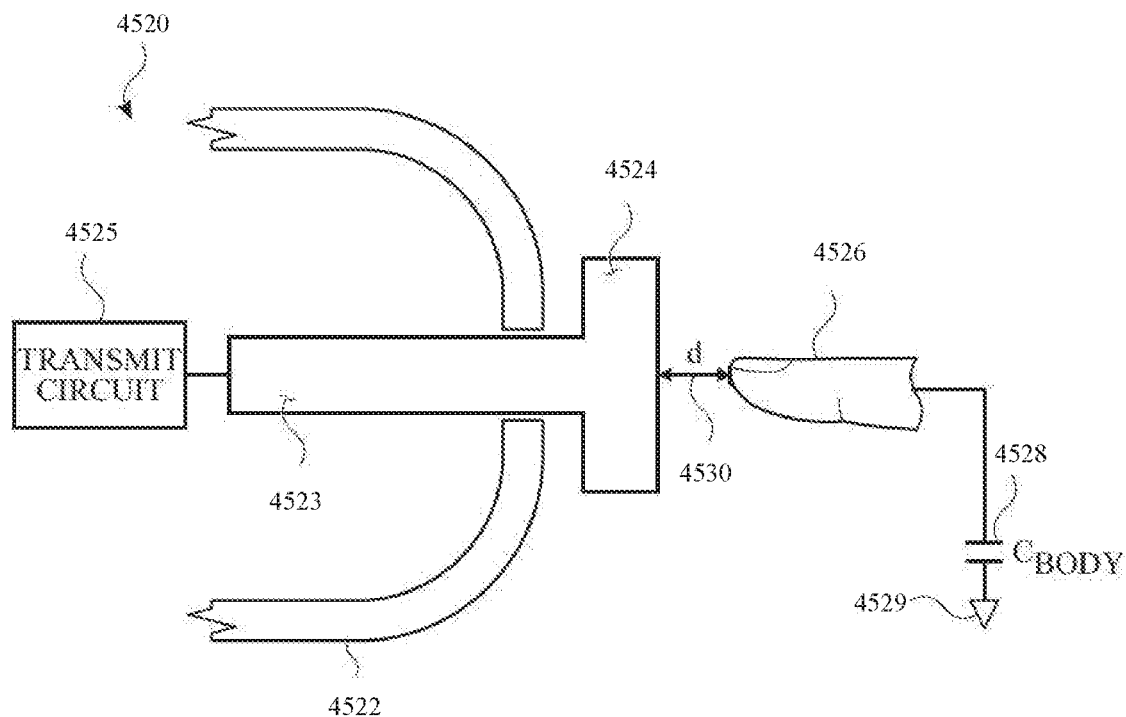
FIG. 45B illustrates an example object in proximity to an example crown according to examples of the disclosure.

The example circuit of FIG. 45A can be implemented in a device with a crown to detect touch and/or proximity between an object and the crown. FIG. 45B illustrates an example object in proximity to an example crown according to examples of the disclosure. FIG. 45B illustrates an example device 4520 (e.g., a wearable device) including a housing 4522. Shaft 4523 can extend from the housing 4522 and can be coupled to crown 4524. Transmit circuit 4525 can be operatively coupled to shaft 4523 and can correspond, for example, to the circuit 4500 illustrated in FIG. 45A. Transmit circuit 4525 can inject electromagnetic energy into shaft 4523 and crown 4524. An object, such as finger 4526 (which can be considered to be coupled to ground through $C_{body}$ 4528) approaching crown 4524 can cause a capacitance to form between the crown 4524 and ground 4529. The capacitance formed between the finger and crown can be a function of the distance 4530 (labeled "d") between the crown 4524 and the finger 4526. This capacitance can cause dynamic changes in the transmit circuit 4525 that can be measured by a monitoring circuit (not shown) to detect the presence of an object proximate to or touching the crown based, for example, on the estimated distance 4530.

Figure 45C:
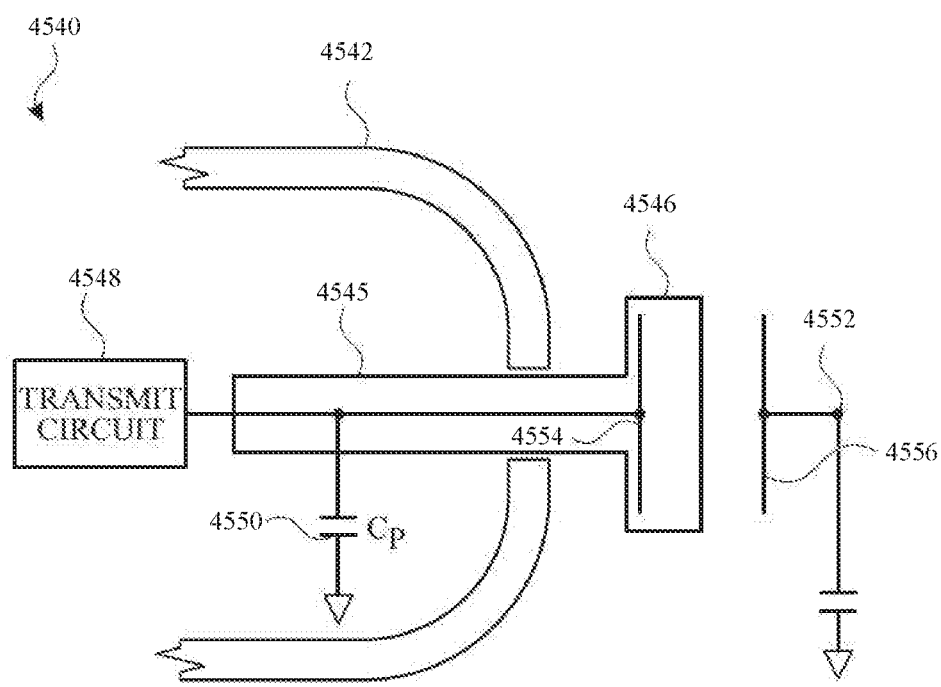
FIG. 45C illustrates an example touch and/or proximity sensor using a crown according to examples of the disclosure.

FIG. 45C illustrates an example touch and/or proximity sensor using a crown according to examples of the disclosure. FIG. 45C illustrates an example device 4540 (e.g., a wearable device) including a housing 4542, shaft 4544 and crown 4546. Shaft 4544 and crown 4540 can be modeled by a parasitic capacitance 4550. Transmit circuit 4548 (e.g., corresponding to the circuit 4500 illustrated in FIG. 45A) can be operatively coupled to shaft 4544 and crown 4546. In some examples, the parasitic capacitance 4550 of the shaft and crown can replace the capacitor 4506 in FIG. 45A. In other examples, the parasitic capacitance can add to capacitor 4506 forming an equivalent capacitance for the transmit circuit 4548. The circuit elements of transmit circuit 4548 can be selected to cause transmit circuit to resonate at a desired frequency using the effective capacitance of parasitic capacitance 4550 and additional capacitance from transmit circuit 4548 (if any) and the inductor from transmit circuit 4548. In some examples, transmit circuit 4548 can include an adjustable capacitance to allow for tuning the resonant frequency of transmit circuit 4548.

Transmit circuit 4548 can inject electromagnetic energy into shaft 4544 and crown 4546 as discussed above. An object, represented by node 4552 (which can be considered to be coupled to ground) can form an additional capacitance between the crown, represented by a first parallel plate 4554, and the object, represented by a second parallel plate 4556 in FIG. 45C. The capacitance formed between parallel plates 4554 and 4556 can correspond to the variable capacitance illustrated in FIG. 45A. This variable capacitance can cause dynamic changes in the operation of transmit circuit 4548 that can be measured by a monitoring circuit (not shown) to detect the presence of the object proximate to or touching the crown 4546.

Figure 46:
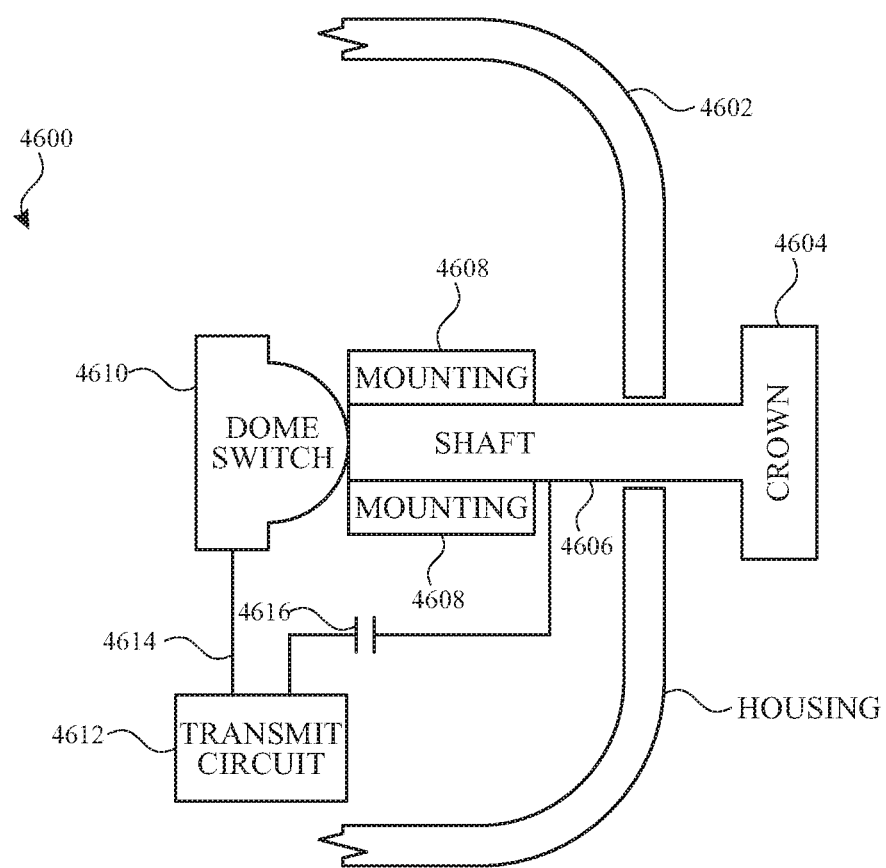
FIG. 46 illustrates an example contact between a crown/shaft and transmit circuit according to examples of the disclosure.

In the examples described above, the transmit circuit is illustrated as injecting energy into the shaft and/or crown. In some examples, an electrical contact can be added to couple the transmit circuit to the crown. The electrical contact can be a single point contact. In some examples, a bearing and/or slip ring (or other contact mechanisms) can be used to couple the shaft to transmit circuitry. FIG. 46 illustrates an example contact between a crown/shaft and transmit circuit according to examples of the disclosure. FIG. 46 illustrates device 4600 including a housing 4602, crown 4604 and shaft 4606. Shaft 4606 can be coupled to a mounting 4608 that can allow rotational movement by crown 4604 and shaft 4606. The proximal (rear) portion of shaft 4606 can be formed, at least in part, from a conducting material that can contact dome switch 4610. In some examples, the portion of dome switch 4610 contacting shaft 4606 can be conducting as well. Transmit circuit 4612 can be coupled (e.g., via wired pathway 4614) to the conductive portion of dome switch

4610, such that the transmit circuit can inject energy into the crown via the existing point of contact between the dome switch 4610 and shaft 4606 (i.e., without adding an additional point of contact to the shaft).

In some examples, rather than using a physical contact to the shaft and/or crown, which can be difficult (e.g., because of the rotational movement of the crown), a wireless coupling can be used. In some examples, energy can be injected into the shaft and/or crown via capacitive coupling. For example, the transmit circuit 4612 can be disposed proximate to the shaft (or crown) such that energy in the transmit circuit can capacitively couple (e.g., via capacitive pathway 4616) to the shaft and/or crown. Transmitting energy via capacitive coupling, however, can consume significant power in order to transfer enough energy to the crown for proper touch and/or proximity sensing.

Figure 47A:
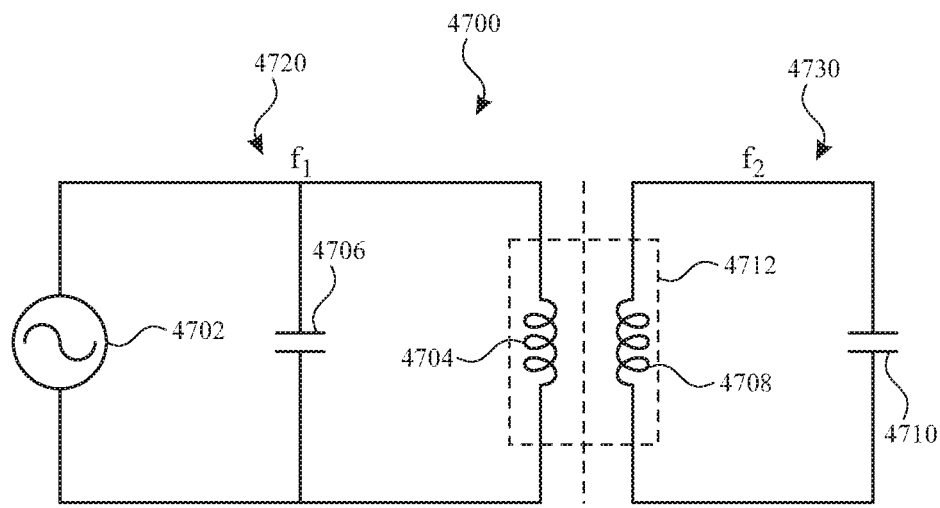
FIGS. 47A and 47B illustrate circuit diagrams of an exemplary touch and/or proximity sensor using inductive coupling according to examples of the disclosure.
Figure 47B:
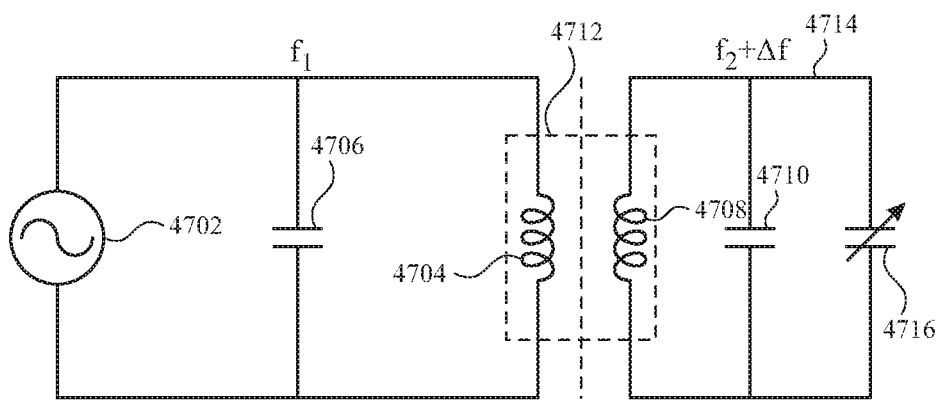

In some examples, energy can be injected into the shaft and/or crown via inductive coupling (e.g., a transformer). Inductive coupling can, in some examples, provide for relatively efficient energy transfer to the shaft and/or crown (as compared with capacitive coupling described above) and without requiring reliable contact with the shaft and/or crown. FIGS. 47A and 47B illustrate circuit diagrams of an exemplary touch and/or proximity sensor using inductive coupling according to examples of the disclosure. FIG. 47A illustrates a circuit 4700 including a transmit (Tx) stage 4720 and a receive (Rx) stage 4730. Tx stage 4720 can include a voltage source 4702, inductor 4704 and capacitor 4706. Tx stage 4720 can be referred to as a resonant circuit or tank circuit that can oscillate with a resonant frequency $f_1$ (e.g., based on the inductance of inductor 4704 and the capacitance of capacitor 4706). Although Tx stage 4720 is illustrated as including a voltage source 4702, it is understood that voltage source 4702 can be replaced with any suitable driving source (e.g., a current source, etc.) Rx stage 4730 can include inductor 4708 and capacitor 4710. Rx stage 4730 can also be referred to as a resonant circuit or tank circuit that can oscillate with a resonant frequency $f_2$ (e.g., based on the inductance of inductor 4708 and the capacitance of capacitor 4710). Inductors 4704 and 4708 together can form a transformer 4712 to inductively couple energy between the Tx stage 4720 and Rx stage 4730.

FIG. 47B illustrates example circuit 4700 when an object is touching or proximate to the Rx stage 4720. When an object is proximate to or contacting node 4714 of Rx stage 4730, for example, a variable capacitance 4716 can be formed between the object and circuit Rx stage 4730. The variable capacitance 4716 can cause a change in the operation (detuning) of Rx stage 4730 (e.g., due to energy dissipated through the finger). For example, the resonant frequency of Rx stage 4730 can shift to $f_2+\Delta f$, where $f_2$ can represent the resonant frequency without a proximate object and $\Delta f$ can represent the shift in resonant frequency due to the variable capacitance introduced by a proximate object. The shift in frequency in Rx stage 4730 can cause a shift in frequency of Tx stage 4720 (detuning), which can be monitored and used to determine the presence of an object touching or proximate to circuit 4700. Additionally, the shift in frequency can be used to estimate the distance between the object and circuit 4700 based on the amount of shift in frequency, as the capacitance value associated with variable capacitance 4716 can be a function of the distance between the object and circuit 4700. It should be understood that the example circuit 4700 in FIGS. 47A and 47B is exemplary only and fewer or additional components can be added in the same or a different configuration.

In some examples, Tx stage 4720 and Rx stage 4730 can be designed to have the same resonant frequency (i.e., $f_1=f_2$), though in some examples, Tx stage 4720 and Rx stage 4730 can be designed to have different resonant frequencies. Using a common resonant frequency for Tx stage 4720 and Rx stage 4730 can increase (and, in some examples, maximize) the power transfer between the two stages. In some examples, capacitor 4506 and/or capacitor 4510 can be adjustable such that the resonant frequency can be turned for Tx stage 4720 and/or Rx stage 4730. Additionally, improving the coupling between inductors 4704 and 4708 can improve the energy transfer between the two stages.

Although discussed above as monitoring a shift in frequency, the sensor can be configured to measure other parameters that can be used to determine touch and/or proximity events. For example, the dynamics of the circuit that can be measured can include changes in the amplitude or phase of the signals produced by the driving source (e.g., voltage source 4702). Additionally, in some examples, the dynamics can be detuning of the Tx stage measured, for example, by power loss or standing wave ratio. Depending on the signal dynamics to be measured, a suitable monitoring circuit or element (not shown) can be used to measure the parameter(s), which can be used to detect the presence of an object proximate to the crown and can be used to estimate the distance between the object and the crown from the parameter. For example, when the measured shift in frequency from the resonant frequency meets a first threshold, but not a second threshold, the object can be estimated to be proximate to the crown, but not touching the crown. The distance between the object and crown can be estimated as a function of the shift in frequency. When the object meets the second threshold, the object can be estimated to be touching the crown. In some examples, the first threshold can represent the maximum distance (e.g., $d=d_{max}$) between the object and the crown that can be detected by the sensor (e.g., above a noise threshold), and the second threshold can represent the minimum distance between the object and the crown (e.g., $d=0$). In some examples, detecting an object touching or proximate to the crown (and estimating its distance) can be based on measuring more than one of the parameters. In some examples, each of the one or more parameters can be compared to one or more thresholds to determine a touch and/or hover event.

In some examples, the touch and/or proximity sensor can include processing circuitry to process measured parameters and detect the presence of a touch or hover event and/or estimate the distance between an object and the crown. In other examples, the raw or partially processed data can be processed by other processing circuitry external to the sensor (e.g., by processor 202).

The detection range of the touch and/or proximity sensor can be a function of the sensitivity of the sensor to detect changes in capacitance between the object and the crown. As described herein, the capacitance can be a function of the surface area of the crown, the surface area of the object proximate to the crown, and the distance between the object and the crown. As a result, the maximum detectable distance of the sensor can be function of the surface area of the crown and the surface area of the finger.

Additionally or alternative, in some examples, rather than comparing one or more measured parameters to one or more thresholds to detect a touch and/or proximity event, a signature of an approaching object can be detected based on a multiple (e.g., a sequence) of measurements by the touch and/or proximity sensor. For example, an object approaching the crown can be sensed to have a signature of increasing shifts in resonant frequency that can be used to trigger a touch/proximity event. In some examples, the rate of change of the shifts in resonant frequency can be used to determine if the rate of change corresponds to the signature of an object approaching and/or contacting the crown.

Figure 48:
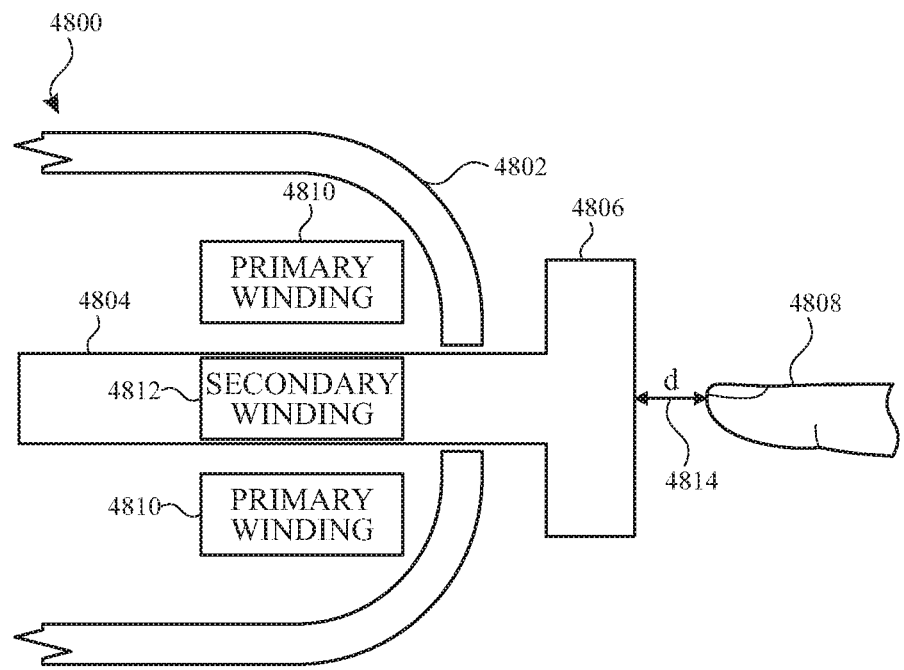
FIG. 48 illustrates an example object in proximity to an example crown according to examples of the disclosure.

The example circuit of FIGS. 47A and 47B can be implemented in a device with a crown to detect touch and/or proximity between an object and the crown. FIG. 48 illustrates an example object in proximity to an example crown according to examples of the disclosure. FIG. 48 illustrates an example device 4800 (e.g., a wearable device) including a housing 4802. Shaft 4804 can extend from the housing 4802 and can be coupled to crown 4806. The primary winding 4810 and secondary winding 4812 can be inductively coupled (e.g., forming a transformer that can correspond to transformer 4712) of the crown touch and/or proximity sensor. The transformer formed by primary winding 4810 and secondary winding 4812 can operatively couple a Tx stage (including primary winding 4810) to an Rx stage formed from shaft 4804 and/or crown 4806 (including secondary winding 4812). The transformer can inject electromagnetic energy from the Tx stage into the Rx stage formed from shaft 4804 and/or crown 4806 without a physical connection between the Tx stage and Rx stage. An object, such as finger 4808 (which can be considered to be effectively shorted to ground through $C_{body}$) approaching crown 4806 can cause a capacitance to form between the crown 4806 and ground. The capacitance formed between the finger and crown can be a function of the distance 4814 (labeled "d") between the crown 4806 and the finger 4808. This capacitance can cause dynamic changes in the Rx stage that can in turn cause to the Tx stage. The dynamic changes in the Tx stage can be measured by a monitoring circuit (not shown) to detect the presence of an object proximate to or touching the crown based, for example, on the estimated distance 4814.

Figure 49A:
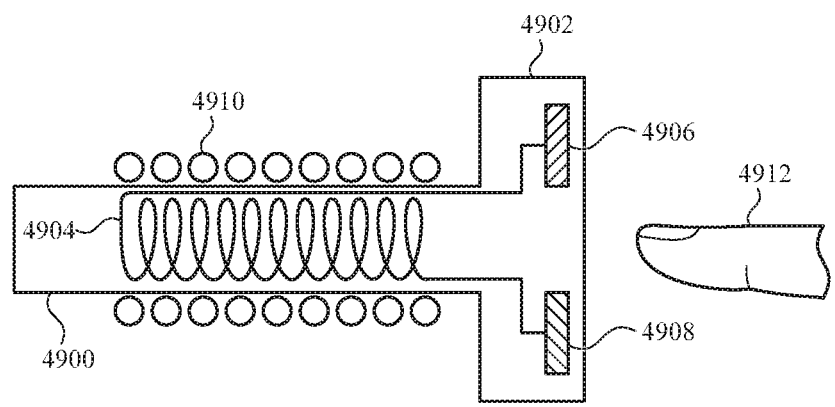
FIG. 49A illustrates an example touch and/or proximity sensor using a crown according to examples of the disclosure.

FIG. 49A illustrates an example touch and/or proximity sensor using a crown according to examples of the disclosure. FIG. 49A illustrates an example shaft 4900 and crown 4902, which can form an Rx stage. Shaft 4900 can have a cylindrical shape, for example, and can include inductor 4904 forming the secondary winding of a transformer (coupled inductors). Inductor 4904 can be coupled to two electrodes 4906 and 4908 disposed in the crown. Each electrode can be coupled to one terminal of inductor 4904. Inductor 4910, forming the primary winding of the transformer, can envelope shaft 4900 including some or all of inductor 4904 (without contacting secondary winding of inductor 4904). In other words the inductor 4904 and inductor 4908 can form a solenoid within a solenoid that can provide inductive coupling to transfer energy between the Tx stage and Rx stage. Inductor 4910 can correspond to the inductor of the Tx stage, the remainder of which is not shown for ease of illustration and brevity of description. When an object, such as finger 4912, is proximate to or contacts crown 4906, a capacitance can be formed between each of electrodes 4906 and 4908. The capacitances can detune the Rx stage and thereby detune the Tx stage (via inductive coupling).

It should be understood that the sensor in FIG. 49A is exemplary only and fewer or additional components can be added in the same or a different configuration. For example, the shaft and/or crown can include one or more additional capacitors (including a variable capacitor, for example) to tune the Rx stage to a desired resonant frequency. Additionally or alternatively, the Tx stage can include one or more additional capacitors (including a variable capacitor, for example) to tune the Tx stage resonant frequency to match the resonant frequency of the Rx stage.

Figure 49B:
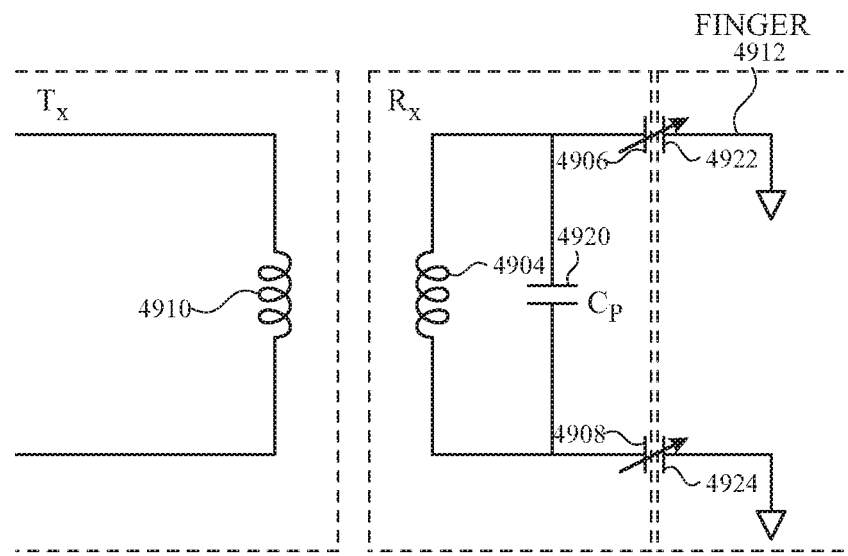
FIG. 49B illustrates a circuit diagram corresponding to the example touch and/or proximity sensor of FIG. 49A.

FIG. 49B illustrates a circuit diagram corresponding to the example touch and/or proximity sensor of FIG. 49A. As illustrated in FIG. 49B, inductor 4910 of the Tx stage can inductively couple with inductor 4904 of the Rx stage. The shaft 4900 and/or crown 4902 can form a parasitic capacitance 4920. Inductor 4904 and parasitic capacitance 4920 can form the resonant circuit of the Rx stage. Additionally, electrodes 4906 and 4908 disposed in the crown 4902 can each be modeled as one plate of a variable capacitors 4922 and 4924. An object, such as finger 4912, proximate to crown 4902 can be modeled as a second plate of the variable capacitors 4922 and 4924.

In some examples, inductor 4904 can be wire wrapped around an outer surface of the shaft 4900. In some examples, inductor 4904 can be incorporated, at least in part, into shaft 4900. In some examples, inductor 4910 can be a wire wrapped around shaft 4900. In some examples, inductor 4910 can be incorporated, at least in part, into the shaft mounting (e.g., formed internally to the mounting or wrapped around a surface of the shaft mounting facing the shaft). The amount of coupling between inductor 4904 and inductor 4908 can be a design parameter for the touch and/or proximity sensor. The placement of inductor 4904 and inductor 4910 can impact the coupling between the Rx stage and the Tx stage. In some examples, to increase inductive coupling, inductor 4904 and inductor 4908 can be disposed such that the electromagnetic field lines of inductor 4908 can be captured by inductor 4904. When inductor 4904 is located closer to the outside surface of the shaft, more field lines of inductor 4908 can be captured (increased coupling). When inductor 4904 is located closer to the center of the shaft, fewer field lines of inductor 4908 can be captured (decreased coupling).

In some examples, one or more of the inductors can be implemented using non-ferrous, air core inductors (e.g., with a high quality factor). In some examples, the electric field can be concentrated to improve efficiency of power transfer between the inductors. For example, rather than an air core, one or more of the inductors can be implemented using a ferrous core (e.g., soft iron, steel, alloy, etc.). In some examples, the inductors can be cut into sheets to prevent current losses.

Figure 49C:
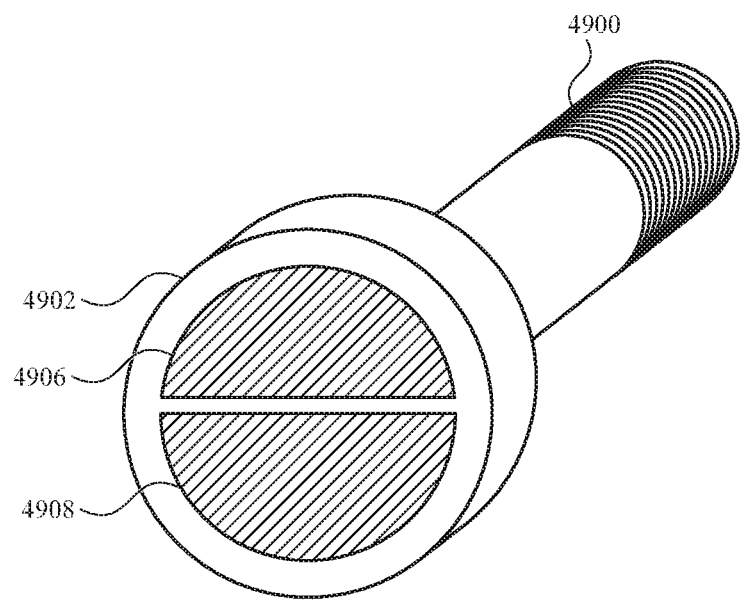
FIG. 49C illustrates a view of crown electrodes for the example touch and/or proximity sensor of FIG. 49A.

FIG. 49C illustrates a view of crown electrodes for the example touch and/or proximity sensor of FIG. 49A according to examples of the disclosure. FIG. 49C illustrates shaft 4900 with crown 4902 at its distal end. Electrodes 4906 and 4908 can be disposed in crown 4902, and can be electrically isolated (e.g., separated from one another by an insulator). Although electrodes 4906 and 4908 are illustrated in FIG. 49C as having a semi-circular shape (i.e., in the plane of the crown face), in other examples, the electrodes can have a different shape. For example, the electrodes can have a polygonal or square shape, for example. Additionally, the electrodes can also have different orientations. For example, the electrodes can have an orientation as illustrated and described below with reference to FIG. 50C.

Referring back to FIG. 49A, the crown electrodes (and, in some examples, portions of the feeding traces/electrodes in the shaft) can be formed of one or more conducting materials (e.g., metal, semi-conductor, alloy, conducting plastic or composites, etc.). In some examples, the conducting portions of the shaft and/or crown can be formed of the same materials. In some examples, the conducting portions of the shaft and/or crown can be formed of different conducting materials.

In some examples, the dimensions of the crown electrodes can be selected to ensure sufficient coupling with an object touching or proximate to the crown to enable touch and/or proximity detection. Increasing the size of the crown electrodes can increase capacitive coupling and can thereby increase the sensitivity of the sensor.

The two crown electrodes 4906 and 4908 can be coupled to remaining sensor circuitry (e.g., of the Rx stage) through traces/electrodes in shaft 4900. The electrodes in shaft 4900 can be separated by an insulating material. In some examples, the electrodes in shaft 4900 can have a coaxial structure including one shaft electrode in the center of shaft 4900 coupling to one of electrodes 4906 and 4908 and a second shaft electrode away from the center of shaft 4900 coupling to a second electrode of electrodes 4906 and 4908, for example. The electrodes in shaft 4900 can be separated by a dielectric material.

Figure 50A:
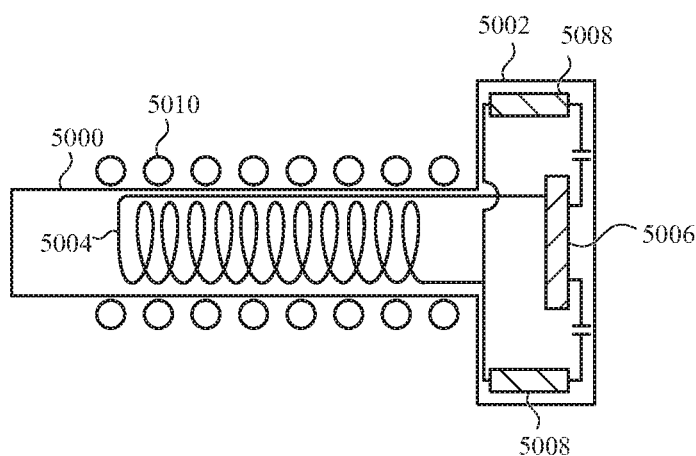
FIG. 50A illustrates another example touch and/or proximity sensor using a crown according to examples of the disclosure.

FIG. 50A illustrates another example touch and/or proximity sensor using a crown according to examples of the disclosure. FIG. 50A illustrates an example shaft 5000 and crown 5002, which can form an Rx stage. Shaft 5000 can include inductor 5004 forming the secondary winding of a transformer. Inductor 5004 can be coupled to two electrodes 5006 and 5008 that can be disposed in the crown. Inductor 5010, forming the primary winding of the transformer, can envelope shaft 5000 including some or all of inductor 5004 (without contacting secondary winding of inductor 5004). Unlike the electrodes in the sensor of FIG. 49A, the electrodes in the sensor of FIG. 50A can be disposed in the crown such that electrode 5006 can be disposed in the center of the crown 5002 and electrode 5008 can be disposed away from the center of crown 5002 (e.g., around the circumference of a cylindrical portion of the crown). It should be understood that the sensor in FIG. 50A is exemplary only and fewer or additional components can be added in the same or a different configuration.

Figure 50B:
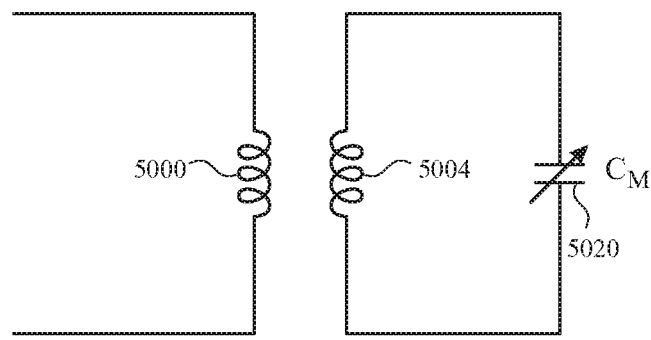
FIG. 50B illustrates a circuit diagram corresponding to the example touch and/or proximity sensor of FIG. 50A.

FIG. 50B illustrates a circuit diagram corresponding to the example touch and/or proximity sensor of FIG. 50A. As illustrated in FIG. 50B, inductor 5010 of the Tx stage can inductively couple with inductor 5004 of the Rx stage. The shaft 5000 and/or crown 5002 can form a parasitic capacitance 5020 (i.e., mutual capacitance between electrodes 5006 and 5008). Inductor 5004 and parasitic capacitance 5020 can form the resonant circuit of the Rx stage. When an object is proximate to or contacts crown 5006, the object can interfere with the electric field between electrodes 5006 and 5008 that can cause a change in the mutual capacitance (modeled by the variable capacitance of capacitor 5020). The change in mutual capacitance can detune the Rx stage and thereby detune the Tx stage (via inductive coupling).

Figure 50C:
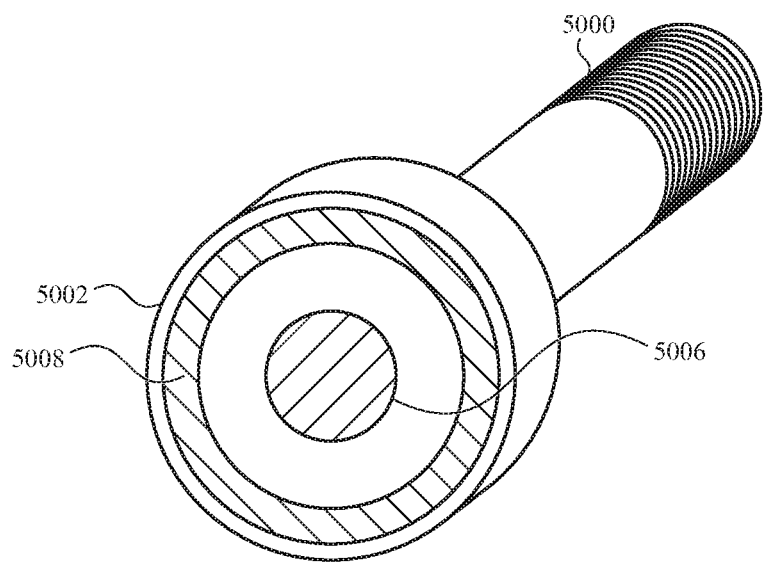
FIG. 50C illustrates a view of crown electrodes for the example touch and/or proximity sensor of FIG. 50A according to examples of the disclosure.

FIG. 50C illustrates a view of crown electrodes for the example touch and/or proximity sensor of FIG. 50A according to examples of the disclosure. FIG. 50C illustrates shaft 5000 with crown 5002 at its distal end. Electrodes 5006 and 5008 can be disposed in crown 5002, and can be separated from one another by an insulator so as to form mutual capacitance therebetween. Although electrodes 5006 and 5008 are illustrated in FIG. 50C as having a circular shape (in the plane of the crown face), in other examples, the electrodes can have a different shape. For example, the electrodes can have a polygonal, semi-circular or square shape. Additionally, the electrodes can also have different orientations. For example, the electrodes can have an orientation as illustrated and described with reference to FIG. 49C.

Figure 51A:
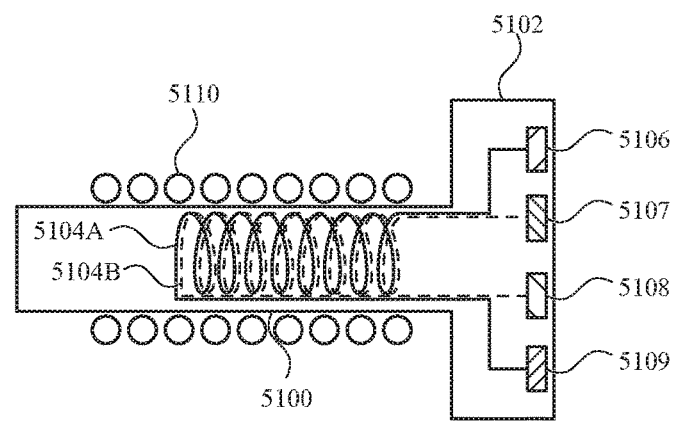
FIGS. 51A-51D illustrate example touch and/or proximity sensors using four crown electrodes according to examples of the disclosure.

In some examples, rather the two electrodes, the crown can have a different number of electrodes (e.g., one or more). FIGS. 51A-51D illustrate example touch and/or proximity sensors using four crown electrodes according to examples of the disclosure. FIG. 51A illustrates an example shaft 5100 and crown 5102, which can form an Rx stage. Shaft 5100 can include two inductors 5104A and 5104B forming the secondary windings of transformers for two Rx stages. Inductors 5104A and 5100B can be coupled to four electrodes 5106-5109 that can be disposed in the crown. Inductor 5110, forming the primary winding of the transformer can envelope shaft 5100 including some or all of the inductors 5104A and 5104B (without contacting the secondary windings). It should be understood that the sensor in FIG. 51A is exemplary only and fewer or additional components can be added in the same or a different configuration.

Figure 51B:
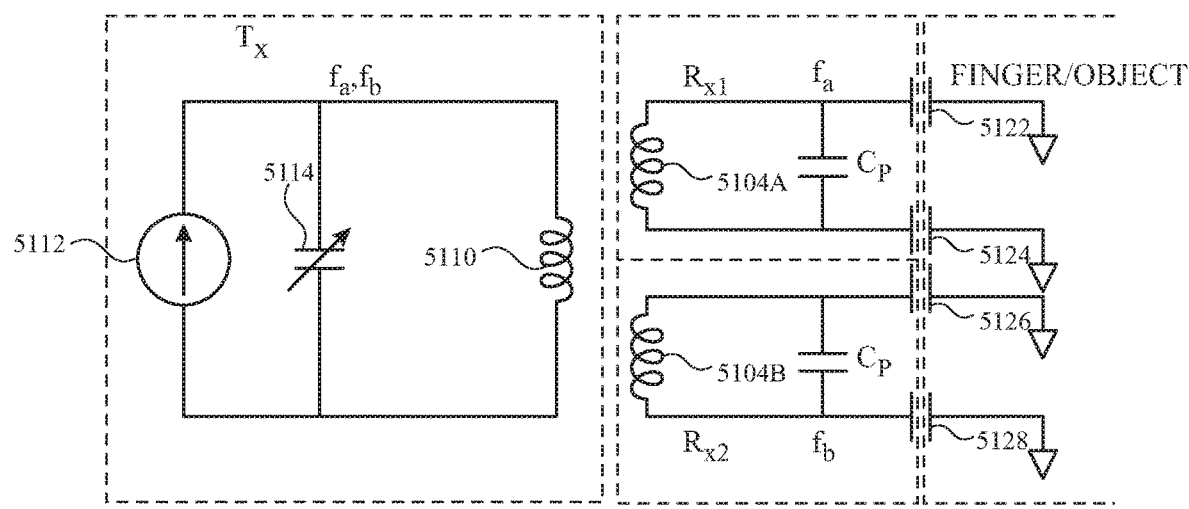

FIG. 51B illustrates a circuit diagram corresponding to the example touch and/or proximity sensor of FIG. 51A. As illustrated in FIG. 51B, inductor 5110 of the Tx stage can inductively couple with the two inductors 5104A and 5104B of the two Rx stages. The shaft 5100 and/or crown 5102 can form a parasitic capacitance. The inductor 5104A and the parasitic capacitance can form the resonant circuit of the first Rx stage and the inductor 5104B and the parasitic capacitance can form the resonant circuit of the second Rx stage. The resonant frequency of the first and second Rx stages can be different (by changing inductance or capacitance for the respective circuits) so as to distinguish between the two Rx stages as described herein. When an object, such as a finger, is proximate to or contacts crown 5106, capacitances 5122, 5124, 5126 and 5128 can be formed between each of electrodes 5106-5109 and the object. In some examples, system can measure a change in mutual capacitance between pairs of electrodes 5106-5109 (as discussed, for example, with reference to FIG. 50B). The capacitances can detune the corresponding Rx stage and thereby detune the Tx stage (via inductive coupling).

The Tx stage can include, in addition to inductor 5106, a current source 5112 (or some other driving source) and an adjustable capacitor 5114, for example. The Tx stage can be tuned to two different resonant frequencies $f_A$ and $f_B$ to match the corresponding resonant frequencies for the two Rx stages. By switching the tuning of the Tx stage (e.g., alternating between two different capacitance values for adjustable capacitor 5114 when the sensor is active), the sensor can measure the detuning due to objects proximate to the electrodes for each Rx stage.

Using two different Rx stages for proximity/touch detection at the crown can allow, for example, for improved differentiation of touch and/or proximity events due to person's wrist (undesired) and due to an object such as a finger (desired). For example, the device may want to wake up (from a rest mode) when touch and/or proximity is detected at the crown by a person's finger (intentional use) and not by accidental proximity or touch by a person's wrist. Improving differentiation of finger and wrist input, for example, can reduce the number of false positive touch and/or proximity events reported. Additionally, two or more Rx stages can allow, for example, for touch and/or proximity information for different parts of the crown (that can be used, for example, as additional touch and/or proximity inputs for the crown).

In some examples, the touch and/or proximity information for the outer electrodes (e.g., electrode 5106 and 5109) can be used as a first input that can represent touch and/or proximity events around the circumference of the crown. The touch and/or proximity information for the inner electrodes (e.g., 5107 and 5108) can be used as a second input that can represent touch and/or proximity events at the face of the crown. In some examples, the touch and/or proximity information from each crown electrode (or group of crown electrodes) can be used to distinguish between undesired touch and/or proximity from person's wrist and desired touch and/or proximity from a finger or other object, which can reduce false positives due to undesired contact by a user's wrist. For example, a ratio of the touch and/or proximity information can be compared to a threshold to predict whether the object is a finger or wrist. In other examples, the touch and/or proximity information from each electrode (or group of electrodes) can be compared with a threshold, and the touch and/or proximity event can be reported only when the thresholds are met for each electrode (or group of electrodes).

Figure 51C:
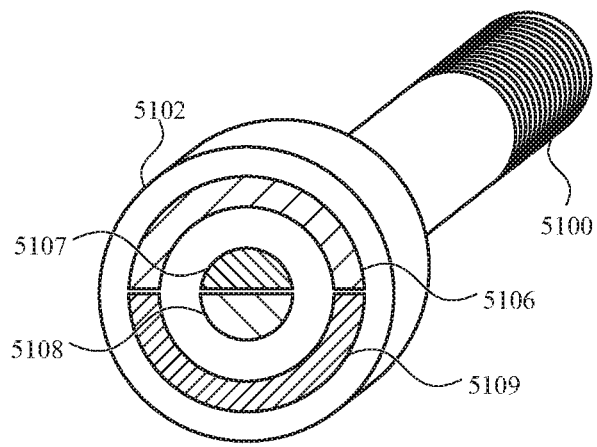
Figure 51D:
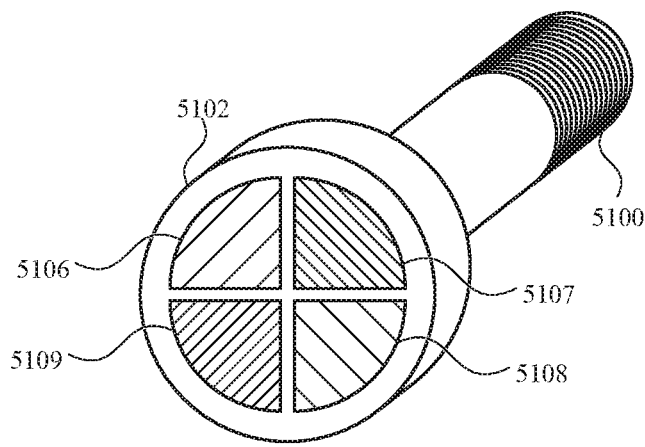

FIGS. 51C and 51D illustrate views of crown electrodes for the example touch and/or proximity sensor of FIG. 51A according to examples of the disclosure. FIGS. 51C and 10D illustrate shaft 5100 with crown 5102 at its distal end. Electrodes 5106-5109 can be disposed in crown 5102. In FIG. 51C, the electrodes 5107 and 5108 can have a semi-circular shape (in the plane of the crown face). Electrodes 5106 and 5109 can have a semi-disk shape (in the plane of the crown face). In FIG. 51D, the electrodes 5106-5109 can have a wedge shape (in the plane of the crown face). In other examples, the electrodes can have different shapes and/or orientations than illustrated in FIGS. 51C and 51D.

Figure 52:
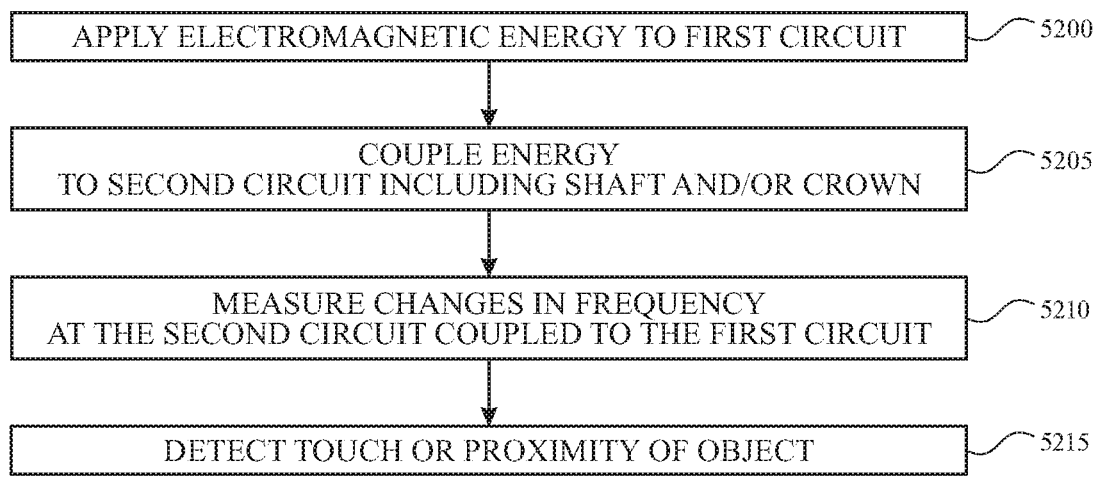
FIG. 52 illustrates an exemplary process for detecting objects touching and/or proximate to the crown of a device according to examples of the disclosure.

FIG. 52 illustrates an exemplary process for detecting objects touching and/or proximate to the crown of a device according to examples of the disclosure. The device can apply electromagnetic energy to a first circuit (5200). For example, the first circuit can be the LC circuit of the Tx stage energized by the driving source of the Tx stage. The device can couple the energy from the first circuit to the second circuit, which can include the shaft and crown of the device (5205). For example, the second circuit can be the LC circuit of the Rx stage. Coupling can occur between the inductive elements of the Tx stage and Rx stage so as to transfer/inject electromagnetic energy into the shaft and crown of the device. The device can measure changes in one or more parameters (e.g., electromagnetic dynamics) of the first circuit (5210). For example, a monitoring circuit or element can detect changes in frequency, phase and/or amplitude (or other parameters) of the Tx stage. In some examples, a shift in resonant frequency of the Tx stage LC circuit can be measured. The device can detect touch and/or proximity of an object at the crown (5215). For example, based on the measured one or more parameters, the device (e.g., processor 202 or crown controller 252) can sense a capacitance formed between the crown and an object (e.g., a finger) proximate to the crown. The one or more parameters (e.g., the sensed capacitance) can be used to detect whether the object is touching or proximate to the crown (e.g., based on comparing the one or more parameters to one or more detection thresholds). Additionally or alternatively, the device can estimate the distance between the object and the crown based on the one or more measured parameters. In some examples, the distance can be estimated by comparing the one or more parameters to values in a look-up table (LUT). In some examples, the system can exit a rest state (as described, for example, with respect to FIG. 44A) in response to detecting a threshold level of proximity between the object and the crown. In some examples, the estimated distance can be compared with multiple thresholds that can be used for reporting one or more touch/hover events (as described, for example, with respect to FIGS. 44B and 44C).

The resonant frequency used by Tx stage and Rx stage can be selected to avoid or reduce interference with external objects or other elements of the device. For example, the stages can operate in a different frequency range than a WiFi® and/or BLUETOOTH™ antenna in the device. Additionally, the frequency can be selected to reduce interference and susceptibility to detecting conducing objects like buttons or cufflinks that a person might be wearing proximate to the crown. In some examples, the Tx stage and/or Rx stage can include a variable capacitor that can be used to tune the resonant frequencies to avoid or reduce interference. In some examples, the tuning can be performed during factory calibration. In some examples, the tuning can be performed dynamically in response, for example, to detecting noise in the operating environment.

In some examples, the crown touch and/or proximity detection described herein can be performed continuously (e.g., 100% duty cycle) or periodically (e.g., at a fixed duty cycle, such as a 50% duty cycle). In some examples, the crown touch and/or proximity detection can be performed intermittently or can be performed based on device conditions. For example, if touch and/or proximity detection is used only to wake up the device (e.g., as described with respect to FIG. 44A), the crown touch and/or proximity detection can be performed (e.g., continuously or periodically) when the device is in the rest mode, and stopped or performed less frequently during the ready mode. Additionally or alternatively, when touch/hover event inputs can be accepted as inputs by the UI, the crown touch and/or proximity detection can be performed (e.g., continuously or periodically). When touch/hover event inputs cannot be accepted as inputs by the UI, the crown touch and/or proximity detection can be stopped or performed less frequently.

In some additional examples of the disclosure, a device can inject electromagnetic energy into the crown to detect objects touching or proximate to the crown of a device. In some examples, a touch and/or proximity sensor can include a transmit circuit operatively coupled to a rotational input element (e.g., crown) and configured to inject electromagnetic energy into the rotational input element, and a monitoring circuit operatively coupled to the rotational input element and configured to measure one or more parameters (e.g., resonant frequency). The one or more parameters can be indicative of an object touching or in proximity to the rotational input element. One or more touch or hover events can be detected based on the one or more parameters measured by the monitoring circuit. In some examples, the touch and/or proximity sensor can measure changes in resonant frequency of an oscillating circuit (e.g., an LC tank circuit). In some examples, the touch and/or proximity sensor can measure detuning of an antenna (e.g., the crown acting as an antenna).

Figure 53:
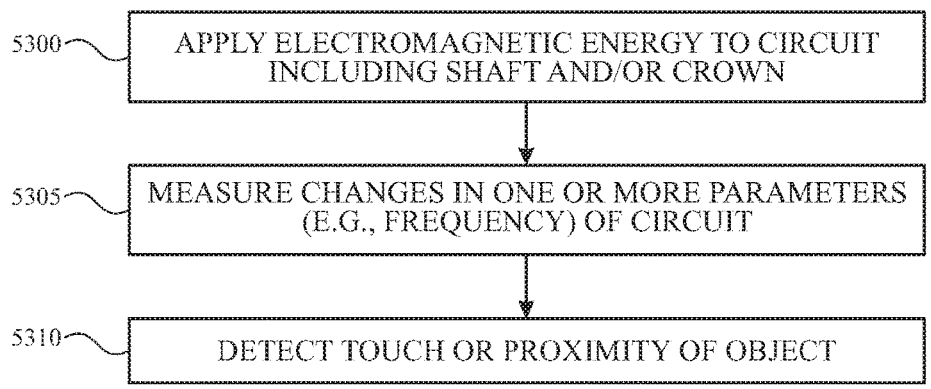
FIG. 53 illustrates an exemplary process for detecting objects touching and/or proximate to the crown of a device according to examples of the disclosure.

FIG. 53 illustrates an exemplary process for detecting objects touching and/or proximate to the crown of a device according to examples of the disclosure. The device can apply electromagnetic energy to a circuit including the shaft and crown of the device (5300). For example, as discussed above with regard to FIGS. 45A-45C for example, a transmit circuit can form an LC resonant tank circuit that can inject electromagnetic energy into the shaft and crown of the device. The device can measure changes in one or more parameters (e.g., electromagnetic dynamics) of the circuit (5305). For example, a monitoring circuit or element can detect changes in frequency, phase and/or amplitude of the LC resonant tank circuit. In some examples, a shift in resonant frequency of the LC resonant tank circuit can be measured. The device can detect touch and/or proximity of an object at the crown (5310). For example, referring back to FIG. 2, based on the measured one or more parameters, the device (e.g., with processor 202 or crown controller 252) can sense a capacitance formed between the crown and an object (e.g., a finger) proximate to the crown. The one or more parameters (e.g., the sensed capacitance) can be used to detect whether the object is touching or proximate to the crown (e.g., based on comparing the one or more parameters to one or more detection thresholds). Additionally or alternatively, the device can estimate the distance between the object and the crown based on the one or more measured parameters. In some examples, the distance can be estimated by comparing the one or more parameters to values in a look-up table (LUT). In some examples, the system can exit a rest state (as described, for example, with respect to FIG. 44A) in response to detecting a threshold level of proximity between the object and the crown. In some examples, the estimated distance can be compared with multiple thresholds that can be used for reporting one or more touch/hover events (as described, for example, with respect to FIGS. 44B and 44C above).

Figure 54A:
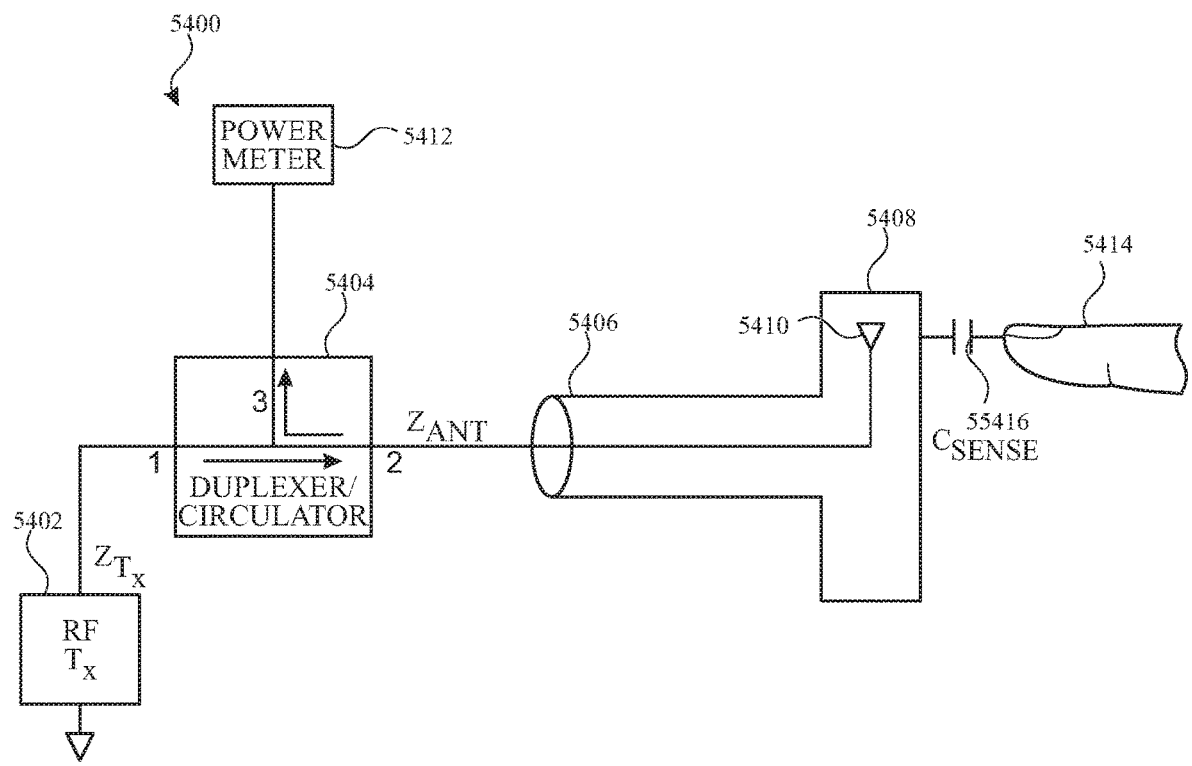
FIG. 54A illustrates an example circuit diagram of an exemplary touch and/or proximity sensor using antenna detuning according to examples of the disclosure.

In some examples, touch and/or proximity events at the crown can be detected using the shaft and/or crown as an antenna. Radio frequency energy can be injected into the shaft and crown and detuning of the antenna (e.g., formed of the shaft and crown), caused by an object proximate to or touching the crown, can be measured and used to detect touch and/or proximity of the object. FIG. 54A illustrates an example circuit diagram of an exemplary touch and/or proximity sensor using antenna detuning according to examples of the disclosure. FIG. 54A illustrates a touch and/or proximity sensor circuit 5400 including a radio frequency transmit circuit 5402 (RF Tx) to radiate electromagnetic energy to an antenna 5410, and a monitoring circuit, such as power meter 5412, to measure detuning of antenna 5410. The antenna 5410 can be formed of some or all of shaft 5406 and/or some or all of crown 5408. In other words, the portions of shaft 5406 and crown 5408 radiating the RF energy can be modeled by antenna 5410. The radio frequency transmit circuit 5402 and power meter 5412 can be operatively coupled to the shaft and/or crown by a duplexer circuit 5404 (circulator circuit). The duplexer circuit 5404 can include three ports (labeled 1, 2 and 3 in FIG. 54A) that can allow the RF energy to pass to the antenna 5410 from port 1 to port 2, and that can allow reflected RF energy to return from the antenna 5410 from port 2 to port 3. The touch and/or proximity sensor circuit 5400 can be designed to tune the performance of antenna 5410 to a baseline performance. When an object, such as finger 5414 approaches or touches crown 5408, the capacitance $C_{sense}$ 5416 (variable capacitance) formed between crown 5408 and finger 5414 can detune the antenna 5410, and the detuning can be used to detect touch and/or proximity events and to estimate the distance between the object and the crown (e.g., based on how different the performance of the detuned antenna is from the baseline performance).

In some examples, the monitoring circuit can measure detuning using a standing wave ratio, such as a voltage standing wave ratio (VSWR) or a power standing wave ratio (PSWR). The standing wave ratio can be used to measure the impedance matching between the impedance of radio frequency transmit circuit 5402 ($Z_{Tx}$) with the impedance of antenna 5410 ($Z_{ANT}$). An object proximate to the crown can introduce a variable capacitance that can change $Z_{ANT}$ (resulting in an impedance discontinuity). The change in the standing wave ratio can be compared with a baseline standing wave ratio (i.e., the standing wave ration when no object is touching or proximate to the crown) to detect touch and/or proximity events. In some examples, the touch and/or proximity sensor circuit 5400 can be tuned to match the impedance of radio frequency transmit circuit 5402 ($Z_{Tx}$) with the impedance of antenna 5410 ($Z_{ANT}$), such that the baseline standing wave ratio is 1:1. In some examples, rather than using a standing wave ratio, the monitoring circuit can use a reflection coefficient (F) or return loss to measure detuning due to an object proximate to or touching the crown. Other metrics or parameters can be used to detect touch and/or hover events at the crown. In some examples, the metrics described above can be generated (e.g., calculated) based on other parameters (e.g., voltage/current, amplitude/phase/frequency) measured by the monitoring circuit.

The one or more parameters/metrics measured by the monitoring circuit can be compared with one or more thresholds to determine a touch and/or one or more different hover events (as with the measured parameters from the resonant tank circuit discussed above). The metrics can also be used to estimate the distance between a hovering object and the crown. For brevity, the discussion of various thresholds, resulting touch and/or hover events, and corresponding operations is omitted here.

Figure 54B:
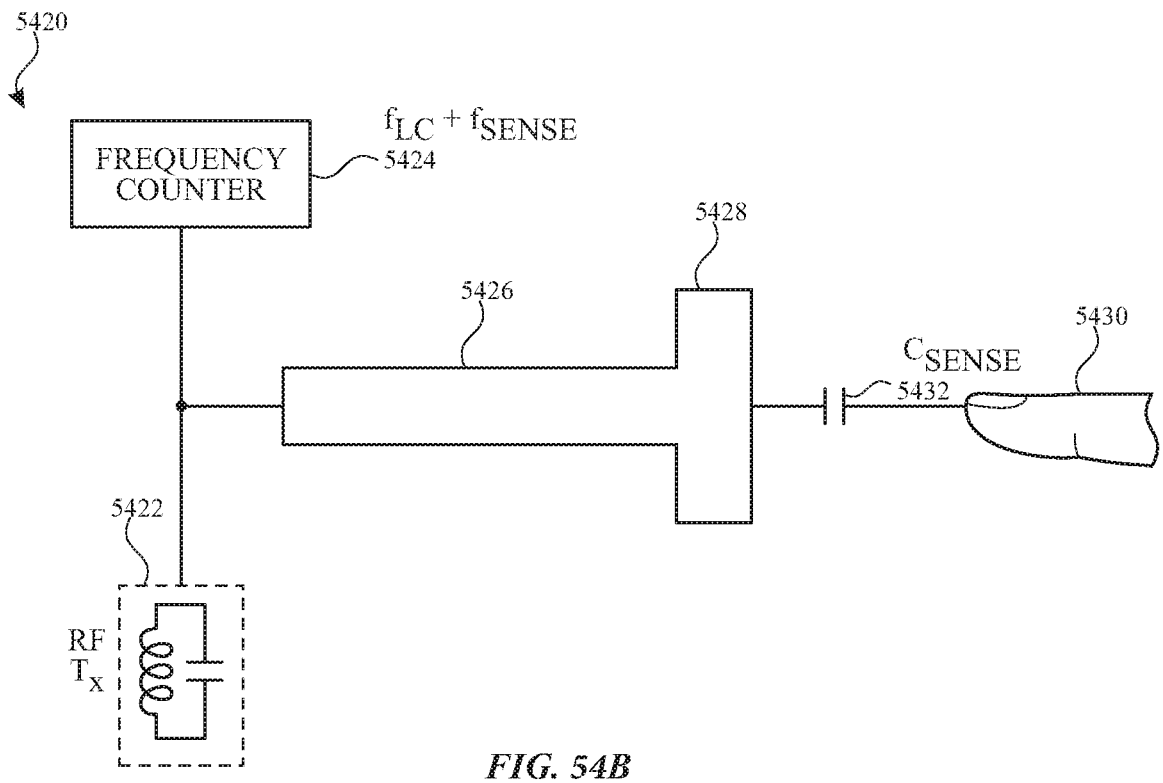
FIG. 54B illustrates an exemplary touch and/or proximity sensor using antenna detuning according to examples of the disclosure.

FIG. 54B illustrates an exemplary touch and/or proximity sensor using antenna detuning according to examples of the disclosure. FIG. 54B illustrates a touch and/or proximity sensor circuit 5420 including a radio frequency transmit circuit 5422 (RF Tx) implemented with an LC resonant tank circuit. The RF transmit circuit 5422 can radiate electromagnetic energy (at the resonant frequency $f_{LC}$) through an antenna formed by shaft 5426 and crown 5428. FIG. 54B illustrates a monitoring circuit, implemented by frequency counter circuit 5424, that can measure detuning of the antenna due to variable capacitance 5432 formed between crown 5428 and proximate object 5430 (e.g., finger). The frequency counter circuit 5424 (or other monitoring circuit) can be used to detect a shift in frequency of the LC resonant tank circuit due to antenna detuning, and the shift in frequency can be used to detect touch/hover events and estimate the distance between the crown and the object as discussed herein.

In some examples, the shaft and crown together can form the antenna. In other examples, the shaft can be designed as a transmission line between the transmit circuit and the antenna formed of the crown. In some examples a portion of the shaft and/or a portion of the crown can form the antenna and there remaining portions can be designed as a transmission line. In some examples, the shaft and/or crown portions acting as a transmission line can be implemented with a coaxial structure to improve the transmission line characteristics.

Figure 55:
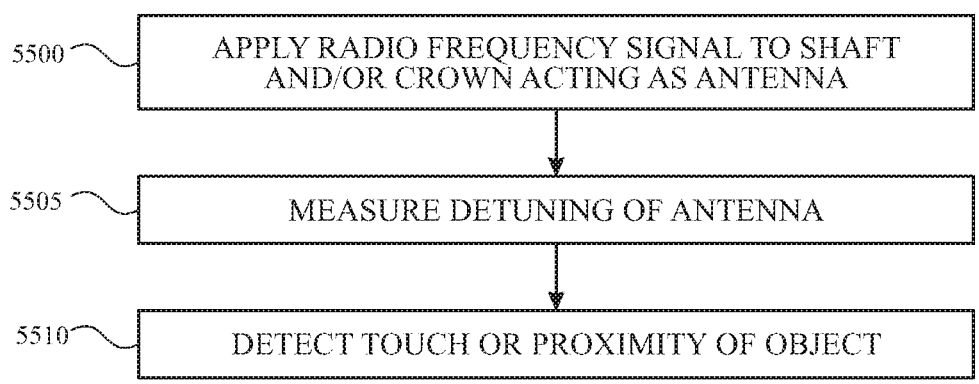
FIG. 55 illustrates another exemplary process for detecting objects touching and/or proximate to a crown of a device according to examples of the disclosure.

FIG. 55 illustrates another exemplary process for detecting objects touching and/or proximate to a crown of a device according to examples of the disclosure. The device can apply electromagnetic energy (e.g., in the form of a radio frequency signal) to a circuit including the shaft and crown of the device (5500). For example, as discussed above with regard to FIGS. 54A and 54B, for example, an RF transmit circuit can inject electromagnetic energy into the shaft and crown of the device which can form an antenna. The device can measure changes in one or more parameters (e.g., electromagnetic dynamics) of the circuit corresponding to detuning of the antenna (5505). For example, a monitoring circuit or element can detect changes in a standing wave ratio, return loss or reflection coefficient. Additionally or alternatively, the monitoring circuit or element can detect changes of frequency, phase and/or amplitude of the transmit circuit. The device can detect the touch and/or proximity of an object at the crown (5510). For example, based on the measured one or more parameters, the device (e.g., processor 202 or crown controller 252) can sense a capacitance formed between the crown and an object (e.g., a finger) proximate to the crown. The one or more parameters (or the sensed capacitance) can be used to detect whether the object is touching or proximate to the crown (e.g., based on comparing the one or more parameters to one or more detection thresholds). Additionally or alternatively, the device can estimate the distance between the object and the crown based on the one or more measured parameters. In some examples, the distance can be estimated by comparing the one or more parameters to values in a look-up table (LUT). In some examples, the system can exit a rest state (as described, for example, with respect to FIG. 44A) in response to detecting a threshold level of proximity between the object and the crown. In some examples, the estimated distance can be compared with multiple thresholds that can be used for reporting one or more touch/hover events (as described, for example, with respect to FIGS. 44B and 44C).

Figure 56A:
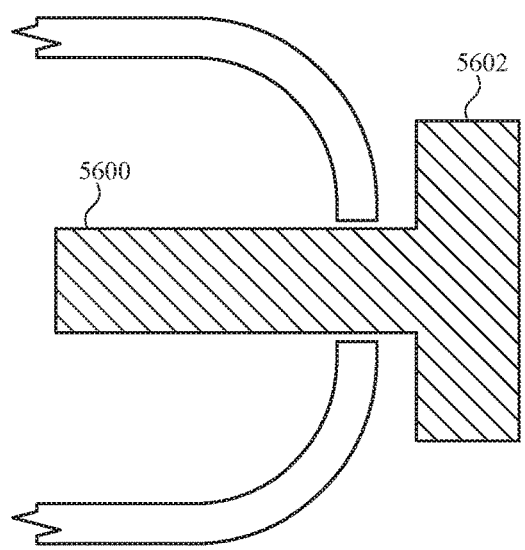
FIG. 56A illustrates an example shaft and crown formed of one or more conducting materials according to examples of the disclosure.

As described above, touch and/or proximity to the crown can be detected by capacitively coupling between the crown (and/or shaft) and an object. In some examples, the crown and/or shaft can be formed of one or more conducting materials (e.g., metal, semi-conductor, alloy, conducting plastic or composites, etc.). FIG. 56A illustrates an example shaft and crown formed of one or more conducting materials according to examples of the disclosure. FIG. 56A illustrates a shaft 5600 and crown 5602 formed of one or more conducting materials. In some examples, the shaft and/or crown can be solid. In some examples, the shaft and/or crown can include a hollow. In some examples, the shaft and/or crown can be formed of the same materials. In some examples, the shaft and/or crown can be formed of different materials.

Figure 56B:
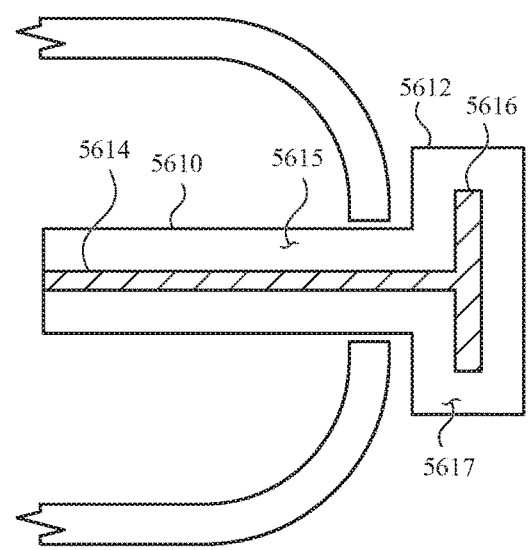
FIG. 56B illustrates an example shaft and/or crown formed of conducting and non-conducting materials according to examples of the disclosure.

In some examples, the shaft and/or crown can be formed of conducting and non-conducting materials. FIG. 56B illustrates an example shaft and/or crown formed of conducting and non-conducting materials according to examples of the disclosure. FIG. 56B illustrates a shaft 5610 including a conducting portion 5614 and a non-conducting portion 5615, and crown 5612 including a conducting portion 5616 and a non-conducting portion 5617. The conducting portions 5614 and 5616 can be coupled together and can be coupled to transmit circuitry (e.g., at the proximal end of the shaft). The conducting portions 5614 and 5616 can also capacitively couple to an object proximate to or touching the crown.

In some examples, the dimensions of the conducting portions 5614 and 5616 can be selected to ensure sufficient coupling with an object touching or proximate to the crown 5612 to enable touch and/or proximity detection. Increasing the size of the conducting portions can increase capacitive coupling and can thereby increase the sensitivity of the sensor. In some examples, the shaft 5610 can include a conducting portion 5614 and a non-conducting portion 5615, and the crown can be entirely a conductor. In some examples, the crown 5612 can include a conducting portion 5616 and a non-conducting portion 5617, and the shaft can be entirely a conductor. In some examples, the shaft and/or crown can also include a hollow. In some examples, the conducting and/or non-conducting portions of the shaft and/or crown can be formed of the same materials. In some examples, the conducting and/or non-conducting portions of the shaft and/or crown can be formed of different materials.

In some examples, the crown and/or shaft can include two or more conducting portions (electrodes). Using two or more conducting electrodes for proximity/touch detection at the crown can allow, for example, for improved differentiation of touch and/or proximity events due to person's wrist (undesired) and due to an object such as a finger (desired). For example, the device may want to wake up (from a rest mode) when touch and/or proximity is detected at the crown by a person's finger (intentional use) and not by accidental proximity or touch by a person's wrist. Improving differentiation of finger and wrist input, for example, can reduce the number of false positive touch and/or proximity events reported. Additionally, two or more conducting electrodes can allow, for example, for touch and/or proximity information for different parts of the crown (that can be used, for example, as additional touch and/or proximity inputs for the crown).

Figure 56C:
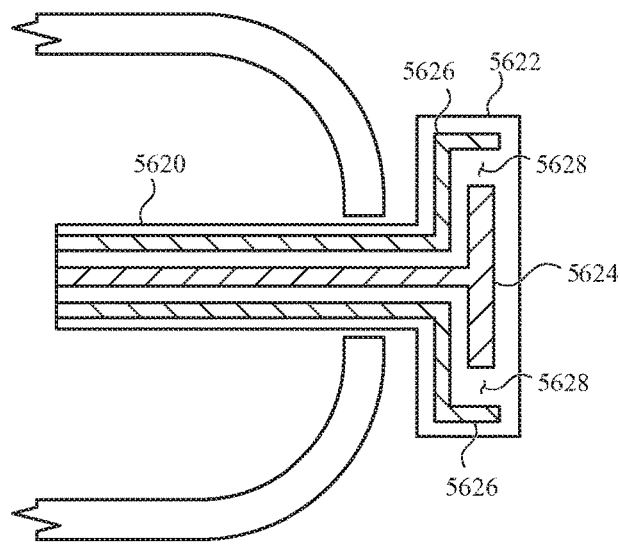
FIGS. 56C and 56D illustrate an example crown including two conducting electrodes according to examples of the disclosure.
Figure 56D:
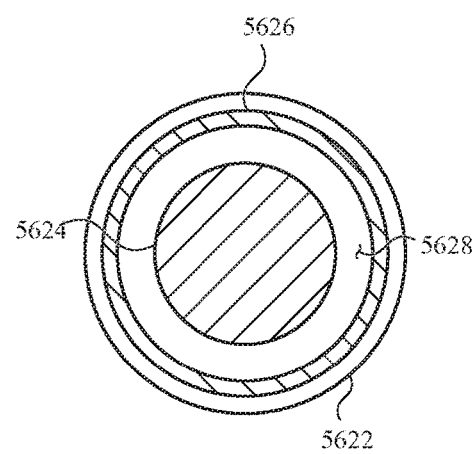

FIGS. 56C and 56D illustrate a crown including two conducting electrodes according to examples of the disclosure. FIG. 56C illustrates a cross-sectional view of shaft 5620 and crown 5622 (along a plane symmetrically dividing the shaft and crown). FIG. 56D illustrates a cross sectional view of the crown face (along a plane orthogonal to the plane of FIG. 56C). Crown 5622 can include two electrodes 5624 and 5626 that can be separated by an insulating layer 5628. As illustrated in FIG. 56D, the inner electrode 5624 can have a circular cross-sectional shape and be disposed in the center of the circular crown face, and the outer electrode 5626 can have a circular cross-sectional shape and be disposed around the inner electrode 5624 and away from the center of the circular crown face. As illustrated in FIG. 56C, for example, the outer electrode 5626 can have a cylindrical shape wrapping around crown 5622. Although illustrated in FIGS. 56C and 56D as having circular/cylindrical shapes, inner and outer electrodes 5624 and 5626 can have different shapes (e.g., polygonal, square, conic, etc.). The two electrodes 5624 and 5626 in the crown can be coupled to remaining sensor circuitry through electrodes in shaft 5620. The electrodes in shaft 5620 can be separated by an insulating layer as well. In some examples, the electrodes in shaft 5620 can have a coaxial structure with one electrode in the center of shaft 5620 and one electrode away from the center of shaft 5620. The electrodes in shaft 5620 can be separated by a dielectric material.

In some examples, each crown electrode in FIGS. 56C and 56D can be coupled to a different transmit circuit (and one or more monitoring circuits). For example as described herein, each crown electrode can be coupled to an RF transmit circuit (e.g., each tuned to a different frequency) and a corresponding monitoring circuit, and each crown electrode can act as an antenna. The detuning of each antenna can be measured to generate touch and/or proximity information for each crown electrode. Alternatively, each crown electrode can be coupled to a resonant tank LC circuit (e.g., each tuned to a different frequency) and a corresponding monitoring circuit. The shift in resonant frequencies of each resonant tank LC circuit can be measured to generate touch and/or proximity information for each crown electrode.

In some examples, the touch and/or proximity information for the outer electrode can be used as a first input that can represent touch and/or proximity events around the circumference of the crown. The touch and/or proximity information for the inner electrode can be used as a second input that can represent touch and/or proximity events at the face of the crown. In some examples, the touch and/or proximity information from each crown electrode can be used to distinguish between undesired touch and/or proximity from person's wrist and desired touch and/or proximity from a finger or other object, which can reduce false positives due to undesired contact by a user's wrist. For example, a ratio of the touch and/or proximity information can be compared to a threshold to predict whether the object is a finger or wrist. In other examples, the touch and/or proximity information from each electrode can be compared with a threshold, and the touch and/or proximity event can be reported only when the thresholds are met for both electrodes.

In some examples, rather than measuring touch and/or proximity information for each crown electrode with two transmit circuits, the touch and/or proximity sensor can be configured to measure changes mutual capacitance the between the two crown electrodes. For example, referring back to FIG. 45C, rather than modeling the crown as a parasitic capacitance to ground, one crown electrode can be coupled to one node of the circuit (e.g., to the node at one terminal of the inductor) and the second crown electrode can be coupled to a second node of the circuit (e.g., to the node at a second terminal of the inductor). The sensor can measure the coupling between the two electrodes to differentiate between a finger and a wrist. For example, when a finger is contacting the crown, the mutual capacitance coupling between the two electrodes can be more reduced in comparison with a wrist contacting the crown.

Figure 57:
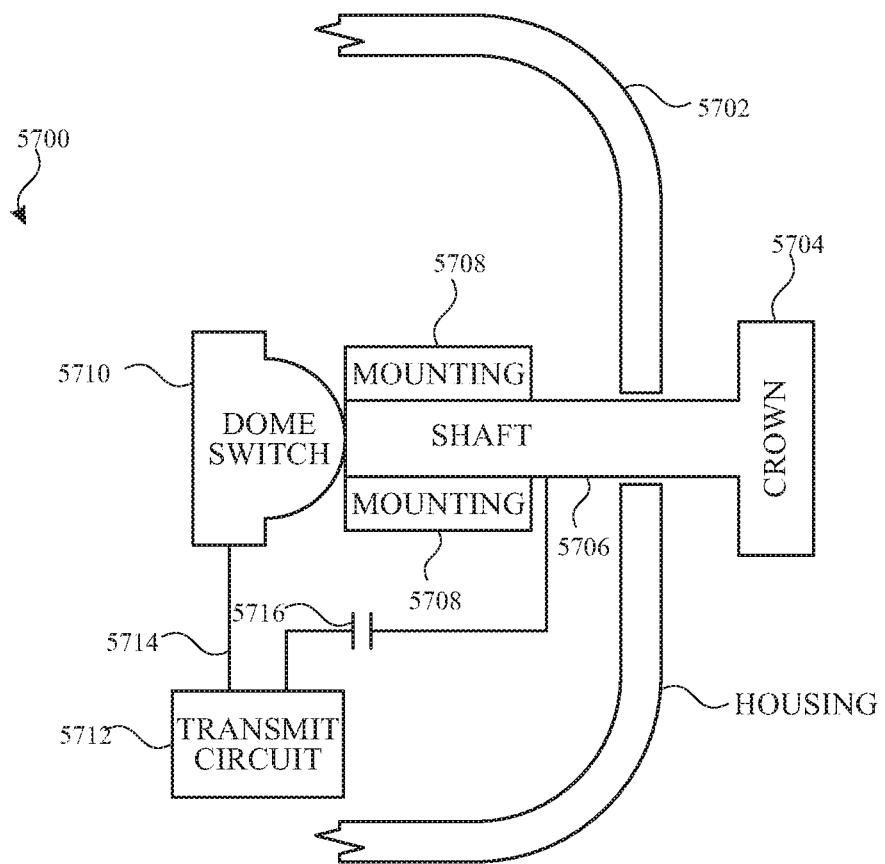
FIG. 57 illustrates an example contact between a crown shaft and transmit circuit according to examples of the disclosure.

In the examples described above, the transmit circuit is illustrated as injecting energy into the shaft and/or crown. In some examples, an electrical contact can be added to couple the transmit circuit to the crown. The electrical contact can be a single point contact. In some examples, a bearing and/or slip ring (or other contact mechanisms) can be used to couple the shaft to transmit circuitry. FIG. 57 illustrates an example contact between a crown/shaft and transmit circuit according to examples of the disclosure. FIG. 57 illustrates device 5700 including a housing 5702, crown 5704 and shaft 5706. Shaft 5706 can be coupled to a mounting 5708 that can allow rotational movement by crown 5704 and shaft 5706. The proximal (rear) portion of shaft 5706 can be formed, at least in part, from a conducting material that can contact dome switch 5710. In some examples, the portion of dome switch 5710 contacting shaft 5706 can be conducting as well. Transmit circuit 5712 can be coupled (e.g., via wired pathway 5714) to the conductive portion of dome switch 5710, such that the transmit circuit can inject energy into the crown via the existing point of contact between the dome switch 5710 and shaft 5706 (i.e., without adding an additional point of contact to the shaft).

In some examples, rather than using a physical contact, energy can be injected into the shaft and/or crown via capacitive coupling. For example, the transmit circuit 5712 can be disposed proximate to the shaft (or crown) such that energy in the transmit circuit can capacitively couple (e.g., via capacitive pathway 5716) to the shaft and/or crown. Transmitting energy via capacitive coupling, however, can consume significant power in order to transfer enough energy to the crown for proper touch and/or proximity sensing.

In some examples, rather than adding additional transmit circuitry, existing transmit circuits in the device that generate oscillating signals can be coupled to the crown to perform touch and/or proximity sensing described herein. For example, the device can include a WiFi® and/or BLUETOOTH™ antenna, which can be coupled to the shaft and/or crown. Detuning of the existing antenna (WiFi® and/or BLUETOOTH™ antenna) can be measured to detect touch and/or proximity events without adding additional transmit circuits to the device. In some examples, a point of contact connection between the existing antenna can result in a shared ground between the existing antenna the crown acting as an extension of the antenna. The touch and/or proximity of an object to the crown can detune the antenna formed of the existing antenna and the crown. In some examples, the existing antenna can be capacitively coupled to the shaft and/or crown using a capacitive pathway as discussed above.

Figure 58:
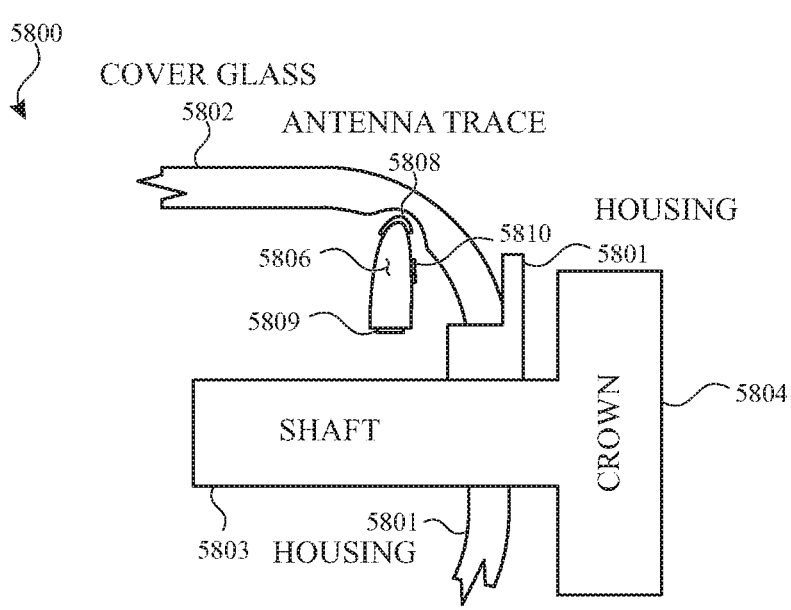
FIG. 58 illustrates an example device including an existing antenna that can be used for touch and/or proximity detection according to examples of the disclosure.

FIG. 58 illustrates an example device including an existing antenna that can be used for touch and/or proximity detection according to examples of the disclosure. FIG. 58 illustrates a device 5800 including housing 5801, cover substrate 5802, shaft 5803 and crown 5804. Device 5800 can also include one or more existing antennas (e.g., WiFi®, BLUETOOTH™, etc.). In some examples, the existing antenna can include an element 5806 (e.g., a plastic element) acting as an antenna carrier, with an antenna trace 5808 disposed on the surface of element 5806 (e.g., using laser direct structuring technology). The existing antenna can be positioned in a groove in the cover substrate, and the antenna trace 5808 can be positioned over the top portion of element 5806 to enable WiFi® and/or BLUETOOTH™ signals to be efficiently transmitted out and away from the device. In some examples, the ground for the existing antenna can be shared with the crown via a physical connection (e.g., a wire).

In some examples, the existing antenna can be proximate to shaft 5803 such that energy can be injected from the existing antenna to the shaft via a capacitive pathway. In such examples, a trace 5809 can be added on the surface of element 5806 proximate to shaft 5803 to allow capacitive coupling between the existing antenna and the shaft 5803. An object touching and/or proximate to the crown 5804 can then be detected based on how it detunes the antenna.

In some examples, rather than coupling the existing transmit circuits in the device to the crown, the existing antenna itself can act as a touch and/or proximity sensor without coupling to the crown. For example, the existing antenna can be disposed within the device, proximate to the crown (for example as illustrated in FIG. 58). When a finger or other object comes into proximity with the crown, it also can come into proximity with antenna trace 5808 and can cause some detuning of the existing antenna. This antenna detuning can be measured to detect touch and/or proximity of an object.

In some examples, the transmit circuit can be implemented using element 5806 of the existing antenna. For example, referring to FIG. 58, an additional antenna trace 5810 can be added to element 5806. Antenna trace 5810 can be coupled to different transmit circuitry than is coupled to antenna trace 5808. Antenna trace 5810 can also be coupled on a different portion of element 5806 that can be more proximate to and/or facing the crown 5804. Antenna trace 5810 can be coupled to shaft 5803 and crown 5804, for example, via a wired connection or capacitive coupling (not shown). This second antenna structure can be operated in a manner than can allow for touch and/or proximity detection as described herein.

The RF frequency or resonant frequency used by transmit circuit can be selected to avoid or reduce interference with external objects or other elements of the device. For example, the transmit circuit can operate in a different frequency range than a WiFi® and/or BLUETOOTH™ antenna in the device. Additionally, the frequency can be selected to reduce interference and susceptibility to detecting conducing objects like buttons or cufflinks that a person might be wearing proximate to the crown. In some examples, the transmit circuit can include a variable capacitor that can be used to tune the RF or resonant frequency to avoid or reduce interference. In some examples, the tuning can be performed during factory calibration. In some examples, the tuning can be performed dynamically in response, for example, to detecting noise in the operating environment.

In some examples, the crown touch and/or proximity detection described herein can be performed continuously (e.g., 100% duty cycle) or periodically (e.g., at a fixed duty cycle, such as a 50% duty cycle). In some examples, the crown touch and/or proximity detection can be performed intermittently or can be performed based on device conditions. For example, if touch and/or proximity detection is used only to wake up the device (e.g., as described with respect to FIG. 3A), the crown touch and/or proximity detection can be performed (e.g., continuously or periodically) when the device is in the rest mode, and stopped or performed less frequently during the ready mode. Additionally or alternatively, when touch/hover event inputs can be accepted as inputs by the UI, the crown touch and/or proximity detection can be performed (e.g., continuously or periodically). When touch/hover event inputs cannot be accepted as inputs by the UI, the crown touch and/or proximity detection can be stopped or performed less frequently.

Capacitive Detection Apparatus and Methods

In some examples, a device (e.g., device 100 above) can drive the crown with a drive signal to capacitively detect objects in contact or in proximity of the crown of the device. In some examples, a contact and/or proximity sensor can include a drive circuit operatively coupled to a rotational input element (e.g., crown) and configured to drive the drive signal onto the rotational input element, and a sense circuit for sensing capacitive coupling to an object (e.g., a finger) based on capacitive coupling between the object and the contact and/or proximity sensor. The capacitive coupling can be indicative of an object contacting or in proximity to the rotational input element. One or more touch or hover events can be detected based on the signals measured by the sense circuit. In some examples, the contact and/or proximity sensor can detect an object by performing a self-capacitance measurement. In some examples, the contact and/or proximity sensor can detect an object by performing a mutual capacitance measurement. In some examples, the contact and/or proximity sensor can switch between performing self-capacitance measurements and performing mutual capacitance measurements.

To assist in the detection of objects in contact or in proximity of the crown of the device, one or more gasket sensor electrodes can be added proximate to the crown. In some examples, the gasket sensor electrodes can form a mutual capacitance with the rotational input element for performing a mutual capacitance measurement. In some examples, the gasket sensor electrode can be used for performing a self-capacitance measurement. Due to the proximity of the gasket sensor electrode to the crown, measurements indicative of contact or proximity of the object and the gasket sensor electrode can also indicate that the object is in contact or proximity of the crown. The additional touch detection capabilities provided by the driven crown and/or gasket sensor electrodes of the disclosure can be used to provide new interactions with user interface elements displayed on the electronic device.

It should be noted that the terms "poorly grounded," "ungrounded," "not grounded," "partially grounded," "not well grounded," "improperly grounded," "isolated," and "floating" can be used interchangeably to refer to poor grounding conditions that can exist when an object is not making a low impedance electrical coupling to the ground of the device.

It should be further noted that the terms "grounded," "properly grounded," and "well grounded" can be used interchangeably to refer to good grounding conditions that can exist when an object is making a low impedance electrical coupling to the ground of the device.

Figure 59:
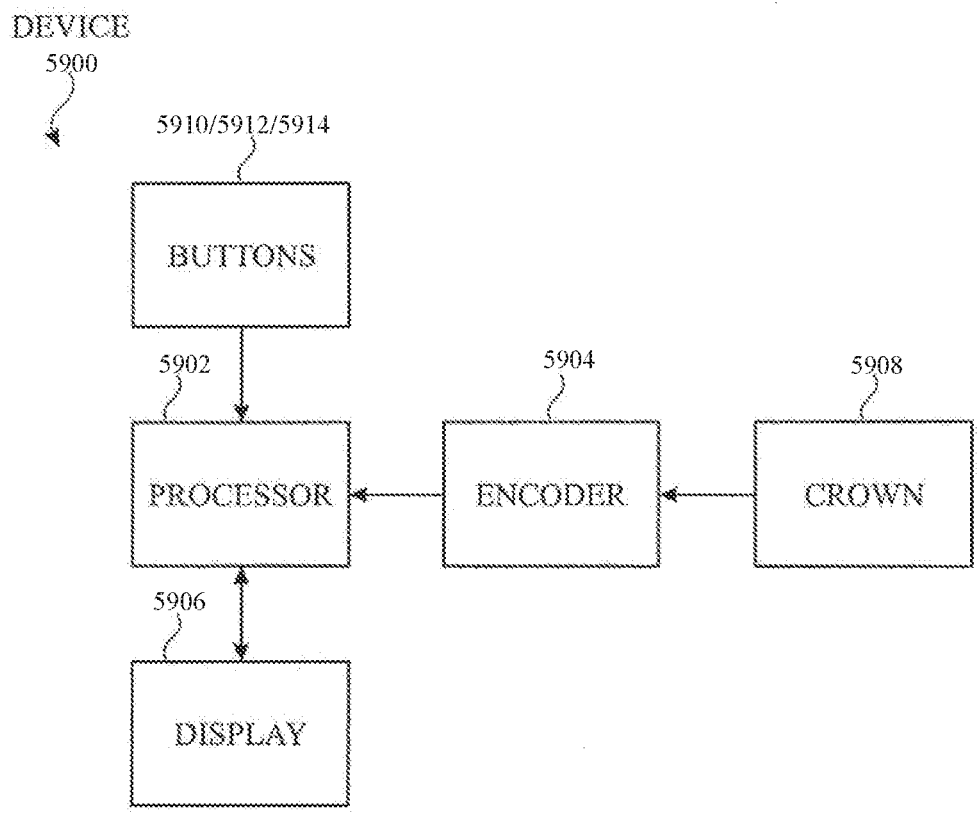
FIG. 59 illustrates a block diagram of components within an exemplary device according to examples of the disclosure.

FIG. 59 illustrates an exemplary block diagram of components within an exemplary device 5900 according to examples of the disclosure. In some examples, crown 5908 (which can correspond to crown 108 described above) can be coupled to encoder 5904, which can be configured to monitor a physical state or change of physical state of the crown (e.g., the position and/or rotational state of the crown), convert it to an electrical signal (e.g., convert it to an analog or digital signal representation of the position or change in position of the crown), and provide the signal to processor 5902. For instance, in some examples, encoder 5904 can be configured to sense the absolute rotational position (e.g., an angle between 0-360°) of crown 5908 and output an analog or digital representation of this position to processor 5902. Alternatively, in other examples, encoder 5904 can be configured to sense a change in rotational position (e.g., a change in rotational angle) of crown 5908 over some sampling period and to output an analog or digital representation of the sensed change to processor 5902. In these examples, the crown position information can further indicate a direction of rotation of the crown 5908 (e.g., a positive value can correspond to one direction and a negative value can correspond to the other). In yet other examples, encoder 5904 can be configured to detect a rotation of crown 5908 in any desired manner (e.g., velocity, acceleration, or the like) and can provide the crown rotational information to processor 5902. The rotational velocity can be expressed in numerous ways. For example, the rotational velocity can be expressed as a direction and a speed of rotation, such as hertz, as rotations per unit of time, as rotations per frame, as revolutions per unit of time, as revolutions per frame, as a change in angle per unit of time, and the like. In alternative examples, instead of providing information to processor 5902, this information can be provided to other components of device 5900, such as, for example, a state machine. While the examples described herein refer to the use of rotational position of crown 5908 to control scrolling or scaling of a view, it should be appreciated that any other physical state of the crown can be used to control appropriate actions.

In some examples, the state of the display 5906 (which can correspond to display 106 described above) can control physical attributes of crown 5908. For example, if display 5906 shows a cursor at the end of a scrollable list, crown 5908 can have limited motion (e.g., cannot be rotated forward). In other words, the physical attributes of the crown 5908 can be conformed to a state of a user interface that is displayed on display 5906. The mechanisms for controlling the physical attributes of the crown are described in further detail below. In some examples, a temporal attribute of the physical state of crown 5908 can be used as an input to device 5900. For example, a fast change in physical state can be interpreted differently than a slow change in physical state. These temporal attributes can also be used as inputs to control physical attributes of the crown.

Processor 5902 can be further coupled to receive input signals from buttons 5910, 5912, and 5914 (which can correspond to buttons 110, 112, and 114, above respectively), along with touch signals from touch-sensitive display 5906. Processor 5902 can be configured to interpret these input signals and output appropriate display signals to cause an image to be produced by touch-sensitive display 5906. While a single processor 5902 is shown, it should be appreciated that any number of processors or other computational devices can be used to perform the functions described above.

Figure 60:
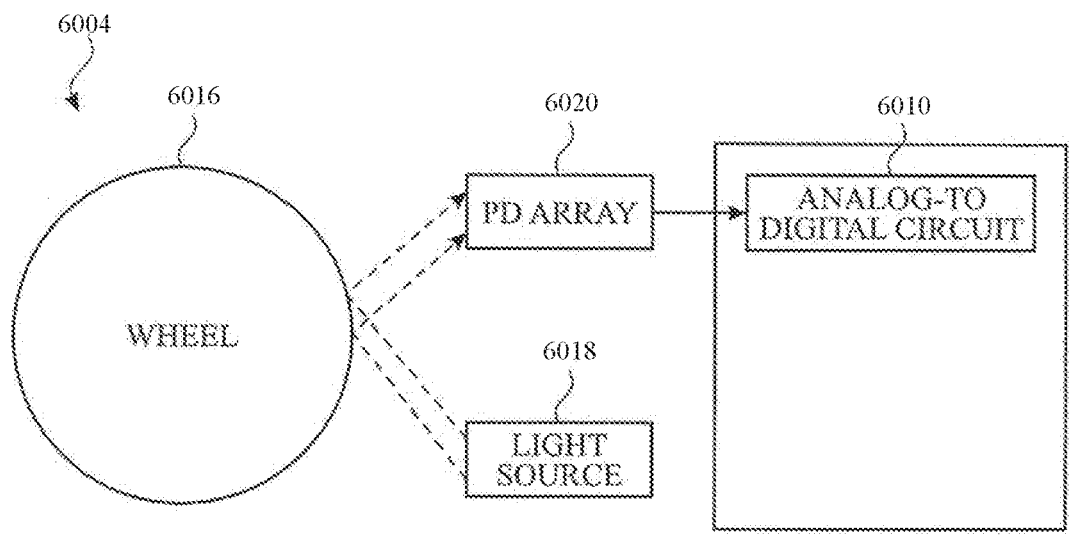
FIG. 60 illustrates a diagram of various components of an optical encoder that may be used to receive crown position information according examples of the disclosure.

FIG. 60 illustrates an exemplary block diagram of various components of an optical encoder 6004 that can be used to receive crown position information according to examples of the disclosure. The optical encoder 6004 shown in FIG. 60 may correspond to the encoder 5904 described above, or may be used in conjunction with the encoder 5904 described above. In various electronic devices, rotational and/or axial movement of a component (e.g., a crown) of the electronic device may need to be determined (e.g., the user interface scrolling operations described above for FIG. 1). In such instances, an optical encoder 6004 may be used to detect the rotational movement and the axial movement of the component. For example, an optical encoder 6004 according to examples of the disclosure can include a light source 6018 that shines on a wheel 6016 (also referred to as an encoder wheel) or a shaft of the optical encoder. The wheel 6016 (or shaft) may include an encoding pattern, such as, for example, a collection of light and dark lines that are arranged in a particular sequence or in a particular pattern. In some examples, the wheel 6016 may be integrated with or attached by a shaft to the crown 108 described above.

When light from the light source 6018 hits the encoding pattern, the encoding pattern can modulate the light and reflect it onto one or more sensors 6020 associated with the optical encoder. In certain examples, the one or more sensors 6020 may be an array of photodiodes (PD). As light from the light source 6018 is reflected off the wheel 6016, one or more photodiodes of the photodiode array 6020 can produce a voltage measurement associated with an amount of light received at a given sample time. Once the light is received by the photodiode array 6020 at a given time period, an analog-to-digital circuit 6010 can convert the analog signal received from the photodiode array to a digital signal. The corresponding digital signals can be processed, and a determination may be made as to the direction, speed and/or movement (rotational and/or axial) of the wheel.

Figure 61:
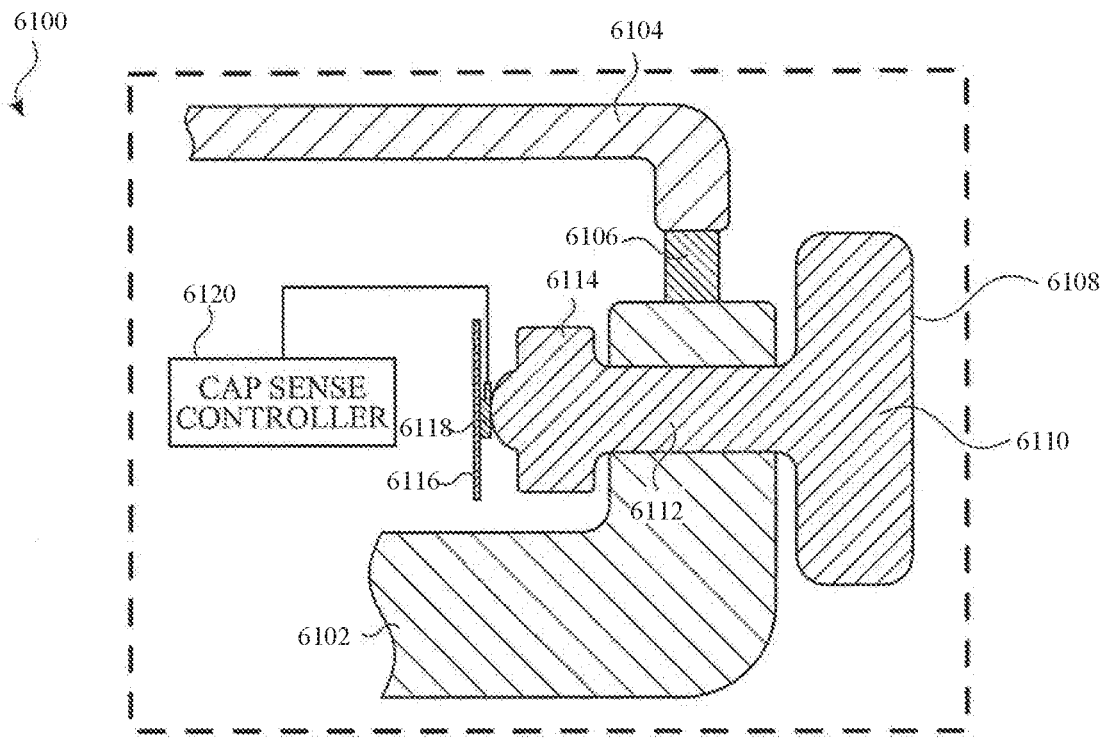
FIG. 61 illustrates an exemplary device including an exemplary mechanical input assembly according to examples of the disclosure.

FIG. 61 illustrates exemplary device 6100 (which can correspond to device 100 above) including an exemplary mechanical input assembly 6108 according to examples of the disclosure. In some examples, device 6100 can include a housing 6102 (which can correspond to housing 116 above). In some examples, a display screen 6104 (which can correspond to display screen 106 above) can be attached to housing 6102 by a gasket 6106. In some examples, display screen 6104 can be disposed on a cover substrate (which can correspond to cover substrate 1812 above), and the cover substrate can be attached to the housing 6102 by the gasket 6106. In some examples, gasket 6106 can attach around an exterior edge portion of a bottom surface of the display screen 6104. In some examples, the gasket 6106 can form a seal for preventing outside air and/or liquid from entering an interior cavity of the housing 6102. In some examples, gasket 6106 can be a compressible material. In some examples, the gasket 6106 can also be used to perform additional functions. Some of the possible additional functions for gasket 6106 will be described in further detail below. In some examples, a mechanical input assembly 6108 can be physically coupled to the housing 6102 such that a shaft 6112 of the mechanical input assembly passes through the housing and can rotate within the housing. In some examples, a crown 6110 (which can correspond to crown 108 above) portion of the mechanical input assembly 6108 can protrude outside of the housing and provide a user with a mechanical input to device 6100 as described in detail above in FIGS. 1 and 59-60. In some examples, the shaft 6112 can be attached to an encoder wheel 6114 (which can correspond to wheel 6016 above) inside of the housing. In some examples, a portion of the encoder wheel 6114 or a protrusion on the encoder wheel can contact a shear plate 6116. In some examples, the shear plate 6116 can be held in a stationary position within the housing. In some examples, shear plate 6116 can be disposed between mechanical input assembly 6108 and a depressible switch (not shown) for providing an additional input mechanism for the mechanical input assembly. In some examples, the shear plate 6116 can be constructed from a durable material capable of withstanding prolonged friction from rotation of the mechanical input assembly 6108. In some examples, debris, oils, moisture, or sweat can penetrate spaces between the crown 6110 and the housing 6102, which can create a conductive connection between the crown and housing. In some examples, a portion of the mechanical input assembly 6108 (e.g., crown 6110) can be coated with an insulating material to prevent conductive contact or bridging between conductive portions of the housing 6102 and the mechanical input assembly 6108.

In some examples, device 6100 can be configured to detect the presence of an object (e.g., a finger) touching or hovering near mechanical input assembly 6108 by measuring a self-capacitance with the mechanical input assembly as an electrode. In some examples, an internal electrical contact 6118 can be disposed on the shear plate 6116 such that a conductive portion of the mechanical input assembly 6108 can contact the internal electrical contact. In some examples, the internal electrical contact 6118 can be coupled to a capacitive sense controller 6120. In some examples, contact between the internal electrical contact 6118 and the mechanical input assembly 6108 can cause some or all of the mechanical input assembly (e.g., conductive portions) to behave as a drive and/or sense electrode. Specifically, the internal electrical contact 6118 can act as a fixed contact point for connecting the mechanical input assembly 6108 (which can be rotated by a user) to drive and/or sense circuitry in the capacitive sense controller 6120 for detecting contact or proximity of an object with the crown 6110. In some examples, the capacitive sense controller 6120 can also be a controller that can be used to control capacitive touch sensing operations for a touch sensitive display (e.g., touch sensitive display 106 described above). In other examples, the capacitive sense controller 6120 can be a separate controller for controlling capacitive touch sensing operations. In some examples, the capacitive sense controller 6120 can be configured to drive the internal electrical contact 6118 with a drive signal. In some examples, the mechanical input assembly 6108 can be made from a conductive material such that the drive signal couples from the internal electrical contact 6118 to the entire mechanical input assembly. In some examples, portions of the mechanical input assembly 6108 can be conductive while other portions of the mechanical input assembly can be non-conductive. In some examples, portions of the mechanical input assembly 6108 that form a conductive path from the internal electrical contact 6118 can be driven with the drive signal while portions of the mechanical input assembly that do not form a conductive path from the internal electrical contact can be undriven. In some examples, an exterior surface of a non-conductive mechanical input assembly 6108 can be coated with a conductive layer to form the electrode on the mechanical input assembly such that the entire mechanical input assembly can be driven with the drive signal despite the underlying material being non-conductive. Such an approach can reduce the drive signal strength required relative to a mechanical input assembly that is entirely made of metal, for example. In some examples, the internal electrical contact 6118 can also be used to receive sensed signals from the mechanical input assembly 6108 (e.g., self-capacitance sensing using the mechanical input assembly as a contact or proximity sensing electrode or mutual capacitance sensing using the crown 6110 as a sense electrode). In some examples, capacitive sense controller 6120 can detect proximity of an object or contact by an object with crown 6110 based on signals present on internal electrical contact 6118.

In some examples, device 6100 can be a wearable device worn, for example, on a user's wrist (not shown). In some examples, crown 6110 can be in close proximity to the user's wrist such that movement of the crown relative to the user's wrist can be detected by the internal electrical contact 6118. In some examples, changes in the user's wrist position relative to crown 6110 (including contact between the user's wrist and the crown) can generate a self-capacitance signal that can interfere with detection of proximity or contact by other objects, such as a user's finger.

While the above examples describe the internal electrical contact 6118 being disposed on a shear plate 6116, it is understood that the internal electrical contact can be placed in a different location, as long as the internal electrical contact can be positioned to make electrical contact with a portion of the mechanical input assembly 6108. In some examples, the internal electrical contact 6118 can be operatively coupled to the mechanical input assembly 6108 without direct electrical contact. For example, the internal electrical contact 6118 can be capacitively coupled to the mechanical input assembly 6108. In such an arrangement, the capacitance formed between the internal electrical contact 6118 and the mechanical input assembly 6108 can be in series with a capacitance between the mechanical input assembly and an object (e.g., a user's finger). In some examples, internal electrical contact 6118 can be configured to maintain a consistent spacing with mechanical input assembly 6108 so that the capacitance between the mechanical input assembly and the internal electrical contact remains stable, as changes in the capacitance can modulate the signal driven onto the mechanical input assembly. In some examples, such a non-contact based configuration for driving the mechanical input assembly can improve reliability by reducing both mechanical wear and electromigration of conductive material between the internal electrical contact 6118 and the mechanical input assembly 6108.

In the examples below, where figure components or elements are labeled with the reference numerals 6102-6120, it is understood that the labeled components or elements in the figure being discussed can correspond to components/elements 6102-6120 described in FIG. 61. More generally, where descriptions of figures below refer to components or elements with reference numerals used in the descriptions of preceding examples of the disclosure, it is understood that the labeled components or elements in the figure being discussed can correspond to the previously discussed components having the same reference numeral and/or variations thereof.

Figure 62A:
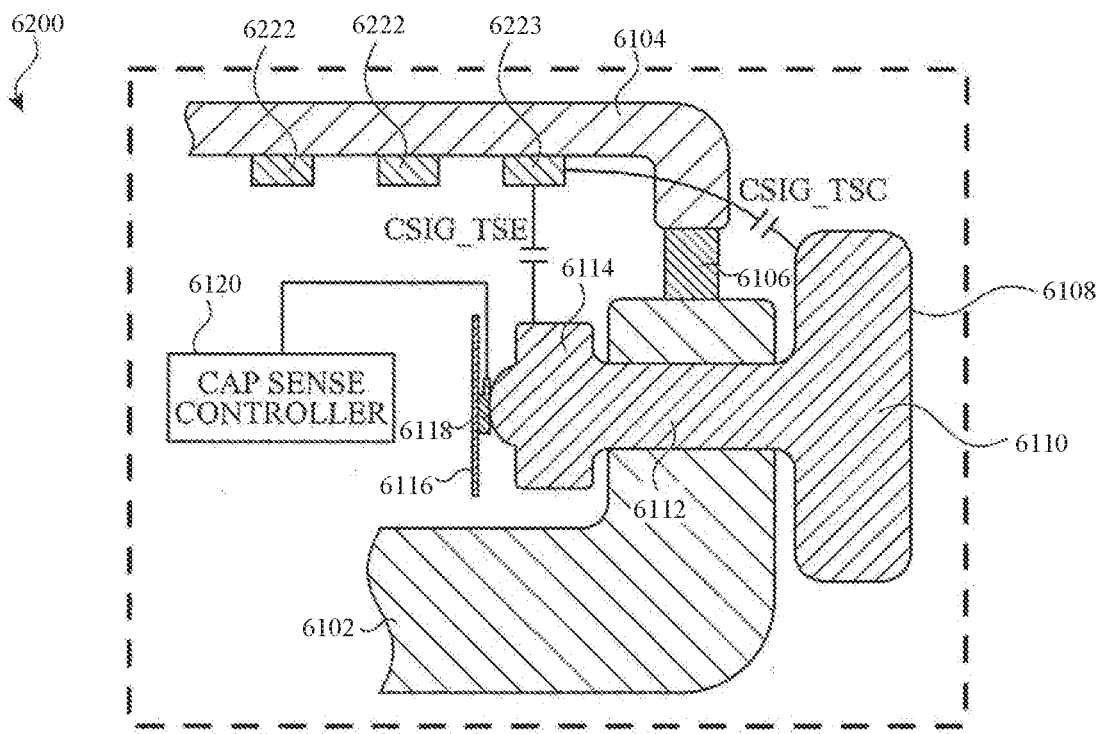
FIGS. 62A-62C illustrate variations of an exemplary device that can be used to detect proximity or contact with an object using mutual capacitance sensing between the crown and one or more touch screen electrodes according to examples of the disclosure.
Figure 62B:
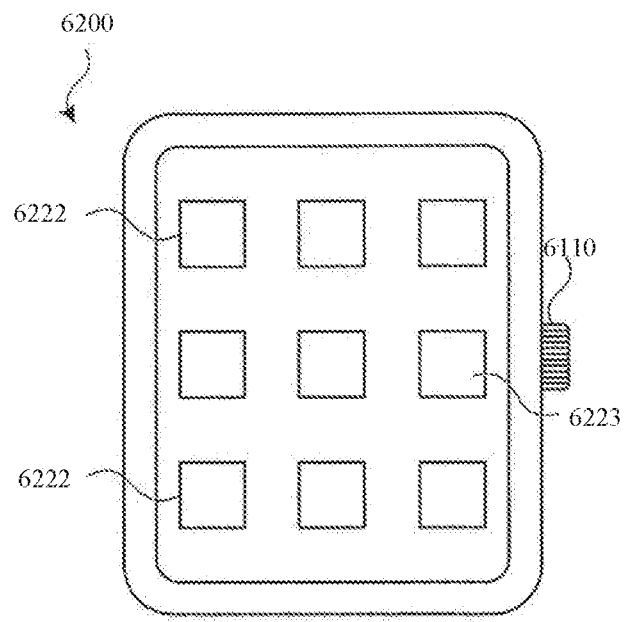
Figure 62C:
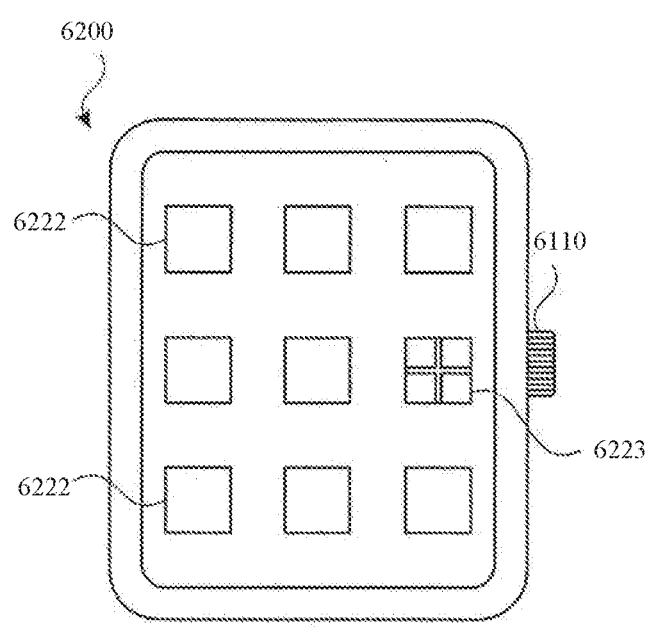

FIGS. 62A-62C illustrate variations of exemplary device 6200 (which can correspond to device 6100 above), that can be used to detect proximity or contact with an object using mutual capacitance sensing between the crown 6110 and one or more touch screen electrodes 6222 according to examples of the disclosure.

FIG. 62A illustrates a cross sectional view of an exemplary device 6200 that can be used to detect proximity or contact of an object to the mechanical input assembly 6108 by utilizing a mutual capacitance touch sensing measurement. In some examples, display screen 6104 can be a touch sensitive display screen and can include touch screen electrodes 6222. In some examples, touch screen electrodes 6222 can be configured to detect proximity or contact of an object (e.g., a finger or stylus) near or at a display area of display screen 6104. As described above, the mechanical input assembly 6108 can be configured as an electrode. In some examples, touch screen electrodes 6222 can be further configured in conjunction with the mechanical input assembly 6108 to detect proximity or contact of an object near the crown 6110. In some examples, a mutual capacitance can be formed between a touch screen electrode 6222 and the crown 6110 portion of the mechanical input assembly 6108 (CSIG_TSC). In some examples, CSIG_TSC can be considered to represent coupling between the mechanical input assembly 6108 and the touch screen electrode 6223 at the edge of display screen 6104 nearest to crown 6110 corresponding to the region located between the touch screen electrode and the crown itself. In some examples, an additional mutual capacitance CSIG_TSE can be considered to represent coupling between the encoder wheel 6114 (which can correspond to wheel 6016 above) and the touch screen electrode 6223. FIG. 62B illustrates an exemplary top view of device 6200 depicting a possible location for touch screen electrode 6223 near the crown. It should be understood that although a 3×3 array of touch screen electrodes 6222 is illustrated, different touch screen electrode arrangements are within the scope of the present disclosure. In addition, although the discussion above describes only a single capacitive coupling (CSIG_TSC) between crown 6110 and screen electrode 6223, it should be understood that a capacitive coupling can exist between crown 6110 and additional touch screen electrodes 6222. Similarly, a capacitive coupling can exist between encoder wheel 6114 and additional touch screen electrodes 6222. In some examples, measuring capacitive coupling values with multiple touch screen electrodes 6222 (and/or 6223) can provide additional information about a proximity and/or position of an object relative to the crown 6110 by, for example, comparing relative signal strength received at each of the touch screen electrodes.

Returning to FIG. 62A, in some examples, housing 6102 can be configured to shield electric fields between the encoder wheel 6114 and the touch screen such that only CSIG_TSC is measured. In some examples, touch screen electrode 6223 can be driven with a drive signal and the mechanical input assembly 6108 can be a sense electrode (as described above in FIG. 61). In some examples, internal electrical contact 6118 can transfer the sensed signal from the mechanical input assembly 6108 to capacitive sense controller 6120. In other examples, the mechanical input assembly 6108 can be driven with a drive signal, and touch screen electrode 6223 can be a sense electrode. In some examples, various control schemes can be utilized to prevent interference between contact and proximity detection for the display screen 6104 and contact and proximity detection for the crown 6110. In some examples, a single controller can be used to control display screen 6104 and crown 6110 detection operations. In some examples, interference can be prevented by assigning different time slots for contact or proximity detection at the display screen 6104 and the crown 6110. In some examples, different frequencies can be used to prevent interference. For example, a first frequency can be used for contact and proximity detection for the display screen 6104 and a second frequency can be used for contact and proximity detection for the crown 6110. In some examples, different pseudo-random noise drive signals can be used to prevent interference between the two types of detection.

FIG. 62C illustrates a top view of a variation of exemplary device 6200 according to examples of the disclosure. In some examples one or more touch screen electrodes 6223 of the display screen 6104 can be divided into multiple sub-electrodes. It should be understood that while the illustration depicts a single electrode 6223 divided into four sub-electrodes in a rectangular pattern, other variations are possible. In some examples, a single electrode can be divided into two sub-electrodes, three sub-electrodes, or more than four sub-electrodes. In some examples, the sub-electrodes can have a non-rectangular shape, including non-uniform sub-electrode shapes. In some examples, multiple electrodes can be divided into sub-electrodes: for example, all electrodes along the side of the device nearest to crown 6110 could be divided into sub-electrodes. In some examples, dividing the electrode 6223 into sub-electrodes can allow additional information about a position of an object relative to the crown 6110 by, for example, comparing relative signal strength received at each of the sub-electrodes. In some examples, it can be advantageous to use sub-electrodes of electrode 6223 because such an arrangement can result in more unique electrode elements in proximity to the crown 6110. Since the required drive strength of a drive signal on crown 6110 for detecting proximity of an object (e.g., a user's finger) can depend on the distance between the sense electrodes and the crown, placing additional sense electrodes near the crown can reduce the required drive strength of the drive signal (e.g., relative to measurements using multiple touch screen electrodes 6222/6223 described above). Such a reduction of drive strength can have advantages in many design aspects including, but not limited to, reduced power consumption, reduced interference with nearby circuitry, and improved reliability due to lower current densities.

Figure 63A:
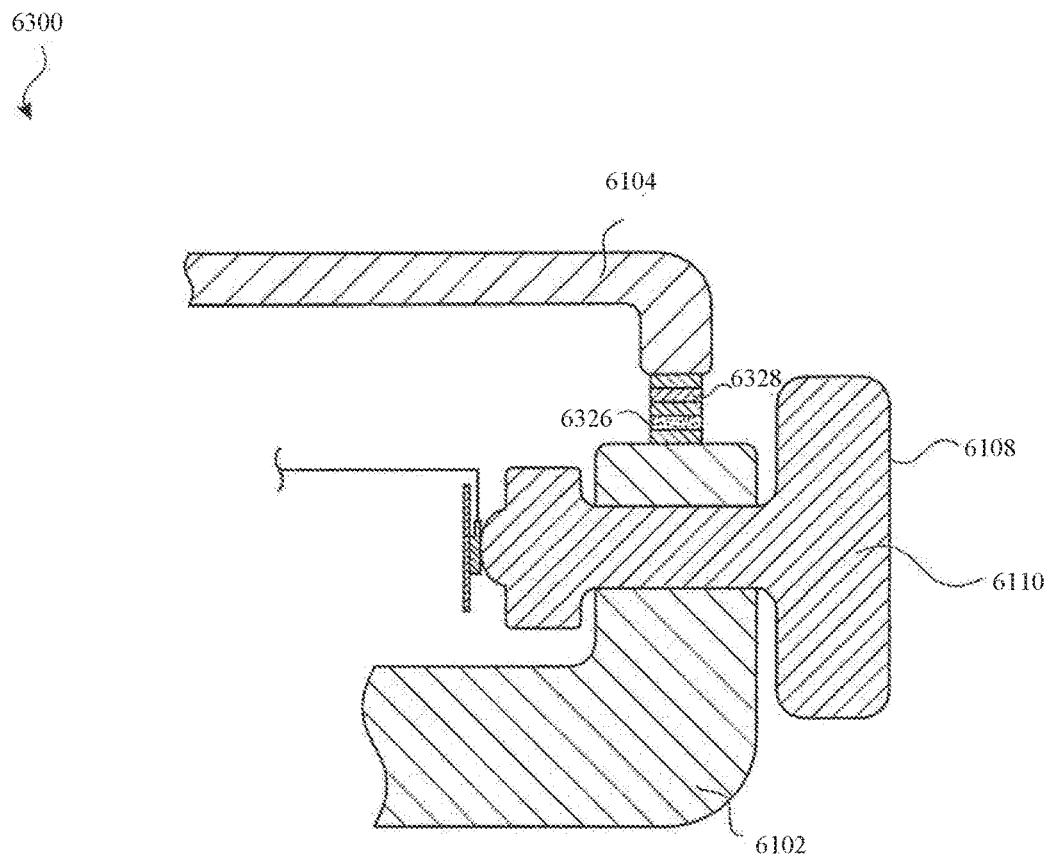
FIGS. 63A-63B illustrate variations of an exemplary device that can be used to detect proximity or contact of an object to the mechanical input assembly by utilizing a gasket sensor electrode that can be included in a gasket of the device.
Figure 63B:
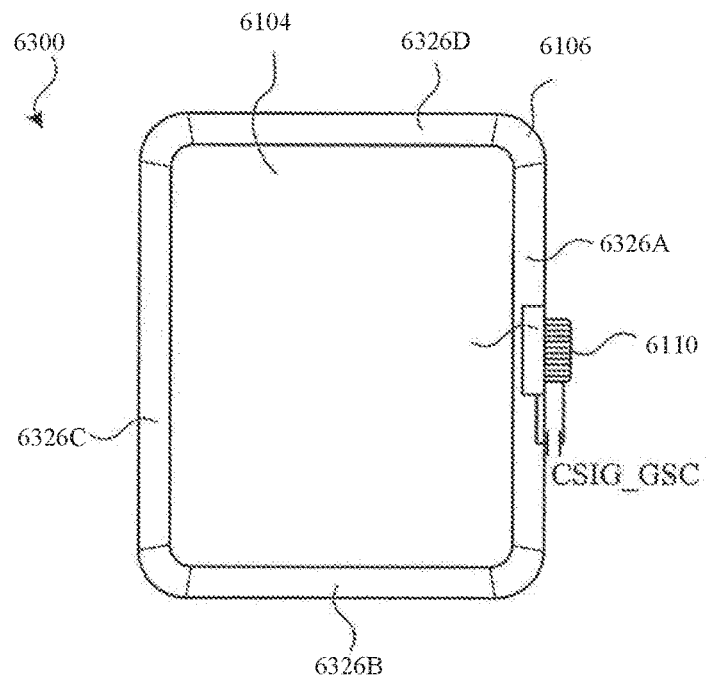

FIGS. 63A-63B illustrate variations of exemplary device 6300 (which can correspond to device 6100 above) that can be used to detect proximity or contact of an object with the mechanical input assembly 6108 by utilizing a gasket sensor electrode 6328 that can be included in a gasket 6106 of the device. FIG. 63A illustrates a cross-sectional view of exemplary device 6300 that can include a gasket sensor electrode 6328 in the gasket 6106. In some examples, the gasket 6106 can include one or more force sensors 6326 that can detect intensity of one or more contacts with display screen 6104. For example, force sensors 6326 can be used to determine an amount of force applied by a finger to the display screen 6104. In some examples, the gasket 6106 can include multiple force sensors 6326 (as discussed further below) around the perimeter of the display screen 6104. In some examples, gasket sensor electrode 6328 can be disposed in gasket 6106 above a portion of the force sensor 6326 near crown 6110. In some examples, gasket sensor electrode 6328 can be stacked above the force sensors 6326 in the gasket. In some examples, the gasket sensor electrode 6328 can be used for self-capacitance measurement for detecting contact or proximity of an object with the crown 6110. In some examples, gasket sensor electrode 6328 can be used for mutual capacitance sensing together with mechanical input assembly 6108 analogously to the mutual capacitance sensing with touch sensor electrode 6223 described above in FIGS. 62A-62C. In addition, techniques for avoiding conflicts between touch sensing for display screen 6104 and contact or proximity sensing for crown 6110 described above in FIGS. 62A-62C can similarly be applied.

FIG. 63B illustrates a top view of a variation of device 6300 that can include a gasket 6106 that can include four force sensors 6326A-6326D (i.e., one sensor per side of the touch sensitive display screen 6104) to detect intensity of a contact and/or multiple simultaneous contacts (e.g., detecting different amounts of force corresponding to each of two fingers contacting the display screen 6104). In some examples, gasket 6106 can include multiple force sensors per side of the display screen 6104. In some examples, gasket sensor electrode 6328 can replace a portion of force sensor 6326A (i.e., the sensor nearest to crown 6110 of mechanical input assembly 6108). In some examples, gasket sensor electrode 6328 can be divided into multiple electrodes to provide a multi-dimensional representation of proximity or contact by an object (as described in reference to FIG. 62C above). In some examples, the multi-dimensional representation can include two or more of object proximity, x-axis position, and y-axis position. In some examples, replacing a portion of force sensor 6326A with gasket sensor electrode 6328 can reduce an effective sense area of force sensor 6326A. In some examples, a sampling or integration time of force sensor 6326A can be increased relative to sample or integration times for force sensors 6326B-6326D to compensate for the reduction in area of force sensor 6326A. In some examples, a signal can be driven onto crown 6110 (as described above) and sense electrode 6328 and can be used as a sense electrode for a mutual capacitance measurement (e.g., a measurement of capacitance CSIG_GSC). In this example, mutual capacitance between crown 6110 and gasket sensor electrode 6328 can be used to detect proximity or contact of an object near the crown 6110 (analogous to the mutual capacitance measurements described above regarding FIGS. 62A-62C). In some examples, gasket sensor electrode 6328 can be closer to the crown 6110 than touch screen electrodes 6222 and 6223 on the display panel 6104 (see FIG. 62), and the signal drive strength on crown necessary for mutual capacitance detection of proximity or contact of an object near the crown can be significantly reduced. Such a reduction of drive strength can improve power performance, as well as reducing corrosive effects (e.g., electromigration) of driving a larger (e.g., higher current) signal to drive the mechanical input assembly 6108 with the drive signal. In some examples, drive and sense electrodes can be reversed such that gasket sensor electrode 6328 can be driven with a drive signal while crown 6110 can be a sense electrode. In some examples, a self-capacitance measurement can be performed with gasket sensor electrode 6328 acting as the self-capacitance electrode. A self-capacitance measurement of gasket sensor electrode 6328 can be less susceptible to proximity of a user's wrist compared to the self-capacitance measurement using crown 6110 as the electrode (described in FIG. 61 above). This reduced susceptibility to the user's wrist can be due to a larger distance between the gasket sensor electrode 6328 and the user's wrist relative to the distance between a user's wrist and the crown 6110 and/or shielding due to the housing 6102 between the wrist and the gasket sensor electrode.

Figure 64A:
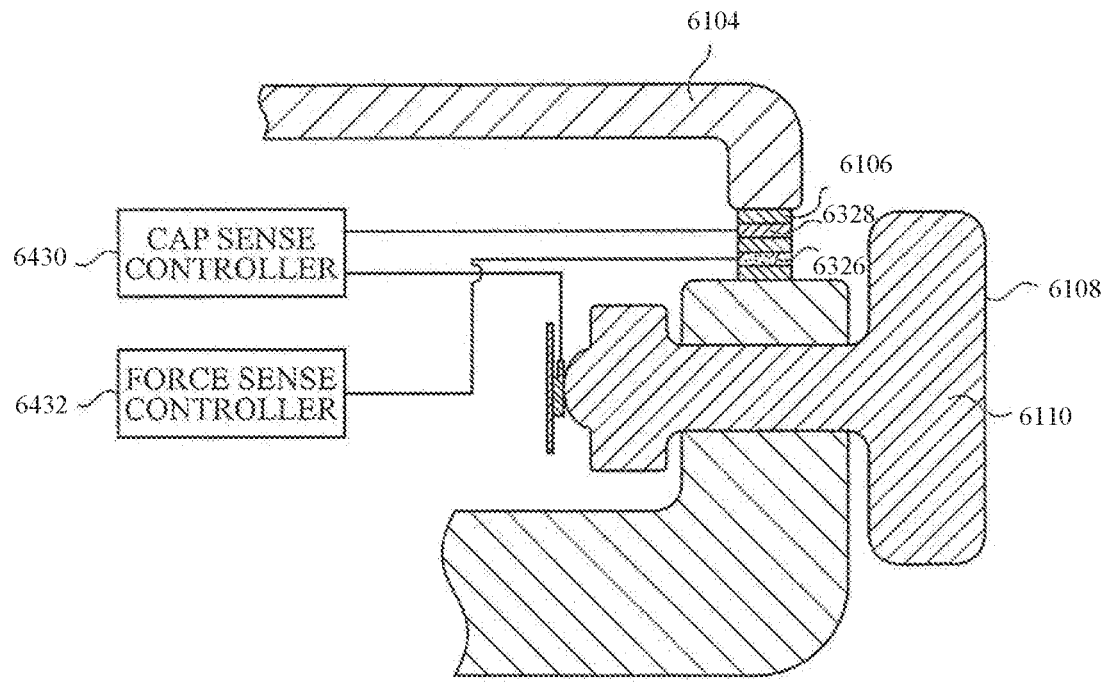
FIGS. 64A-64B illustrate exemplary control circuitry configurations for coordinating operations of a gasket sensor electrode and a force electrode included in the gasket according to examples of the disclosure.
Figure 64B:
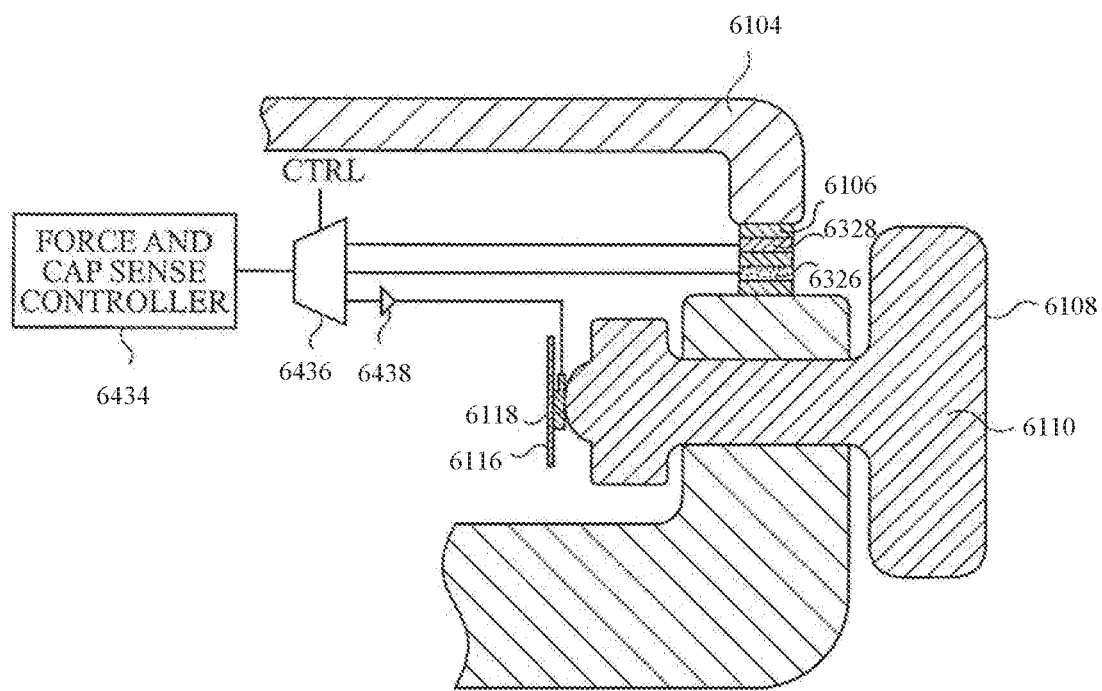

FIGS. 64A-64B illustrate exemplary control circuitry configurations for coordinating operations of a gasket sensor electrode 6328 and force sensors 6326 included in the gasket 6106 according to examples of the disclosure. FIG. 64A illustrates one variation of a control circuitry configuration for coordinating operations of gasket sensor electrode 6328 and force sensors 6326. In some examples, gasket sensor electrode 6328 and force sensors 6326 can be operated by independent controllers. For example, gasket sensor electrode 6328 can be controlled by a capacitive sense controller 6430 and force sensors 6326 can be controlled by a force controller 6432. In some examples, capacitive sense controller 6330 can control gasket sensor electrode 6328 and mechanical input assembly 6108 to perform any of the measurements described above in FIGS. 61-63.

FIG. 64B illustrates another variation of a control scheme for coordinating operations of gasket sensor electrode 6328 and force sensors 6326. In some examples, a single force and capacitance sense controller 6434 can be used to control operation of two or more of the force sensors 6326, the gasket sensor electrode 6328, and the mechanical input assembly 6108. In some examples, demultiplexer 6436 can be connected to a drive output of the force and capacitance sense controller 6434 for distributing drive signals to the various circuits. In some examples, control line (CTRL) can be used to connect an output of demultiplexer 6436 connected to the drive signal from the force and capacitance sense controller 6434. In some examples, an additional buffer amplifier 6438 can be connected to one or more of the demultiplexer 6436 outputs. In some examples, demultiplexer 6436 outputs connected to particularly large loads can be connected to the buffer amplifier 6438. In some examples, the mechanical input assembly 6108 can present a particularly load, and accordingly the buffer 6438 is illustrated connected to the internal electrical contact 6118 for driving the mechanical input assembly 6108. Variations of the mechanical input assembly 6108 that can reduce the load of the assembly are discussed below. These reduced load variations of the mechanical input assembly 6108 can potentially be driven without need for the buffer amplifier 6438. In some examples, separate drive connections can be provided for driving each of the gasket sensor electrode 6328, force sensors 6326, and mechanical input assembly 6108 (not shown). In some examples, providing separate drive connections between force and capacitance sense controller 6434 and each element can allow for more flexibility in control how each of the force sensors 6326, the gasket sensor electrode 6328, and the mechanical input assembly 6108 can be driven. In some examples, some of the drive connections can have separate connections, while others can be driven by the demultiplexer 6436. In some examples, the force sensors can be grounded during capacitive sensing operations, and the drive electrode can be grounded during force sensing operations. In addition to the drive signal connections described above, sense connections connected to the force and capacitance sense controller 6434 can be included for sensing outputs of the sensors and electrodes described above. In some examples, force and capacitance sense controller 6434 can control gasket sensor electrode 6328 and mechanical input assembly 6108 to perform any of the contact or proximity measurements described above in FIGS. 61-63. Similarly, in some examples, techniques for avoiding conflict between measurements described above in FIGS. 61-63 can analogously be applied to avoid conflicts between force sensing and contact or proximity sensing.

Figure 65A:
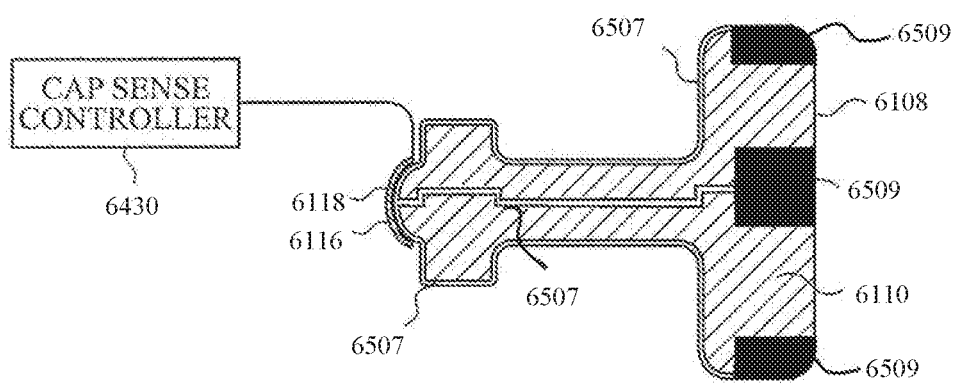
FIGS. 65A-65B illustrate exemplary variations of electrode configurations for a mechanical input assembly according to examples of the disclosure.
Figure 65B:
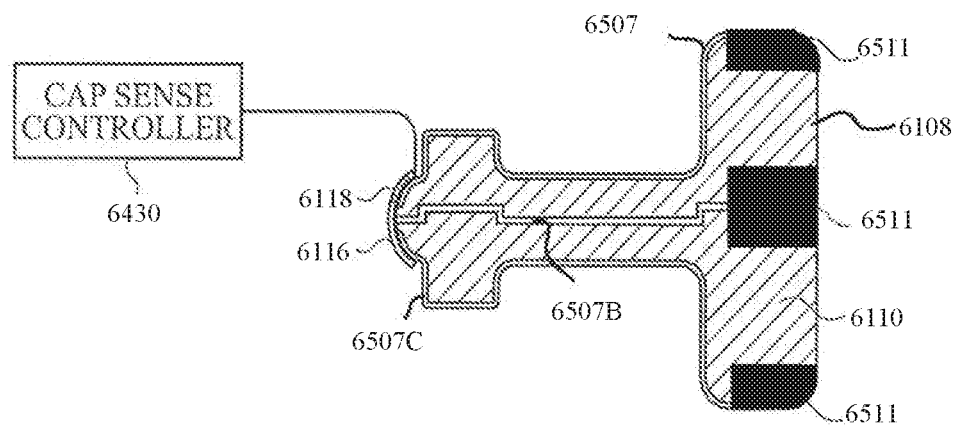

FIGS. 65A-65B illustrate exemplary variations of electrode configurations for mechanical input assembly 6108 according to examples of the disclosure. As described above in connection with FIG. 61, in some examples, mechanical input assembly 6108 can be formed completely from a conductive material, or can have a non-conductive core with an exterior surface completely surrounded or plated with a conductive material. FIG. 65A illustrates a side view of an exemplary mechanical input assembly 6108 configuration wherein a reduced portion of the surface of the mechanical input assembly can be covered by a conductive material. The conductive material can include routing traces 6507 (e.g., 6507A-6507C) and conductive pads 6509 (e.g., 6509A-6509C). It is understood that one or more additional routing traces 6507 and conductive pads 6509 can be disposed on the far side of the mechanical input assembly 6108 as well. In some examples (as illustrated), the routing traces can be routed along an exterior surface of the mechanical input assembly 6108, following any contours of the mechanical input assembly surface, and can provide routing from a first distal end of the mechanical input assembly near the shear plate 6116 toward the conductive pads 6509 located at an opposite distal end of the mechanical input assembly at crown 6110. In some examples, the routing traces can be routed through the interior of mechanical input assembly 6108. In some examples, the conductive pads 6509A-6509C can be disposed around a perimeter of crown 6110 at a top side, near side, and bottom side, respectively. In some examples, routing traces 6507A-6507C can be electrically connected together near the shear plate 6116 such that conductive pads 6509A-6509C can also be electrically connected together. In some examples, reducing the amount of conductive material on the mechanical input assembly 6108 (compared to a solid metal or fully metal plated mechanical input assembly) can reduce an amount of current required to drive a correspondingly smaller load. In some examples, a high current between internal electrical contact 6118 and the mechanical input assembly 6108 can result in electromigration of conductive material between the internal electrical contact and the mechanical input assembly. Since internal electrical contact 6118 can experience significant mechanical stresses due to friction of rotation caused by contact with mechanical input assembly 6108, reducing the electromigration of conductive material can be useful in extending device life. In addition, in some examples, reducing an amount of conductive material on the mechanical input assembly 6108 can reduce manufacturing costs. As explained above, coupling of a drive signal between internal electrical contact 6118 and conductive pads 6509 on crown 6110 can be achieved through conductive (e.g., direct contact) or non-conductive (e.g., capacitive) coupling. In some examples, the exterior of the crown 6110, including conductive pads 6509, can be coated with a non-conductive material to shield the conductive pads from the user and the environment.

FIG. 65B illustrates a side view of a further variation of electrode configurations for mechanical input assembly 6108 according to examples of the disclosure. In some examples, conductive material can be disposed on the mechanical input assembly surface to form multiple conductive pads 6511 (e.g., conductive pads 6511A-C) that can be electrically isolated from each other. For example, routing traces 6507A-6507C (which can correspond to routing traces 6507A-6507C in FIG. 65A) can provide routing between the conductive pads 6511A-C on the crown 6110 and the opposite distal end of the mechanical input assembly 6108 near the shear plate 6116. In some examples, routing traces 6507 can be routed along an exterior surface of the mechanical input assembly 6108, and in some examples, routing traces can be routed internally to the mechanical input assembly. As illustrated, the traces 6507A-6507C can be electrically isolated from one another by physically separating the traces. In some examples, internal electrical contact 6118 can be positioned on shear plate 6116 such that the internal electrical contact only couples to a subset of the routing traces 6507A-6507C at any time, and consequently only couples to the subset of corresponding conductive pads 6511A-C on the crown 6110. In some examples, portions of the shear plate 6116 can be coated with a non-conductive material to avoid conductively connecting routing traces 6507A-6507C together. The conductive pads 6511A-C can be disposed around a perimeter of crown 6110 at a top side, near side, and bottom side, respectively. In the illustrated example, routing trace 6507A is shown proximate to internal electrical contact 6118, and in this position conductive pad 6511A can be operatively coupled to the internal electrical contact. In some examples, a pad (not shown) can also be placed at the end of the routing traces 6507 near the shear plate 6116 to increase the area for coupling with the internal electrical contact 6118. As the crown is rotated, the routing traces 6507 can be arranged such that one or more conductive pads 6511 are always coupled to the internal electrical contact 6118. For example, rotation of the crown could move the routing trace 6507A in the illustration away from the internal electrical contact 6118, and instead bring the routing trace 6507B proximate to the internal electrical contact, thus coupling conductive pad 6511B to the internal electrical contact and uncoupling conductive pad 6511A. In this configuration, the conductive pad (or pads) 6511 coupled to the internal electrical contact 6118 can be driven with a drive signal from the capacitive sense controller 6430 and/or can be coupled to sense circuitry for detecting contact or proximity of an object to the mechanical input assembly as described above in FIGS. 61-63.

As explained above, coupling of a signal between internal electrical contact 6118 and routing traces 6507 (and corresponding conductive pads 6511 on crown 6110) can be achieved through conductive (e.g., direct contact) or non-conductive (e.g., capacitive) coupling. In some examples, the routing traces 6507 can be shielded to reduce stray capacitances and maintain a consistent capacitance of the routing traces (and corresponding conductive pads 6511) coupled to the internal electrical contact 6118 as the crown rotates. In some examples, the shielding for routing trace 6507 can be a grounded shield. In some examples, a portion of shear plate 6116 that contacts the mechanical input assembly can provide a ground connection to the mechanical input assembly. In some examples, a portion of mechanical input assembly 6108 (e.g. the central shaft) can be coupled to a device chassis (e.g., housing 116 of device 100 above) for providing a ground connection. In some examples, routing traces 6507 can be disposed with a small area (e.g, by providing narrow traces) to minimize an amount of stray capacitive coupling affecting signals coupled onto the routing traces.

In some examples, the variation of the electrode configuration described above can be utilized to perform self-capacitance sensing (as described in FIG. 61 above). In some examples, the driven conductive pads 6511 can be configured such that only the conductive pads positioned away from the user's wrist will be activate (as described above). This configuration can reduce sensitivity of a self-capacitance measurement to proximity or contact of a user's wrist which can interfere with detection of contact or proximity of an object with the crown 6110. As noted above, in some examples, the exterior of the crown 6110, including conductive pads 6511, can be coated with a non-conductive material to shield the conductive pads from the user and the environment.

Figure 66:
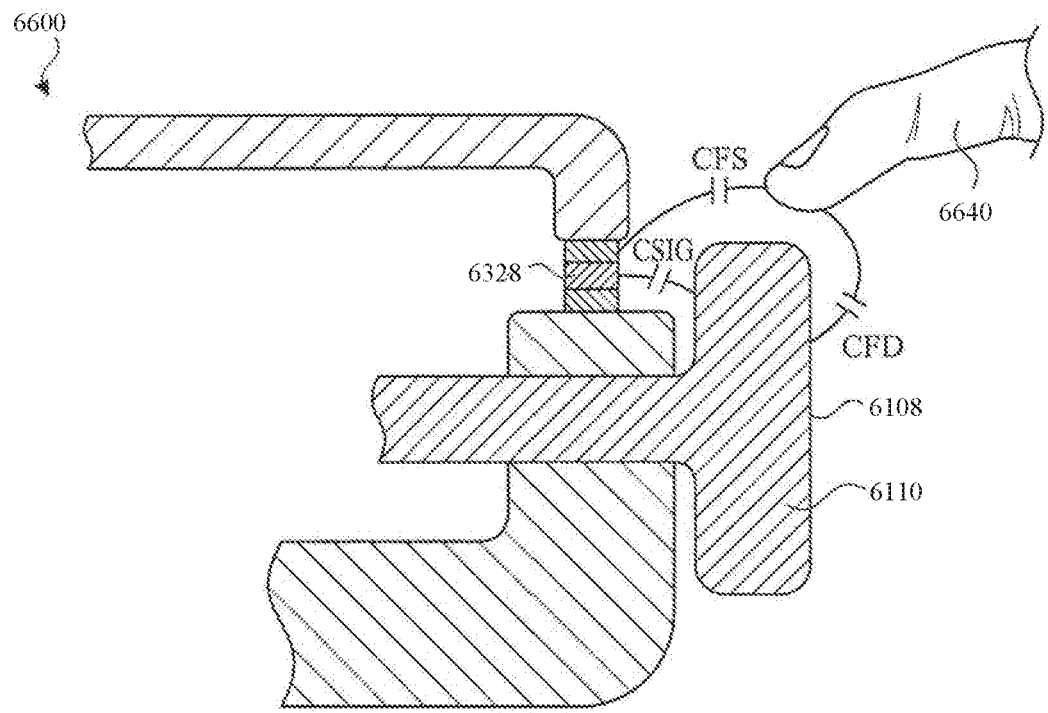
FIG. 66 illustrates exemplary capacitive couplings between a crown and an object in contact or proximity with the crown according to examples of the disclosure.

FIG. 66 illustrates exemplary capacitive couplings between crown 6110 of device 6600 (which can correspond to device 6300) and an object in contact or in proximity with crown 6110 according to examples of the disclosure. In some examples, a mutual capacitance CSIG can form between a crown 6110 and gasket sensor electrode 6328. In some examples, the crown 6110 can be a drive electrode, and the gasket sensor electrode 6328 can be a sense electrode. In some examples, the crown 6110 can be the sense electrode and the gasket sensor electrode 6328 can be the drive electrode. In some examples, a finger-to-sense capacitance (CFS) can form between a finger 6640 and the sense electrode. In some examples, a finger-to-drive capacitance (CFD) can form between the finger 6640 and the drive electrode. In some examples, mutual capacitance touch detection is performed by driving the drive electrode with a stimulation (or drive) signal, and measuring a resulting sense signal at the sense electrode due to the capacitive coupling between the drive and sense electrode. In some examples, when there are no objects in proximity or contact with the device 6600, the capacitive coupling between drive and sense electrodes can be expressed as a capacitance CSIG. In some examples, when a grounded object (such as finger 6640 of a grounded user) is in proximity or contact with the crown 6110, a portion of the coupling electric field between the drive and sense electrodes can be disrupted (i.e., reduced), and the reduction can be represented by a capacitance change ΔCSIG. This capacitance change ΔCSIG can be caused by current or charge from the electric field lines being shunted through the touching finger to ground. As a result, the proximity or contact of finger 6640 can reduce an amount of coupling between the drive and sense electrode, and accordingly reduce the resulting measured signal. In other words, proximity or contact of an object can be indicated by an apparent reduction in CSIG. Touch signals representative of the capacitance change ΔCSIG can be transmitted by the sense lines 102 to sense circuitry for processing.

In some examples, when an ungrounded user's finger 6640 (or other ungrounded object) is in proximity or contact with the crown 6110, current or charge from the electric field lines coupling from the drive electrode can be transmitted by the finger to the sense electrode rather than being shunted to ground. As illustrated in FIG. 9, capacitors CFS and CFD can form a signal path through the finger 6640 between the drive electrode and sense electrode. The drive signal transmission to the sense electrode through this signal path can be represented as capacitance Cneg. Thus, in some examples, proximity or contact of ungrounded finger 6640 can reduce CSIG by an amount ΔCSIG−Cneg. In some examples, the capacitance Cneg can result in erroneous touch signals representative of the capacitance change corresponding to the proximity or contact of the finger 6640 with the crown 6110. In some examples, CSIG can be larger than Cneg, and the sensed signals can still generally indicate proximity or contact by the finger 6640. In some examples, Cneg can be greater than or equal to ΔCSIG, and the sensed signals can indicate no change or even an apparent increase in the capacitance CSIG (i.e., an apparent increase in the coupling capacitance between the drive and sense electrodes). In some examples, the sensed signals may indicate no touch or a negative touch despite the finger 6640 being positioned close to the crown 6110. Such a result can occur when the ungrounded finger 6640 is located between the drive and sense electrodes, and in close proximity and/or contact with the drive and sense electrodes. When the poorly grounded finger 6640 is in close proximity and/or contact with the drive and sense electrodes, both CFS and CFD can be large, and Cneg can correspondingly also be large. As a result, touch signals indicative of sensed capacitance can appear to increase, rather than decrease as described in the example above for grounded finger 6640, and thus indicate a "negative pixel" condition. Device 6600 can be configured to address this potential "negative pixel" condition as will be described in more detail below.

Figure 67A:
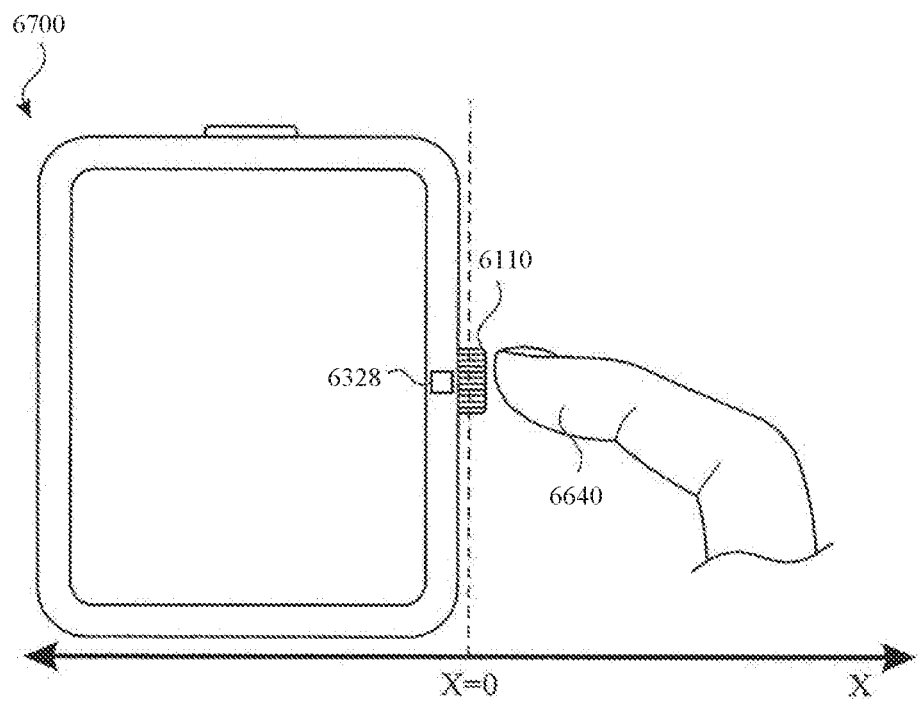
FIGS. 67A-67B illustrate exemplary performance of self-capacitance and mutual capacitance measurements for detecting an object in proximity or contact with a crown according to examples of the disclosure.
Figure 67B:
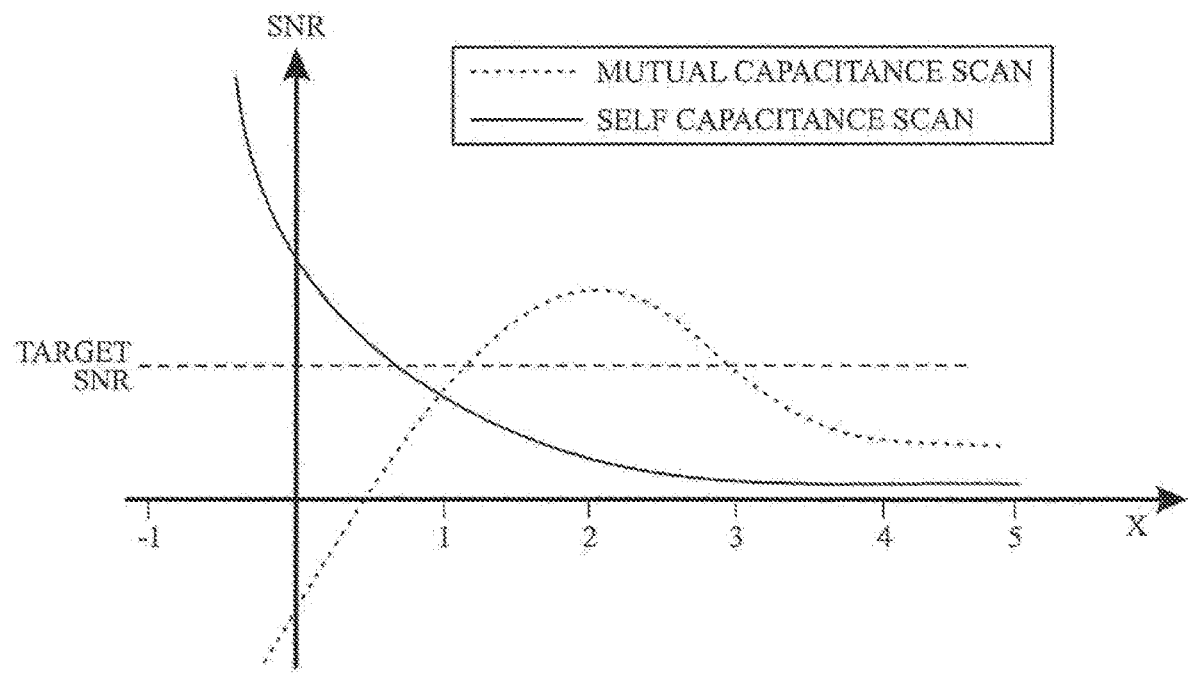

FIGS. 67A and 67B illustrate exemplary operation of self-capacitance and mutual capacitance measurements for detecting an object in proximity or contact with a crown 6110 of device 6700 (which can correspond to device 6100 above) according to examples of the disclosure. FIG. 67A illustrates an exemplary coordinate system for relating position of an object such as a user's finger 6640 relative to the device 6700. As illustrated, an exemplary x=0 position can run vertically through the center of crown 6110 (which can be a portion of mechanical input assembly 6108 described above) protruding from one side of the device 6700. Positive x values can represent positions to the right of the center of crown 6110 while negative x values can represent positions to the left of the center of the crown. In some examples, gasket sensor electrode 6328, which can be located at a negative x position, can be used for performing self-capacitance measurements and for performing mutual capacitance measurements with the crown 6110 as described above.

FIG. 67B illustrates exemplary signal to noise ratio (SNR) values for different object positions along the x-direction that can result from self-capacitance and mutual capacitance sensing as described above regarding FIG. 67B. The x-axis is presented on a dimensionless scale as the particular dimensions and measurement values can vary among various implementations of the present disclosure. It should be understood that the graphs presented in FIG. 67B are merely exemplary and for the purpose of illustration. The dashed line (labeled Target SNR) can represent a threshold SNR that can be used to detect a proximity or contact of an object with a crown (e.g., crown 6110 above). While a single target SNR threshold is illustrated, it should be understood that different SNR thresholds can be used for each of mutual capacitance sensing and self-capacitance sensing. In some examples, the illustrated dotted line can represent a SNR for mutual capacitance sensing relative to a position of an object along the x-axis (e.g., finger 6640 above). In some examples, as the finger 6640 approaches device 6700 from a positive value of x>5, the SNR value can gradually increase as the finger begins to disrupt fringing electric fields between drive and sense electrodes, resulting in a signal ΔCSIG as described above in FIG. 66. In some examples, if the finger 6640 is ungrounded or poorly grounded, as the finger nears the crown, a negative pixel condition can occur as described above in FIG. 66. In the example graph, the SNR of the mutual capacitance measurement reaches a maximum SNR value at approximately x=2. In some examples, as the finger 6640 continues to move in the negative x-axis direction, the negative pixel condition can gradually become larger such that the SNR can become zero and eventually become increasingly negative for x<0. Accordingly, when finger 6640 is poorly grounded, a mutual capacitance measurement may only be able to detect presence of the finger for positions x>1.1 (i.e., where the dotted line crosses the target SNR).

In some examples, the solid line can represent a SNR for self-capacitance sensing (e.g., as described in FIGS. 61 and 63). In some examples, as the finger or object 6640 approaches the device 6700 from the positive x-axis direction, the self-capacitance measurement SNR can slowly climb, until eventually reaching the target SNR for detecting the finger at an x-axis position of approximately 0.8. In some examples, as the finger 6640 continues to move in the negative x-axis direction, the SNR of the self-capacitance measurement can continue to increase, in contrast to the mutual capacitance measurement described above. In some examples, this self-capacitance measurement profile can be present even if the finger 6640 is poorly grounded. Thus, the self-capacitance measurement in the exemplary graph can detect the presence of the poorly grounded finger 6640 in locations where the mutual capacitance measurement is unable to detect the poorly grounded finger due to a negative pixel condition. Accordingly, a person of ordinary skill can recognize that a measurement technique that includes a mutual capacitance measurement and self-capacitance measurement can potentially detect presence of a poorly grounded finger 6640 for a larger range of finger positions along the x-axis.

It should be noted, as further illustrated in the exemplary graphs, there can be a region of x values between the detection range of the self-capacitance measurement (i.e., x<0.8) and the detection range of the mutual capacitance measurement (i.e., 1.1<x<3) that can be considered a "deadzone" for detection of the poorly grounded finger (i.e., dead zone 0.8<x<1.1). In some examples, the dead-zone can be eliminated by lowering the target SNR to the SNR value where the SNR of the mutual capacitance measurement and the SNR of the self-capacitance measurement intersect (i.e., x=1). In some examples, a similar effect can be achieved by increasing the SNR of either of the mutual capacitance measurement, the self-capacitance measurement, or both.

Figure 68:
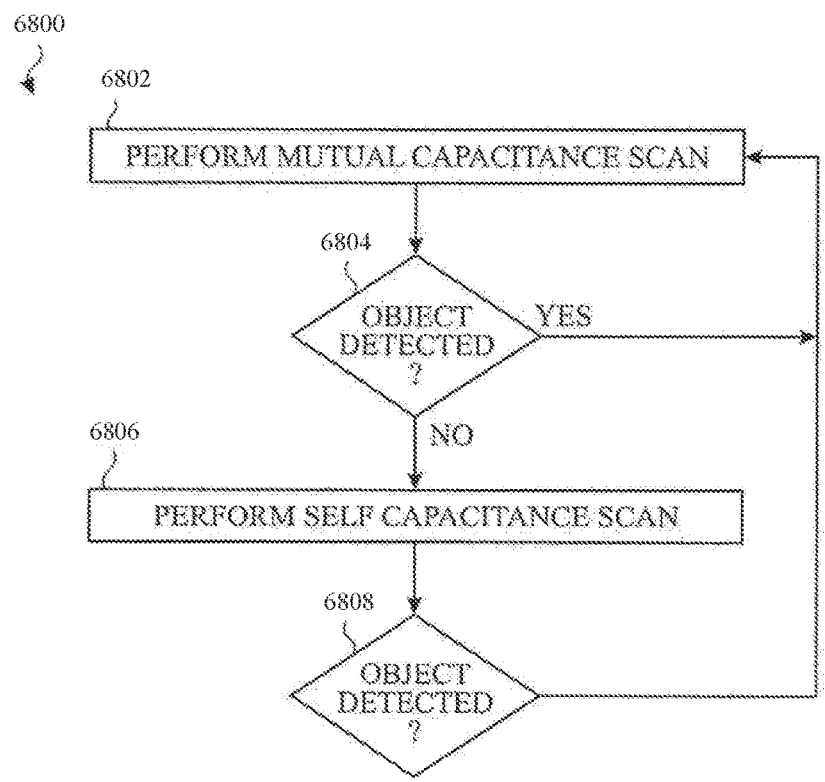
FIG. 68 illustrates an exemplary process for performing a proximity or contact measurement utilizing self-capacitance and mutual capacitance measurements according to examples of the disclosure.

FIG. 68 illustrates an exemplary process for performing proximity or contact measurement utilizing self-capacitance and mutual capacitance measurements according to examples of the disclosure. It should be noted that any of the exemplary devices or configurations above or any number of variations of or alternatives to the devices or configurations above that are capable of performing a mutual capacitance measurement and a self-capacitance measurement to determine a proximity or contact of a proximate object can be suitable for implementing process 6800. At step 6802, process 6800 can perform a mutual capacitance measurement for sensing proximity or contact of a proximate object to a rotatable mechanical input of a device (e.g., mutual capacitance sensing described in FIGS. 62-63). At step 6804, process 6800 can determine whether an object was detected by the mutual capacitance measurement. As described above, in some examples, a negative pixel condition can result in no object being detected. If it is determined that an object was not detected during the mutual capacitance measurement, process 6800 can proceed to step 6806. At step 6806, process 6806 can perform a self-capacitance measurement (e.g., a self-capacitance measurement of mechanical input assembly 6118 or a self-capacitance measurement of a gasket sensor electrode 6328 as described above in FIGS. 61 and 63). At step 6808, process 6800 can determine whether an object was detected by the self-capacitance measurement. If an object is detected at either step 6804 or step 6808, process 6800 can report that an object was detected and return to step 6802. In some examples, if an object is detected at step 6808, process 6800 can further report that the object is potentially a poorly grounded object, and that a negative pixel condition may be present as described in greater detail above.

Figure 69:
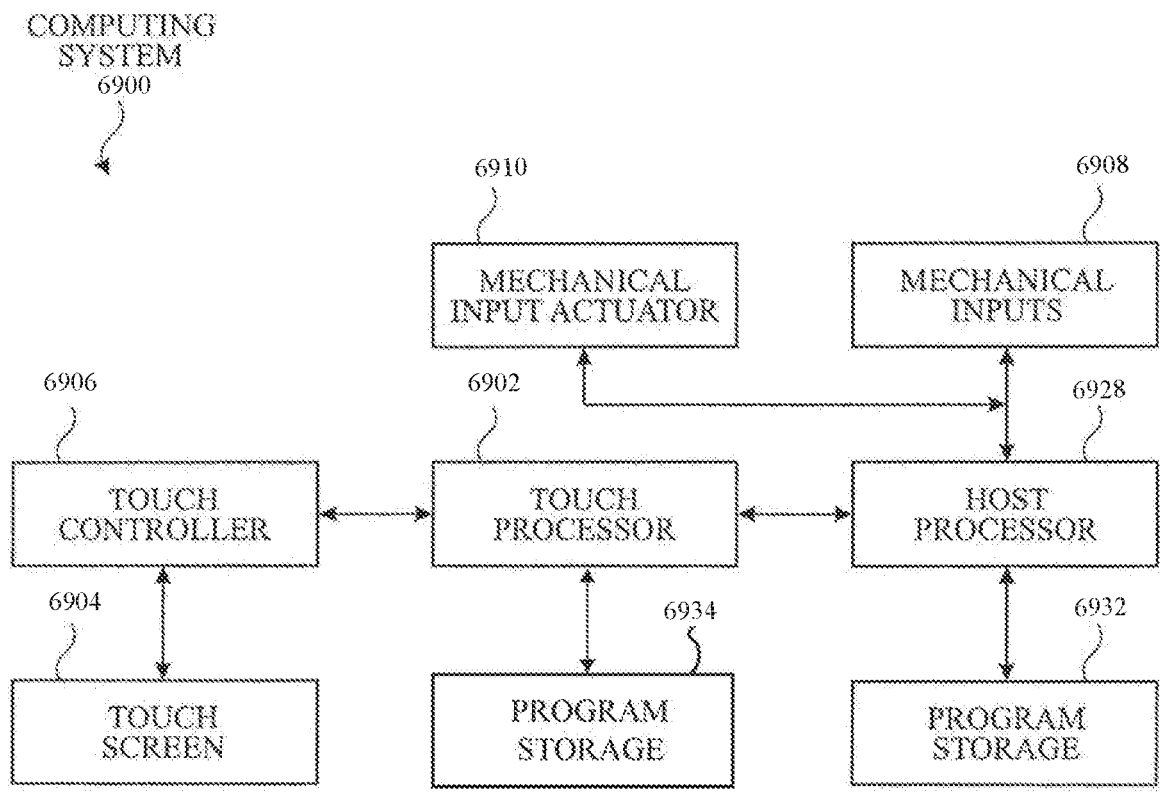
FIG. 69 illustrates an example computing system for implementing finger-on-crown detection according to examples of the disclosure.

FIG. 69 illustrates an example computing system 6900 (which can correspond to one or more components of device 200 illustrated in FIG. 2 above) for implementing detection of proximity or contact of an object with a crown of a device according to examples of the disclosure. Computing system 6900 can be included in, for example, device 100 above or any mobile or non-mobile computing device and/or wearable or non-wearable device that includes a rotary input (e.g., crown 6110 described above). Computing system 6900 can include a touch sensing system including one or more touch processors 6902, touch controller 6906 and touch screen 6904. Touch screen 6904 can be a touch screen adapted to sense touch inputs, as described in the disclosure. Touch controller 6906 can include circuitry and/or logic configured to sense touch inputs on touch screen 6904. In some examples, touch controller 6906 and touch processor 6902 can be integrated into a single application specific integrated circuit (ASIC).

Computing system 6900 can also include host processor 6928 for receiving outputs from touch processor 6902 and performing actions based on the outputs. Host processor 6928 can be connected to program storage 6932. For example, host processor 6928 can contribute to generating an image on touch screen 6904 (e.g., by controlling a display controller to display an image of a user interface (UI) on the touch screen), and can use touch processor 6902 and touch controller 6906 to detect one or more touches on or near touch screen 6904. Host processor 6928 can also contribute to sensing and/or processing mechanical inputs 6908 (which can correspond to crown 6110 described above) as described in the disclosure. The inputs from touch screen 6904 and/or mechanical inputs 6908 can be used by computer programs stored in program storage 6932 to perform actions in response to the touch and/or mechanical inputs. For example, touch inputs can be used by computer programs stored in program storage 6932 to perform actions that can include moving an object such as a cursor or pointer, scrolling or panning, adjusting control settings, opening a file or document, viewing a menu, making a selection, executing instructions, operating a peripheral device connected to the host device, answering a telephone call, placing a telephone call, waking a device from a screen-off state in response to a user's contact, turning off touch screen 6904 in response to a user's palm placed over the screen, and other actions that can be performed in response to touch inputs. Mechanical inputs 6908 can be used by computer programs stored in program storage 6932 to perform actions that can include changing a volume level, locking the touch screen, turning on the touch screen, taking a picture, and other actions that can be performed in response to mechanical inputs. Host processor 6928 can also perform additional functions that may not be related to touch and/or mechanical input processing. In some examples, touch processor 6902 may be connected to separate optional program storage 6934. In some examples, mechanical inputs 6908 can be connected directly to touch processor 6902. In some examples, touch processor 6902 can process inputs from touch screen 6904 and/or mechanical inputs 6908 by computer programs stored in program storage 6934 to perform actions in response to the touch and/or mechanical inputs (as described above). In some examples, touch processor 6902 can also perform additional functions that may not be related to touch and/or mechanical input processing.

Note that one or more of the functions described above can be performed by firmware stored in memory in computing system 6900 and executed by touch processor 6902, or stored in program storage 6932 and executed by host processor 6928. The firmware can also be stored and/or transported within any non-transitory computer-readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "non-transitory computer-readable storage medium" can be any medium (excluding signals) that can contain or store the program for use by or in connection with the instruction execution system, apparatus, or device. The computer-readable storage medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport medium can include, but is not limited to, an electronic, magnetic, optical, electromagnetic or infrared wired or wireless propagation medium.

Thus, according to the above, some examples of the disclosure are directed to an electronic device comprising: a rotational input element having a near end and a far end; a touch sensor, the touch sensor comprising: a transmit circuit operatively coupled to the rotational input element and configured to send an acoustic wave through the rotational input element such that the acoustic wave reflects off of the far end of the rotational input element; a receiver circuit operatively coupled to the rotational input element and configured to measure one or more parameters of the acoustic wave after the acoustic wave has reflected off of the far end of the rotational input element; and a processor operably coupled to the touch sensor and configured to: detect one or more touch events based on the one or more parameters measured by the receiver circuit; and perform an action based on the one or more touch events detected. Additionally or alternatively to one or more of the examples disclosed above, in some examples, the electronic device is a wearable device and the rotational input element is a crown. Additionally or alternatively to one or more of the examples disclosed above, in some examples, the transmit circuit includes an acoustic transducer. Additionally or alternatively to one or more of the examples disclosed above, in some examples, the receiver circuit includes an acoustic transducer. Additionally or alternatively to one or more of the examples disclosed above, in some examples, the transmit circuit includes an acoustic transducer, the receiver circuit includes the same acoustic transducer, and the touch sensor further comprises a switching network configured to selectively couple the acoustic transducer to the transmit circuit and the receiver circuit. Additionally or alternatively to one or more of the examples disclosed above, in some examples, the receiver circuit is operatively coupled to the rotational input element nearer to the near end than the transmit circuit. Additionally or alternatively to one or more of the examples disclosed above, in some examples, the rotational input element is formed of at least a first acoustically conductive material. Additionally or alternatively to one or more of the examples disclosed above, in some examples, the rotational input element includes a first acoustic channel coupled to the transmit circuit and terminating at the far end of the rotational input element, wherein the first acoustic channel comprises: a first material having a first acoustic conductivity; a second material having a second acoustic conductivity encircling the first material along a length of the acoustic channel. Additionally or alternatively to one or more of the examples disclosed above, in some examples, the first acoustic conductivity is greater than the second acoustic conductivity. Additionally or alternatively to one or more of the examples disclosed above, in some examples, the first material of the first acoustic channel has a circular cross-sectional shape and the second material of the first acoustic channel has a hollow cylindrical cross-sectional shape. Additionally or alternatively to one or more of the examples disclosed above, in some examples, the first acoustic channel is coupled to the transmit circuit at the first material. Additionally or alternatively to one or more of the examples disclosed above, in some examples, the first acoustic channel is coupled to the receiver circuit. Additionally or alternatively to one or more of the examples disclosed above, in some examples, the device further comprises: a second acoustic channel, wherein the second acoustic channel is coupled to the receiver circuit. Additionally or alternatively to one or more of the examples disclosed above, in some examples, the device further comprises: a second acoustic channel, wherein the second acoustic channel terminates a different area of the far end of the rotational input element than the first acoustic channel.

Additionally or alternatively to one or more of the examples disclosed above, in some examples, the second acoustic channel is coupled to a second transmit circuit. Additionally or alternatively to one or more of the examples disclosed above, in some examples, the rotational input element is divided along a length of the rotational input element into a plurality of segments, wherein each segment is acoustically conductive and each segment is separated from each adjacent segment by an acoustically insulating material. Additionally or alternatively to one or more of the examples disclosed above, in some examples, the device further comprises each segment is coupled to one of a plurality of transmit circuits. Additionally or alternatively to one or more of the examples disclosed above, in some examples, the device further comprises each segment is coupled to one of a plurality of receiver circuits. Additionally or alternatively to one or more of the examples disclosed above, in some examples, the transmit circuit includes a mechanical hammer configured to send the acoustic wave by striking the rotational input element. Additionally or alternatively to one or more of the examples disclosed above, in some examples, the acoustic wave includes a pulse wave. Additionally or alternatively to one or more of the examples disclosed above, in some examples, the parameters of the acoustic wave include an amplitude of the acoustic wave.

Additionally or alternatively to one or more of the examples disclosed above, in some examples, the parameters of the acoustic wave include a delay measurement between a first time when the transmit circuit sends the acoustic wave and a second time when the receiver circuit receives the wave. Additionally or alternatively to one or more of the examples disclosed above, in some examples, the transmit circuit is further configured to successively send a plurality of acoustic waves, each having a different frequency, through the rotational input element. Additionally or alternatively to one or more of the examples disclosed above, in some examples, the device further comprises the receiver circuit is further configured to measure one or more parameters of the plurality of acoustic wave and the processor is further configured to detect one of the one or more touch events based on the one or more parameters of more than one of the plurality of acoustic waves.

Some examples of the disclosure are directed to a method of detecting one or more touch events on a rotational input element comprising: sending an acoustic wave through the rotational input element such that the acoustic wave reflects off of a far end of the rotational input element; measuring one or more parameters of the acoustic wave after the acoustic wave has reflected off of the far end of the rotational input element; determining whether a touch event has occurred based on the one or more parameters of the acoustic wave. Additionally or alternatively to one or more of the examples disclosed above, in some examples, the rotational input element is a crown. Additionally or alternatively to one or more of the examples disclosed above, in some examples, the acoustic wave is sent through the rotational input element using an acoustic transducer. Additionally or alternatively to one or more of the examples disclosed above, in some examples, the one or more parameters of the acoustic wave are measured using an acoustic transducer. Additionally or alternatively to one or more of the examples disclosed above, in some examples, the acoustic wave is sent through the rotational input element using an acoustic transducer coupled to a transmit circuit, and after sending an acoustic wave through the rotational input element, selectively coupling the acoustic transducer to a receiver circuit, and measuring the one or more parameters of the acoustic wave using the receiver circuit. Additionally or alternatively to one or more of the examples disclosed above, in some examples, the receiver circuit is operatively coupled to the rotational input element nearer to the near end than the transmit circuit. Additionally or alternatively to one or more of the examples disclosed above, in some examples, the acoustic wave reflects off of the far end of the rotational input element at a first area, and the method further comprising: sending a second acoustic wave through the rotational input element such that the acoustic wave reflects off of the far end of the rotational input element at a second location; measuring one or more parameters of the second acoustic wave after the acoustic wave has reflected off of the far end of the rotational input element; determining whether the touch event has occurred at the first area of the rotational input element based on the one or more parameters of the acoustic wave, and determining whether a second touch event has occurred at the second area of the rotational input element based on the one or more parameters of the second acoustic wave. Additionally or alternatively to one or more of the examples disclosed above, in some examples, sending the acoustic wave through the rotational input element includes striking the rotational input element with a mechanical hammer. Additionally or alternatively to one or more of the examples disclosed above, in some examples, measuring the one or more parameters of the acoustic wave includes measuring an amplitude of the acoustic wave. Additionally or alternatively to one or more of the examples disclosed above, in some examples, measuring the one or more parameters of the acoustic wave includes measuring a shape of the acoustic wave. Additionally or alternatively to one or more of the examples disclosed above, in some examples, the method further comprises: successively sending a plurality of acoustic waves, each having a different frequency, through the rotational input element; measuring one or more parameters of the plurality of acoustic waves; and determining one of the one or more touch events based on the one or more parameters of more than one of the plurality of acoustic waves.

Some examples of the disclosure are directed to an electronic device comprising: a rotational input element having a near end and a far end; a touch sensor, the touch sensor comprising: a transmit circuit operatively coupled to the rotational input element and configured to cause a vibration of the rotational input element; a receiver circuit operatively coupled to the rotational input element and configured to measure one or more parameters of the vibration; and a processor operably coupled to the touch sensor and configured to: detect one or more touch events based on the one or more parameters measured by the receiver circuit; and perform an action based on the one or more touch events detected. Additionally or alternatively to one or more of the examples disclosed above, in some examples, the electronic device is a wearable device and the rotational input element is a crown. Additionally or alternatively to one or more of the examples disclosed above, in some examples, the transmit circuit includes an acoustic transducer. Additionally or alternatively to one or more of the examples disclosed above, in some examples, the receiver circuit includes an acoustic transducer. Additionally or alternatively to one or more of the examples disclosed above, in some examples, the transmit circuit includes a rotating mass. Additionally or alternatively to one or more of the examples disclosed above, in some examples, the transmit circuit includes an electromagnet configured to emit electromagnetic waves, thereby vibrating the rotational input element. Additionally or alternatively to one or more of the examples disclosed above, in some examples, the receiver circuit comprises an optical sensor. Additionally or alternatively to one or more of the examples disclosed above, in some examples, the receiver circuit comprises an accelerometer. Additionally or alternatively to one or more of the examples disclosed above, in some examples, the rotational input element is divided along a length of the rotational input element into a plurality of segments, wherein each segment is acoustically conductive and each segment is separated from each adjacent segment by an acoustically insulating material. Additionally or alternatively to one or more of the examples disclosed above, in some examples, the device further comprises each segment is coupled to one of a plurality of transmit circuits. Additionally or alternatively to one or more of the examples disclosed above, in some examples, the device further comprises each segment is coupled to one of a plurality of receiver circuits. Additionally or alternatively to one or more of the examples disclosed above, in some examples, the parameters of the vibration include an amplitude and a frequency of the vibration. Additionally or alternatively to one or more of the examples disclosed above, in some examples, the transmit circuit is further configured to cause a plurality of vibrations of the rotational input element, each of the vibrations of the plurality of vibrations having a different frequency. Additionally or alternatively to one or more of the examples disclosed above, in some examples, the device further comprises the receiver circuit is further configured to measure one or more parameters of the plurality of vibrations and the processor is further configured to detect one of the one or more touch events based on the one or more parameters of more than one of the plurality of vibrations.

Some examples of the disclosure are directed to a method of detecting one or more touch events on a rotational input element comprising: vibrating the rotational input element at a vibration; measuring one or more parameters of the vibration of the rotational input element; determining whether a touch event has occurred based on the one or more parameters of the vibration. Additionally or alternatively to one or more of the examples disclosed above, in some examples, the rotational input element is a crown. Additionally or alternatively to one or more of the examples disclosed above, in some examples, vibrating the rotational input element includes rotating a mass. Additionally or alternatively to one or more of the examples disclosed above, in some examples, the one or more parameters of the vibration are measured using an acoustic transducer. Additionally or alternatively to one or more of the examples disclosed above, in some examples, the one or more parameters of the vibration are measured using an accelerometer Additionally or alternatively to one or more of the examples disclosed above, in some examples, vibrating the rotational input element includes emitting electromagnetic waves from an electromagnet. Additionally or alternatively to one or more of the examples disclosed above, in some examples, measuring the one or more parameters of the vibration includes using a receiver circuit including an optical sensor. Additionally or alternatively to one or more of the examples disclosed above, in some examples, measuring the one or more parameters of the vibration includes measuring an amplitude of the vibration. Additionally or alternatively to one or more of the examples disclosed above, in some examples, measuring the one or more parameters of the vibration includes measuring a frequency of the vibration. Additionally or alternatively to one or more of the examples disclosed above, in some examples, the method comprises: successively vibrating the rotational input element with a plurality of vibrations, each having a different frequency; measuring one or more parameters of the plurality of vibrations; and detecting one of the one or more touch events based on the one or more parameters of more than one of the plurality of vibrations.

Some examples of the disclosure are directed to an apparatus comprising: a housing having a lower surface and a side surface; a cover material coupled to the housing and including an outer surface and an inner surface; and a proximity sensor formed within the housing and the cover material, the proximity sensor and cover material configured for generating a field of view encompassing a first area adjacent to the outer surface of the cover material. Additionally or alternatively to one or more of the examples disclosed above, in some examples, at least a portion of the first area encompassed by the field of view is not directly above the cover material. Additionally or alternatively to one or more of the examples disclosed above, in some examples, the inner surface of the cover material has a flat portion having a plane extending in a first direction. Additionally or alternatively to one or more of the examples disclosed above, in some examples, the first area encompassed by the field of view includes an area adjacent to the side surface in the first direction. Additionally or alternatively to one or more of the examples disclosed above, in some examples, the device further comprises: a crown; wherein the field of view includes an area above the crown in a direction orthogonal to the plane of the flat portion. Additionally or alternatively to one or more of the examples disclosed above, in some examples, the inner surface of the cover material has a curved portion, and wherein the field of view passes through the curved portion. Additionally or alternatively to one or more of the examples disclosed above, in some examples, the proximity sensor is mounted normal to a first angle with respect to the plane of the flat portion, and the field of view of the proximity sensor beyond the outer surface of the cover material is centered about a second angle with respect to the plane of the flat portion, different from the first angle. Additionally or alternatively to one or more of the examples disclosed above, in some examples, the difference between the first angle and the second angle is in a range of 10 degrees and 60 degrees. Additionally or alternatively to one or more of the examples disclosed above, in some examples, the device further comprises: on the inner surface of the cover material, an opaque mask having one or more apertures, wherein the field of view of the proximity sensor passes through the one or more apertures. Additionally or alternatively to one or more of the examples disclosed above, in some examples, the device further comprises: an optical filter configured to pass a first wavelength range of light and block a second wavelength range of light, different from the first wavelength range; wherein the optical filter is positioned, at least in part, in the apertures of the opaque mask and the field of view of the proximity sensor passes through the optical filter. Additionally or alternatively to one or more of the examples disclosed above, in some examples, the device further comprises: a processor capable of receiving data from the proximity sensor; determining whether an object is present in the field of view of the proximity sensor; performing a first operation if the object is not touching the crown; and performing a second operation, different from the first, if the object is touching the crown. Additionally or alternatively to one or more of the examples disclosed above, in some examples, performing the first operation wakes the device from a sleep mode. Additionally or alternatively to one or more of the examples disclosed above, in some examples, the device is a wearable device.

Some examples of the disclosure are directed to a device comprising: a cover material; and a proximity sensor including a light emitter, wherein: the proximity sensor is mounted normal to a first angle with respect to a plane, a light path of the light emitter is initially about the first angle and is refracted through the cover material at a second angle, different from the first angle. Additionally or alternatively to one or more of the examples disclosed above, in some examples, the difference between the first angle and the second angle is in a range of 10 degrees and 60 degrees. Additionally or alternatively to one or more of the examples disclosed above, in some examples, the light path passes through an optical filter configured to pass light of a same wavelength as the light path and block light of a different wavelength as the light path.

Some examples of the disclosure are directed to a method comprising: emitting a light from a light emitter; refracting the emitted light through a cover material of a device; determining an amount of the emitted light reflected to a photodetector; performing a first operation if the amount of reflected emitted light is a first value; and performing a second operation if the amount of reflected emitted light is a second value different from the first value. Additionally or alternatively to one or more of the examples disclosed above, in some examples, the first value is determined when an object is within a distance of the device, but is not touching the device. Additionally or alternatively to one or more of the examples disclosed above, in some examples, the distance is in a range between 1 mm and 100 mm. Additionally or alternatively to one or more of the examples disclosed above, in some examples, performing the first operation wakes the device from a sleep mode. Additionally or alternatively to one or more of the examples disclosed above, in some examples, the second value is determined when an object is touching the device. Additionally or alternatively to one or more of the examples disclosed above, in some examples, performing the second operation displays a contextual message on a display. Additionally or alternatively to one or more of the examples disclosed above, in some examples, performing the second operation selects an item on a display. Additionally or alternatively to one or more of the examples disclosed above, in some examples, the method further comprises: after performing the first operation, determining an amount of the emitted light reflected to the photodetector; and performing a third operation if the amount of reflected emitted light is a third value. Additionally or alternatively to one or more of the examples disclosed above, in some examples, the method further comprises: if the third value is greater than or equal to the second value, performing the third operation performs the second operation. Additionally or alternatively to one or more of the examples disclosed above, in some examples, the method further comprises: if the third value is less than the second value and greater than or equal to the first value, performing the third operation maintains the device in a ready mode. Additionally or alternatively to one or more of the examples disclosed above, in some examples, the method further comprises: If the third value is less than the first value, the third operation comprises putting the device into a sleep mode. Additionally or alternatively to one or more of the examples disclosed above, in some examples: emitting the light comprises emitted the light at different predetermined pulse frequencies over time; and determining the amount of the emitted light reflected to the photodetector comprises only considering light received at one or more of the predetermined pulse frequencies.

Some examples of the disclosure are directed to a non-transitory computer-readable storage medium having computer-executable instructions which, when executed by one or more computer processors, cause the one or more computer processors to: emit a light from a light emitter; determine an amount of the emitted light reflected to a photodetector; perform a first operation if the amount of reflected emitted light is a first value; and perform a second operation if the amount of reflected emitted light is a second value different from the first value; wherein the emitted light is refracted through a cover material of a device.

Some examples of the disclosure are directed to a proximity sensor comprising: a light emitter, an emitter lens, a plurality of light detectors each aligned with the light emitter in a first direction, a detector lens, and a processor capable of: determining a centroid location using respective amplitudes detected by one or more of the plurality of light detectors, determining a distance of an object to the proximity sensor in a second direction based on the centroid location, the second direction being orthogonal to the first direction. Additionally or alternatively to one or more of the examples disclosed above, in some examples, two or more light detectors of the plurality of light detectors each have respective fields of view which overlap with one another. Additionally or alternatively to one or more of the examples disclosed above, in some examples, the centroid location is determined based on a particular light detector of the plurality of light detectors which has an amplitude larger than that of any other of the plurality of light detectors. Additionally or alternatively to one or more of the examples disclosed above, in some examples, the centroid location is determined by interpolating the respective amplitudes detected by the one or more of the plurality of light detectors. Additionally or alternatively to one or more of the examples disclosed above, in some examples, the proximity sensor further comprises: a second plurality of light detectors, each of the second plurality of light detectors aligned with one another in the first direction, and the first and second plurality of light detectors collectively forming a two-dimensional array of light detectors. Additionally or alternatively to one or more of the examples disclosed above, in some examples, the centroid location is determined in the first direction and a third direction orthogonal to both the first direction and the second direction. Additionally or alternatively to one or more of the examples disclosed above, in some examples, the processor is further capable of determining a shape of the light detected by the plurality of light detectors. Additionally or alternatively to one or more of the examples disclosed above, in some examples, the distance of the object determined by the processor can be in a range of 0 millimeters to 100 millimeters. Additionally or alternatively to one or more of the examples disclosed above, in some examples, the proximity sensor is in a wearable device including a crown, and the determined distance is from the crown to the object. Additionally or alternatively to one or more of the examples disclosed above, in some examples, the proximity sensor is under a cover of the wearable device. Additionally or alternatively to one or more of the examples disclosed above, in some examples, the proximity sensor further comprises an optical filter configured to pass light of a same wavelength as light emitted by the light emitter and block light of a different wavelength as the light emitted by the light emitter. Additionally or alternatively to one or more of the examples disclosed above, in some examples, the emitter lens is a collimating lens and the detector lens is a converging lens. Additionally or alternatively to one or more of the examples disclosed above, in some examples, the proximity sensor is incorporated into an electronic device. Additionally or alternatively to one or more of the examples disclosed above, in some examples, the processor is further capable of performing an operation based on whether the distance of the object meets a threshold. Additionally or alternatively to one or more of the examples disclosed above, in some examples, the electronic device is a wearable device.

Some examples of the disclosure are directed to a method comprising: emitting light from a light emitter through an emitter lens, receiving reflected light originating from the light emitter through a detector lens, detecting respective amplitudes of the received reflected light at each of a plurality of light detectors, determining a centroid location of the received reflected light based on the respective amplitudes of each of the plurality of light detectors, and determining a presence of an object based on the centroid location. Additionally or alternatively to one or more of the examples disclosed above, in some examples, the reflected light is reflected off of the object. Additionally or alternatively to one or more of the examples disclosed above, in some examples, determining the presence of the object based on the centroid location comprises determining a distance of the object from a device. Additionally or alternatively to one or more of the examples disclosed above, in some examples, the presence of the object based on the centroid location further comprises determining that the object is present if the distance meets a first threshold. Additionally or alternatively to one or more of the examples disclosed above, in some examples, determining the presence of the object based on the centroid location further comprises determining that the object is not present if the distance meets a second threshold. Additionally or alternatively to one or more of the examples disclosed above, in some examples, the centroid location is determined based on a light detector of the plurality of light detectors which has an amplitude larger than that of any of the remaining plurality of light detectors. Additionally or alternatively to one or more of the examples disclosed above, in some examples, determining the centroid location comprises interpolating the respective amplitudes detected by the plurality of light detectors. Additionally or alternatively to one or more of the examples disclosed above, in some examples, the centroid location is determined in a first and second direction, where the second direction is orthogonal to the first direction. Additionally or alternatively to one or more of the examples disclosed above, in some examples, the method further comprises: determining a shape based on the respective amplitudes detected by the plurality of light detectors, and determining characteristics of the object based on the determined shape. Additionally or alternatively to one or more of the examples disclosed above, in some examples, emitting light from the light emitter through the emitter lens comprises collimating the light from the light emitter; and detecting light through the detector lens further comprises converging light from the reflected light originating from the light emitter.

Some examples of the disclosure are directed to a proximity sensor comprising: a light emitter, a first light detector aligned with the light emitter in a first direction and configured to receive a first amount of light from the light emitter, a second light detector aligned with the light emitter in the first direction and configured to receive a second amount of light from the light emitter, wherein a distance of an object in a second direction is determined using a ratio of the first amount of light and the second amount of light, the second direction being orthogonal to the first direction. Additionally or alternatively to one or more of the examples disclosed above, in some examples, the first light detector is nearer to the light emitter than the second light detector is to the light emitter in the first direction. Additionally or alternatively to one or more of the examples disclosed above, in some examples, the first light detector is nearer to the light emitter than the first light detector is to the second light detector. Additionally or alternatively to one or more of the examples disclosed above, in some examples, the proximity sensor is in a wearable device including a crown, and the determined distance is from the crown to the object. Additionally or alternatively to one or more of the examples disclosed above, in some examples, the proximity sensor is under a cover substrate of the wearable device. Additionally or alternatively to one or more of the examples disclosed above, in some examples, the first amount of light and the second amount of light are received simultaneously. Additionally or alternatively to one or more of the examples disclosed above, in some examples, the first amount of light has a first light path and the second amount of light has a second light path and the first and second light paths pass through an optical filter configured to pass light of a same wavelength as the light paths and block light of a different wavelength as the light paths.

Some examples of the disclosure are directed to a proximity sensor comprising: a first light emitter, a second light emitter aligned with the first light emitter in a first direction, and a light detector aligned with the first light emitter and second light emitter in the first direction, the light detector configured to receive a first amount of light originating from the first light emitter and a second amount of light originating from the second light emitter, wherein a distance of an object in a second direction is determined using a ratio of the first amount of light and the second amount of light, the second direction being orthogonal to the first direction. Additionally or alternatively to one or more of the examples disclosed above, in some examples, the first light emitter is nearer to the light detector than the second light emitter is to the light detector in the first direction. Additionally or alternatively to one or more of the examples disclosed above, in some examples, the first light emitter is nearer to the light detector than the first light emitter is to the second light emitter. Additionally or alternatively to one or more of the examples disclosed above, in some examples, the proximity sensor is in a wearable device including a crown, and the determined distance is from the crown to the object. Additionally or alternatively to one or more of the examples disclosed above, in some examples, the proximity sensor is under a cover substrate of the wearable device. Additionally or alternatively to one or more of the examples disclosed above, in some examples, the first amount of light and the second amount of light are received sequentially. Additionally or alternatively to one or more of the examples disclosed above, in some examples, the first amount of light from the first light emitter has a first wavelength, the second amount of light from the second light emitter has a second wavelength, different from the first wavelength, and the first amount of light and the second amount of light are detected by the light detector simultaneously. Additionally or alternatively to one or more of the examples disclosed above, in some examples, the first amount of light from the first emitter is emitted according to a first light pulsing scheme, the second amount of light from the second emitter is emitted according to a second light pulsing scheme, different from the first light pulsing scheme, and the first amount of light and the second amount of light are detected by the light detector at the same time. Additionally or alternatively to one or more of the examples disclosed above, in some examples, the first amount of light has a first light path, the second amount of light has a second light path, and the first and second light paths pass through an optical filter configured to pass light of a same wavelength as the light paths and block light of a different wavelength as the light paths.

Some examples of the disclosure are directed to a method comprising: detecting a first amplitude of a first light having a first light path, detecting a second amplitude of a second light having a second light path, determining a ratio of the first amplitude and second amplitude, determining a presence of an object based on the ratio. Additionally or alternatively to one or more of the examples disclosed above, in some examples, the first light path includes a first reflection off of the object and the second light path includes a second reflection off of the object. Additionally or alternatively to one or more of the examples disclosed above, in some examples, determining the presence of the object based on the ratio comprises determining a distance of the object from a device. Additionally or alternatively to one or more of the examples disclosed above, in some examples, determining the presence of the object based on the ratio further comprises determining that the object is present if the distance meets a first threshold. Additionally or alternatively to one or more of the examples disclosed above, in some examples, determining the presence of the object based on the ratio further comprises determining that the object is not present if the distance meets a second threshold. Additionally or alternatively to one or more of the examples disclosed above, in some examples, the first light path is configured to travel a first light path distance and the second light path is configured to travel a second light path distance, and the distance of the object from the device is a function of a difference between the first and second light path distances. Additionally or alternatively to one or more of the examples disclosed above, in some examples, detecting the first amplitude of the first light having the first light path comprises: emitting light from a first light emitter, and detecting, at a light detector, the light from the first light emitter; and detecting the second amplitude of the second light having the second light path comprises: emitting light from a second light emitter, and detecting, at the light detector, the light from the second light emitter. Additionally or alternatively to one or more of the examples disclosed above, in some examples, the first light emitter is aligned with the light detector in a first direction, the second light emitter is aligned with the light detector in the first direction, and the first light emitter is nearer to the light detector than the second light emitter is to the light detector in the first direction. Additionally or alternatively to one or more of the examples disclosed above, in some examples, the first light emitter is nearer to the light detector than to the second light emitter. Additionally or alternatively to one or more of the examples disclosed above, in some examples, the light from the first light emitter and the light from the second emitter are emitted sequentially. Additionally or alternatively to one or more of the examples disclosed above, in some examples, the light from the first light emitter has a first wavelength, the light from the second light emitter has a second wavelength, different from the first wavelength, and the light from the first emitter and the light from the second emitter are detected by the light detector simultaneously. Additionally or alternatively to one or more of the examples disclosed above, in some examples, the light from the first emitter is emitted according to a first light pulsing scheme, the light from the second emitter is emitted according to a second light pulsing scheme, different from the first light pulsing scheme, and the light from the first emitter and the light from the second emitter are detected by the light detector at the same time. Additionally or alternatively to one or more of the examples disclosed above, in some examples, detecting the first amplitude of the first light having the first light path comprises: emitting light from a light emitter, and detecting, at a first light detector, the light from the light emitter, and detecting the second amplitude of the second light having the second light path comprises: emitting light from the light emitter, and detecting, at a second light detector, the light from the light emitter. Additionally or alternatively to one or more of the examples disclosed above, in some examples, detecting at the first light detector the light from the light emitter and detecting at the second light detector the light from the emitter occurs simultaneously. Additionally or alternatively to one or more of the examples disclosed above, in some examples, the first light detector is aligned with the light emitter in a first direction, the second light detector is aligned with the light emitter in the first direction, and the first light detector is nearer to the light emitter than the second light detector is to the light emitter in the first direction. Additionally or alternatively to one or more of the examples disclosed above, in some examples, the first light detector is nearer to the light emitter than to the second light detector. Additionally or alternatively to one or more of the examples disclosed above, in some examples, performing an operation based on whether the presence of the object is detected.

Some examples of the disclosure are directed to a device comprising a proximity sensor including: a first light emitter, a second light emitter aligned with the first light emitter in a first direction, and a light detector aligned with the first light emitter and second light emitter in the first direction, the light detector configured to receive a first amount of light originating from the first light emitter and a second amount of light originating from the second light emitter, and a processor capable of determining a distance of an object in a second direction using a ratio of the first amount of light and the second amount of light, the second direction being orthogonal to the first direction. Additionally or alternatively to one or more of the examples disclosed above, in some examples, the determined distance is from the crown to the object. Additionally or alternatively to one or more of the examples disclosed above, in some examples, the processor is configured to perform an operation based on whether the distance of the object meets a threshold. Additionally or alternatively to one or more of the examples disclosed above, in some examples, the device is a wearable device.

Some examples of the disclosure are directed to a device comprising a proximity sensor including: a light emitter, a first light detector aligned with the light emitter in a first direction and configured to receive a first amount of light from the light emitter, a second light detector aligned with the light emitter in the first direction and configured to receive a second amount of light from the light emitter, and a processor capable of determining a distance of an object in a second direction using a ratio of the first amount of light to the second amount of light, the second direction being orthogonal to the first direction. Additionally or alternatively to one or more of the examples disclosed above, in some examples, the determined distance is from the crown to the object. Additionally or alternatively to one or more of the examples disclosed above, in some examples, the processor is configured to perform an operation based on whether the distance of the object meets a threshold. Additionally or alternatively to one or more of the examples disclosed above, in some examples, the device is a wearable device.

Therefore, according to the above, some examples of the disclosure are directed to an electronic device. The electronic device can comprise a rotational input element, a proximity sensor, and a processor. The proximity sensor can comprise a transmit circuit that can be operatively coupled to the rotational input element and can be configured to inject electromagnetic energy via inductive coupling into the rotational input element, and a monitoring circuit that can be operatively coupled to the rotational input element and can be configured to measure one or more parameters. The one or more parameters can be indicative of an object touching or in proximity to the rotational input element. The processor can be operatively coupled to the proximity sensor and can be capable detecting one or more touch or hover events based on the one or more parameters measured by the monitoring circuit. Additionally or alternatively to one or more of the examples disclosed above, the processor can be further capable of performing an action based on the one or more touch or hover events detected. Additionally or alternatively to one or more of the examples disclosed above, the electronic device can be a wearable device. Additionally or alternatively to one or more of the examples disclosed above, the rotational input element can be a crown. Additionally or alternatively to one or more of the examples disclosed above, the monitoring circuit can detect a shift in a resonant frequency of the transmit circuit. Additionally or alternatively to one or more of the examples disclosed above, the transmit circuit can comprise a first inductive element and one or more first capacitive elements. The transmit circuit can oscillate at a first resonant frequency. The first resonant frequency can be a function of the first inductive element and the one or more first capacitive elements. Additionally or alternatively to one or more of the examples disclosed above, the transmit circuit can comprise at least one adjustable capacitor such that the first resonant frequency can be tunable. Additionally or alternatively to one or more of the examples disclosed above, the proximity sensor can further comprise a receive circuit operatively coupled to or formed as part of the rotational input element, the receive circuit including a second inductive element and one or more second capacitive elements. The receive circuit can oscillate at a second resonant frequency. The second resonant frequency can be a function of the second inductive element and the one or more second capacitive elements. Additionally or alternatively to one or more of the examples disclosed above, the first resonant frequency and the second resonant frequency can be the same. Additionally or alternatively to one or more of the examples disclosed above, the second inductive element can comprise a coil wrapped around at least a portion of rotational input element. Additionally or alternatively to one or more of the examples disclosed above, the second inductive element can be formed, at least in part, within the rotational input element. Additionally or alternatively to one or more of the examples disclosed above, the rotational input element can comprise one or more electrodes formed from a conducting material and coupled to the second inductive element. Additionally or alternatively to one or more of the examples disclosed above, the proximity sensor can further comprise a second receive circuit that can be operatively coupled to or formed as part of the rotational input element. The second receive circuit can include a third inductive element and one or more third capacitive elements. The second receive circuit can oscillate at a third resonant frequency. The third resonant frequency can be a function of the third inductive element and the one or more third capacitive elements. Additionally or alternatively to one or more of the examples disclosed above, the transmit circuit can be configured to tune, during a first time period, the first resonant frequency to match the second resonant frequency of the first receive circuit and to tune, during a second time period, the first resonant frequency to match the third resonant frequency of the second receive circuit. Additionally or alternatively to one or more of the examples disclosed above, detecting the one or more touch or hover events can comprise comparing the one or more parameters measured by the monitoring circuit to one or more thresholds. Additionally or alternatively to one or more of the examples disclosed above, the action can be transitioning one or more components of the device out of a rest state. Additionally or alternatively to one or more of the examples disclosed above, the processor can be further capable of estimating a distance between the rotational input element and the object touching or in proximity to the rotational input element. Additionally or alternatively to one or more of the examples disclosed above, detecting the one or more touch or hover events can comprise identifying a signature from the one or more parameters measured by the monitoring circuit.

Some examples of the disclosure are directed to a method of detecting one or more touch or proximity events on a rotational input element. The method can comprise applying electromagnetic energy to a first circuit, coupling the electromagnetic energy to one or more second circuits including the rotational input element, measuring one or more parameters, the one or more parameters indicative of an object touching or in proximity to the rotational input element, and detecting the one or more touch or proximity events based on the one or more parameters. Additionally or alternatively to one or more of the examples disclosed above, the method can further comprise performing an action based on the one or more touch or proximity events detected. Additionally or alternatively to one or more of the examples disclosed above, the action can be transitioning one or more components out of a rest state. Additionally or alternatively to one or more of the examples disclosed above, detecting the one or more touch or proximity events can comprise comparing the one or more parameters to one or more thresholds. Additionally or alternatively to one or more of the examples disclosed above, the method can further comprise estimating a distance between the rotational input element and an object touching or in proximity to the rotational input element. Additionally or alternatively to one or more of the examples disclosed above, detecting the one or more touch or proximity events can comprise identifying a signature from the one or more parameters. Additionally or alternatively to one or more of the examples disclosed above, the rotational input element can be a crown. Additionally or alternatively to one or more of the examples disclosed above, the one or more parameters can include a shift in a resonant frequency of the first circuit. Additionally or alternatively to one or more of the examples disclosed above, the first circuit can comprise a first inductive element and one or more first capacitive elements. The first circuit can oscillate at a first resonant frequency. The first resonant frequency can be a function of the first inductive element and the one or more first capacitive elements. Additionally or alternatively to one or more of the examples disclosed above, the first circuit can comprise at least one adjustable capacitor such that the first resonant frequency can be tunable. Additionally or alternatively to one or more of the examples disclosed above, the one or more second circuits can comprise a first receive circuit including a second inductive element and one or more second capacitive elements. The first receive circuit can oscillate at a second resonant frequency. The second resonant frequency can be a function of the second inductive element and the one or more second capacitive elements. Additionally or alternatively to one or more of the examples disclosed above, the method can further comprise tuning the first resonant frequency to match the second resonant frequency. Additionally or alternatively to one or more of the examples disclosed above, the one or more second circuits can comprise a second receive circuit including a third inductive element and one or more third capacitive elements. The second receive circuit can oscillate at a third resonant frequency. The third resonant frequency can be a function of the third inductive element and the one or more third capacitive elements. Additionally or alternatively to one or more of the examples disclosed above, the method can further comprise tuning, during a first time period, the first resonant frequency of the first circuit to match the second resonant frequency of the first receive circuit, and tuning, during a second time period, the first resonant frequency to match the third resonant frequency of the second receive circuit. Some examples of the disclosure are directed to a non-transitory computer readable storage medium, the computer readable medium containing instructions that, when executed by a processor, can perform any of the above methods.

Some examples of the disclosure are directed to a touch and/or proximity sensor. The proximity sensor can comprise a transmit circuit that can be operatively coupled to a rotational input element and can be configured to inject electromagnetic energy via inductive coupling into the rotational input element, and a monitoring circuit that can be operatively coupled to the rotational input element and can be configured to measure one or more parameters. The one or more parameters can be indicative of an object touching or in proximity to the rotational input element. Additionally or alternatively to one or more of the examples disclosed above, the proximity sensor can further comprise one or more receive circuits that can be operatively coupled to or formed, at least in part, as part of the rotational input element. Each of the one or more receive circuits can include a second inductive element and one or more second capacitive elements. Additionally or alternatively to one or more of the examples disclosed above, the one or more receive circuits can oscillate at different resonant frequencies.

Therefore, according to the above, some examples of the disclosure are directed to an electronic device. The electronic device can comprise a rotational input element, a proximity sensor, and a processor. The proximity sensor can comprise a transmit circuit operatively coupled to the rotational input element and a monitoring circuit operatively coupled to the rotational input element. The transmit circuit can be configured to inject electromagnetic energy into the rotational input element. The monitoring circuit can be configured to measure one or more parameters. The one or more parameters can be indicative of an object touching or in proximity to the rotational input element. The processor can be operatively coupled to the proximity sensor and can be capable detecting one or more touch or hover events based on the one or more parameters measured by the monitoring circuit. Additionally or alternatively to one or more of the examples disclosed above, the processor can be further capable of performing an action based on the one or more touch or hover events detected. Additionally or alternatively to one or more of the examples disclosed above, the electronic device can be a wearable device. Additionally or alternatively to one or more of the examples disclosed above, the rotational input element can be a crown. Additionally or alternatively to one or more of the examples disclosed above, the transmit circuit can comprise an inductive element and one or more capacitive elements oscillating at a resonant frequency. The resonant frequency can be a function of the inductive element and the one or more capacitive elements. Additionally or alternatively to one or more of the examples disclosed above, the transmit circuit can comprise a radio frequency transmitter. Additionally or alternatively to one or more of the examples disclosed above, the transmit circuit can be coupled to the rotational input element via a duplexer circuit and the monitoring circuit can be coupled to the rotational input element via the duplexer circuit. Additionally or alternatively to one or more of the examples disclosed above, the monitoring circuit can comprise a power meter. Additionally or alternatively to one or more of the examples disclosed above, the monitoring circuit can comprises a frequency counter. Additionally or alternatively to one or more of the examples disclosed above, the monitoring circuit can detect a shift in a resonant frequency of the transmit circuit. Additionally or alternatively to one or more of the examples disclosed above, the monitoring circuit can detect detuning of the rotational input device acting as an antenna. Additionally or alternatively to one or more of the examples disclosed above, the rotational input device can be formed from a conductive material.

Additionally or alternatively to one or more of the examples disclosed above, the rotational input element can comprise a non-conducting outer surface and a conducting material within the rotational input element. Additionally or alternatively to one or more of the examples disclosed above, the rotational input element can comprise a first electrode and a second electrode. Additionally or alternatively to one or more of the examples disclosed above, the first electrode can be coupled to a first transmit circuit to measure one or more first parameters indicative of the object touching or in proximity to the first electrode and the second electrode can be coupled to a second transmit circuit to measure one or more second parameters indicative of the object touching or in proximity to the second electrode. Additionally or alternatively to one or more of the examples disclosed above, the one or more parameters can include a capacitance coupling between the first electrode and the second electrode. Additionally or alternatively to one or more of the examples disclosed above, the device can further comprise a switch including a conductive surface. The conductive surface can coupled to the transmit circuit and the conductive surface can contact the rotational input element so as to form a conductive pathway to inject electromagnetic energy into the rotational input element. Additionally or alternatively to one or more of the examples disclosed above, the transmit circuit can be operatively coupled to the rotational input element via a capacitive coupling. Additionally or alternatively to one or more of the examples disclosed above, the transmit circuit can be a wireless communication device. Additionally or alternatively to one or more of the examples disclosed above, detecting the one or more touch or hover events can comprise comparing the one or more parameters measured by the monitoring circuit to one or more thresholds. Additionally or alternatively to one or more of the examples disclosed above, the action can be transitioning one or more components of the device out of a rest state. Additionally or alternatively to one or more of the examples disclosed above, the processor can be further capable of estimating a distance between the rotational input element and the object touching or in proximity to the rotational input element. Additionally or alternatively to one or more of the examples disclosed above, detecting the one or more touch or hover events can comprise identifying a signature from the one or more parameters measured by the monitoring circuit.

Some examples of the disclosure are directed to a method of detecting one or more touch or proximity events on a rotational input element. The method can comprise applying electromagnetic energy to a circuit including the rotational input element, measuring one or more parameters, the one or more parameters indicative of an object touching or in proximity to the rotational input element, and detecting the one or more touch or proximity events based on the one or more parameters. Additionally or alternatively to one or more of the examples disclosed above, the method can further comprise performing an action based on the one or more touch or proximity events detected. Additionally or alternatively to one or more of the examples disclosed above, the action can be transitioning one or more components of the device out of a rest state. Additionally or alternatively to one or more of the examples disclosed above, detecting the one or more touch or proximity events can comprise comparing the one or more parameters to one or more thresholds. Additionally or alternatively to one or more of the examples disclosed above, the method can further comprise estimating a distance between the rotational input element and an object touching or in proximity to the rotational input element. Additionally or alternatively to one or more of the examples disclosed above, detecting the one or more touch or proximity events can comprise identifying a signature from the one or more parameters. Additionally or alternatively to one or more of the examples disclosed above, the rotational input element can be a crown. Additionally or alternatively to one or more of the examples disclosed above, the circuit can comprise an inductive element and one or more capacitive elements oscillating at a resonant frequency. The resonant frequency can be a function of the inductive element and the one or more capacitive elements. Additionally or alternatively to one or more of the examples disclosed above, the circuit can comprise a radio frequency transmitter. Additionally or alternatively to one or more of the examples disclosed above, the circuit can be coupled to the rotational input element via a duplexer circuit and the one or more parameters are measured by a monitoring circuit that can be coupled to the rotational input element via the duplexer circuit. Additionally or alternatively to one or more of the examples disclosed above, the one or more parameters can be measured by a power meter. Additionally or alternatively to one or more of the examples disclosed above, the one or more parameters can be measured by a frequency counter. Additionally or alternatively to one or more of the examples disclosed above, the one or more parameters can include a shift in a resonant frequency of the circuit. Additionally or alternatively to one or more of the examples disclosed above, measuring the one or more parameters can comprise detecting detuning of the rotational input device acting as an antenna. Additionally or alternatively to one or more of the examples disclosed above, the rotational input element can comprise a first electrode and a second electrode. Additionally or alternatively to one or more of the examples disclosed above, the method can further comprise applying electromagnetic energy to a first circuit to measure one or more first parameters indicative of the object touching or in proximity to the first electrode and applying electromagnetic energy to a second circuit to measure one or more second parameters indicative of the object touching or in proximity to the second electrode. Additionally or alternatively to one or more of the examples disclosed above, the one or more parameters can include a capacitance coupling between the first electrode and the second electrode. Additionally or alternatively to one or more of the examples disclosed above, the circuit can comprises a wireless communication device. Some examples of the disclosure are directed to a non-transitory computer readable storage medium, the computer readable medium containing instructions that, when executed by a processor, can perform any of the above methods.

Therefore, according to the above, some examples of the disclosure are directed to an electronic device comprising: a rotatable mechanical input mechanism; a sense electrode positioned proximate to the mechanical input mechanism; and a capacitive sense circuit comprising: drive circuitry operatively coupled to the mechanical input mechanism and configured for driving a drive signal onto the mechanical input mechanism; and sense circuitry operatively coupled to the sense electrode and configured to measure an amount of coupling between the rotatable mechanical input mechanism and the sense electrode. Additionally or alternatively to one or more of the examples disclosed above, in some examples, the sense circuitry is operatively coupled to the mechanical input mechanism, the sense circuitry configured to measure an amount of self-capacitance coupling between the mechanical input mechanism and an object proximate to the mechanical input mechanism. Additionally or alternatively to one or more of the examples disclosed above, in some examples, the mechanical input circuitry comprises a plurality of conductive segments; and in a first rotational orientation of the mechanical input mechanism, the drive circuitry is coupled to a first conductive segment of the plurality of conductive segments; and in a second rotational orientation of the mechanical input mechanism, different from the first rotational orientation, the drive circuitry is coupled to a second conductive segment of the plurality of conductive segments, different from the first conductive segment. Additionally or alternatively to one or more of the examples disclosed above, in some examples, the drive circuitry is operatively coupled to drive the sense electrode, and the sense circuitry is configured to measure an amount of self-capacitance coupling between the sense electrode and an object proximate to the mechanical input mechanism. Additionally or alternatively to one or more of the examples disclosed above, in some examples, a change in the amount of coupling between the rotatable mechanical input mechanism and the sense electrode is indicative of an object contacting or in proximity with the mechanical input mechanism. Additionally or alternatively to one or more of the examples disclosed above, in some examples, the electronic device further comprises: a display; and a housing, wherein the sense electrode is included in a gasket for connecting the display to the housing. Additionally or alternatively to one or more of the examples disclosed above, in some examples, the electronic device further comprises a force sensor included in the gasket, the force sensor configured for detecting an intensity of contact between an object and the display. Additionally or alternatively to one or more of the examples disclosed above, in some examples, the force sensor and the sense electrode are included on different layers of the gasket. Additionally or alternatively to one or more of the examples disclosed above, in some examples, the electronic device further comprises a touch sensitive display, wherein the sense electrode is an electrode included in the touch sensitive display. Additionally or alternatively to one or more of the examples disclosed above, in some examples, the electronic device is a wearable device and the mechanical input mechanism is a crown.

Some examples of the disclosure are directed to a method comprising: driving a drive signal onto a rotatable mechanical input mechanism of a device; performing a mutual capacitance measurement for detecting a proximity or contact of an object with the mechanical input mechanism; determining whether the object was detected by the mutual capacitance measurement; in accordance with a determination that the object was detected by the mutual capacitance measurement, reporting a touch or proximity event; and in accordance with a determination that the object was not detected by the mutual capacitance measurement, performing a self-capacitance measurement for detecting the proximity or contact of the object with the mechanical input mechanism. Additionally or alternatively to one or more of the examples disclosed above, in some examples, determining whether the object was detected by the mutual capacitance measurement comprises comparing the measurement with a first threshold value. Additionally or alternatively to one or more of the examples disclosed above, in some examples, the first threshold value is a threshold signal-to-noise ratio (SNR). Additionally or alternatively to one or more of the examples disclosed above, in some examples, the method further comprises: determining whether the object was detected by the self-capacitance measurement, wherein the determination comprises comparing the self-capacitance measurement with a second threshold value, wherein the second threshold value is a threshold SNR. Additionally or alternatively to one or more of the examples disclosed above, in some examples, the first threshold value and the second threshold value are a same value.

Some examples of the disclosure are directed to a non-transitory computer readable storage medium having stored thereon a set of instructions, that when executed by a processor causes the processor to: transmit a drive signal onto a rotatable mechanical input mechanism of a device; perform a mutual capacitance measurement for detecting a proximity or contact of an object with the mechanical input mechanism; in accordance with a determination that the object was detected by the mutual capacitance measurement, report a touch or proximity event; and in accordance with a determination that the object was not detected by the mutual capacitance measurement, perform a self-capacitance measurement for detecting the proximity or contact of the object with the mechanical input mechanism. Additionally or alternatively to one or more of the examples disclosed above, in some examples, determining whether the object was detected by the mutual capacitance measurement comprises comparing the measurement with a first threshold value. Additionally or alternatively to one or more of the examples disclosed above, in some examples, the first threshold value is a threshold signal-to-noise ratio (SNR). Additionally or alternatively to one or more of the examples disclosed above, in some examples, the instructions further cause the processor to: determine whether the object was detected by the self-capacitance measurement, wherein the determination comprises comparing the self-capacitance measurement with a second threshold value, wherein the second threshold value is a threshold SNR. Additionally or alternatively to one or more of the examples disclosed above, in some examples, the first threshold value and the second threshold value are a same value.

Some examples of the disclosure are directed to an electronic device comprising: a touch sensor panel disposed on a cover substrate; a housing; a rotatable mechanical input mechanism configured for rotating with respect to the housing; a gasket configured to couple the cover substrate to the housing at a first edge of the cover substrate proximate to the mechanical input mechanism; a force sensor for detecting intensity of contact by an object contacting the cover substrate; a capacitive sense electrode for detecting a proximity or contact by the object with the mechanical input mechanism; and a control circuit for controlling operation of the force sensor and the capacitive sense electrode; wherein the force sensor and the capacitive sense electrode are included in the gasket. Additionally or alternatively to one or more of the examples disclosed above, in some examples, the control circuit is configured to selectively drive one of the force sensor and the capacitive sense electrode with a drive signal. Additionally or alternatively to one or more of the examples disclosed above, in some examples, the electronic device further comprises a demultiplexer, wherein the demultiplexer is selectively configurable for driving one of the force sensor and the capacitive sensed electrode comprises comparing the self-capacitance measurement with a second threshold value, wherein the second threshold value is a threshold SNR. Additionally or alternatively to one or more of the examples disclosed above, in some examples, the control circuit is selectively configurable for driving the force sensor with a ground signal while the capacitive sense electrode is driven with a drive signal.

Although some examples described herein involve proximity sensors used to detect objects near the crown of a watch, it should be understood that the proximity sensors described herein can be used in other electronic devices which utilize proximity sensing including, but not limited to, cellular phones, laptops, or tablet devices.

Although this disclosure and examples have been fully described with reference to the accompanying figures, it is to be noted that various changes and modifications will become apparent to those skilled in the art. Such changes and modifications are to be understood as being included within the scope of the disclosure and examples as defined by the appended claims.

What is claimed is:

1. A wearable electronic device comprising:
a cover substrate forming an outer surface of the wearable electronic device;
a display disposed beneath the cover substrate;
a housing;
a mechanical input mechanism comprising a shaft and a crown, the mechanical input mechanism configured to be rotated;
a sense electrode positioned proximate to the mechanical input mechanism, wherein the sense electrode is disposed in a gasket connecting the display and cover substrate to the housing, wherein the shaft is separated from the gasket by the housing; and
a capacitive sense circuit comprising:
drive circuitry operatively coupled to a conductive portion of the mechanical input mechanism and configured to drive a drive signal onto the conductive portion of the mechanical input mechanism; and
sense circuitry operatively coupled to the sense electrode and configured to measure an amount of capacitive coupling in response to driving the drive signal onto the conductive portion of the mechanical input mechanism.

2. The electronic device of claim 1, wherein:
the mechanical input mechanism comprises a plurality of conductive segments;
in a first rotational orientation of the mechanical input mechanism, the drive circuitry is coupled to a first conductive segment of the plurality of conductive segments via an internal electrical contact; and
in a second rotational orientation of the mechanical input mechanism, different from the first rotational orientation, the drive circuitry is coupled to a second conductive segment of the plurality of conductive segments, different from the first conductive segment, and decoupled from the first conductive segment, via the internal electrical contact.

3. The electronic device of claim 1, wherein a change in the amount of capacitive coupling between the conductive portion of the mechanical input mechanism and the sense electrode is indicative of an object contacting or in proximity with the mechanical input mechanism.

4. The electronic device of claim 1, the gasket comprising a force sensor configured for detecting an intensity of contact between an object and the cover substrate.

5. The electronic device of claim 4, wherein the force sensor and the sense electrode are disposed on different layers of the gasket.

6. The electronic device of claim 1, further comprising:
a shear plate; and
a drive electrode, wherein the drive electrode is disposed between the shear plate and the mechanical input mechanism.

7. The electronic device of claim 1, wherein the conductive portion of the mechanical input mechanism comprises a plurality of conductive pads disposed in the crown and a plurality of routing traces disposed in the shaft, a respective one of the plurality of routing traces corresponding to a respective one of the plurality of conductive pads.

8. The electronic device of claim 7, wherein at least one of the plurality of routing traces is disposed internal to the shaft.

9. The electronic device of claim 7, wherein at least one of the plurality of routing traces is disposed on an exterior surface of the shaft.

10. The electronic device of claim 7, wherein the plurality of routing traces are directly electrically connected.

11. A method comprising:
driving a conductive portion of a crown of a wearable device with a drive signal;
sensing, at a sense electrode proximate to the crown and disposed in a gasket connecting a cover substrate over a display to a housing, the gasket separated from a shaft coupled to the crown by the housing, an amount of capacitive coupling in response to driving the drive signal onto the conductive portion of the crown; and
detecting an object touching or in proximity to the crown based on the amount of capacitive coupling.

12. The method of claim 11, wherein the amount of capacitive coupling comprises a mutual capacitance between the conductive portion of the crown and the sense electrode.

13. The method of claim 11, wherein the conductive portion of the crown comprises a plurality of conductive pads, and wherein driving the conductive portion of the crown comprises:
in a first rotational orientation of the crown, driving a first of the plurality of conductive pads without driving a second of the plurality of conductive pads; and
in a second rotational orientation, different from the first rotational orientation, of the crown, driving the second of the plurality of conductive pads without driving the first of the plurality of conductive pads.

14. A non-transitory computer readable storage medium, the computer readable storage medium including instructions that, when executed by a processor, cause the processor to perform a method comprising:
driving a conductive portion of a crown of a wearable device with a drive signal;
sensing, at a sense electrode proximate to the crown and disposed in a gasket connecting a cover substrate over a display to a housing, the gasket separated from a shaft coupled to the crown by the housing, an amount of capacitive coupling in response to driving the drive signal onto the conductive portion of the crown; and
detecting an object touching or in proximity to the crown based on the amount of capacitive coupling.

15. The non-transitory computer readable storage medium of claim 14, wherein the amount of capacitive coupling comprises a mutual capacitance between the conductive portion of the crown and the sense electrode.

16. The non-transitory computer readable storage medium of claim 14, wherein the conductive portion of the crown comprises a plurality of conductive pads, and wherein driving the conductive portion of the crown comprises:
in a first rotational orientation of the crown, driving a first of the plurality of conductive pads without driving a second of the plurality of conductive pads; and
in a second rotational orientation, different from the first rotational orientation, of the crown, driving the second of the plurality of conductive pads without driving the first of the plurality of conductive pads.

17. The electronic device of claim 1, wherein the gasket extends around an exterior edge portion of a bottom surface of the display and forms a seal to prevent outside air or a liquid from entering an interior cavity of the housing.

* * * * *